US011793068B2

(12) United States Patent
Uno

(10) Patent No.: US 11,793,068 B2
(45) Date of Patent: *Oct. 17, 2023

(54) AMINE COMPOUND AND ORGANIC ELECTROLUMINESCENCE DEVICE INCLUDING THE SAME

(71) Applicant: Samsung Display Co., Ltd., Yongin-Si (KR)

(72) Inventor: Takuya Uno, Yokohama (JP)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 100 days.

This patent is subject to a terminal disclaimer.

(21) Appl. No.: 17/365,393

(22) Filed: Jul. 1, 2021

(65) Prior Publication Data

US 2021/0359230 A1 Nov. 18, 2021

Related U.S. Application Data

(63) Continuation of application No. 16/040,332, filed on Jul. 19, 2018, now Pat. No. 11,121,329.

(30) Foreign Application Priority Data

Nov. 24, 2017 (KR) ........................ 10-2017-0158831

(51) Int. Cl.

*H10K 85/10* (2023.01)
*H10K 85/40* (2023.01)

(Continued)

(52) U.S. Cl.

CPC ........... *H10K 85/40* (2023.02); *C07F 7/0812* (2013.01); *C09K 11/06* (2013.01); *H01L 27/12* (2013.01);

(Continued)

(58) Field of Classification Search

None

See application file for complete search history.

(56) References Cited

U.S. PATENT DOCUMENTS 8,580,980 B2 11/2013 Osaka et al.
9,590,186 B2 3/2017 Itoi et al.

(Continued)

FOREIGN PATENT DOCUMENTS

CN 106146538 11/2016
JP 5848480 1/2016

(Continued)

*Primary Examiner* — Gregory D Clark

(74) *Attorney, Agent, or Firm* — KILE PARK REED & HOUTTEMAN PLLC

(57) ABSTRACT

An amine compound which improves emission efficiency and an organic electroluminescence device including the same are provided. The amine compound is represented by the structure below, wherein X is O or S, Y is C or Si, each of $Ar_1$ and $Ar_2$ is independently a substituted or unsubstituted alkyl group having 1 to 50 carbon atoms, a substituted or unsubstituted aryl group having 6 to 50 carbon atoms for forming a ring, or a substituted or unsubstituted heteroaryl group having 2 to 50 carbon atoms for forming a ring, which includes O or S as a heteroatom, and each of $L_1$ and $L_2$ is independently a direct linkage, a substituted or unsubstituted (Continued)

arylene group having 6 to 30 carbon atoms for forming a ring, or a substituted or unsubstituted heteroarylene group having 2 to 30 carbon atoms for forming a ring. R1 through R5 are defined in the description.

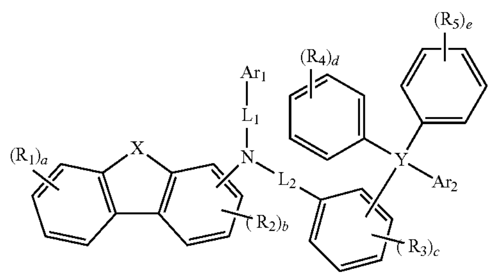

18 Claims, 1 Drawing Sheet

(51) Int. Cl.

| | |
|---|---|
| ***C07F 7/08*** | (2006.01) |
| ***C09K 11/06*** | (2006.01) |
| ***H01L 27/12*** | (2006.01) |
| ***H10K 85/60*** | (2023.01) |
| *H10K 50/11* | (2023.01) |
| *H10K 50/15* | (2023.01) |

(52) U.S. Cl.

CPC ......... *H10K 85/633* (2023.02); *H10K 85/636* (2023.02); *H10K 85/6574* (2023.02); *H10K 85/6576* (2023.02); *C09K 2211/1018* (2013.01); *H10K 50/11* (2023.02); *H10K 50/15* (2023.02); *H10K 85/615* (2023.02)

(56) References Cited

U.S. PATENT DOCUMENTS

| | | | |
|---|---|---|---|
| 9,822,133 | B2 | 11/2017 | Kim et al. |
| 9,871,204 | B2 | 1/2018 | Fuchiwaki |
| 9,929,355 | B2 | 3/2018 | Takada et al. |
| 2015/0333281 | A1 | 11/2015 | Kim et al. |
| 2016/0133849 | A1 | 5/2016 | Miyake et al. |
| 2016/0197283 | A1 | 7/2016 | Itoi et al. |
| 2016/0372677 | A1 | 12/2016 | Miyake |
| 2017/0012204 | A1 | 1/2017 | Jin et al. |

FOREIGN PATENT DOCUMENTS

| | | | | |
|---|---|---|---|---|
| KR | 10-2015-0102734 | | 9/2015 | |
| KR | 10-2015-0131460 | | 11/2015 | |
| KR | 10-2015-0132660 | | 11/2015 | |
| KR | 2015-138000 | * | 12/2015 | ............. H01L 51/50 |
| KR | 10-2016-0055671 | | 5/2016 | |
| KR | 10-1623879 | | 5/2016 | |
| KR | 10-2016-0073285 | | 6/2016 | |
| KR | 10-1695270 | | 1/2017 | |
| KR | 10-1751473 | | 6/2017 | |
| KR | 10-1825542 | | 2/2018 | |
| WO | 2014/015935 | | 1/2014 | |
| WO | 2014/104144 | | 7/2014 | |
| WO | 2015/014435 | | 2/2015 | |
| WO | 2016/013816 | | 1/2016 | |
| WO | 2016/064110 | | 4/2016 | |
| WO | 2016/116520 | | 7/2016 | |
| WO | 2017/022730 | | 2/2017 | |
| WO | 2017/102064 | | 6/2017 | |

* cited by examiner

AMINE COMPOUND AND ORGANIC ELECTROLUMINESCENCE DEVICE INCLUDING THE SAME

CROSS-REFERENCE TO RELATED APPLICATIONS

This is a continuation application of U.S. patent application Ser. No. 16/040,332, filed Jul. 19, 2018, the disclosure of which is incorporated herein by reference in its entirety. U.S. patent application Ser. No. 16/040,332 claims priority to and benefit of Korean Patent Application No. 10-2017-0158831 under 35 U.S.C. § 119, filed on Nov. 24, 2017 in the Korean Intellectual Property Office, the entire contents of which are incorporated herein by reference.

BACKGROUND

The present disclosure herein relates to an amine compound and an organic electroluminescence device including the same.

Recently, the development of an organic electroluminescence display device as an image display device is being actively conducted. Different from a liquid crystal display device, the organic electroluminescence display device is so-called a self-luminescent display device in which holes and electrons injected from a first electrode and a second electrode recombine in an emission layer, and a light emission material including an organic compound in the emission layer emits light to attain display.

As an organic electroluminescence device, an organic electroluminescence device including, for example, a first electrode, a hole transport layer disposed on the first electrode, an emission layer disposed on the hole transport layer, an electron transport layer disposed on the emission layer, and a second electrode disposed on the electron transport layer is well known. Holes are injected from the first electrode, and the injected holes move via the hole transport layer and are injected into the emission layer. Meanwhile, electrons are injected from the second electrode, and the injected electrons move via the electron transport layer and are injected into the emission layer. The holes and electrons injected into the emission layer recombine to produce excitons in the emission layer. The organic electroluminescence device emits light using light generated by the transition of the excitons to a ground state. In addition, an embodiment of the configuration of the organic electroluminescence device is not limited thereto, but various modifications may be possible.

In the application of an organic electroluminescence device to a display device, the decrease of the driving voltage, and the increase of the emission efficiency and the life of the organic electroluminescence device are required, and developments on materials for an organic electroluminescence device stably attaining the requirements are being continuously required.

SUMMARY

The present disclosure provides an amine compound for an organic electroluminescence device having high efficiency.

The present disclosure also provides an organic electroluminescence device having high efficiency and long life, which includes an amine compound in a hole transport region.

An embodiment of the inventive concept provides an amine compound represented by the following Formula 1:

[Formula1]

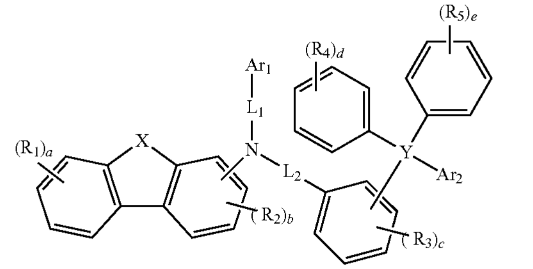

In Formula 1, X may be O or S, and Y may be C or Si.

In Formula 1, $Ar_1$ and $Ar_2$ may be each independently a substituted or unsubstituted alkyl group having 1 to 50 carbon atoms, a substituted or unsubstituted aryl group having 6 to 50 carbon atoms for forming a ring, or a substituted or unsubstituted heteroaryl group having 2 to 50 carbon atoms for forming a ring, which includes O or S as a heteroatom.

In Formula 1, $L_1$ and $L_2$ may be each independently a direct linkage, a substituted or unsubstituted arylene group having 6 to 30 carbon atoms for forming a ring, or a substituted or unsubstituted heteroarylene group having 2 to 30 carbon atoms for forming a ring.

In Formula 1, $R_1$ may be a substituted or unsubstituted aryl group having 6 to 50 carbon atoms for forming a ring.

In Formula 1, $R_2$ to $R_5$ may be each independently a hydrogen atom, a deuterium atom, a halogen atom, a cyano group, a substituted or unsubstituted silyl group, a substituted or unsubstituted alkyl group having 1 to 10 carbon atoms, a substituted or unsubstituted alkoxy group having 1 to 10 carbon atoms, a substituted or unsubstituted arylthio group having 1 to 10 carbon atoms, a substituted or unsubstituted alkylamino group having 1 to 10 carbon atoms, a substituted or unsubstituted arylamino group having 1 to 20 carbon atoms, a substituted or unsubstituted aryl group having 6 to 50 carbon atoms for forming a ring, or a substituted or unsubstituted heteroaryl group having 2 to 50 carbon atoms for forming a ring, or combined with an adjacent group to form a ring.

In Formula 1, "a" may be an integer of 1 to 4, "b" may be an integer of 0 to 3, "c" may be 0 or 1, and "d" and "e" may be each independently an integer of 0 to 5.

In an embodiment, Formula 1 may be represented by the following Formula 1-1:

[Formula 1-1]

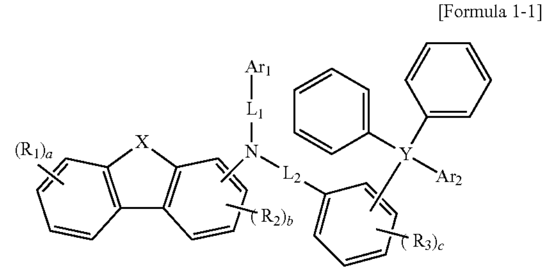

In Formula 1-1, X, $Ar_1$, $Ar_2$, $L_1$, $L_2$, $R_1$ to $R_3$, and "a" to "c" are the same as defined in Formula 1.

In an embodiment, Formula 1 may be represented by the following Formula 1-2:

[Formula 1-2]

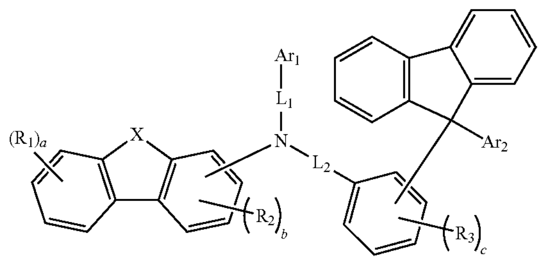

In Formula 1-2, X, Art, $Ar_2$, $L_1$, $L_2$, $R_1$ to $R_3$, and “a” to “c” are the same as defined in Formula 1.

In an embodiment,

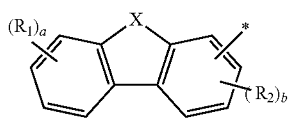

part in Formula 1 may be represented by one of the following H-1 to H-4.

H-1

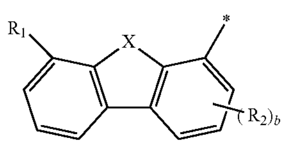

H-2

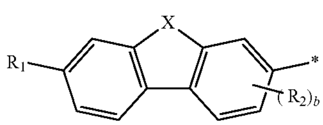

H-3

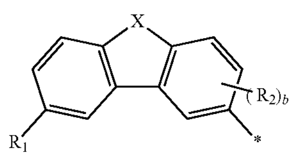

H-4

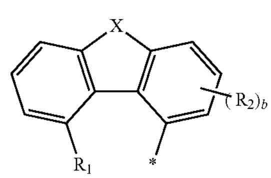

In H-1 to H-4, X, $R_1$, $R_2$ and “b” are the same as defined in Formula 1.

In an embodiment, $Ar_1$ may be a substituted or unsubstituted phenyl group, a substituted or unsubstituted biphenyl group, a substituted or unsubstituted terphenyl group, a substituted or unsubstituted naphthyl group, or a substituted or unsubstituted phenanthryl group.

In an embodiment, $Ar_1$ may be a substituted or unsubstituted dibenzofuranyl group, or a substituted or unsubstituted dibenzothiophene group.

In an embodiment, $Ar_2$ may be a substituted or unsubstituted phenyl group, a substituted or unsubstituted naphthyl group, a substituted or unsubstituted phenanthryl group, a substituted or unsubstituted dibenzofuranyl group, or a substituted or unsubstituted dibenzothiophene group.

In an embodiment, $L_1$ and $L_2$ may be each independently a direct linkage, a substituted or unsubstituted phenylene group, a substituted or unsubstituted dibenzofuranylene group, a substituted or unsubstituted naphthalene group, or a substituted or unsubstituted fluorenylene group.

In an embodiment, $R_1$ may be a substituted or unsubstituted phenyl group, each of $R_2$ to $R_5$ may be a hydrogen atom, a substituted or unsubstituted phenyl group, or a substituted or unsubstituted triphenylsilyl group, or combined with an adjacent group to form a ring.

In an embodiment, Formula 1 may be any one selected from compounds represented in the following Compound Group 1

[Compound Group 1]

A1

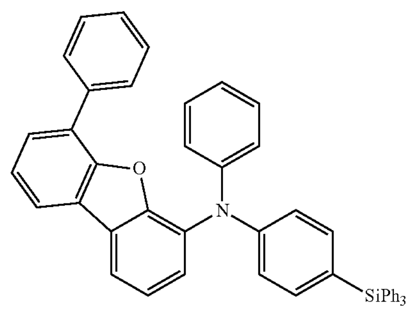

A2

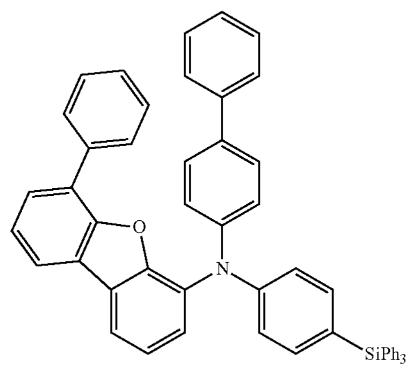

A3

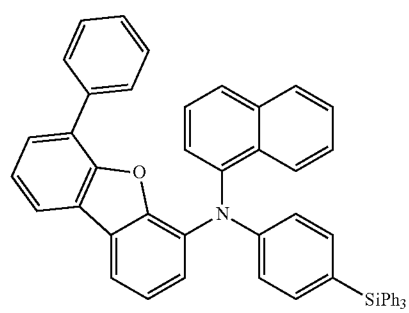

A4
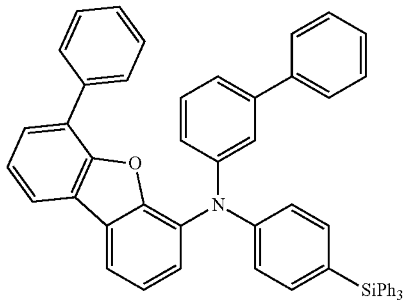
A5
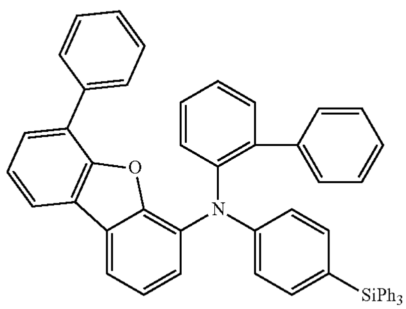
A6
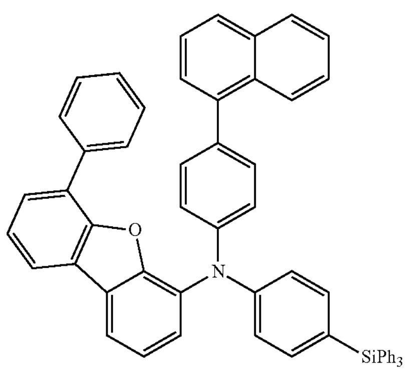
A7
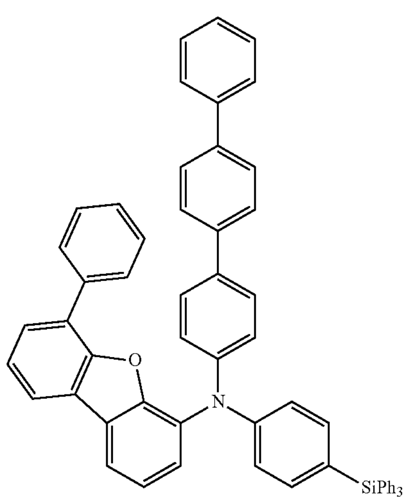
A8
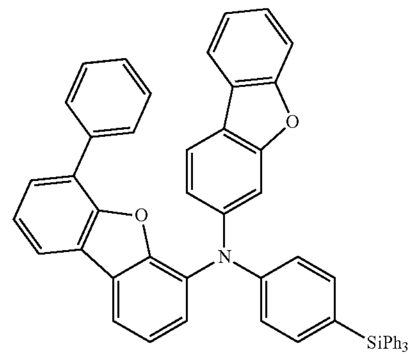
A9
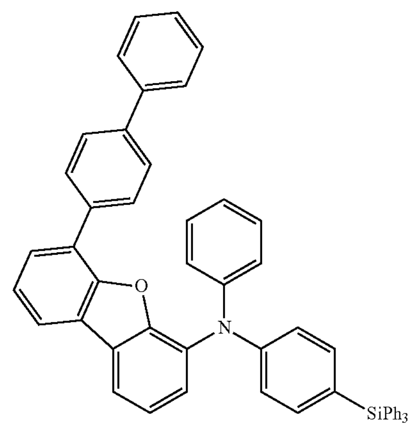
A10
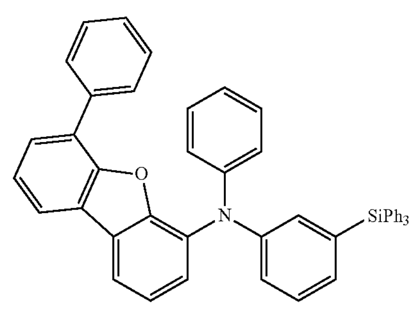
A11
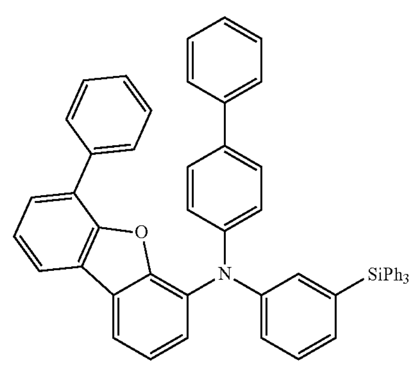

A12
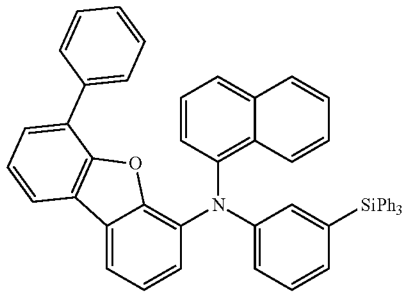
A13
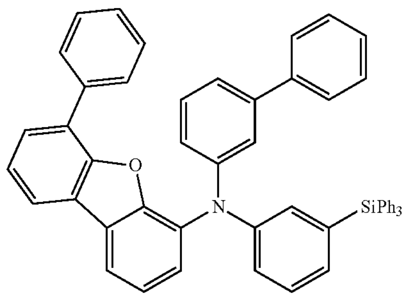
A14
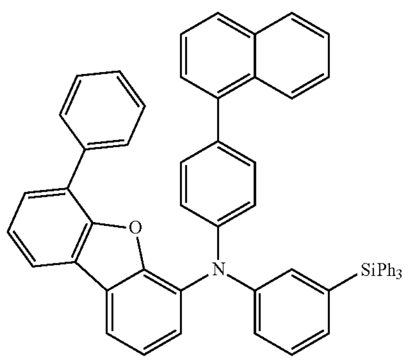
A15
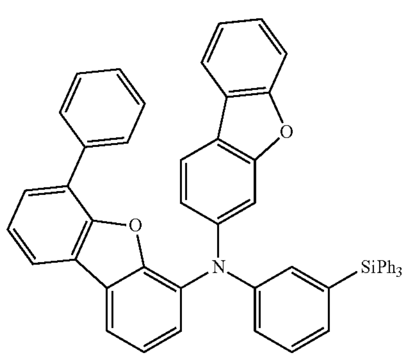
A16
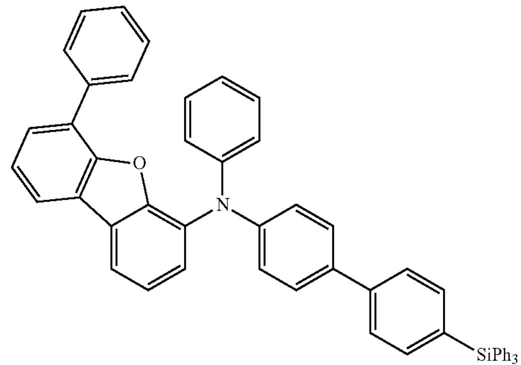
A17
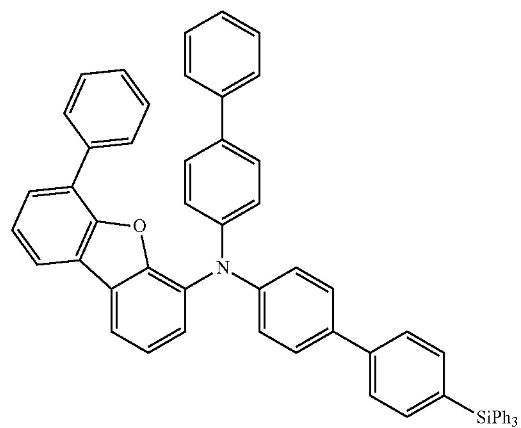
A18
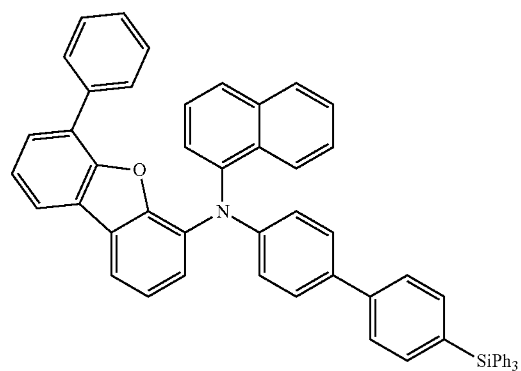
A19
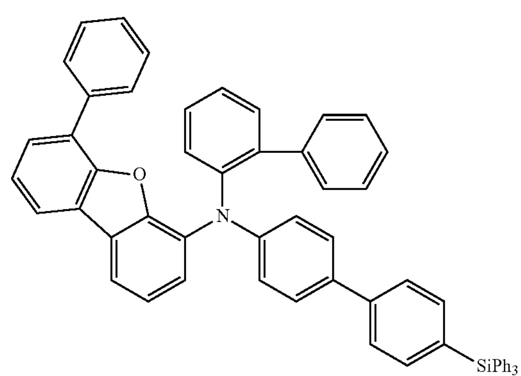

-continued
A20
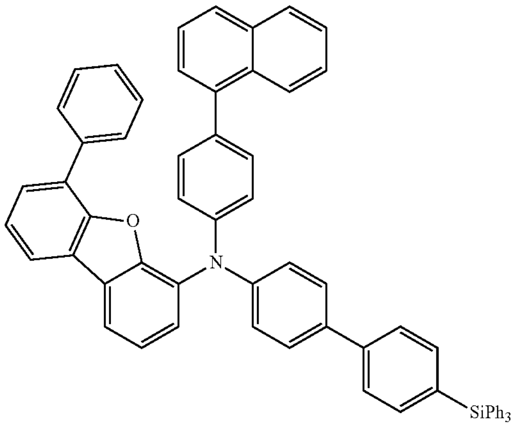
A21
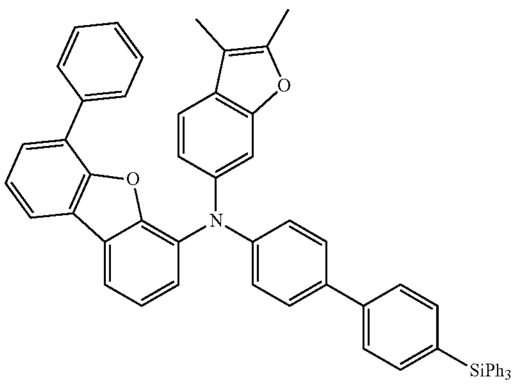
A22
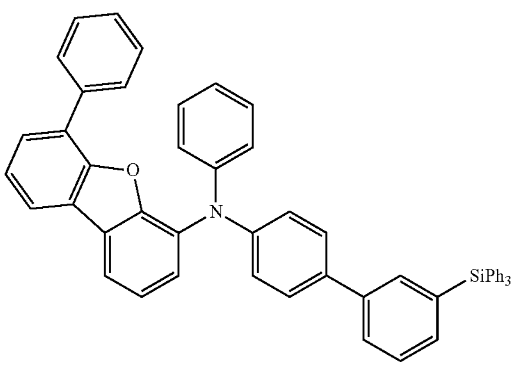
A23
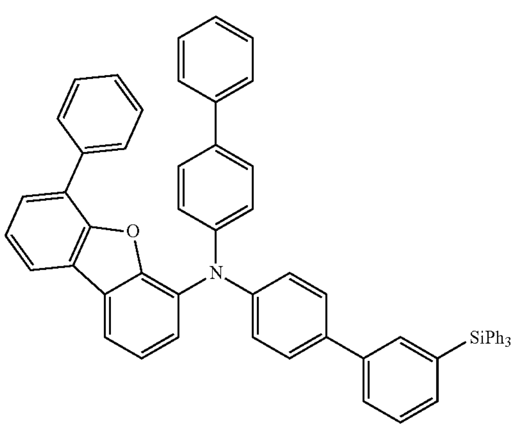
-continued
A24
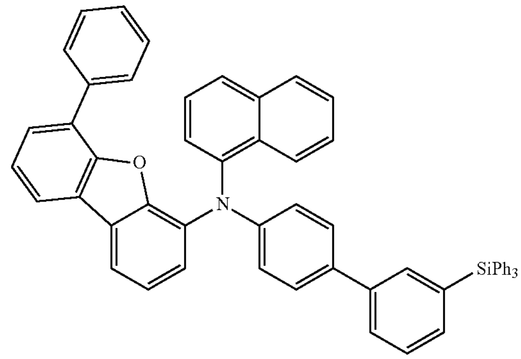
A25
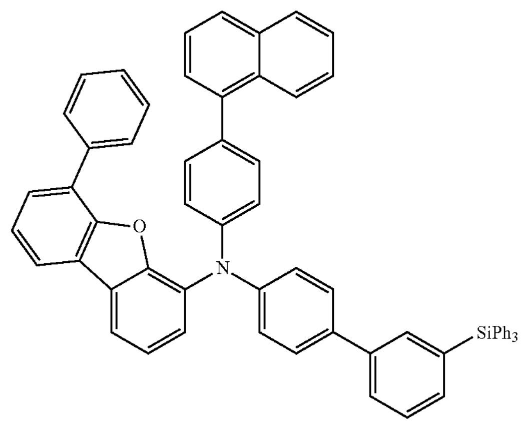
A26
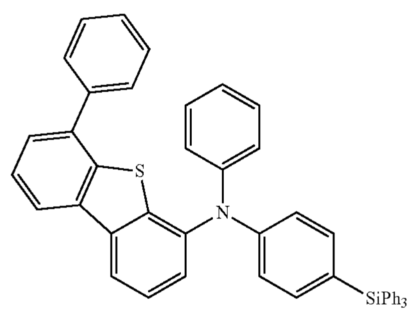
A27
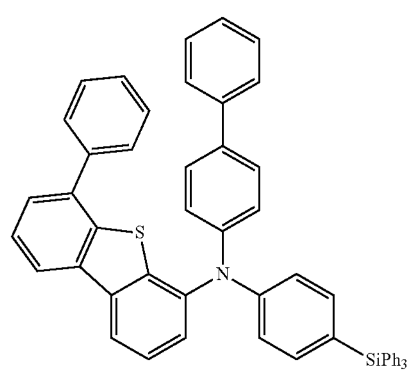

-continued
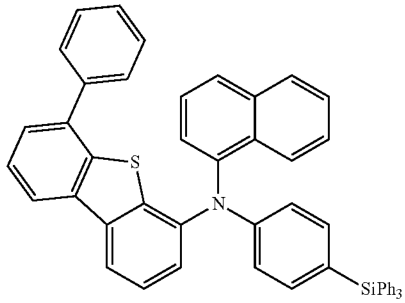
A28
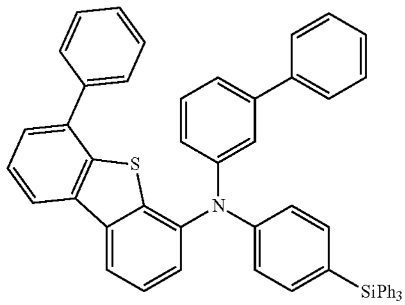
A29
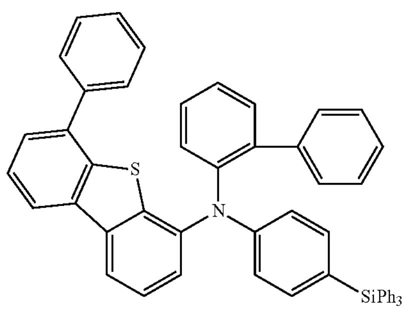
A30
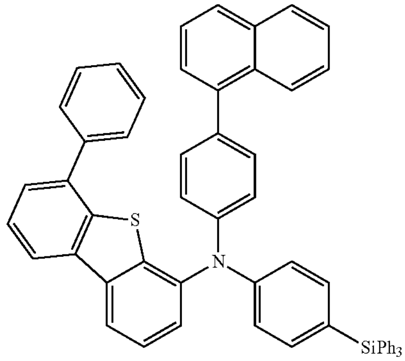
A31
-continued
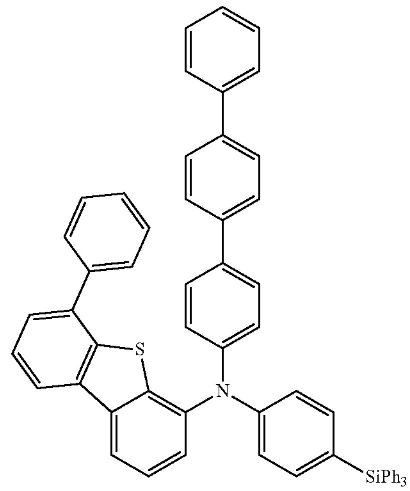
A32
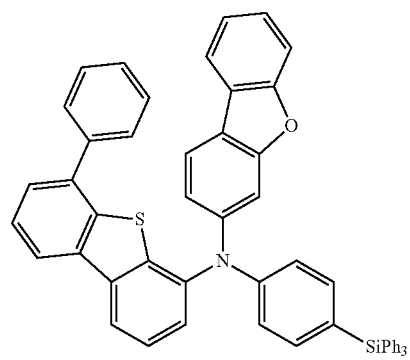
A33
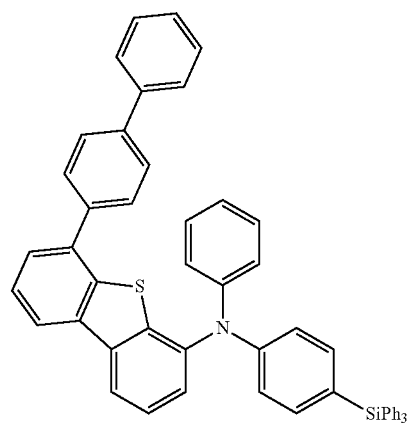
A34
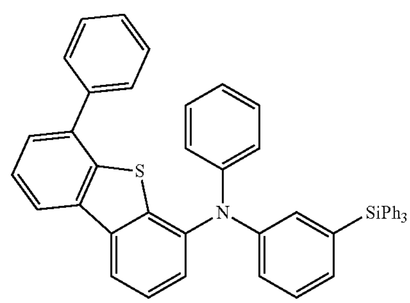
A35

-continued
A36
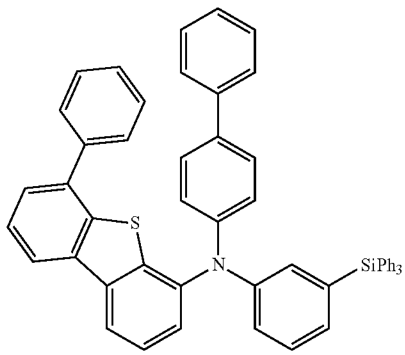
A37
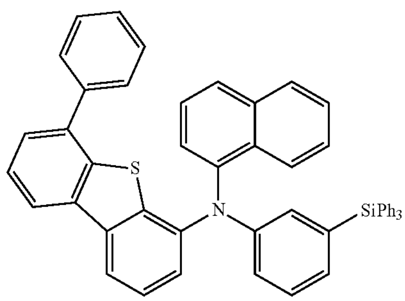
A38
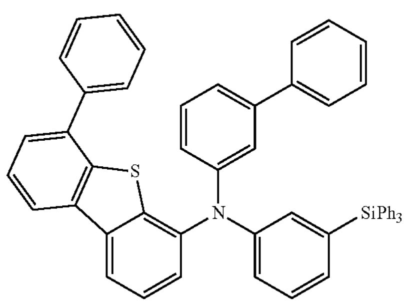
A39
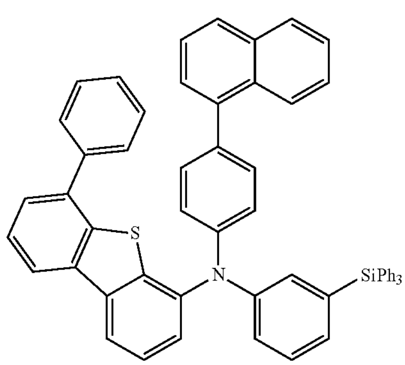
-continued
A40
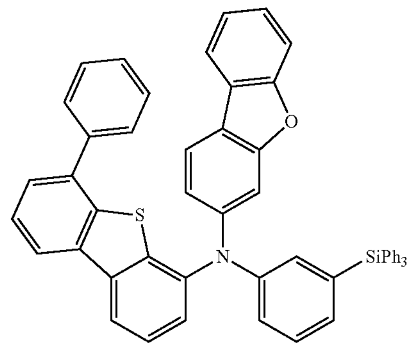
A41
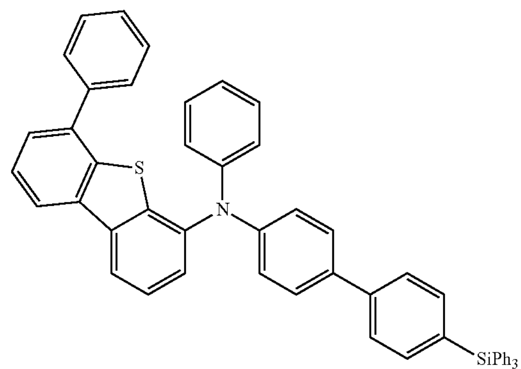
A42
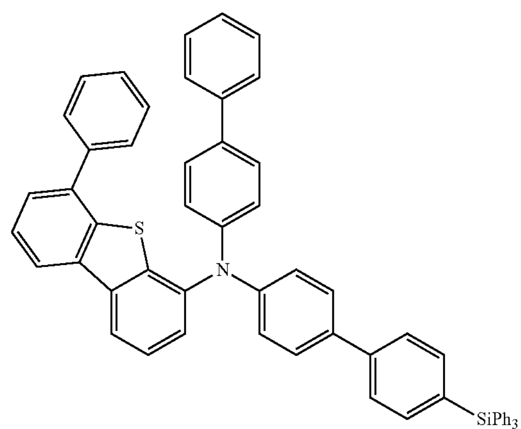
A43
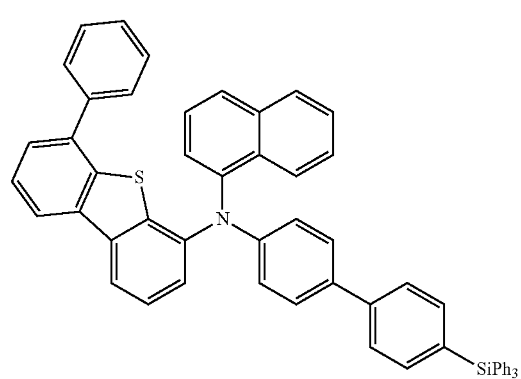

-continued
A44
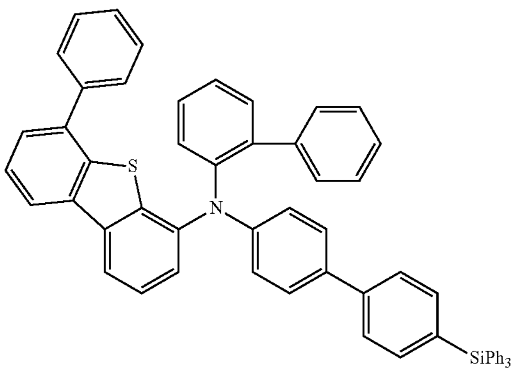
A45
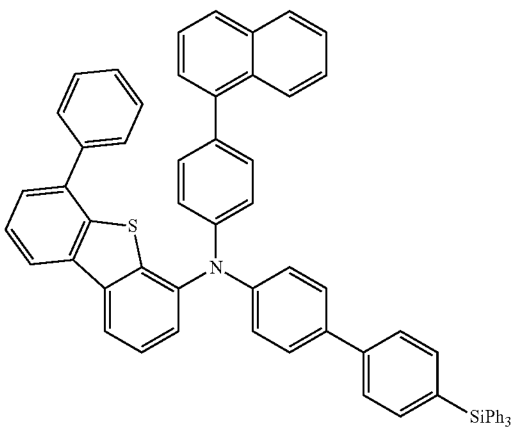
A46
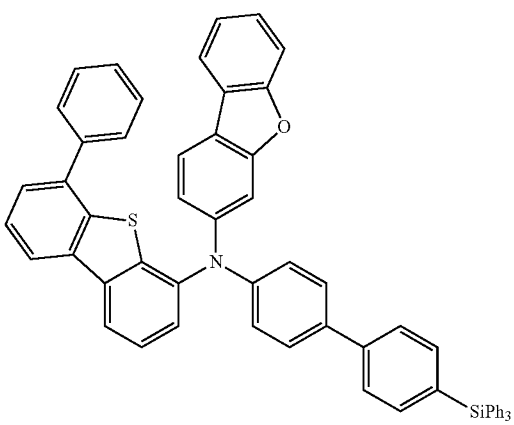
A47
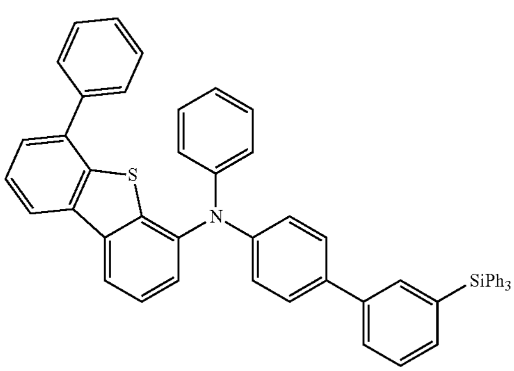
-continued
A48
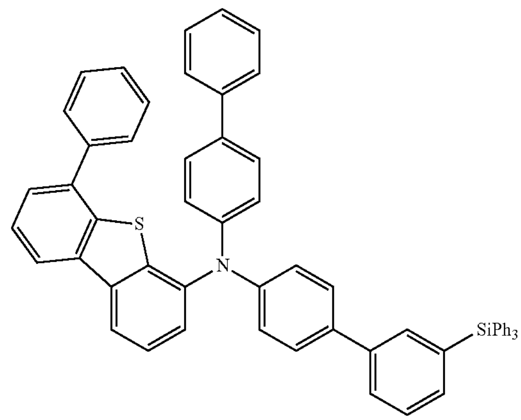
A49
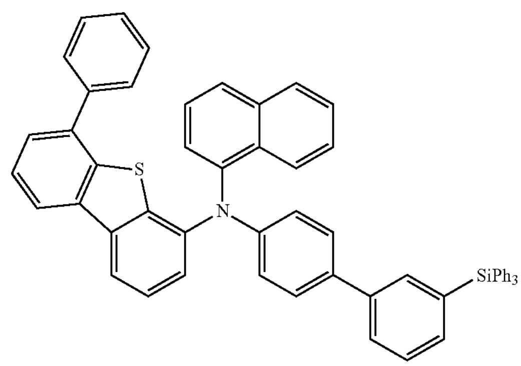
A50
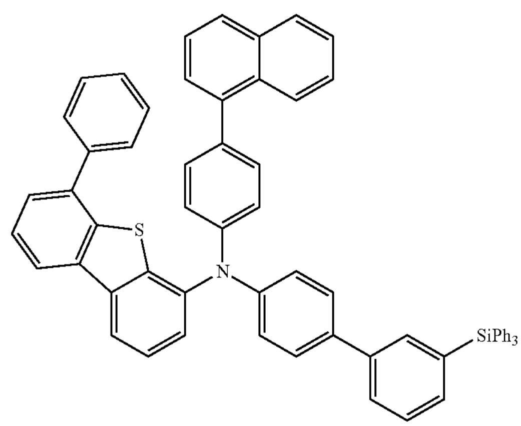
A51
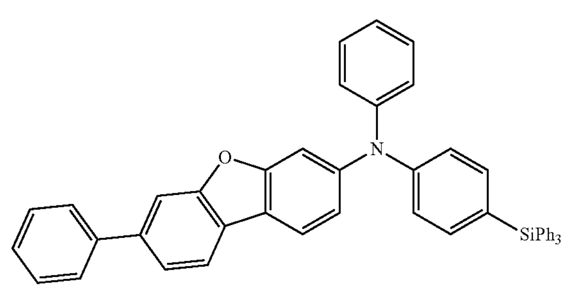

A52
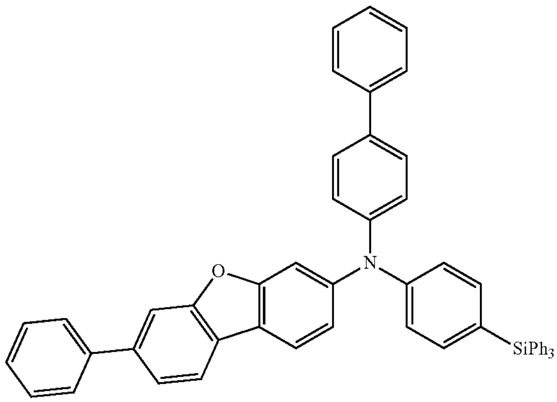
A53
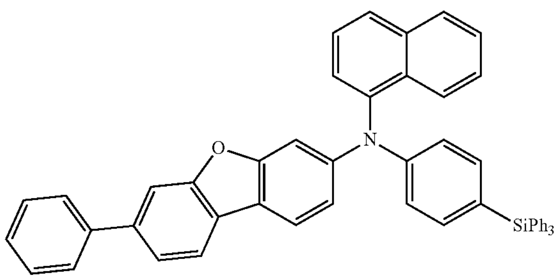
A54
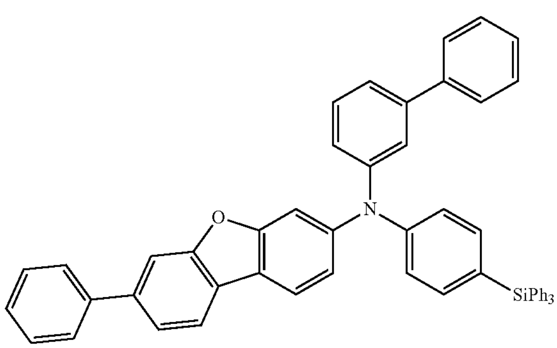
A55
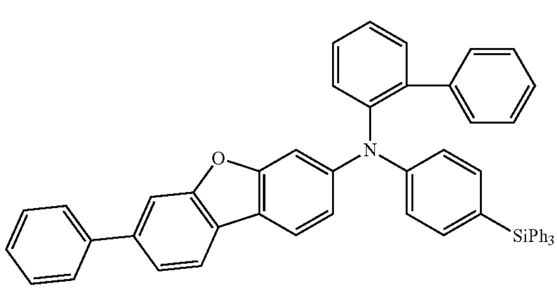
A56
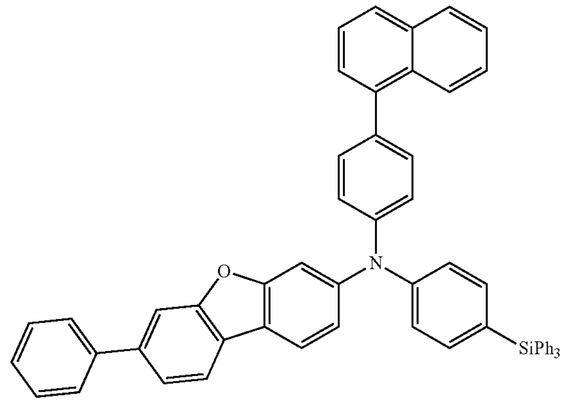
A57
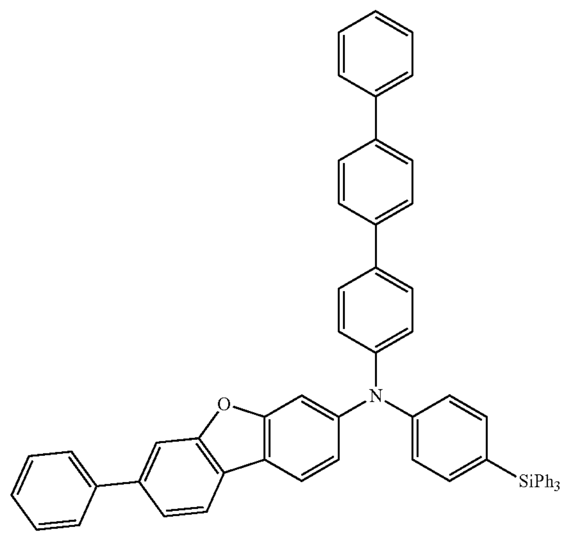
A58
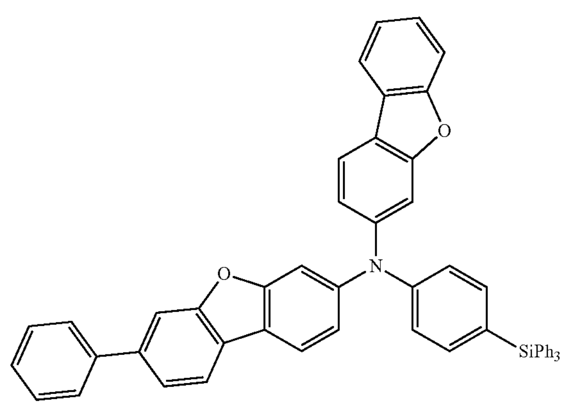

-continued
A59
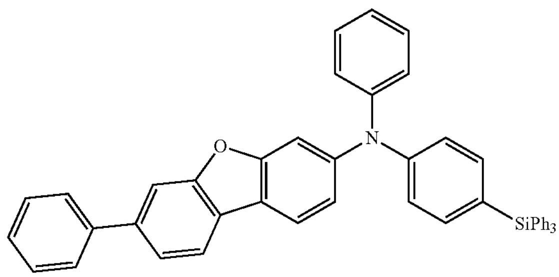
A60
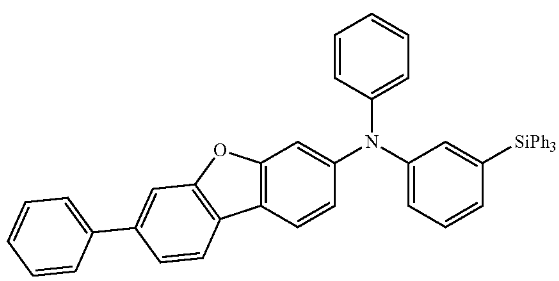
A61
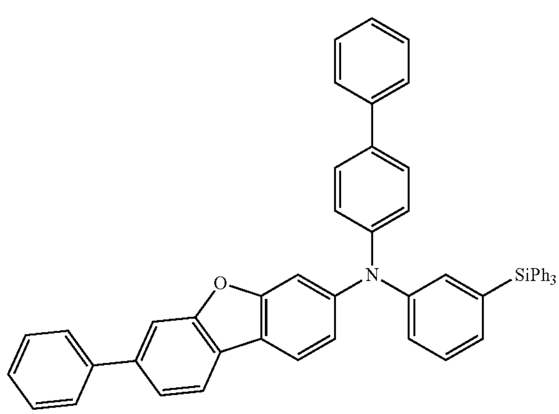
A62
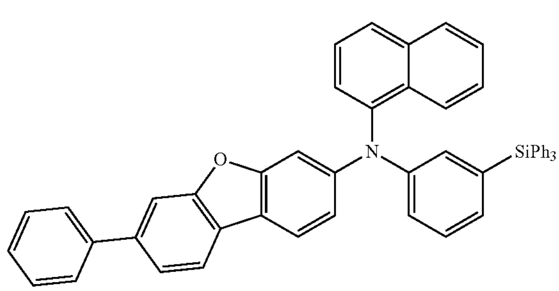
-continued
A63
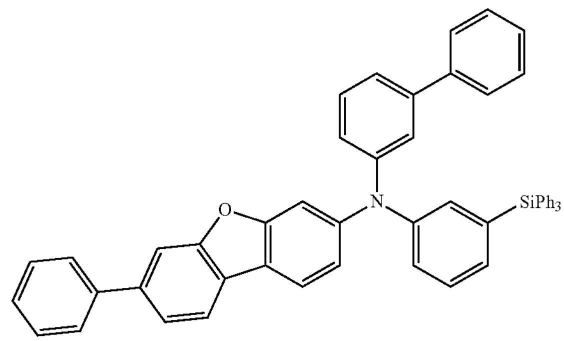
A64
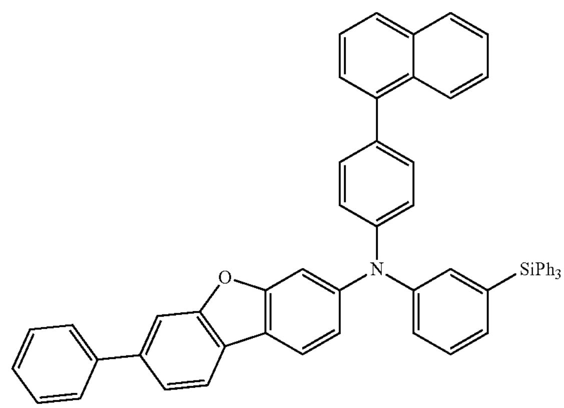
A65
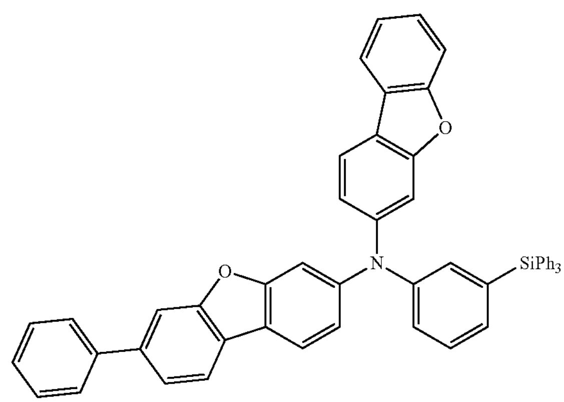
A66
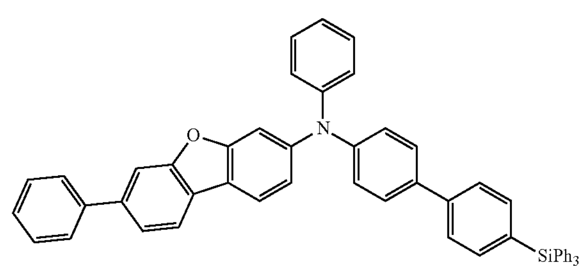

-continued
A67
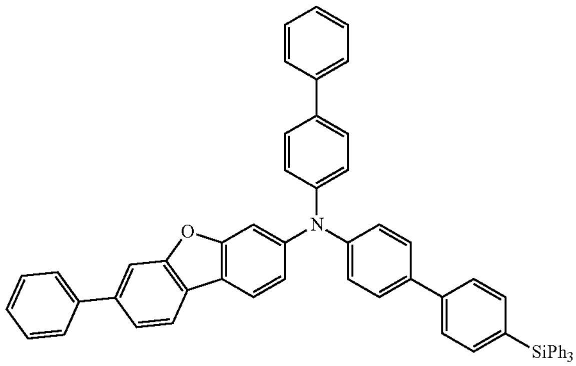
A68
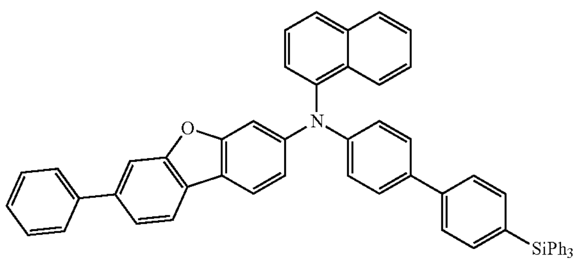
A69
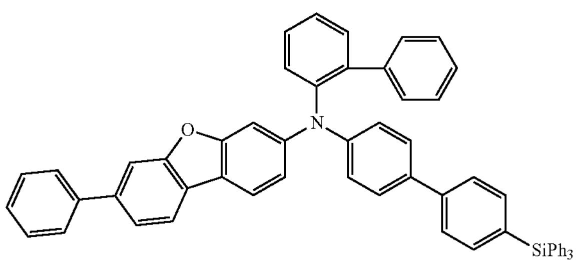
A70
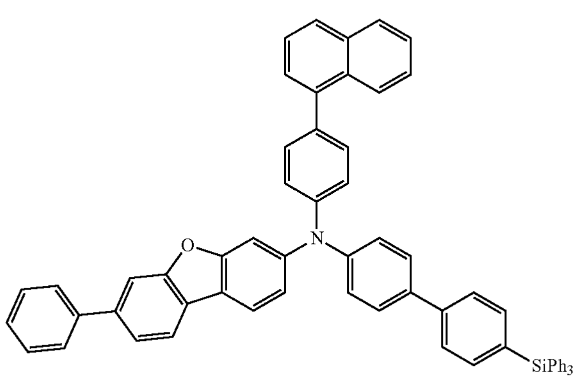
-continued
A71
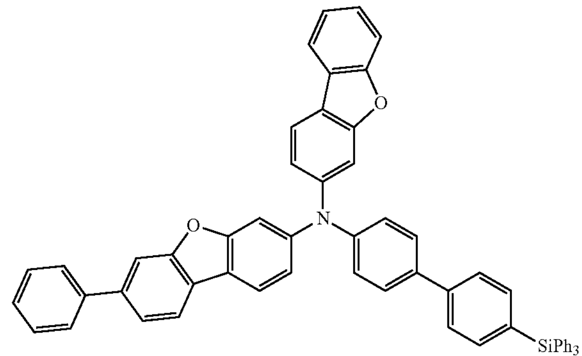
A72
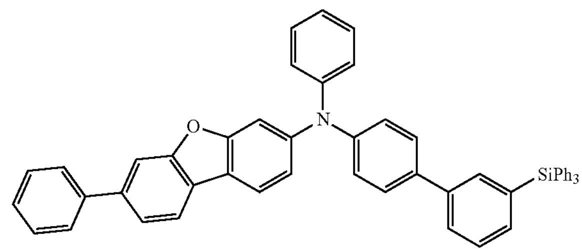
A73
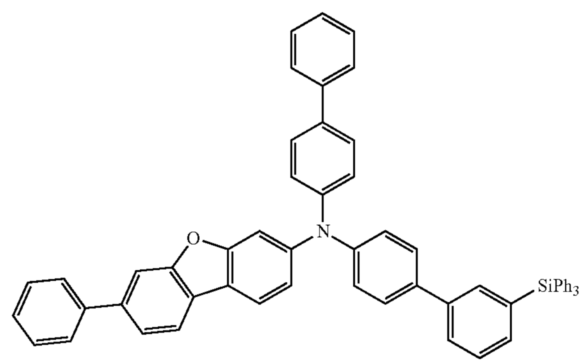
A74
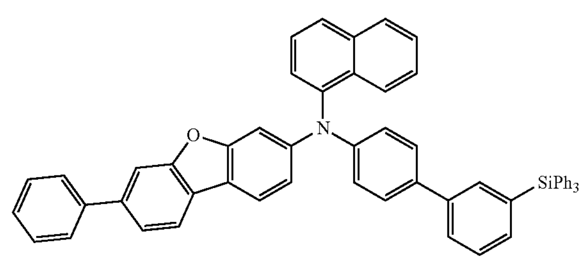

-continued
A75
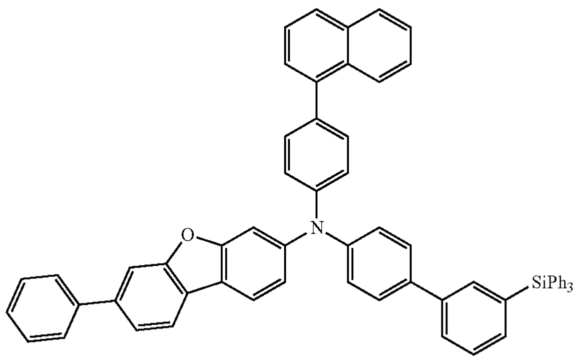
A76
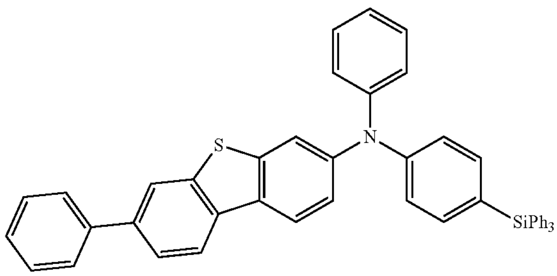
A77
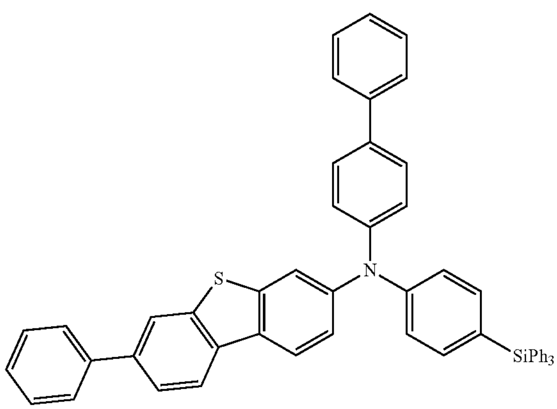
A78
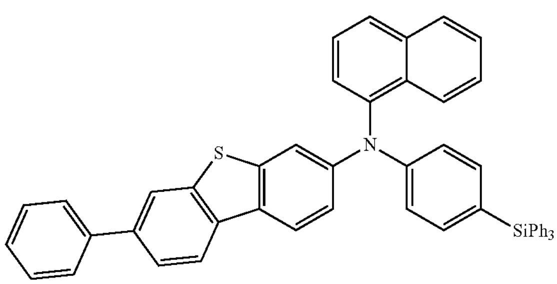
-continued
A79
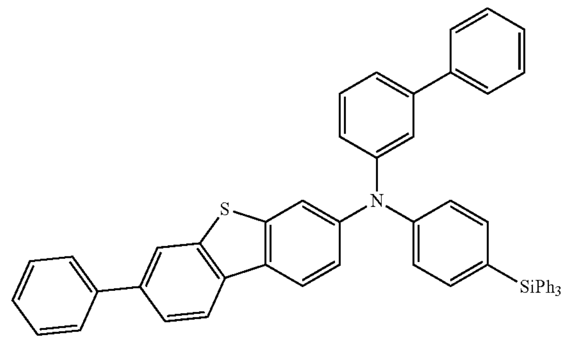
A80
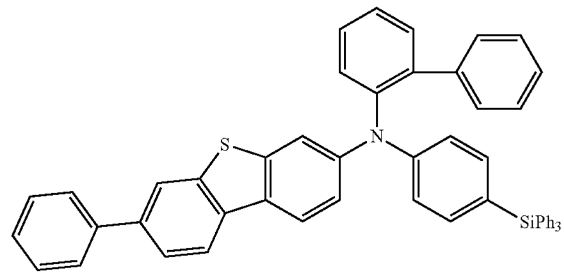
A81
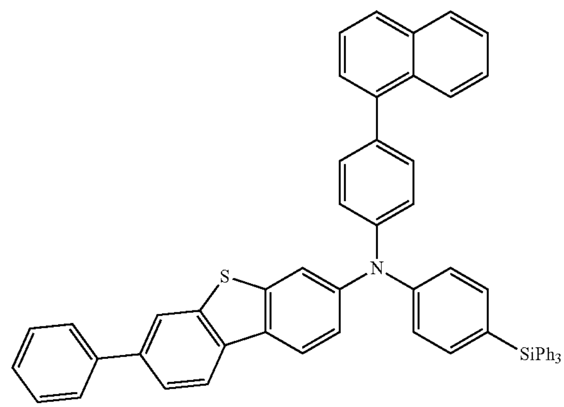
A82
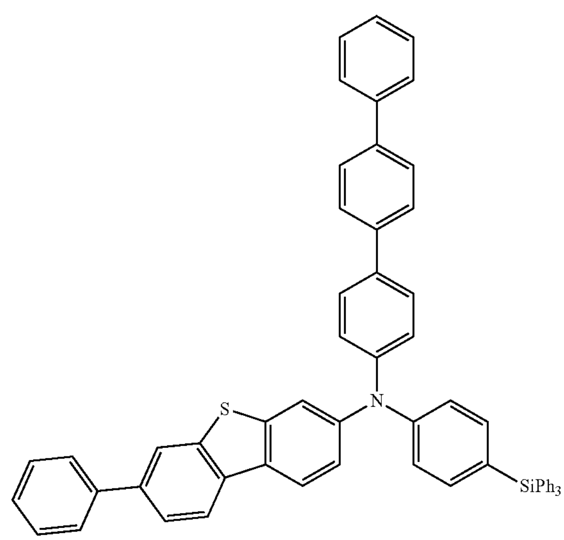

A83
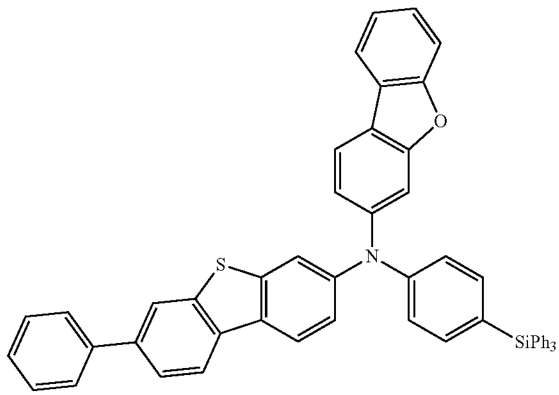
A84
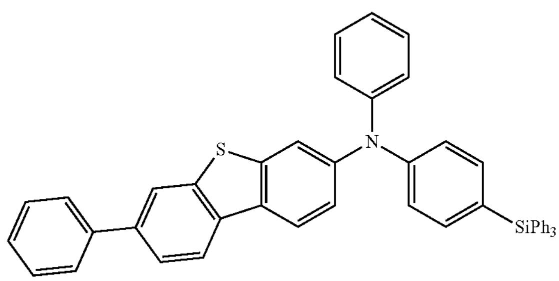
A85
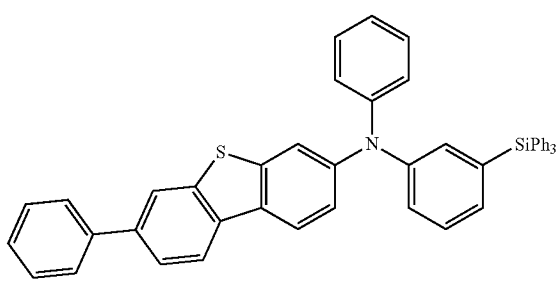
A86
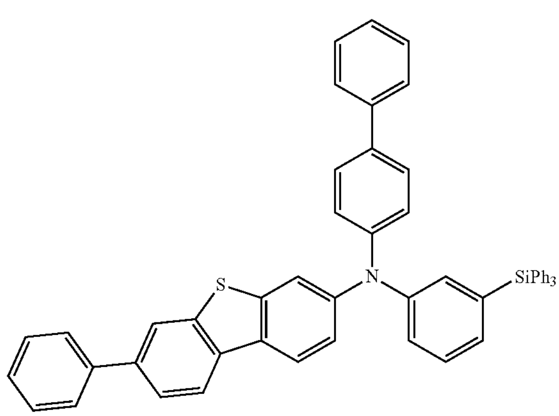
A87
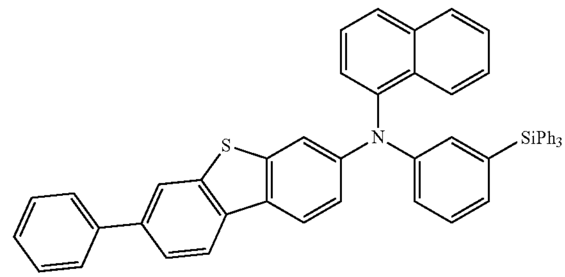
A88
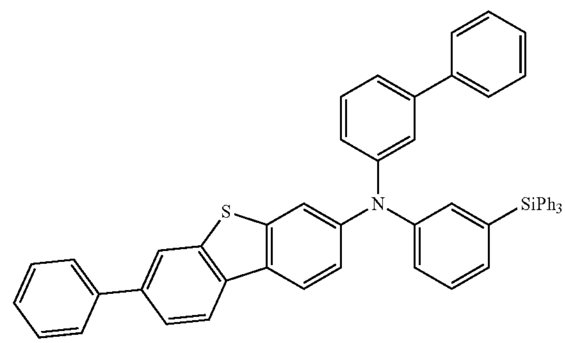
A89
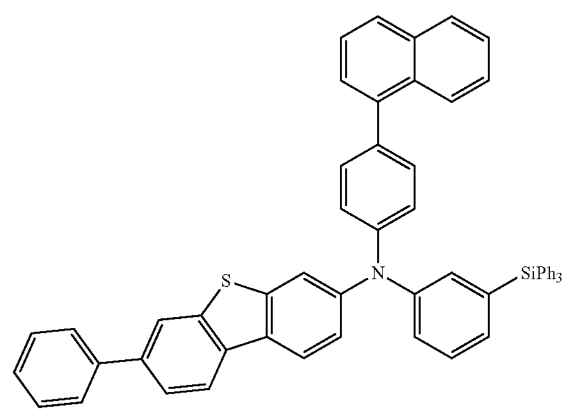
A90
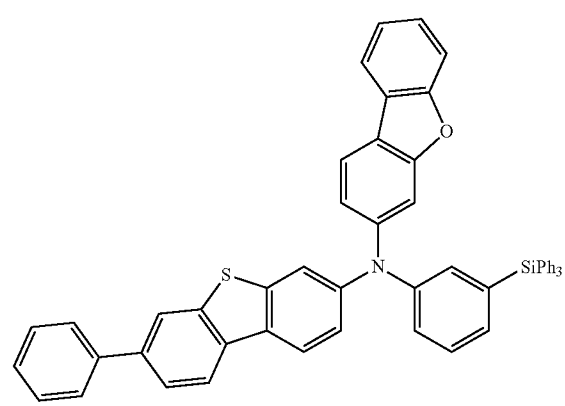

A91
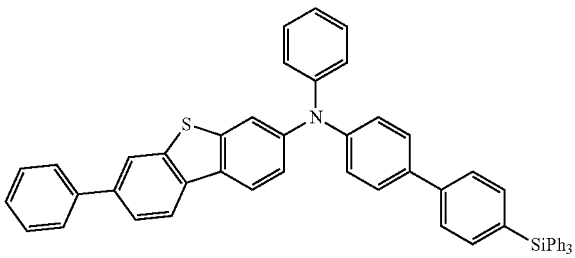
A92
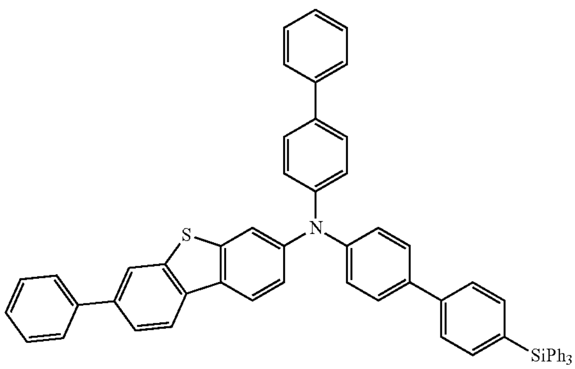
A93
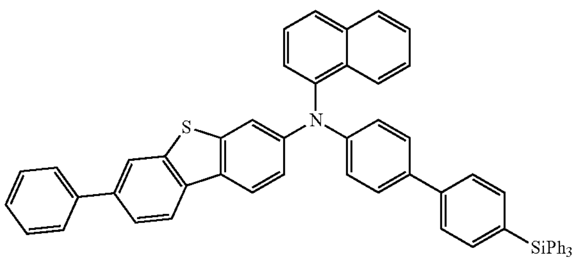
A94
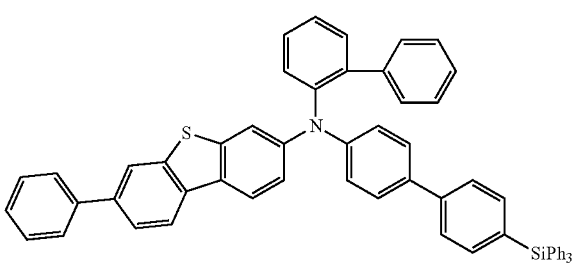
A95
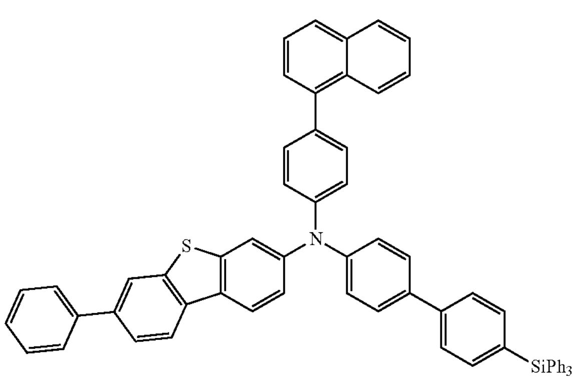
A96
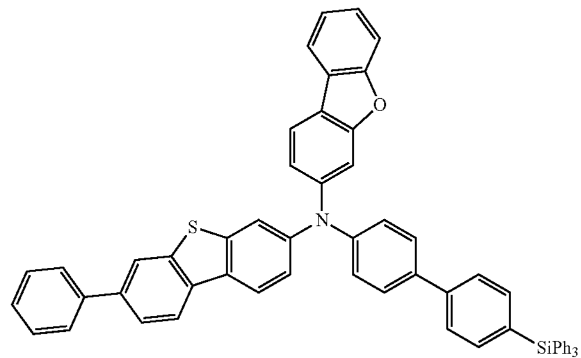
A97
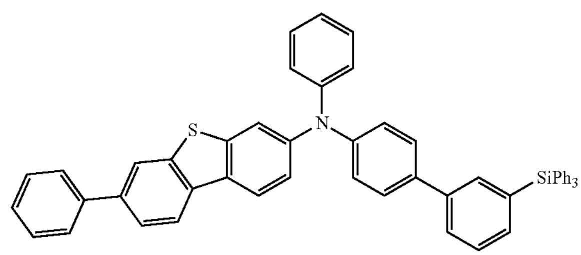
A98
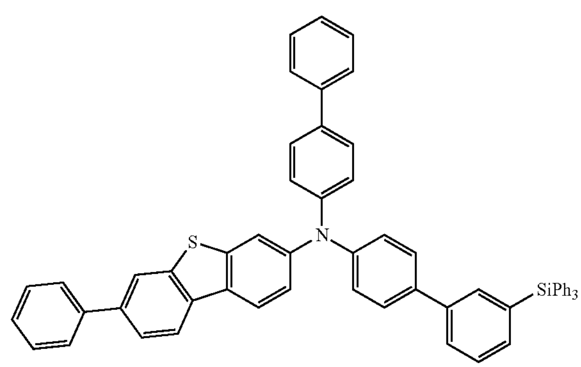
A99
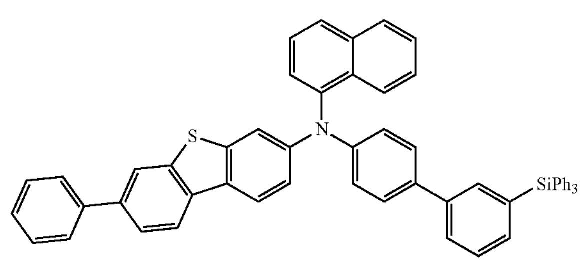

-continued
A100
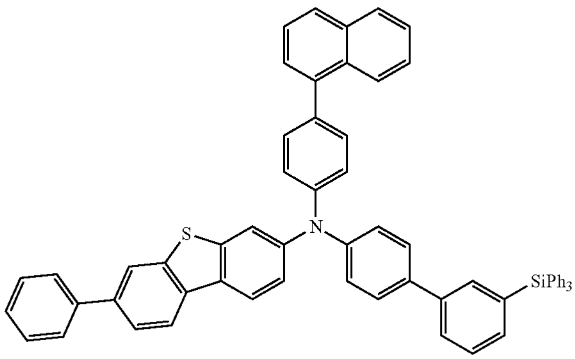
A101
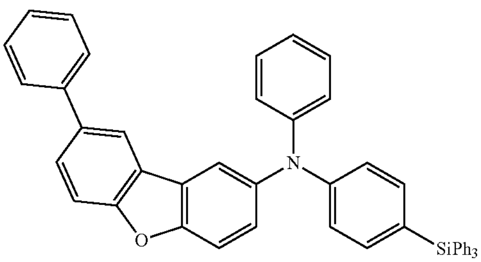
A102
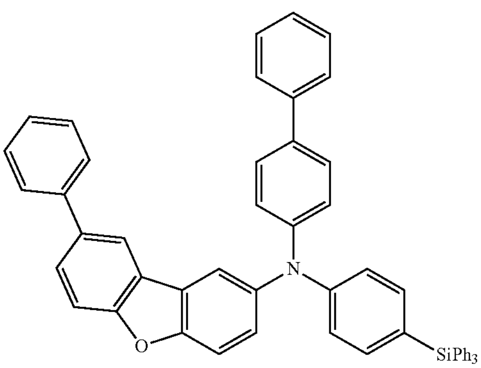
A103
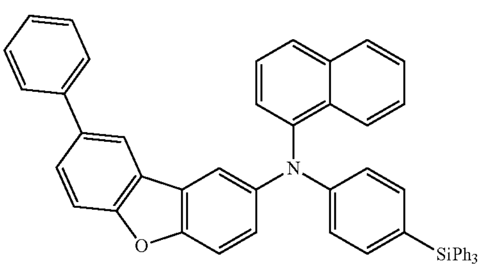
A104
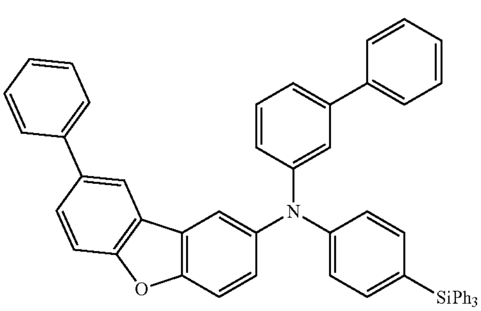
-continued
A105
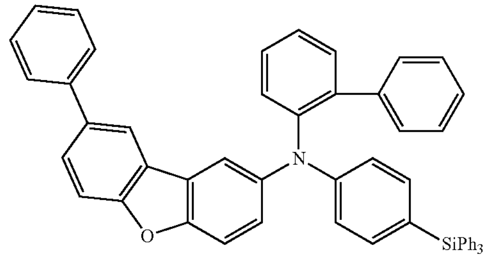
A106
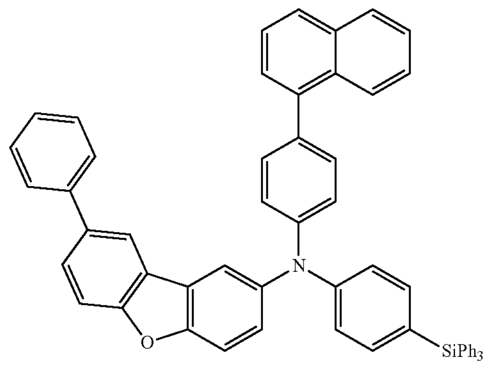
A107
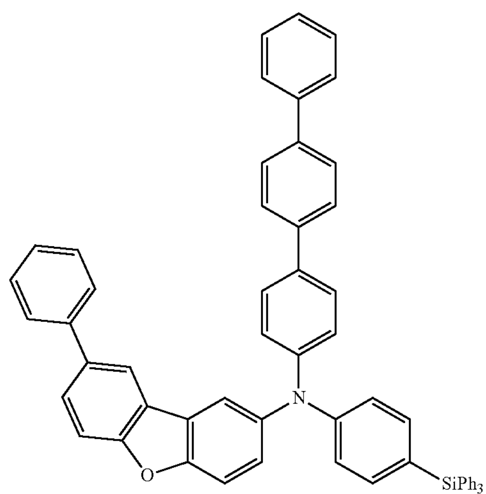
A108
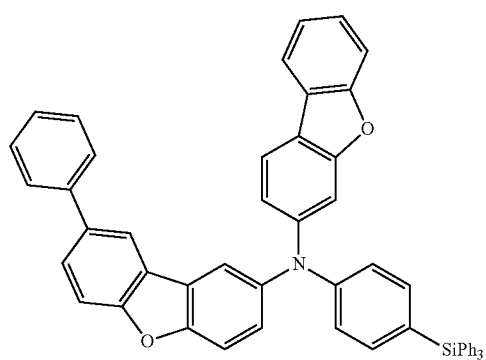

-continued
A109
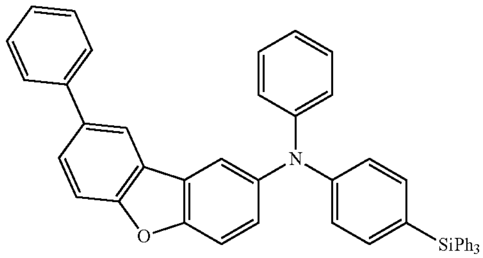
A110
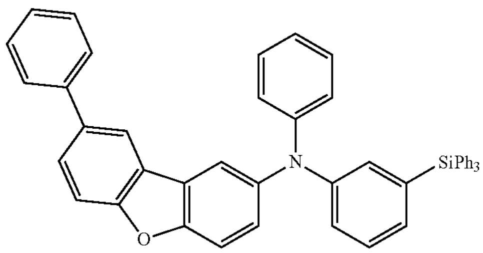
A111
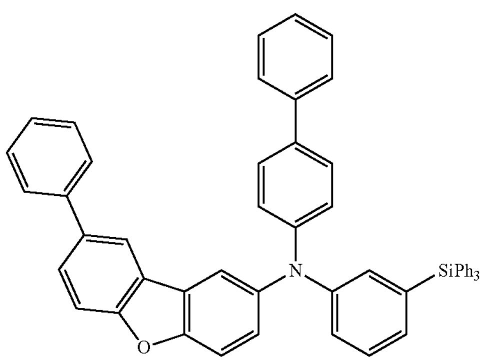
A112
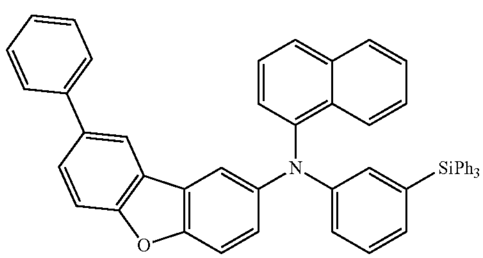
A113
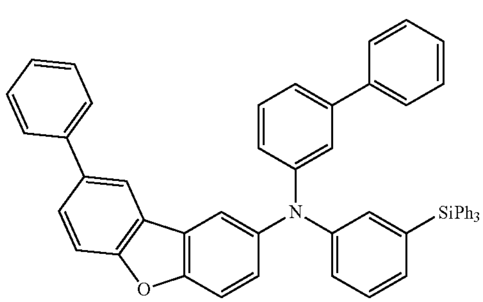
-continued
A114
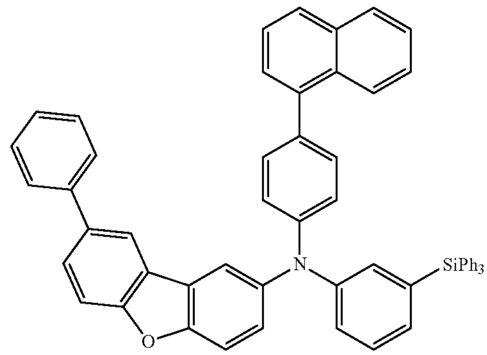
A115
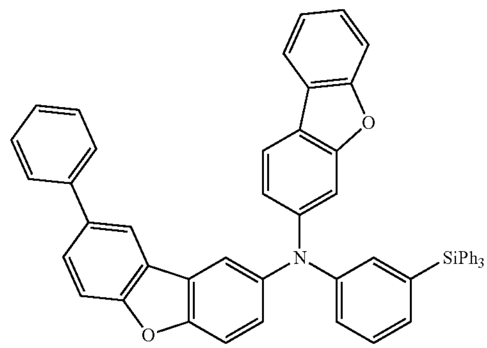
A116
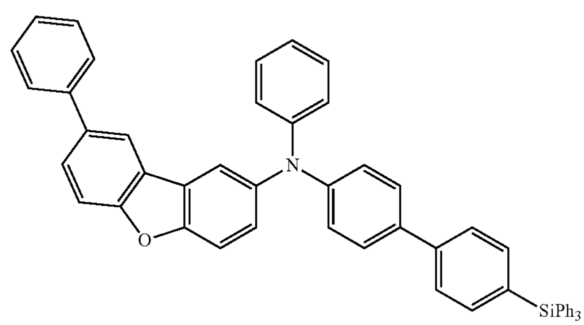
A117
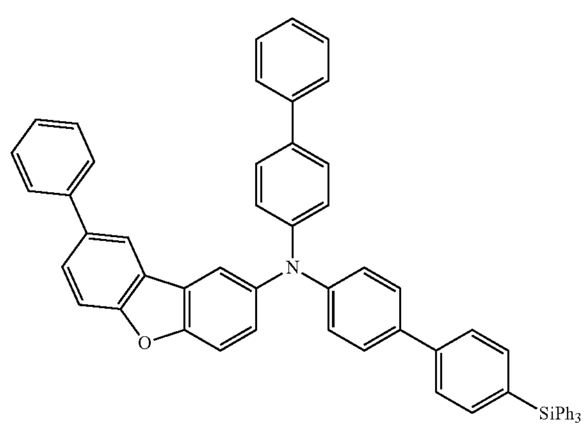

-continued
A118
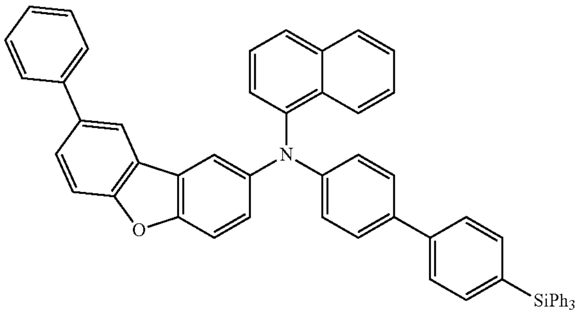
A119
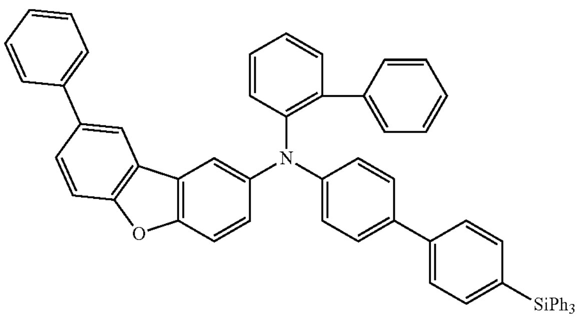
A120
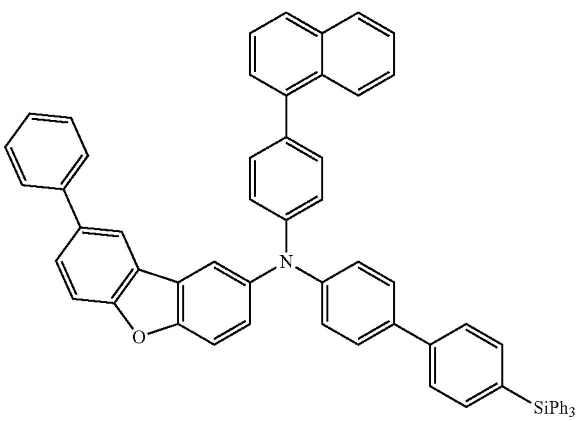
A121
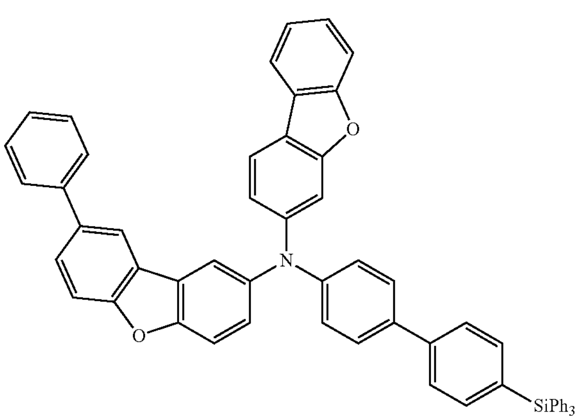
-continued
A122
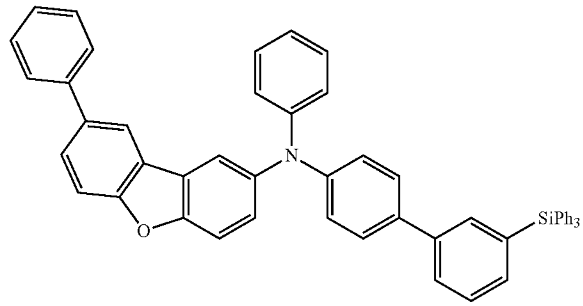
A123
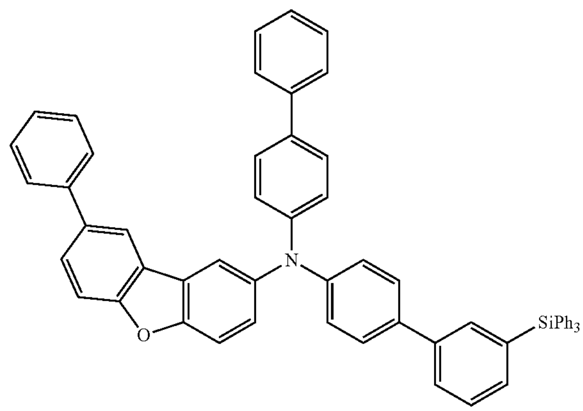
A124
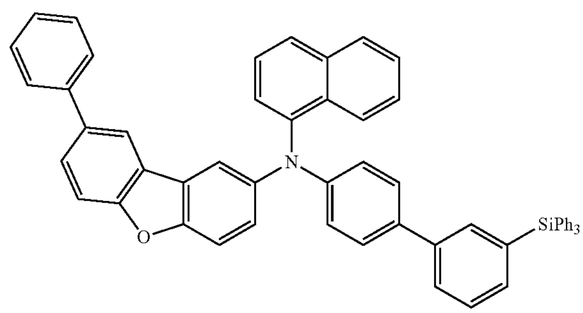
A125
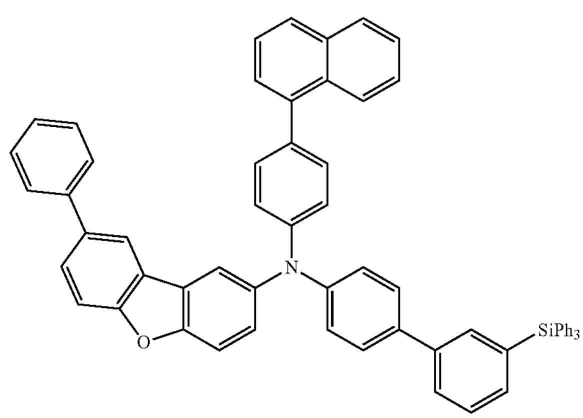

-continued
A126
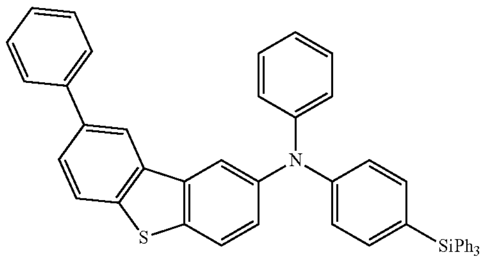
A127
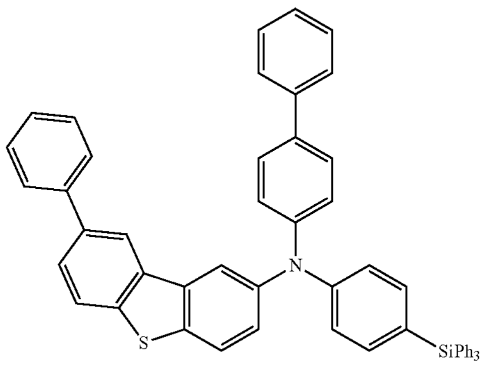
A128
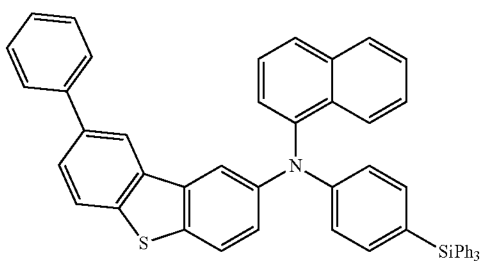
A129
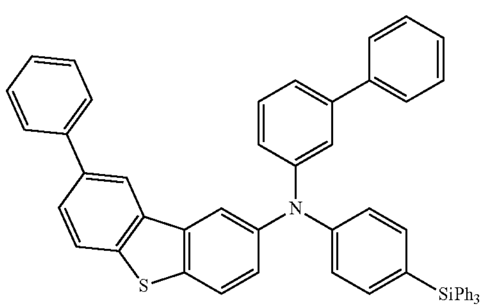
A130
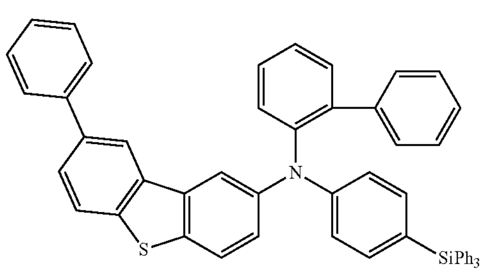
-continued
A131
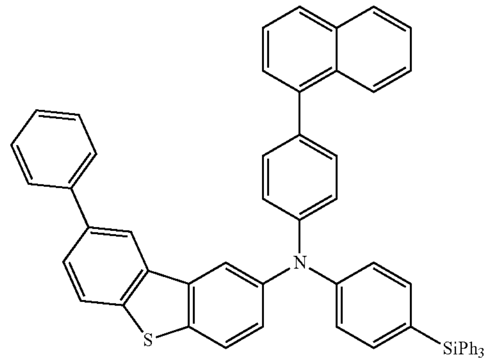
A132
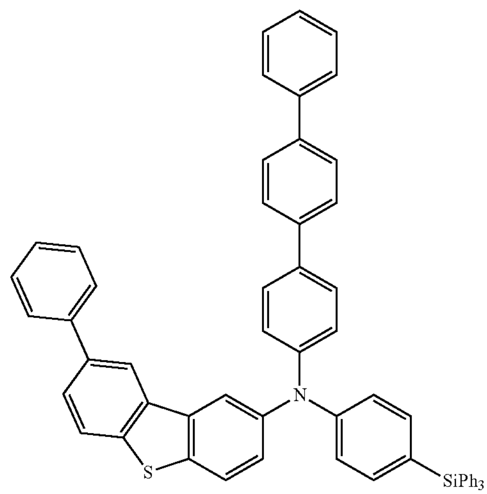
A133
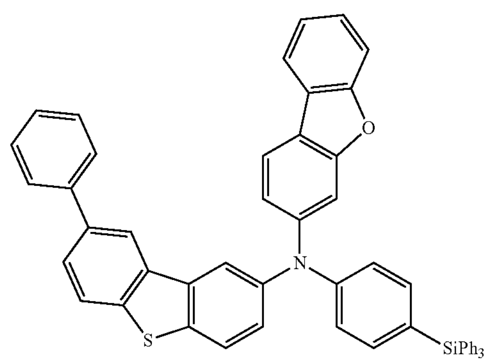
A134
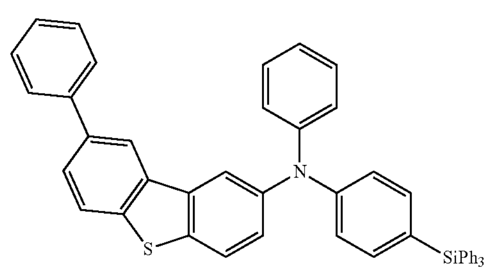

-continued
A135
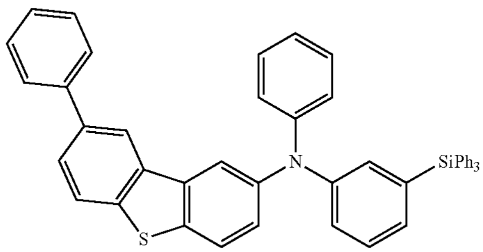
A136
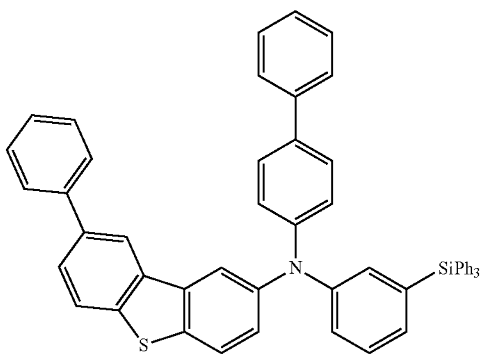
A137
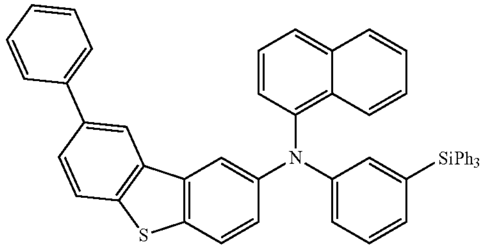
A138
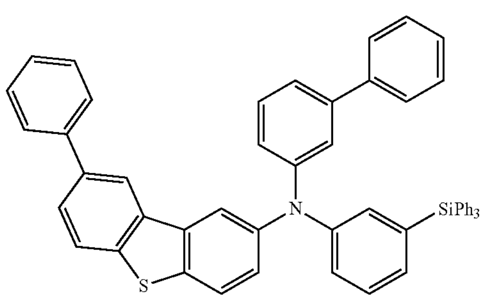
A139
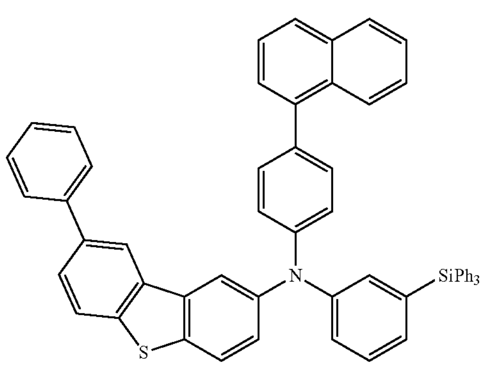
-continued
A140
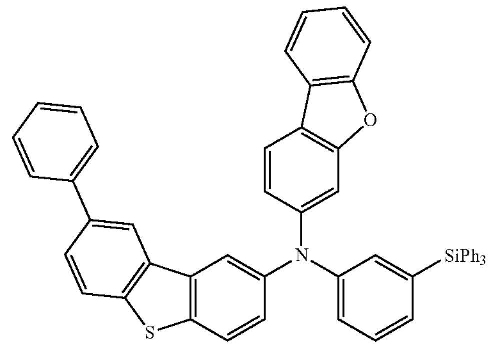
A141
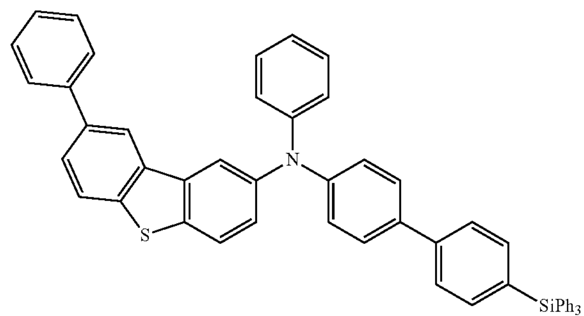
A142
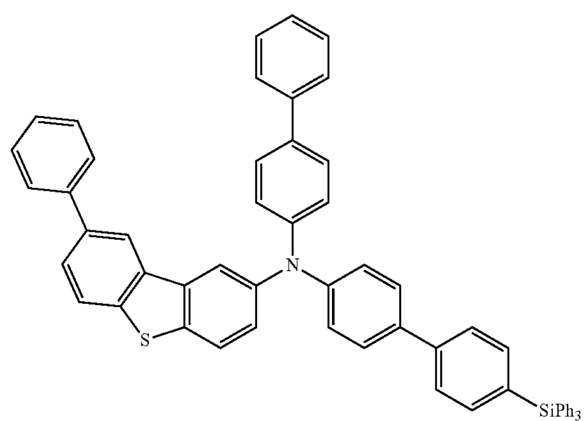
A143
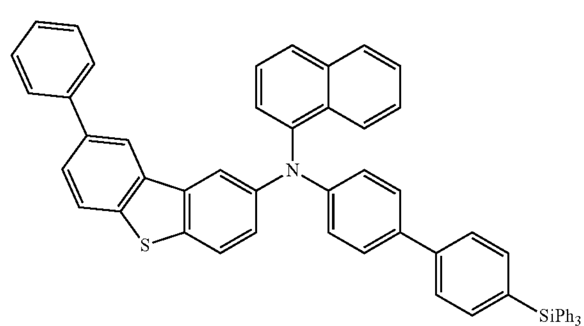

-continued
A144
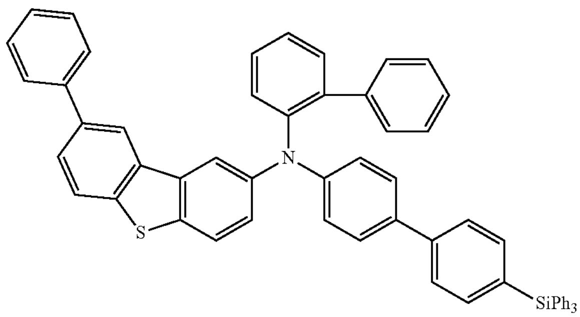
A145
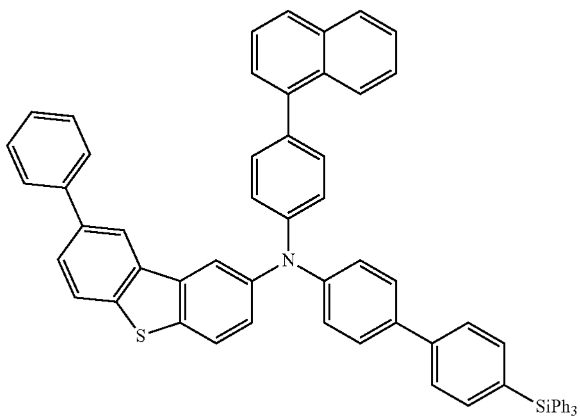
A146
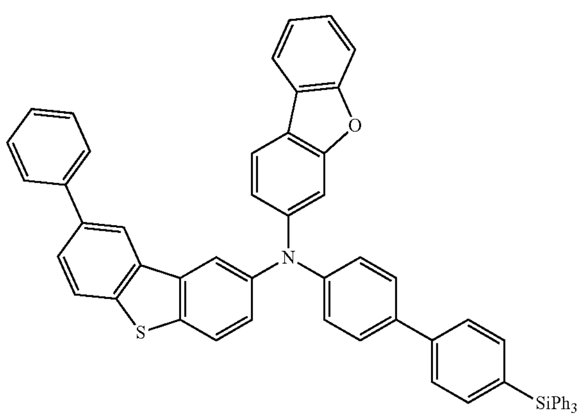
A147
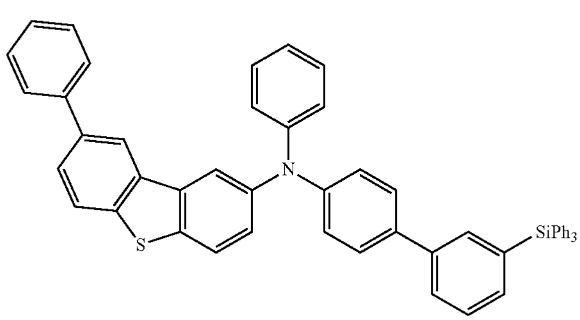
-continued
A148
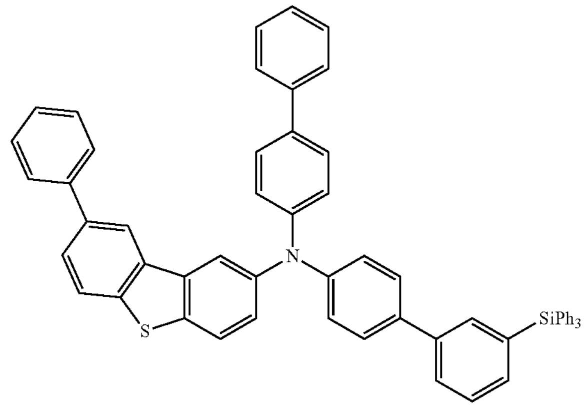
A149
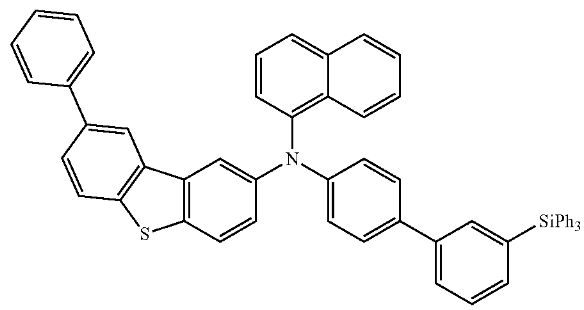
A150
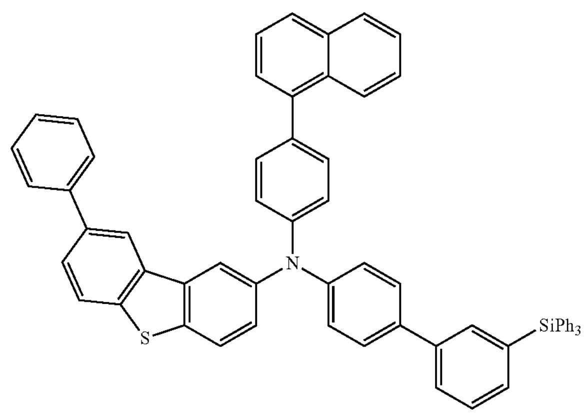
A151
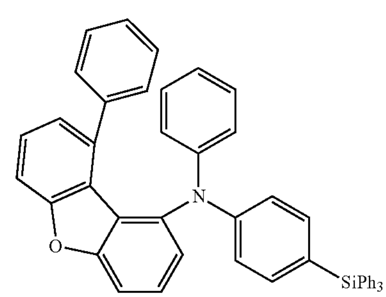

-continued
A152
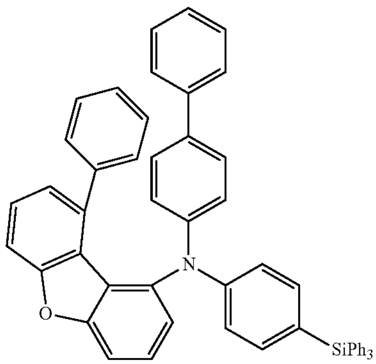
A153
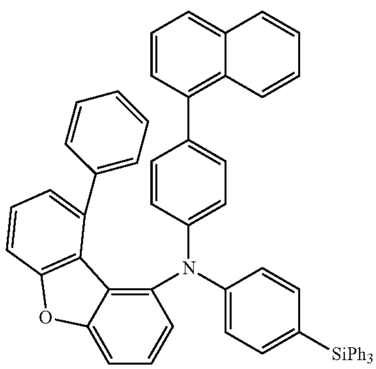
A154
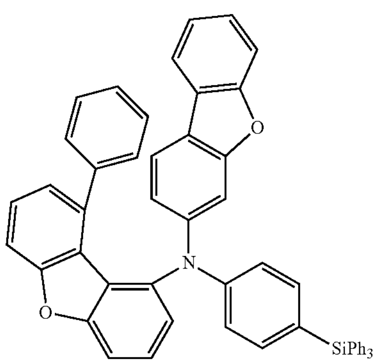
A155
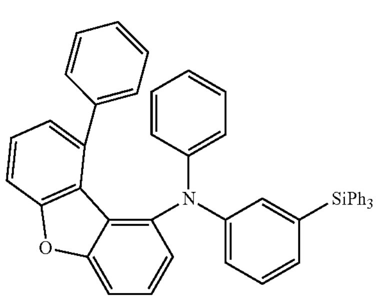
-continued
A156
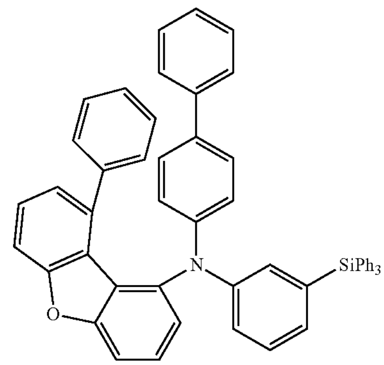
A157
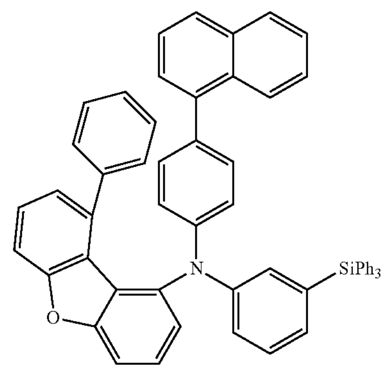
A158
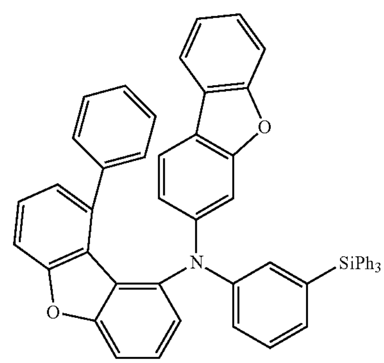
A159
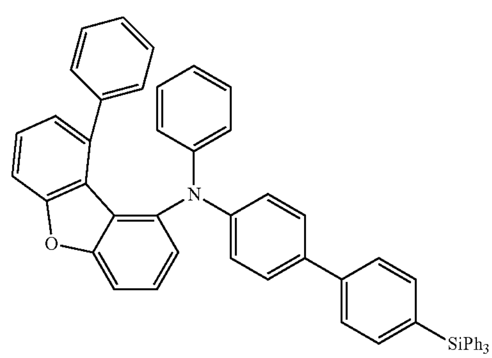

-continued
A160
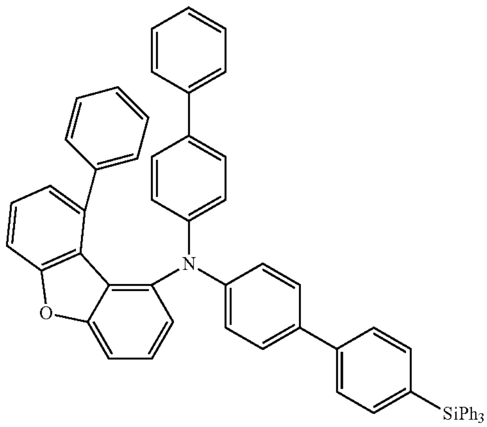
A161
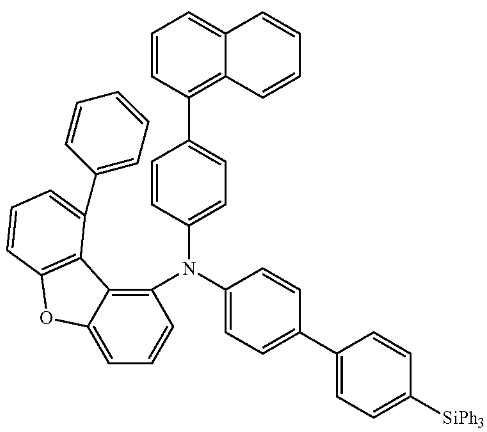
A162
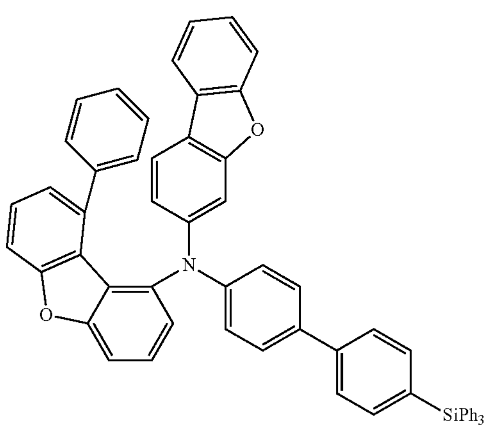
A163
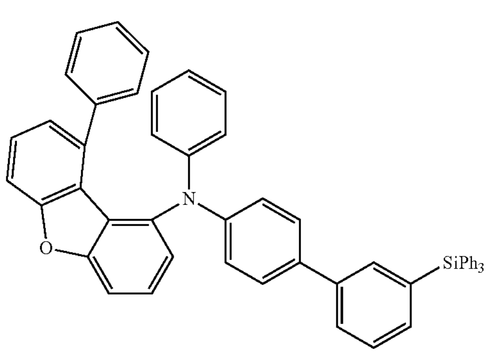
-continued
A164
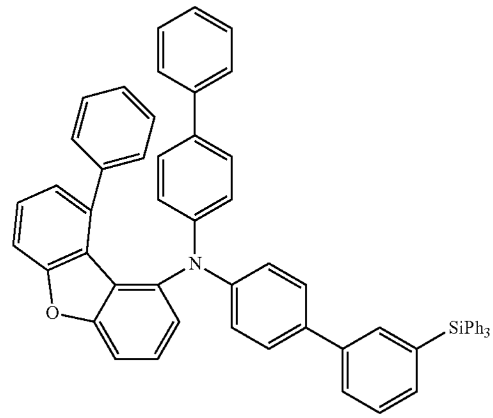
A165
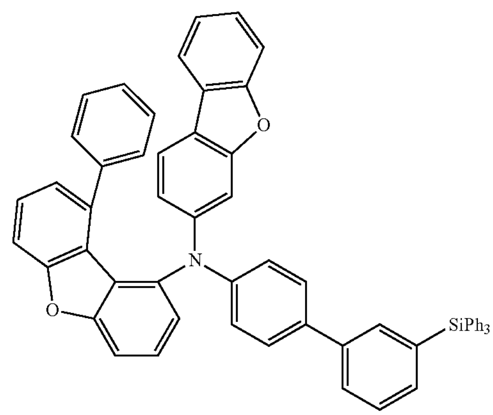
A166
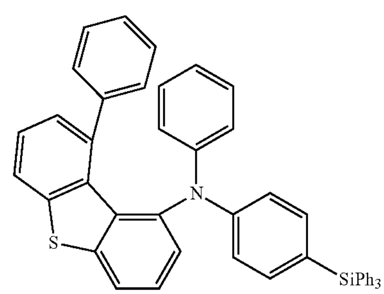
A167
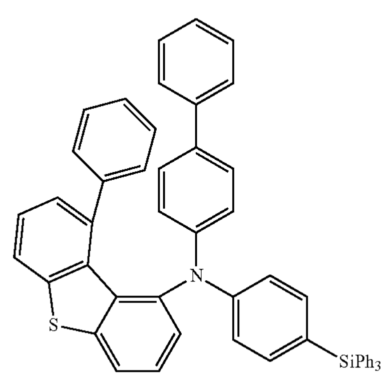

-continued
A168
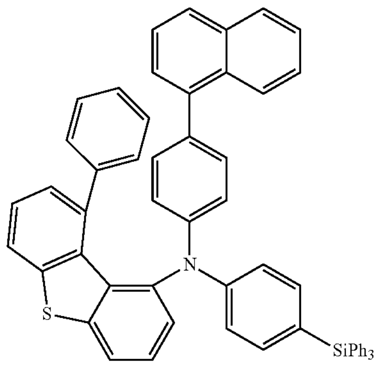
A169
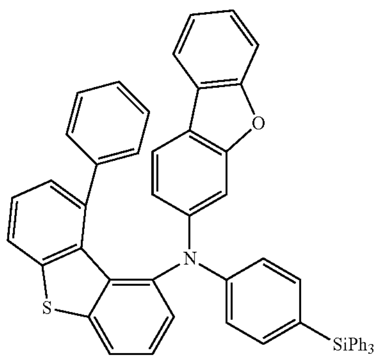
A170
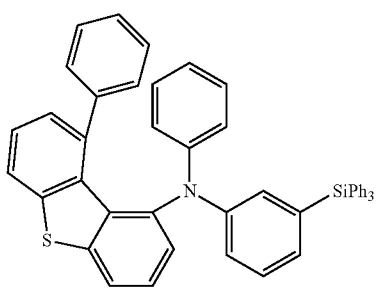
A171
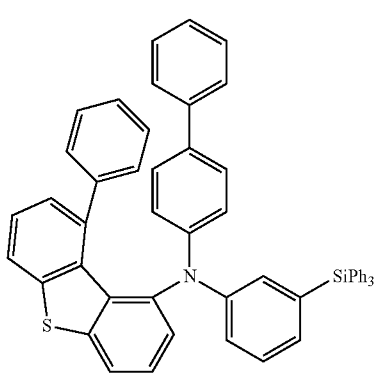
-continued
A172
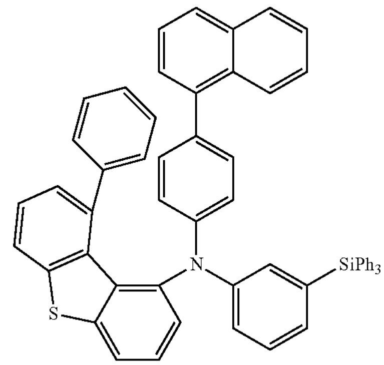
A173
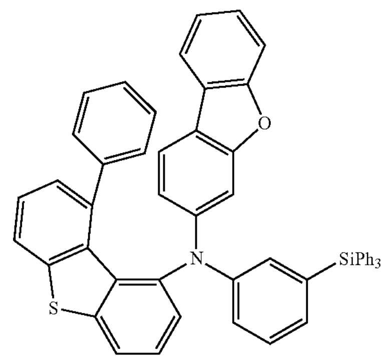
A174
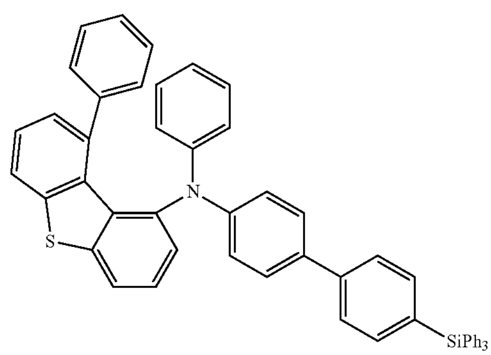
A175
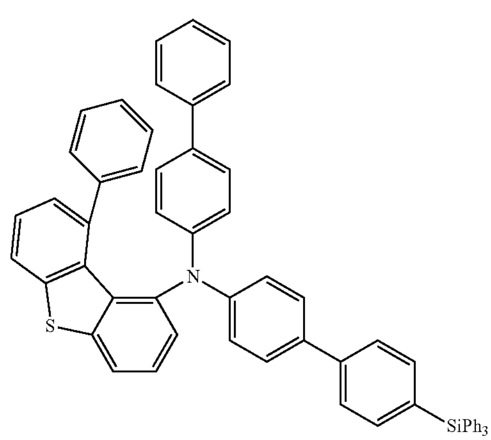

-continued
A176
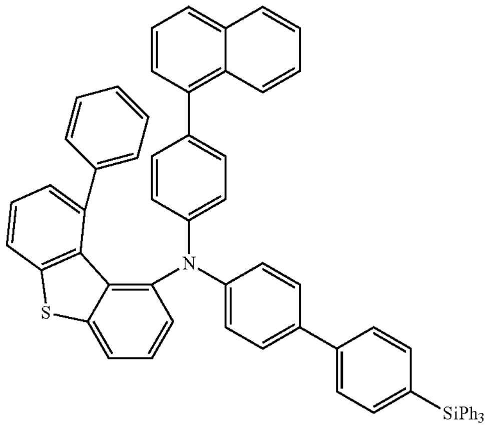
A177
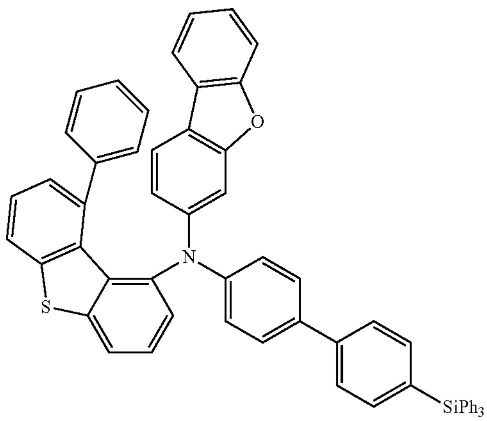
A178
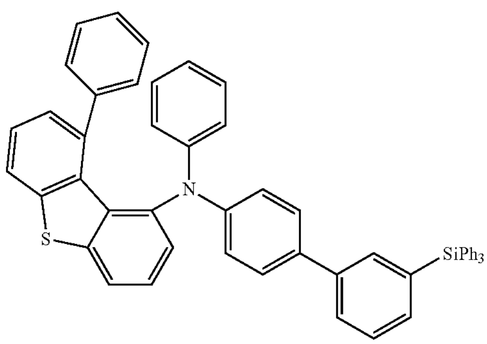
A179
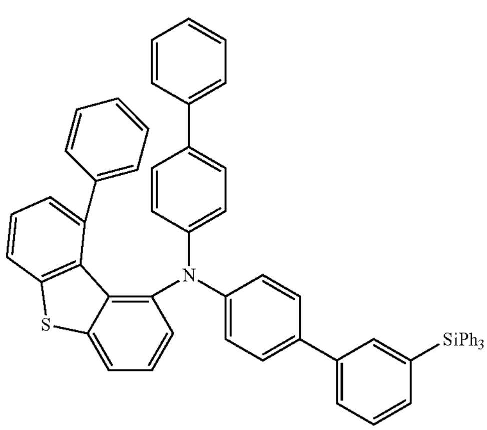
-continued
A180
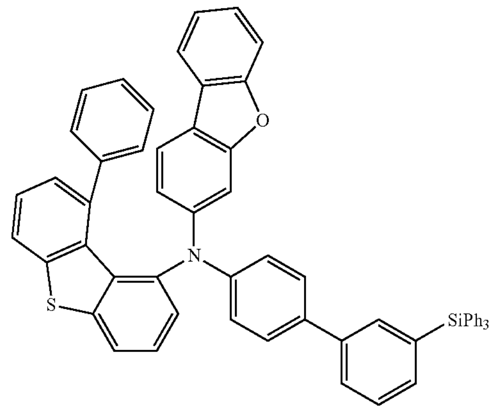
A181
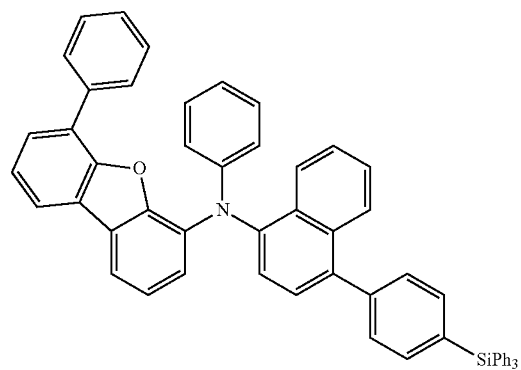
A182
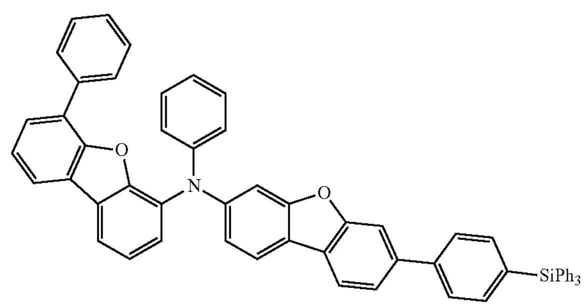
A183
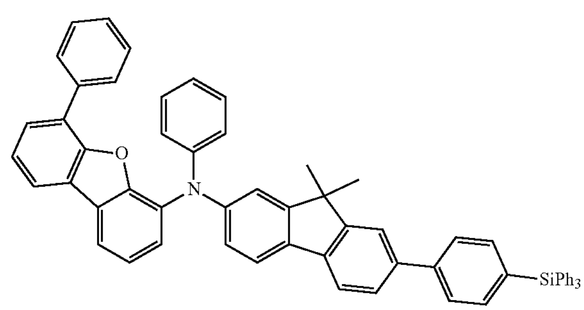

-continued
A184
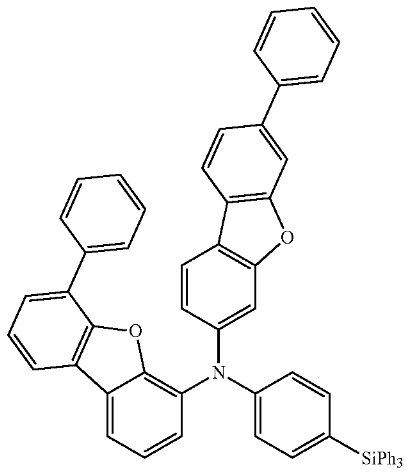
A185
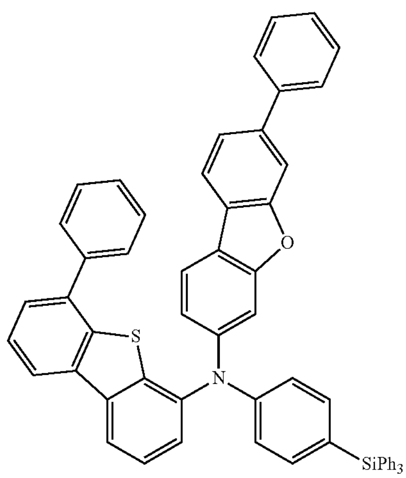
A186
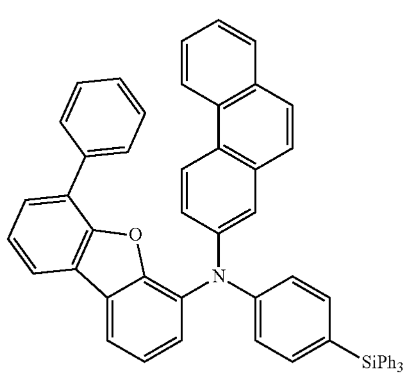
-continued
A187
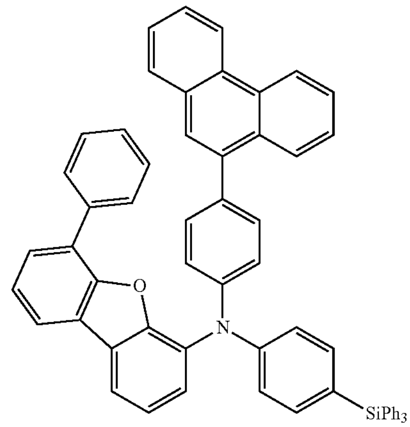
A188
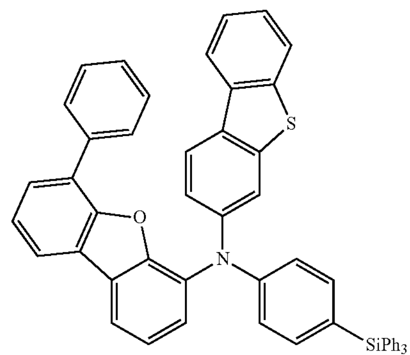
A189
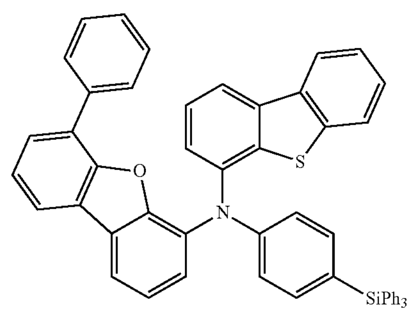
A190
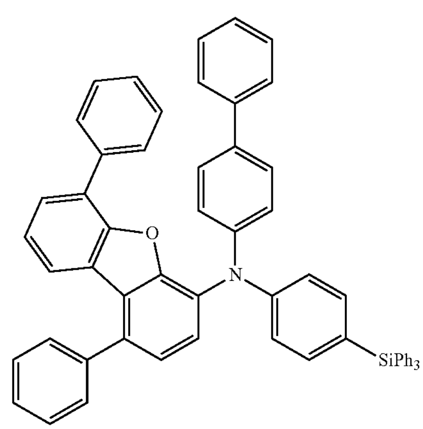

-continued
A191
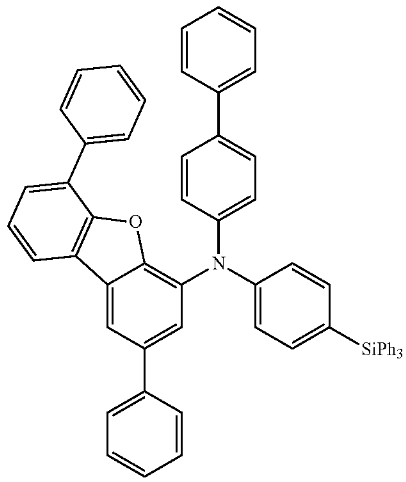
A192
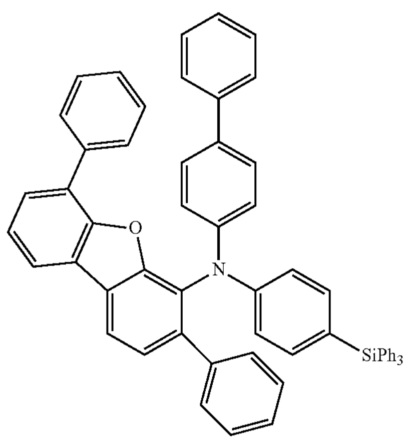
A193
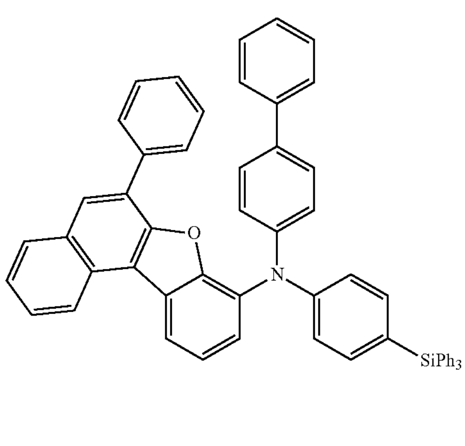
-continued
A194
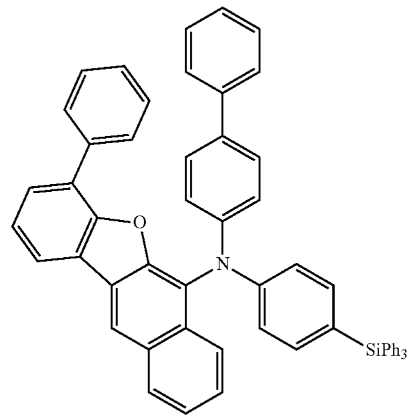
A195
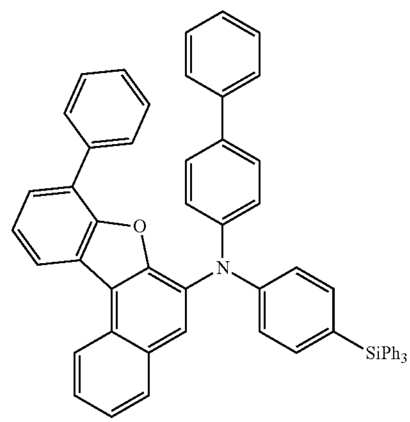
A196
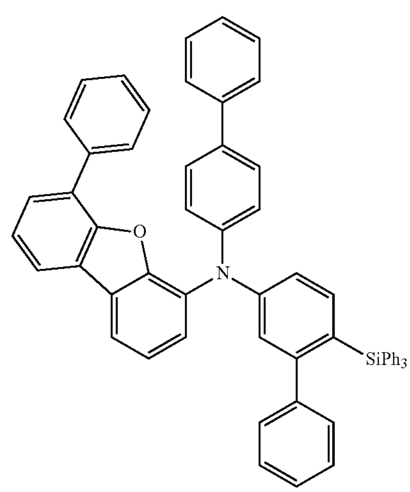

-continued
A197
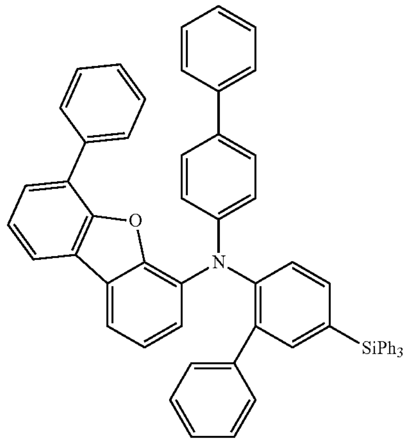
A198
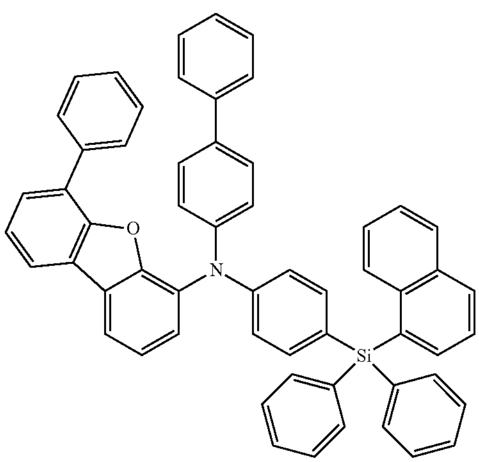
A199
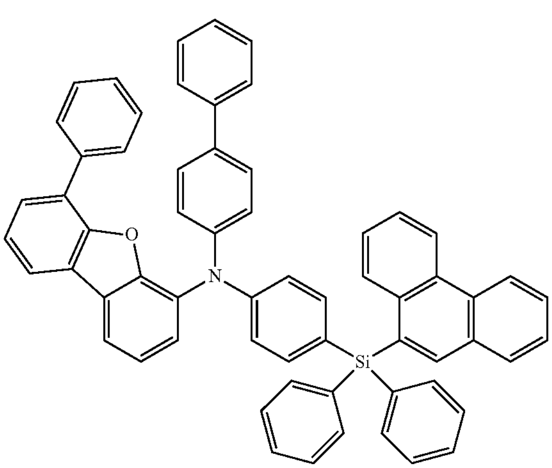
-continued
A200
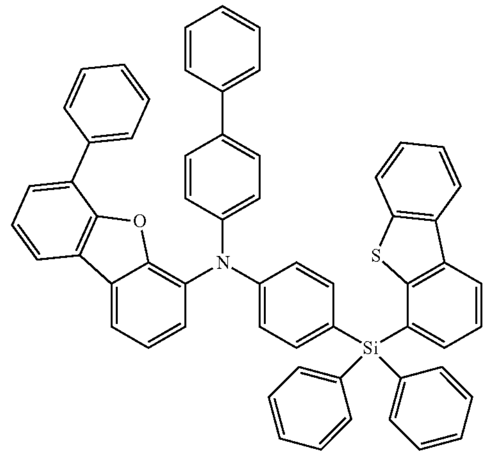
A201
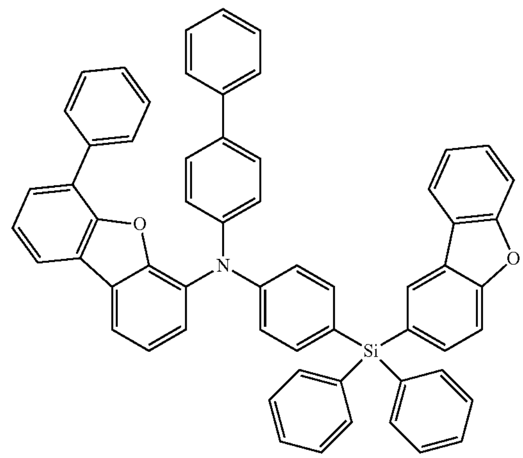
A202
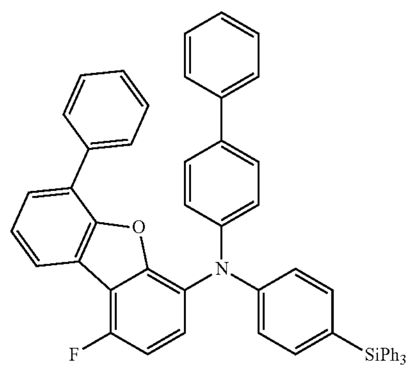
A203
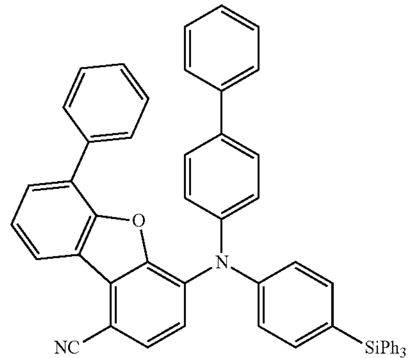

-continued
A204
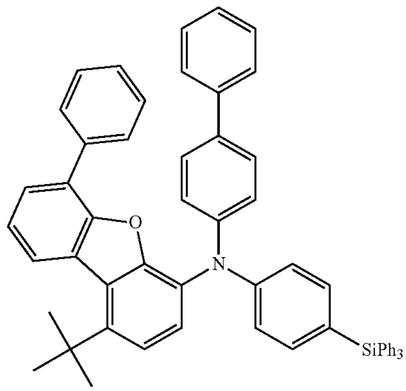
A205
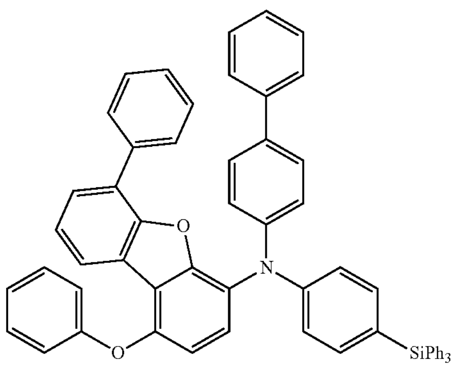
A206
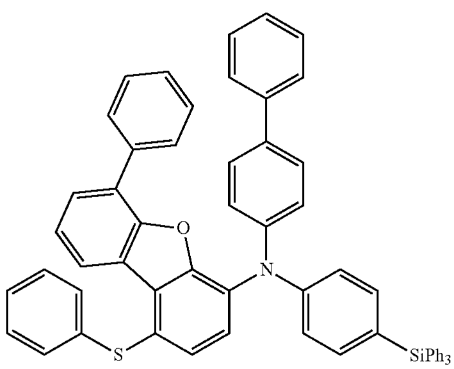
A207
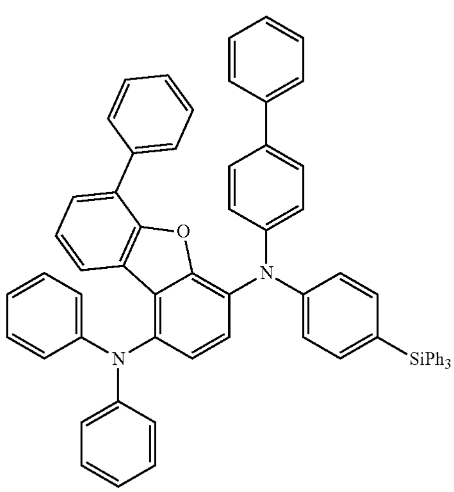
-continued
A208
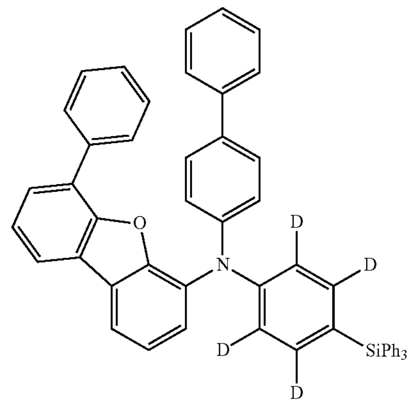
A209
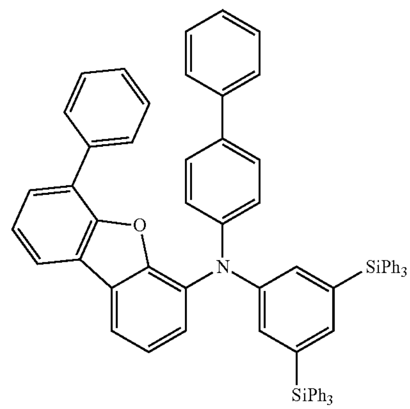
In an embodiment, Formula 1 may be any one selected from compounds represented in the following Compound Group 2.
[Compound Group 2]
B1
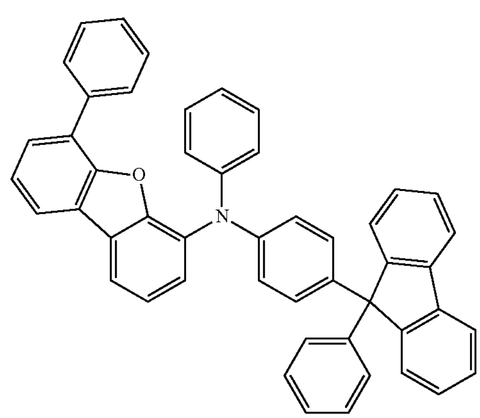

-continued
B2
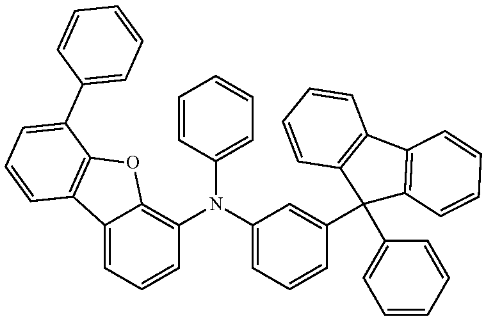
B3
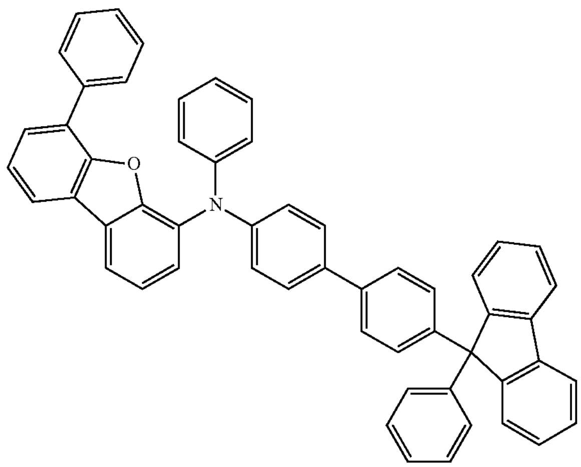
B4
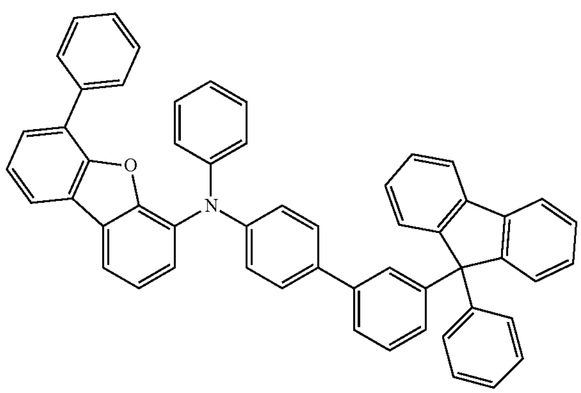
B5
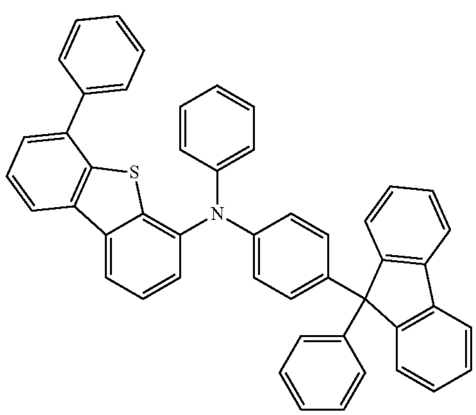
-continued
B6
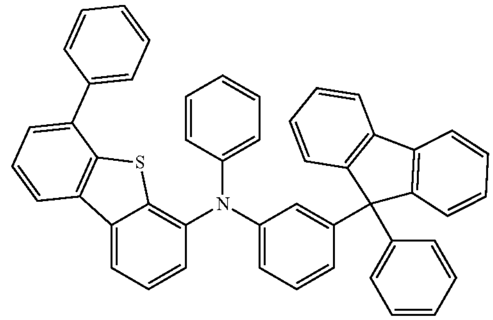
B7
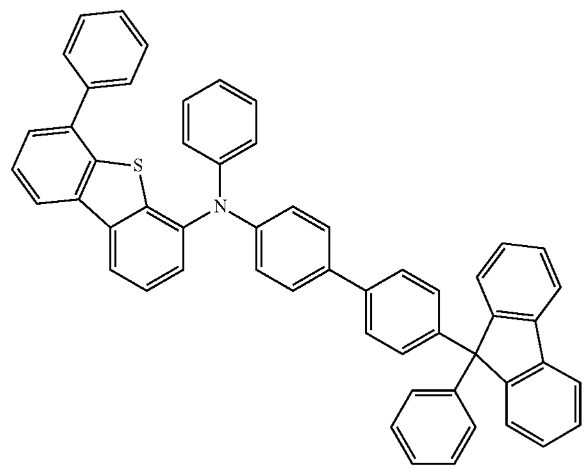
B8
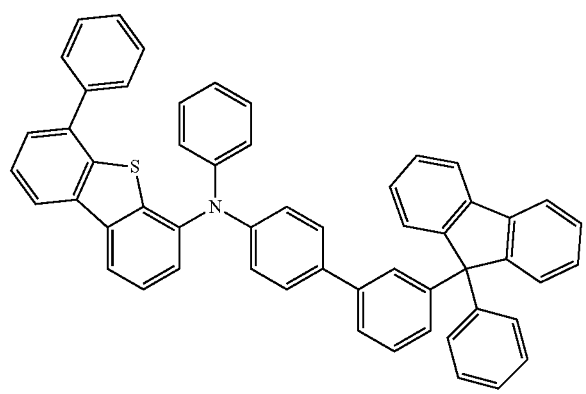
B9
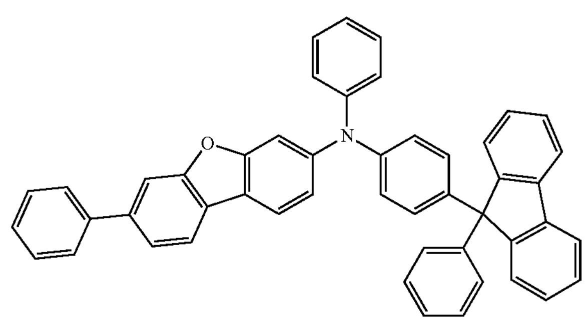

-continued
B10
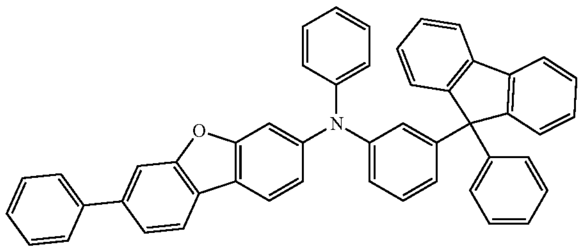
B11
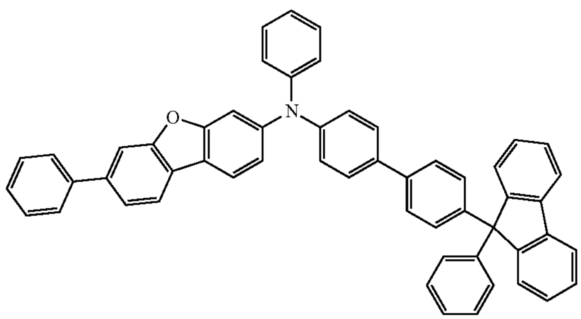
B12
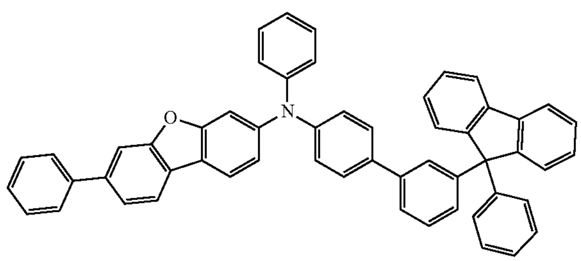
B13
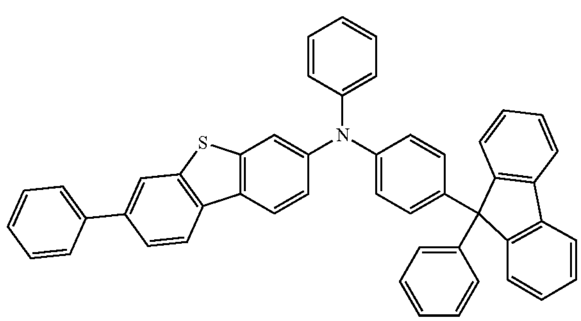
B14
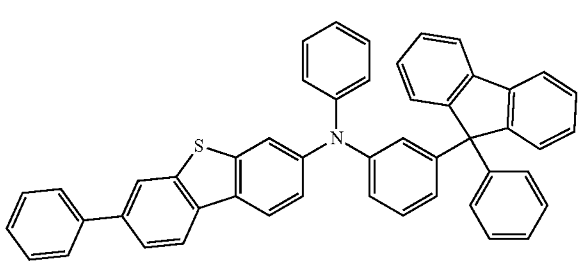
-continued
B15
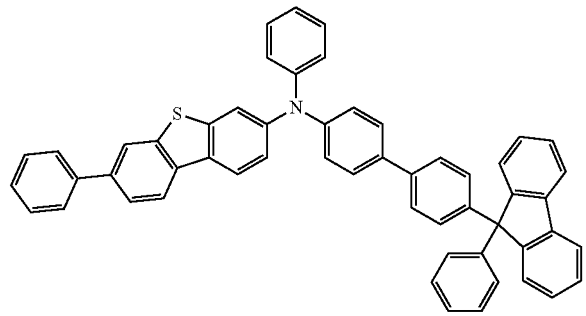
B16
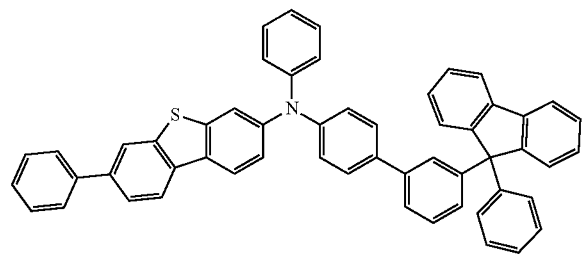
B17
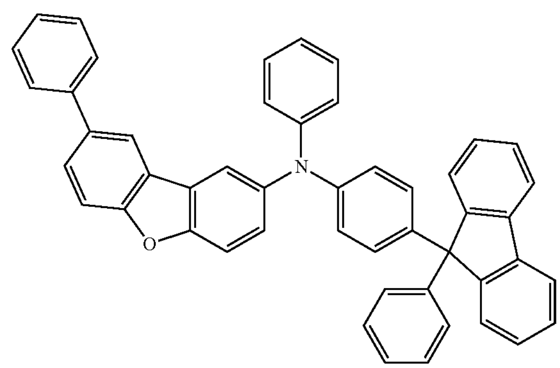
B18
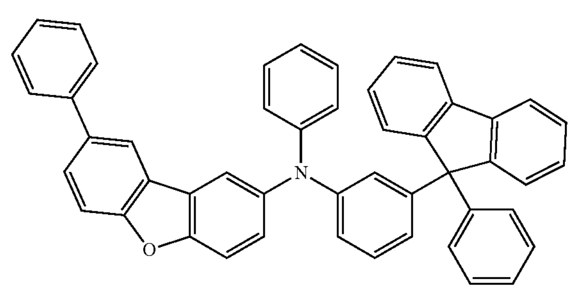

B19
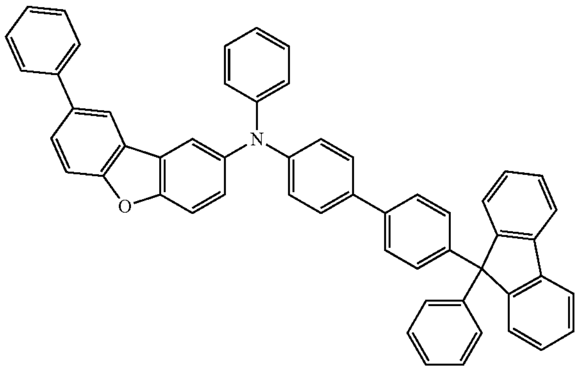
B20
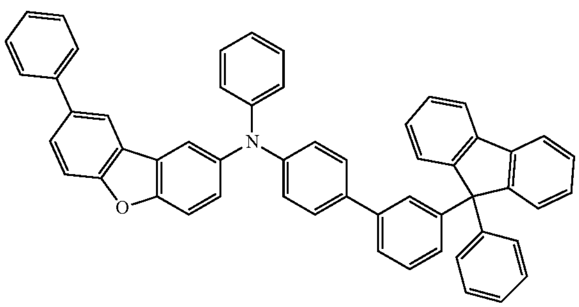
B21
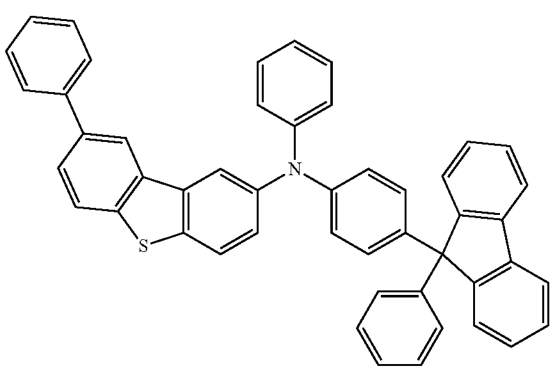
B22
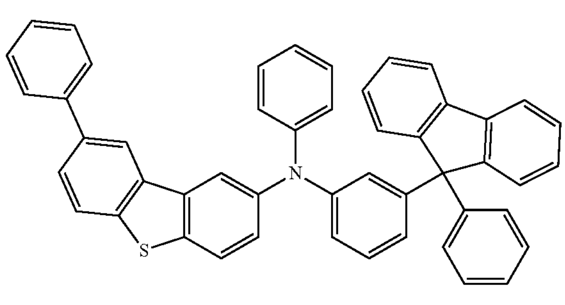
B23
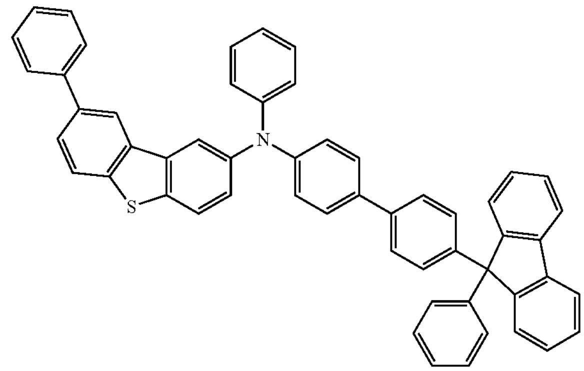
B24
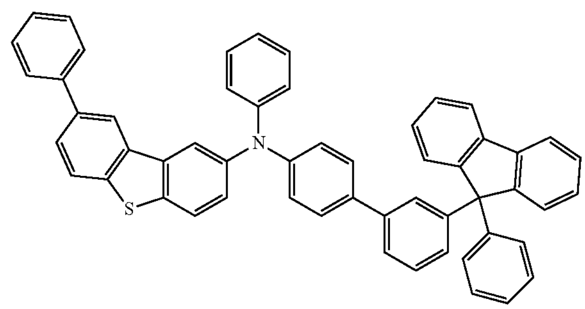
B25
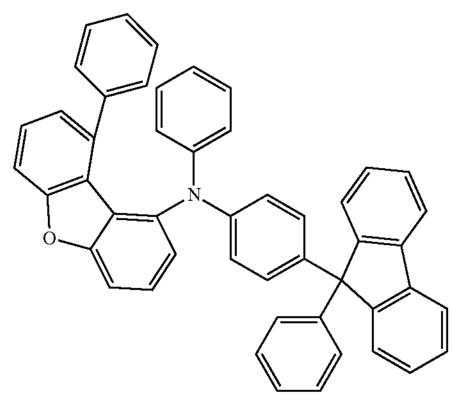
B26
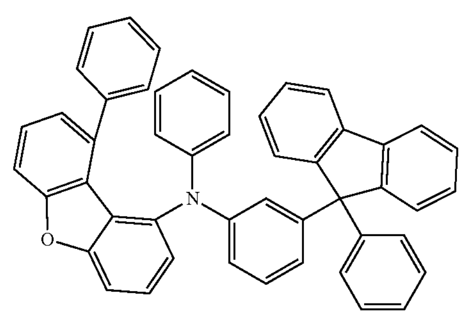

-continued
B27
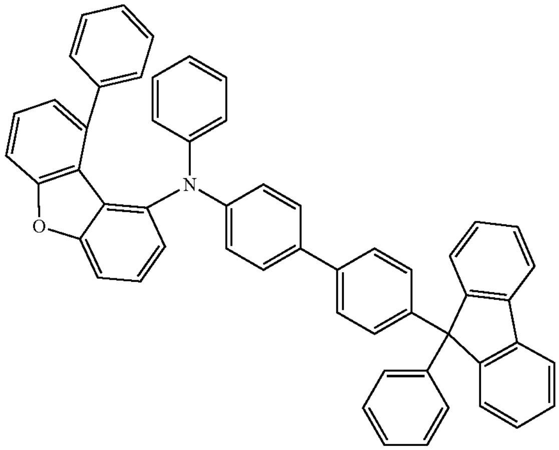
B28
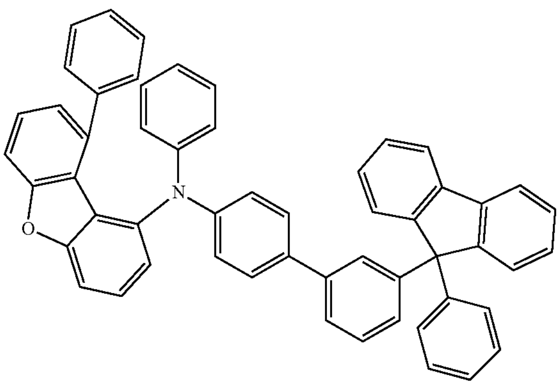
B29
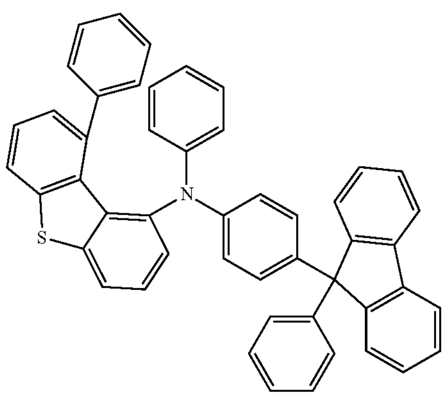
B30
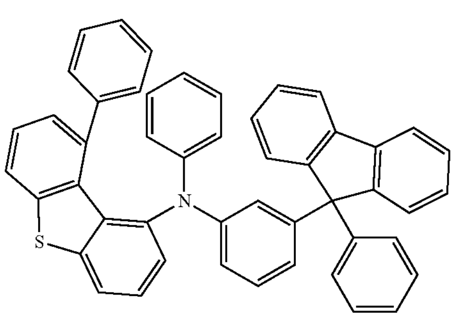
-continued
B31
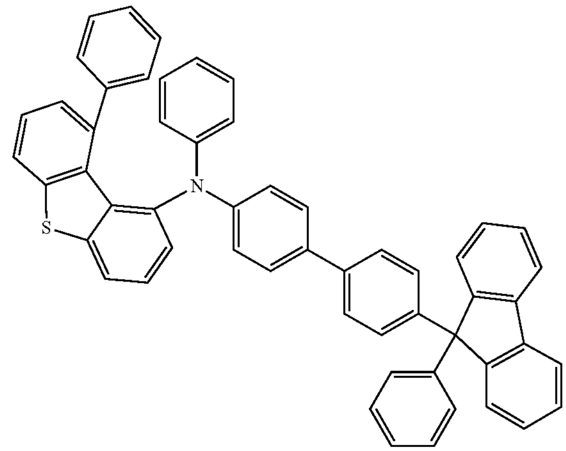
B32
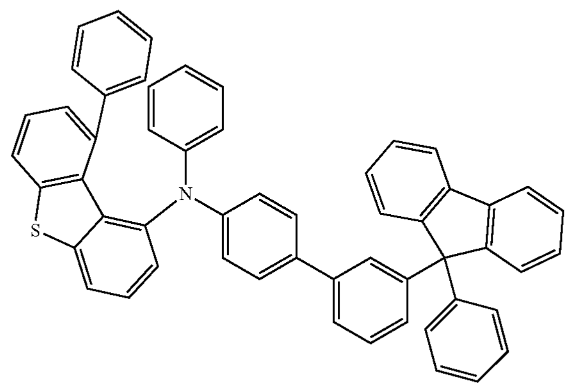
B33
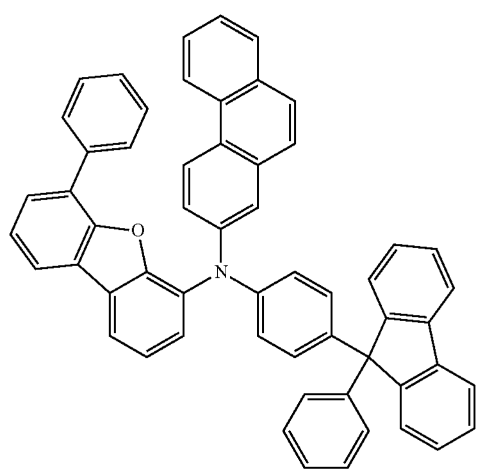

-continued
B34
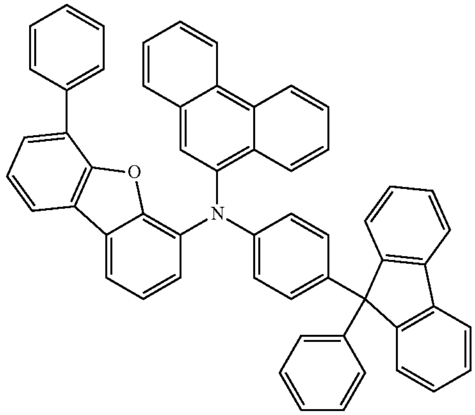
B35
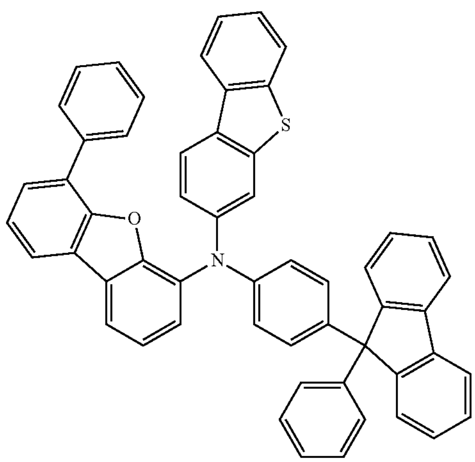
B36
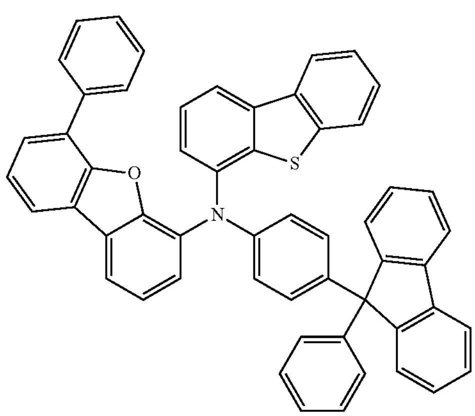
-continued
B37
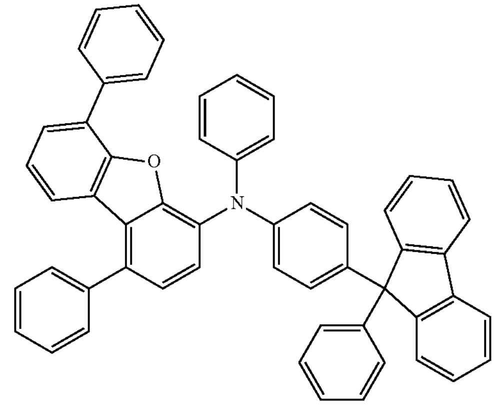
B38
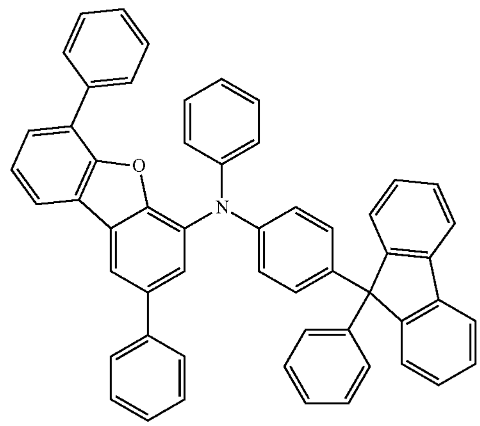
B39
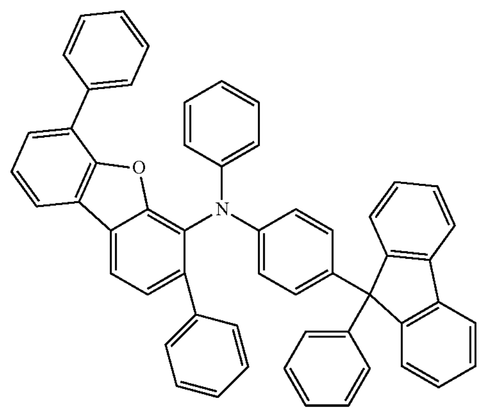
B40
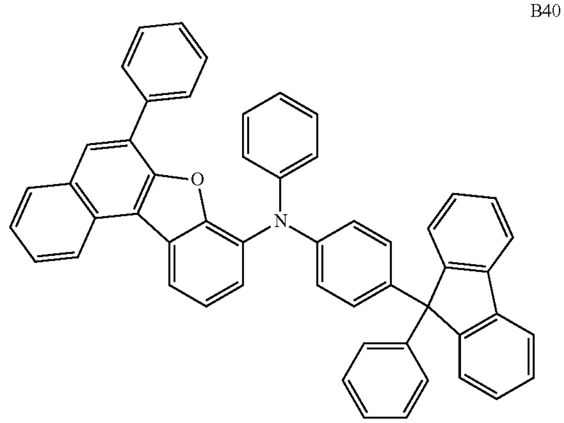

B41
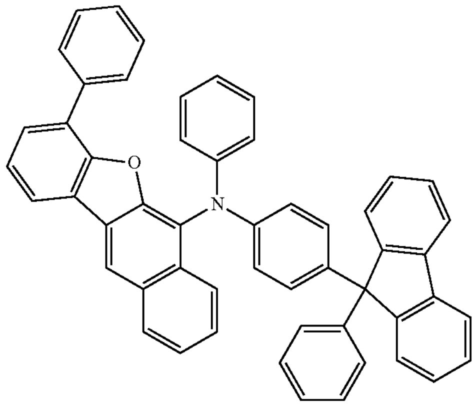
B42
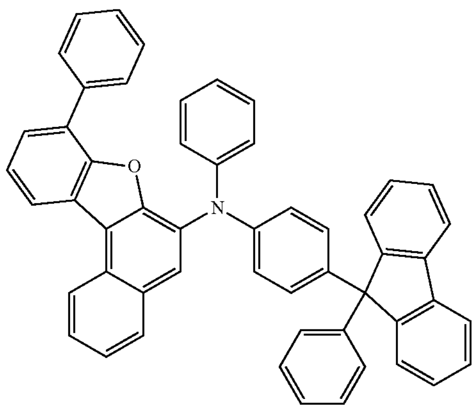
B43
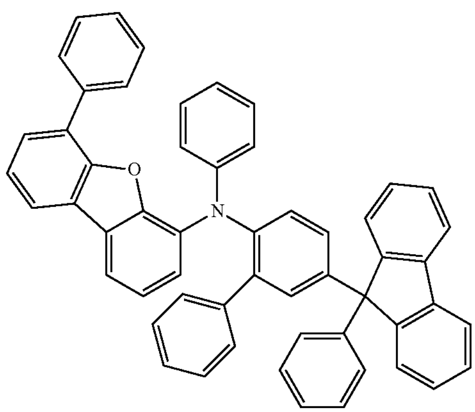
B44
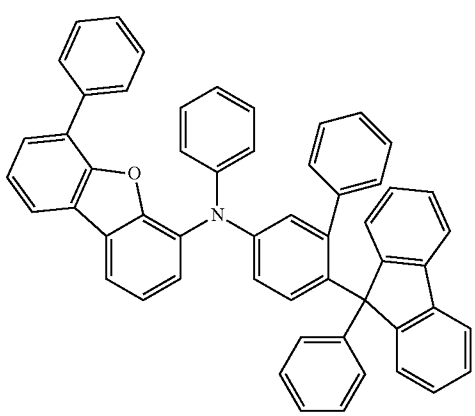
B45
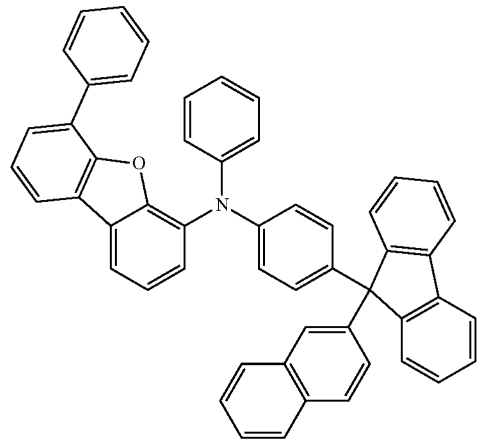
B46
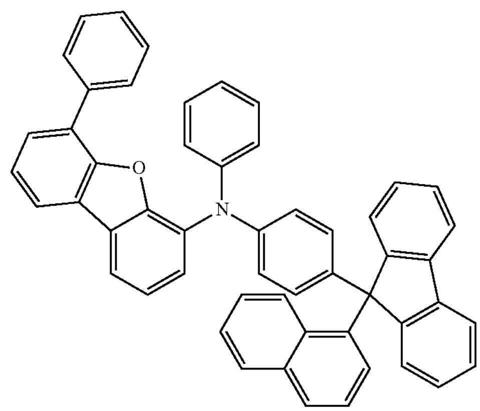
B47
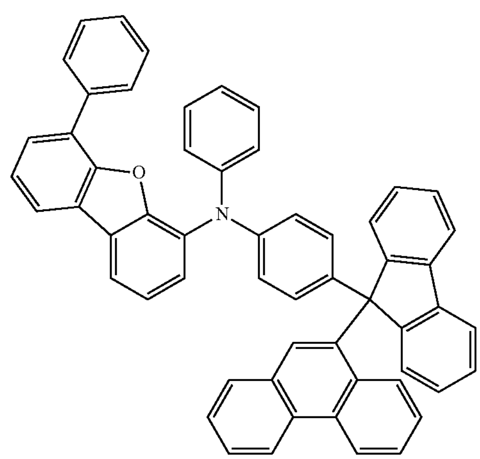

-continued
B48
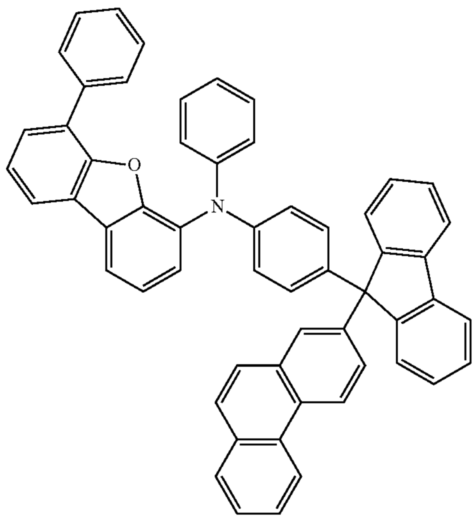
B49
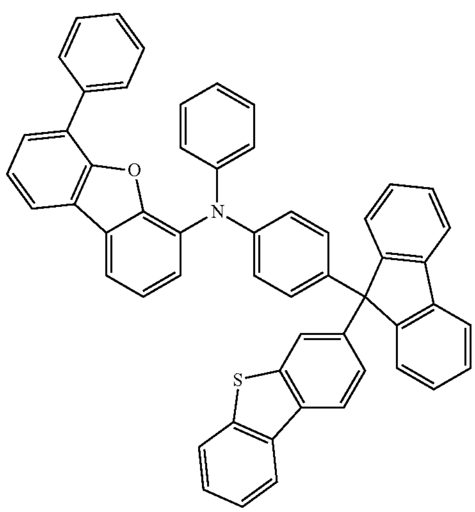
B50
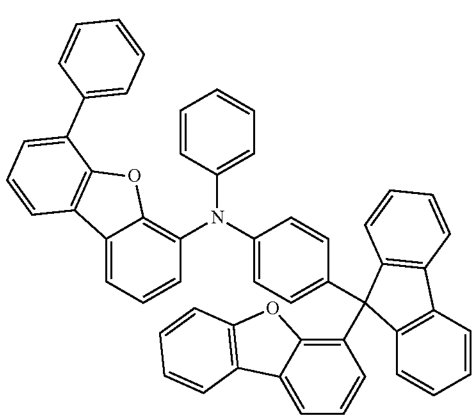
-continued
B51
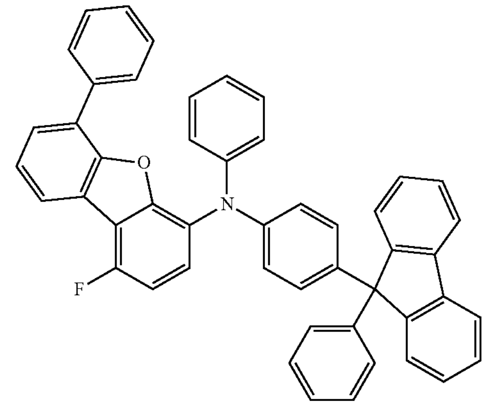
B52
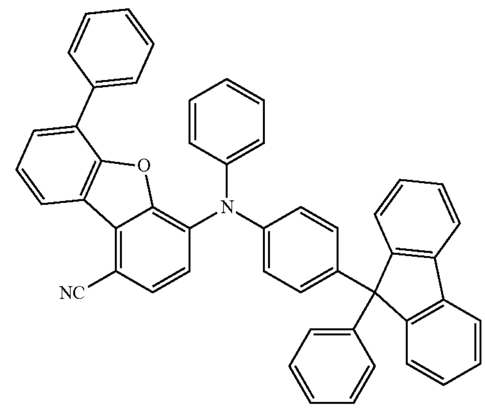
B53
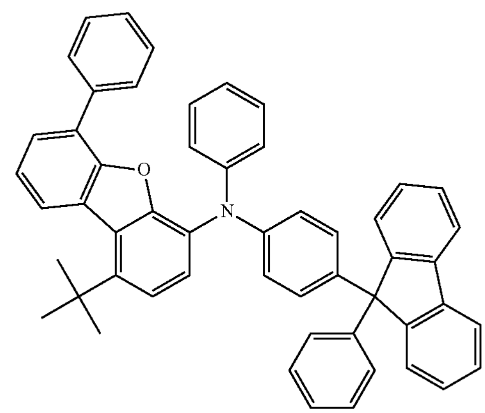
B54
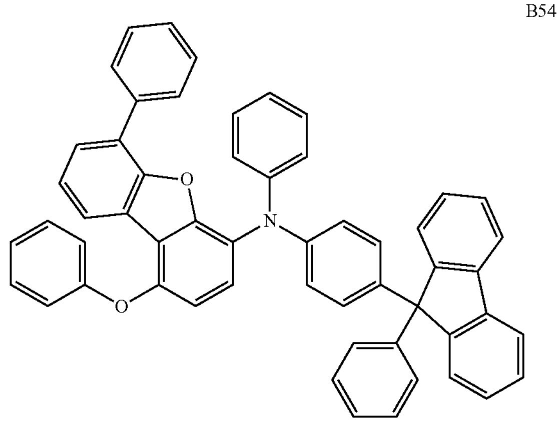

-continued
B55
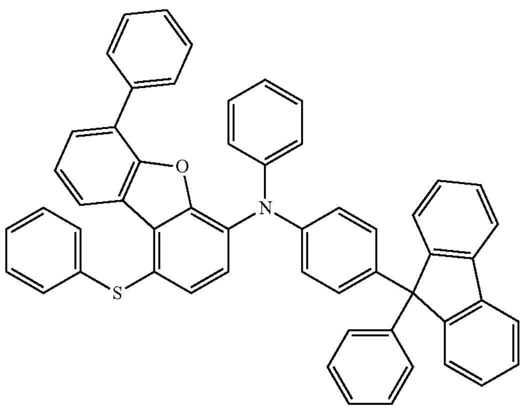
B56
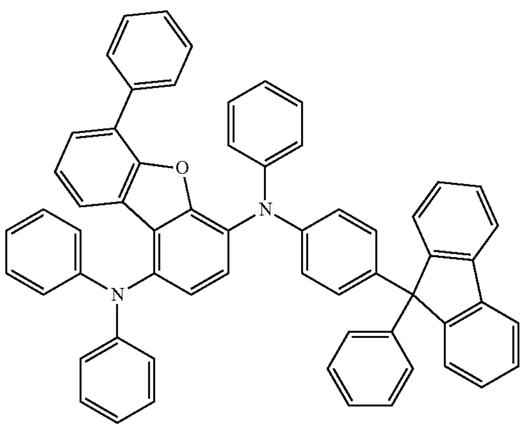
B57
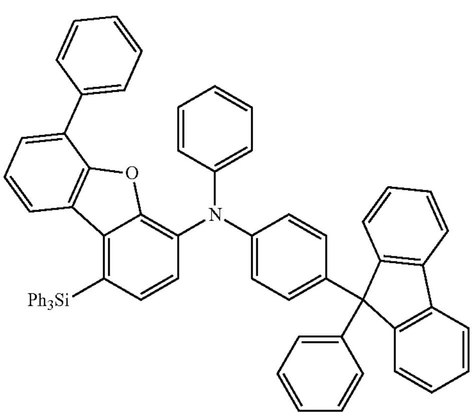
-continued
B58
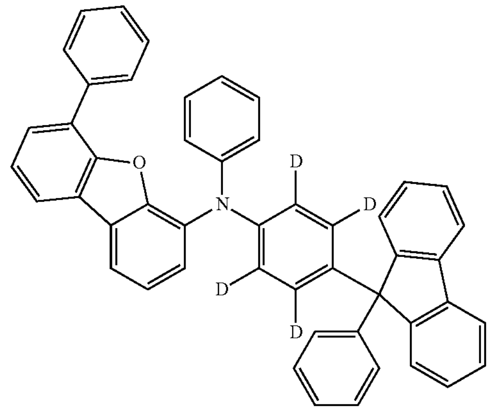
B59
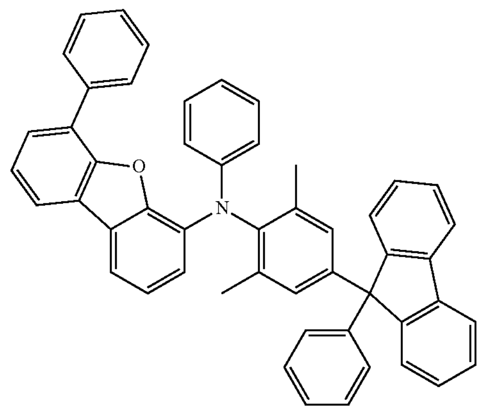
B60
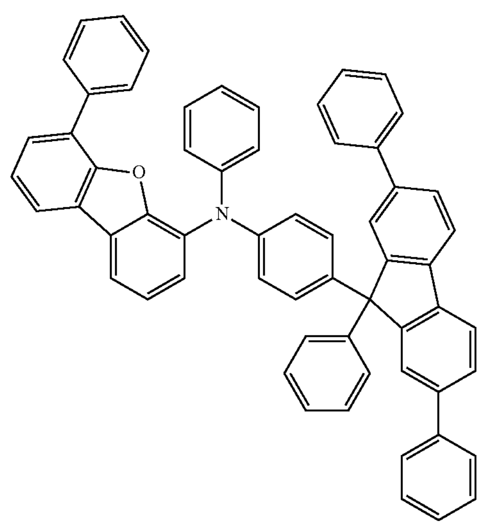

-continued

B61

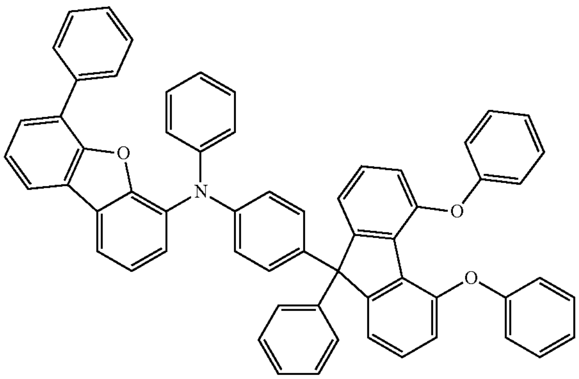

B62

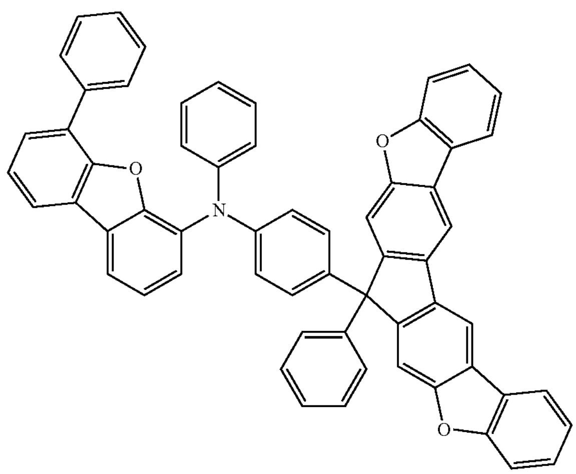

In an embodiment of the inventive concept, an organic electroluminescence device includes a first electrode, a hole transport region disposed on the first electrode, an emission layer disposed on the hole transport region, an electron transport region disposed on the emission layer, and a second electrode disposed on the electron transport region, wherein the hole transport region includes an amine compound represented by the following Formula 1.

[Formula 1]

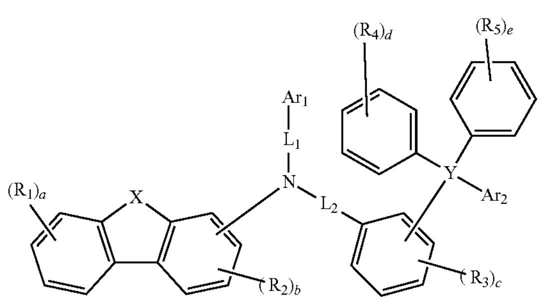

In Formula 1, X may be O or S, and Y may be C or Si.

In Formula 1, $Ar_1$ and $Ar_2$ may be each independently a substituted or unsubstituted alkyl group having 1 to 50 carbon atoms, a substituted or unsubstituted aryl group having 6 to 50 carbon atoms for forming a ring, or a substituted or unsubstituted heteroaryl group having 2 to 50 carbon atoms for forming a ring, which includes 0 or S as a heteroatom.

In Formula 1, $L_1$ and $L_2$ may be each independently a direct linkage, a substituted or unsubstituted arylene group having 6 to 30 carbon atoms for forming a ring, or a substituted or unsubstituted heteroarylene group having 2 to 30 carbon atoms for forming a ring.

In Formula 1, $R_1$ may be a substituted or unsubstituted aryl group having 6 to 50 carbon atoms for forming a ring.

In Formula 1, $R_2$ to $R_5$ may be each independently a hydrogen atom, a deuterium atom, a halogen atom, a cyano group, a substituted or unsubstituted silyl group, a substituted or unsubstituted alkyl group having 1 to 10 carbon atoms, a substituted or unsubstituted alkoxy group having 1 to 10 carbon atoms, a substituted or unsubstituted arylthio group having 1 to 10 carbon atoms, a substituted or unsubstituted alkylamino group having 1 to 10 carbon atoms, a substituted or unsubstituted arylamino group having 1 to 20 carbon atoms, a substituted or unsubstituted aryl group having 6 to 50 carbon atoms for forming a ring, or a substituted or unsubstituted heteroaryl group having 2 to 50 carbon atoms for forming a ring, or combined with an adjacent group to form a ring.

In Formula 1, "a" may be an integer of 1 to 4, "b" may be an integer of 0 to 3, "c" may be 0 or 1, and "d" and "e" may be each independently an integer of 0 to 5.

In an embodiment, the hole transport region may include a hole injection layer, and a hole transport layer disposed between the hole injection layer and the emission layer, wherein the hole transport layer includes the amine compound represented by Formula 1.

In an embodiment, the emission layer may emit blue light.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
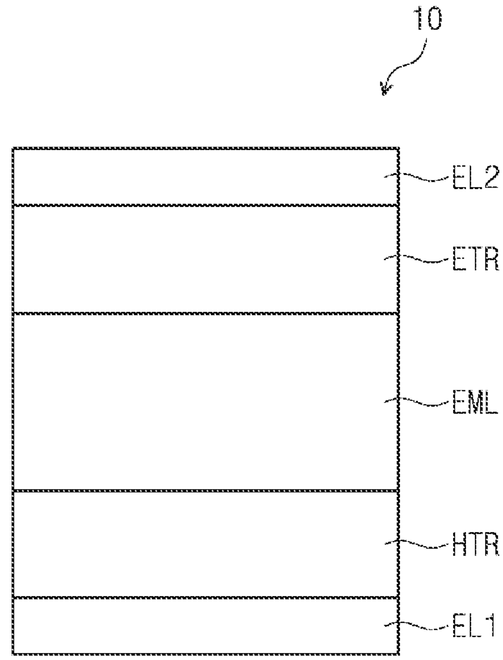
FIG. 1 is a cross-sectional view schematically illustrating an organic electroluminescence device according to an embodiment of the inventive concept.

The inventive concept may have various modifications and may be embodied in different forms, and example embodiments will be explained in detail with reference to the accompany drawings. The inventive concept may, however, be embodied in different forms and should not be construed as limited to the embodiments set forth herein. Rather, all modifications, equivalents, and substituents which are included in the spirit and technical scope of the inventive concept should be included in the inventive concept.

Like reference numerals refer to like elements throughout. In the drawings, the dimensions of structures are exaggerated for clarity of illustration. It will be understood that, although the terms first, second, etc. may be used herein to describe various elements, these elements should not be limited by these terms. These terms are only used to distinguish one element from another element. Thus, a first element could be termed a second element without departing from the teachings of the present invention. Similarly, a second element could be termed a first element. As used herein, the singular forms are intended to include the plural forms as well, unless the context clearly indicates otherwise.

It will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof. It will also be understood that when a layer, a film, a region, a plate, etc. is referred to as being 'on' another part, it can be directly on the other part, or intervening layers may also be present.

In the description, —* means a connecting position.

In the description, the term "substituted or unsubstituted" corresponds to substituted or unsubstituted with at least one substituent selected from the group consisting of a deuterium atom, a halogen atom, a nitro group, an amino group, a silyl group, a boron group, a phosphine oxide group, a phosphine sulfide group, an alkyl group, an alkenyl group, an aryl group, and a heterocyclic group. In addition, each of the substituents may be substituted or unsubstituted. For example, a biphenyl group may be interpreted as an aryl group or a phenyl group substituted with a phenyl group.

In the description, the terms "forming a ring via the combination with an adjacent group" may mean forming a substituted or unsubstituted hydrocarbon ring, or substituted or unsubstituted heterocycle via the combination with an adjacent group. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocyclic or polycyclic. In addition, the ring formed via the combination with an adjacent group may be combined with another ring to form a Spiro structure.

In the description, the terms "an adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentene, two ethyl groups may be interpreted as "adjacent groups" to each other.

In the description, the halogen atom may include a fluorine atom, a chlorine atom, a bromine atom and an iodine atom.

In the description, the alkyl may be a linear, branched or cyclic type. The carbon number of the alkyl may be from 1 to 50, from 1 to 30, from 1 to 20, from 1 to 10, or from 1 to 6. The alkyl may include methyl, ethyl, n-propyl, isopropyl, n-butyl, s-butyl, t-butyl, butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, c-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, the aryl group means an optional functional group or substituent derived from an aromatic hydrocarbon ring. The aryl group may be a monocyclic aryl group or a polycyclic aryl group. The carbon number for forming a ring in the aryl group may be 6 to 50, 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylene, pyrenyl, benzofluoranthenyl, chrysenyl, etc., without limitation.

In the description, the fluorenyl group may be substituted, and two substituents may be combined with each other to form a Spiro structure. For example, if the fluorenyl group is substituted,

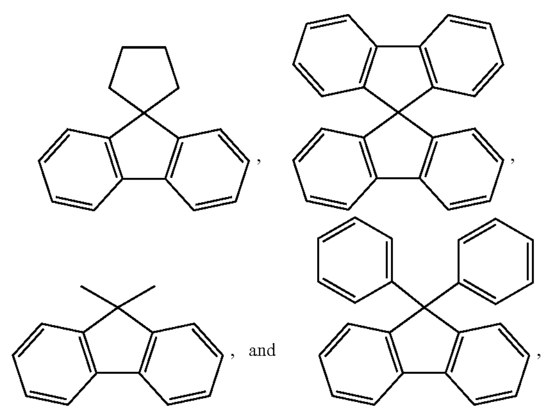

etc. may be included. However, an embodiment of the inventive concept is not limited thereto.

In the description, the heteroaryl may be a heteroaryl including at least one of O, N, P, Si or S as a heteroatom. The carbon number for forming a ring of the heteroaryl may be 2 to 50, 2 to 30, or 2 to 20. The heteroaryl may be monocyclic heteroaryl or polycyclic heteroaryl. Examples of the polycyclic heteroaryl may have dicyclic or tricyclic structure. Examples of the heteroaryl may include thiophene, furan, pyrrole, imidazole, thiazole, oxazole, oxadiazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, thiazole, isooxazole, oxadiazole, thiadiazole, phenothiazine, dibenzosilole, dibenzofuran, etc., without limitation.

In the description, explanation on the aryl group may be applied to an arylene group except for the arylene group is a divalent group.

In the description, explanation on the heteroaryl group may be applied to a heteroarylene group except for the heteroarylene group is a divalent group.

In the description, explanation on the aryl group may be applied to the aryl groups in an arylthio group and an arylamino group.

In the description, explanation on the alkyl group may be applied to the alkyl groups in an alkylamino group and an alkoxy group. In the description, the carbon number of an amino group is not specifically limited, but may be 1 to 30. The amino group may include an alkyl amino group and an aryl amino group. Examples of the amino group may include a methylamino group, a dimethylamino group, a phenylamino group, a diphenylamino group, a naphthylamino group, a 9-methyl-anthracenylamino group, a triphenylamino group, etc., without limitation.

Hereinafter, an amine compound according to an embodiment will be explained.

An amine compound of an embodiment is represented by the following Formula 1:

[Formula 1]

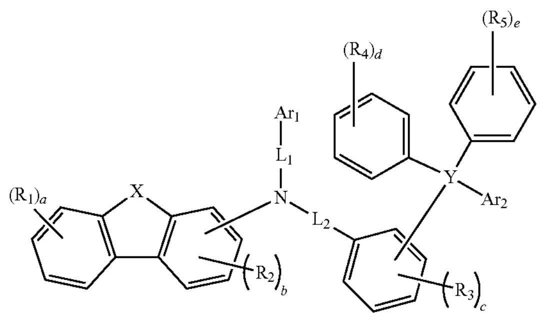

In Formula 1, X may be O or S.

Y may be C or Si.

$Ar_1$ and $Ar_2$ may be each independently a substituted or unsubstituted alkyl group having 1 to 50 carbon atoms, a substituted or unsubstituted aryl group having 6 to 50 carbon atoms for forming a ring, or a substituted or unsubstituted heteroaryl group having 2 to 50 carbon atoms for forming a ring, which includes 0 or S as a heteroatom.

In this case, $Ar_1$ may be a substituted or unsubstituted phenyl group, a substituted or unsubstituted biphenyl group, a substituted or unsubstituted terphenyl group, a substituted or unsubstituted naphthyl group, a substituted or unsubstituted phenanthryl group, a substituted or unsubstituted dibenzofuranyl group, or a substituted or unsubstituted dibenzothiophene group, and $Ar_2$ may be a substituted or unsubstituted phenyl group, a substituted or unsubstituted naphthyl group, a substituted or unsubstituted phenanthryl group, a substituted or unsubstituted dibenzofuranyl group, or a substituted or unsubstituted dibenzothiophene group.

$L_1$ and $L_2$ may be each independently a direct linkage, a substituted or unsubstituted arylene group having 6 to 30 carbon atoms for forming a ring, or a substituted or unsubstituted heteroarylene group having 2 to 30 carbon atoms for forming a ring. Preferably, $L_1$ and $L_2$ may be each independently a direct linkage, a substituted or unsubstituted phenylene group, a substituted or unsubstituted dibenzofuranylene group, a substituted or unsubstituted naphthalene group, or a substituted or unsubstituted fluorenylene group, without limitation.

In the present description, a direct linkage may include a single bond.

$R_1$ may be a substituted or unsubstituted aryl group having 6 to 50 carbon atoms for forming a ring, and preferably, a substituted or unsubstituted phenyl group. $R_1$ may be an unsubstituted phenyl group, but an embodiment of the inventive concept is not limited thereto.

$R_2$ to $R_5$ may be each independently a hydrogen atom, a deuterium atom, a halogen atom, a cyano group, a substituted or unsubstituted silyl group, a substituted or unsubstituted alkyl group having 1 to 10 carbon atoms, a substituted or unsubstituted alkoxy group having 1 to 10 carbon atoms, a substituted or unsubstituted arylthio group having 1 to 10 carbon atoms, a substituted or unsubstituted alkylamino group having 1 to 10 carbon atoms, a substituted or unsubstituted arylamino group having 1 to 20 carbon atoms, a substituted or unsubstituted aryl group having 6 to 50 carbon atoms for forming a ring, or a substituted or unsubstituted heteroaryl group having 2 to 50 carbon atoms for forming a ring, or combined with an adjacent group to form a ring. Preferably, $R_2$ to $R_5$ may be each independently a hydrogen atom, a substituted or unsubstituted phenyl group, a substituted or unsubstituted triphenylsilyl group, or combined with an adjacent group to form a ring.

"a" may be an integer of 1 to 4, "b" may be each independently an integer of 0 to 3, "c" may be 0 or 1, and "d" and "e" may be each independently an integer of 0 to 5. If "a" is an integer of 2 or more, a plurality of $R_1$ groups may be the same or different. For example, if "a" is 2, two $R_1$ groups may be the same or different. In addition, if "a" is 3, three $R_1$ groups may be different from each other, two $R_1$ groups may be the same and the remaining $R_1$ group may be different, or three $R_1$ groups may be the same. For example, a plurality of substituents may be the same or different.

Meanwhile, if "b", "d" and "e" are an integer of 2 or more, the same may be applied. For example, a plurality of substituents may be the same or different.

In Formula 1, if Y is Si, "d" and "e" may be each independently 0.

In addition, in Formula 1, if Y is C, $R_4$ and $R_5$ may be each independently a hydrogen atom, and may be combined with an adjacent group to form a ring. For example, at least one of $R_4$ and $R_5$ may be combined with a phenyl group which is substituted for Y, to form a ring. For example, $R_4$ may be combined with a phenyl group which is substituted for Y, to form a ring, and in this case, may form a tricyclic ring including two phenyl groups which are substituted for Y.

For example, the amine compound of an embodiment, represented by Formula 1 may be represented by the following Formula 1-1 or Formula 1-2:

[Formula 1-1]

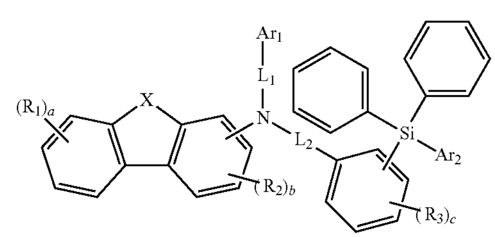

-continued

[Formula 1-2]

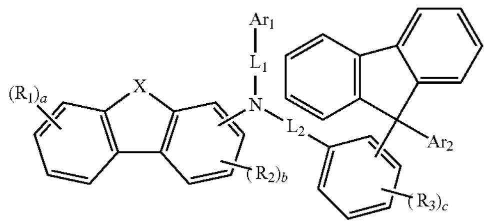

In Formula 1-1 and Formula 1-2, the same explanation on X, $Ar_1$, $Ar_2$, $L_1$, $L_2$, $R_1$ to $R_3$, and “a” to “c” in Formula 1 may be applied.

In this case, $Ar_1$ may be a substituted or unsubstituted phenyl group, a substituted or unsubstituted biphenyl group, a substituted or unsubstituted terphenyl group, a substituted or unsubstituted naphthyl group, a substituted or unsubstituted phenanthryl group, a substituted or unsubstituted dibenzofuranyl group, or a substituted or unsubstituted dibenzothiophene group, $L_1$ and $L_2$ may be each independently a direct linkage, a substituted or unsubstituted phenylene group, a substituted or unsubstituted dibenzofuranylene group, a substituted or unsubstituted naphthalene group, or a substituted or unsubstituted fluorenylene group, and $R_1$ may be a substituted or unsubstituted phenyl group.

Formula 1-1 represents an amine compound of Formula 1 where Y is Si, “d” and “e” are 0. The amine compound of Formula 1-1 may have a dibenzoheterole group and a triphenylsilyl group.

In addition, Formula 1-2 represents an amine compound of Formula 1 where Y is C, $R_4$ and $R_5$ are each independently a hydrogen atom and are combined with each other to form a ring. The amine compound of Formula 1-2 may have a dibenzoheterole group and a fluorenyl group.

Meanwhile, in

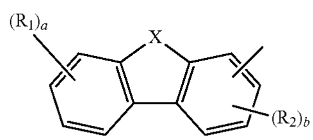

part corresponding to dibenzoheterole group in Formula 1, if “a” is 1, a position where $R_1$ is connected with a dibenzoheterole group and a position where a dibenzoheterole group is connected with N are preferably symmetric.

For example, referring to Formula 3 below, which indicates atomic numbers of a dibenzoheterole group, if an atomic number of a dibenzoheterole group, which is connected with a substituent $R_1$ is 6, a nitrogen atom of an amine is combined at a position where an atomic number is 4 of the dibenzoheterole group, thereby connected positions attaining a symmetric structure.

[Formula 3]

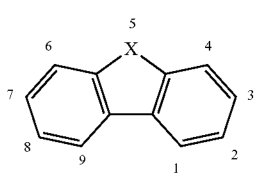

Particularly,

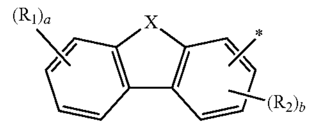

part corresponding to a dibenzoheterole group in Formula 1 may be represented by one of the following H-1 to H-4:

H-1

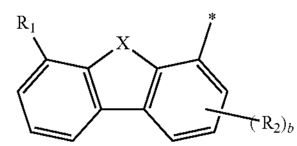

H-2

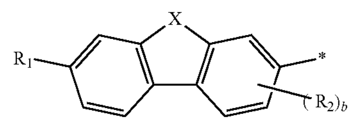

H-3

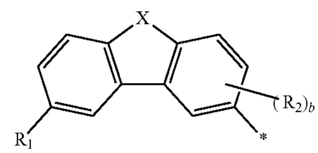

H-4

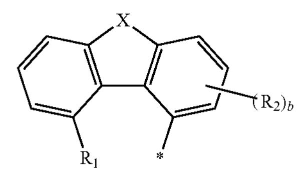

In H-1 to H-4, the same explanation on X, $R_1$ and $R_2$ in Formula 1 may be applied. In this case, $R_1$ is a substituted or unsubstituted phenyl group, $R_2$ is a hydrogen atom, a substituted or unsubstituted phenyl group, or a substituted or unsubstituted triphenylsilyl group, or preferably combined with an adjacent group to form a ring. However, an embodiment of the inventive concept is not limited thereto.

H-1 represents a compound in which a nitrogen atom of an amine is combined with the dibenzoheterole group at the position of atomic number 4, and $R_1$ is combined with the dibenzoheterole group at the position of atomic number 6, and forms a conformation in which a dibenzoheterole skeleton is folded toward the nitrogen atom.

H-2 represents a compound in which a nitrogen atom of an amine is combined with the dibenzoheterole group at the position of atomic number 3, and $R_1$ is combined with the dibenzoheterole group at the position of atomic number 7. H-3 represents a compound in which a nitrogen atom of an amine is combined with the dibenzoheterole group at the position of atomic number 2, and $R_1$ is combined with the dibenzoheterole group at the position of atomic number 8. In addition, H-4 represents a compound in which a nitrogen atom of an amine is combined with the dibenzoheterole group at the position of atomic number 1, and $R_1$ is combined with the dibenzoheterole group at the position of atomic number 9.

Meanwhile, the amine compound according to an embodiment of the inventive concept may be a monoamine compound.

The amine compound of an embodiment, represented by Formula 1 may be any one selected from the compounds represented in Compound Group 1 below. The compounds represented in Compound Group 1 represent compounds of Formula 1 where Y is Si. For example, the compounds represented in Compound Group 1 may represent particular examples of the amine compound represented by Formula 1-1. However, an embodiment of the inventive concept is not limited thereto. In particular embodiments represented in Compound Group 1, $SiPh_3$ represents a triphenylsilyl group.

[Compound Group 1]

A1

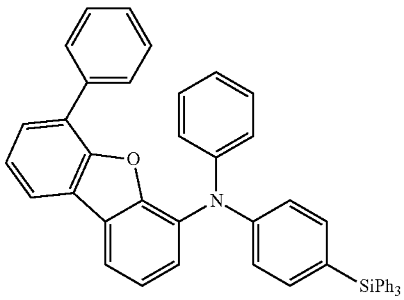

A2

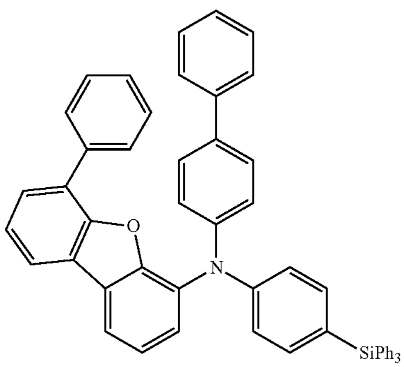

A3

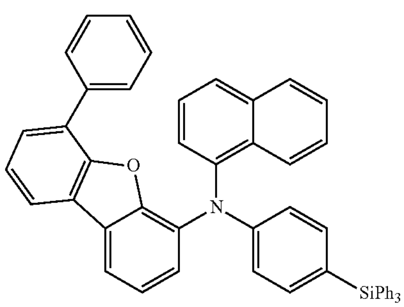

A4

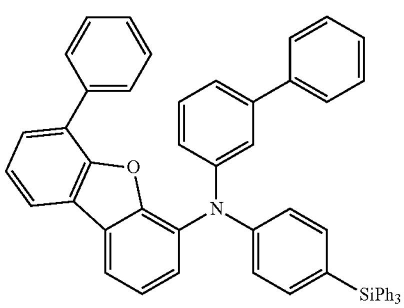

-continued

A5

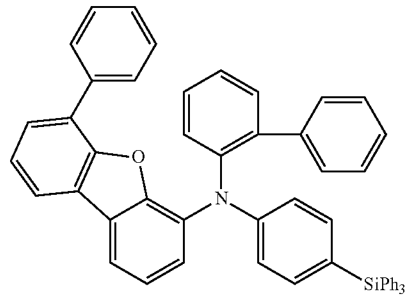

A6

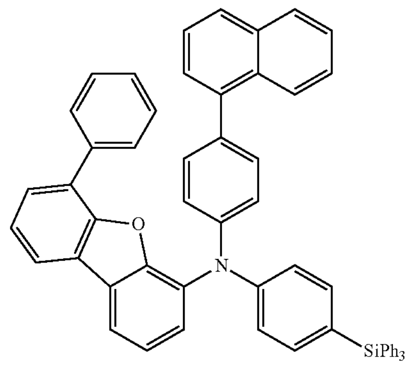

A7

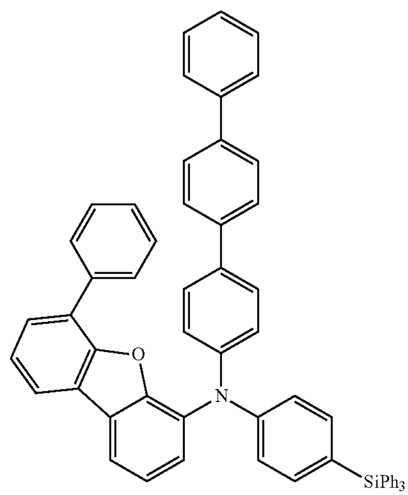

A8

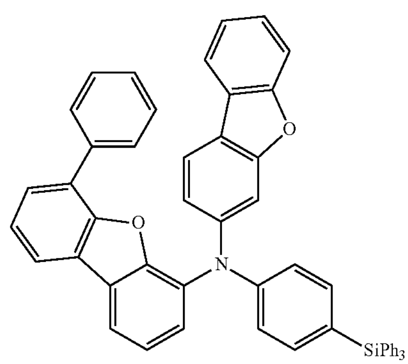

-continued
A9
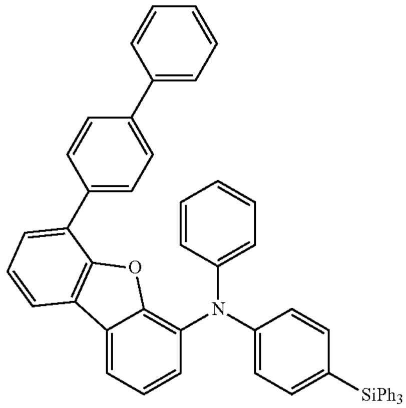
A10
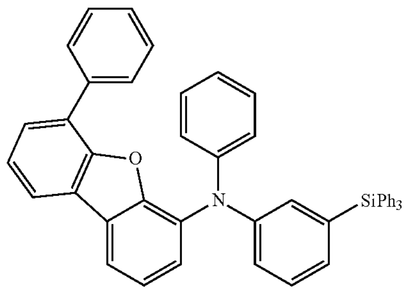
A11
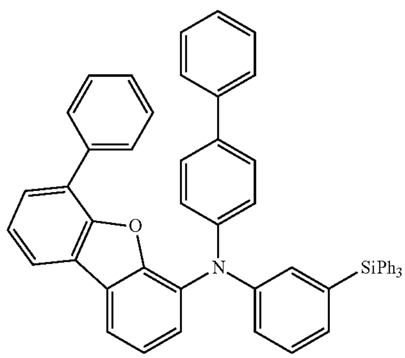
A12
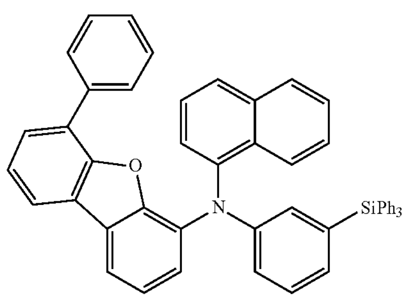
A13
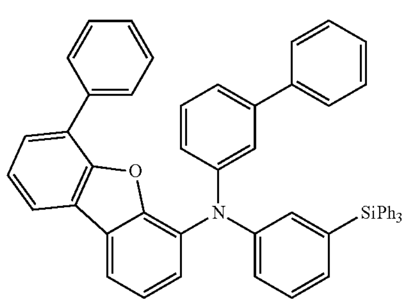
-continued
A14
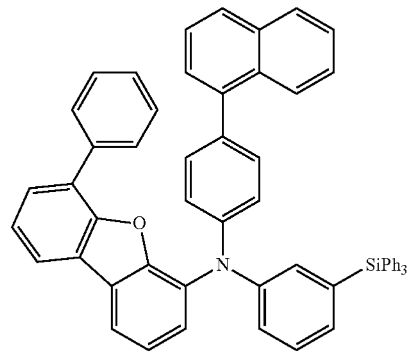
A15
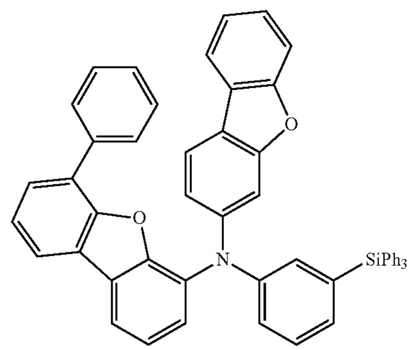
A16
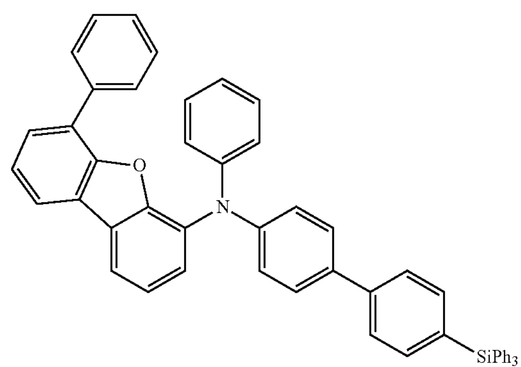
A17
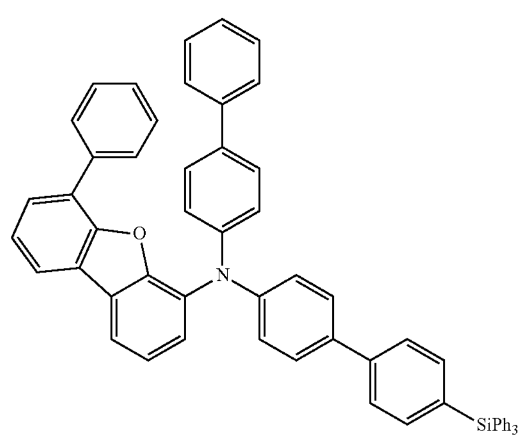

A18
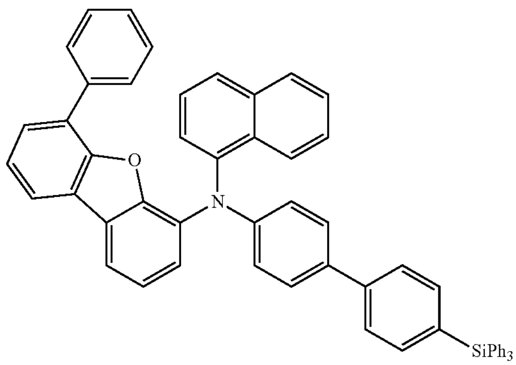
A19
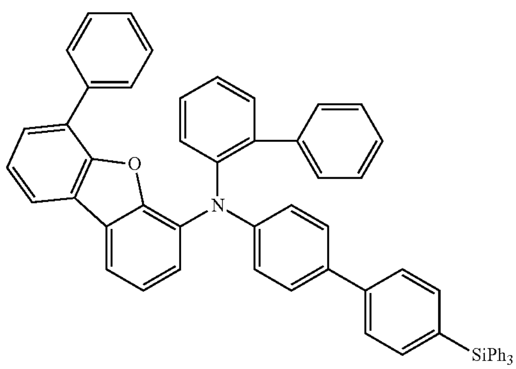
A20
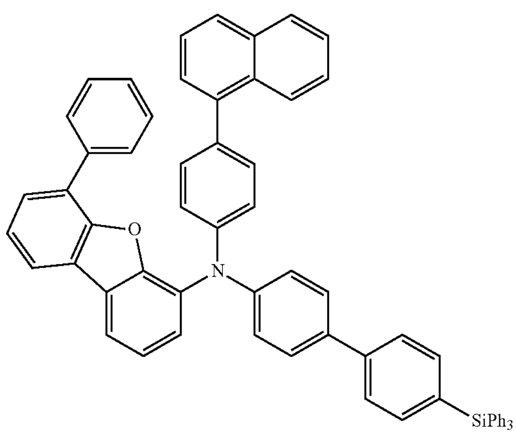
A21
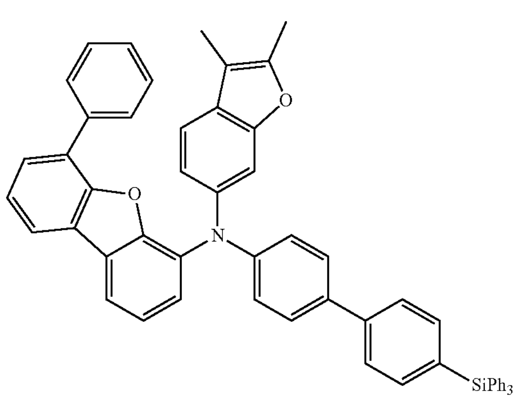
A22
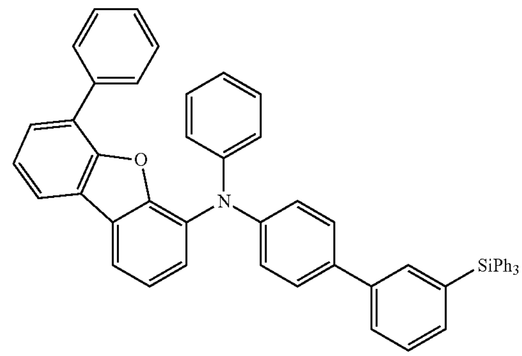
A23
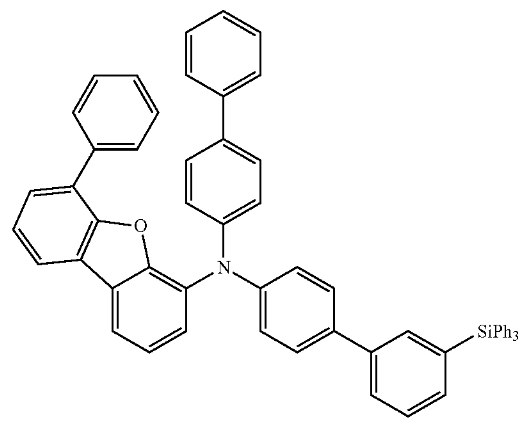
A24
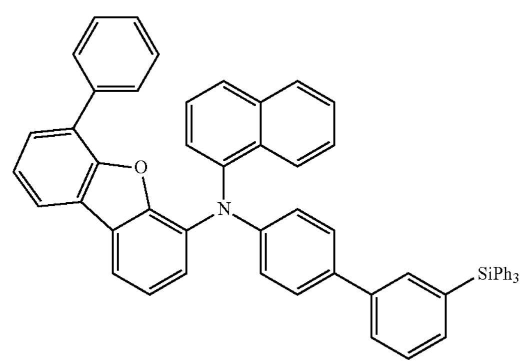
A25
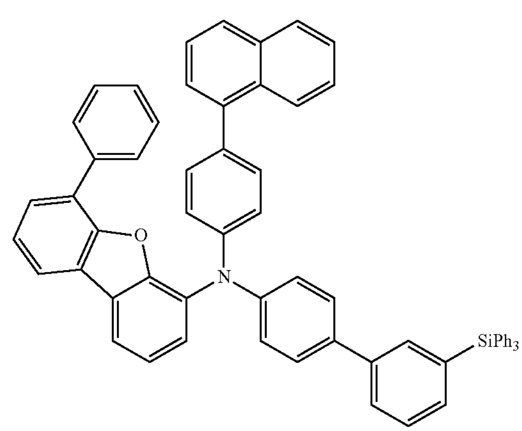

-continued
A26
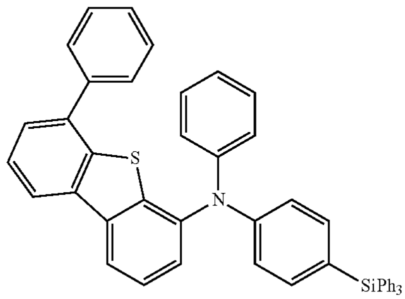
A27
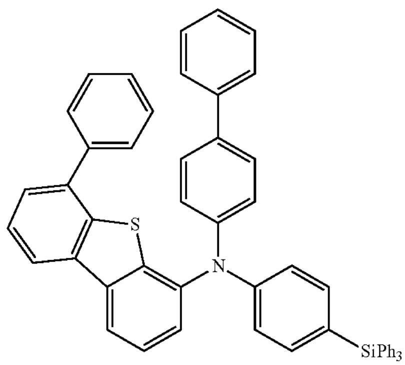
A28
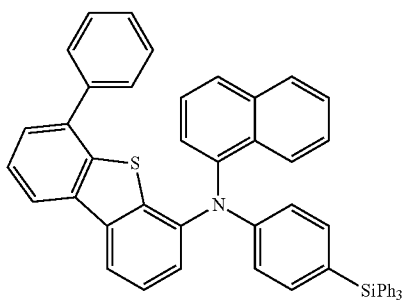
A29
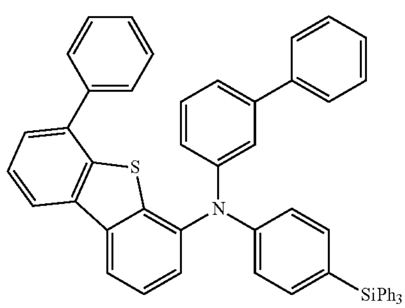
A30
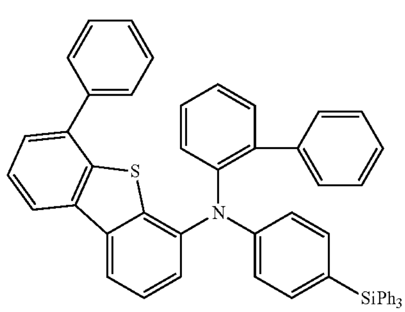
-continued
A31
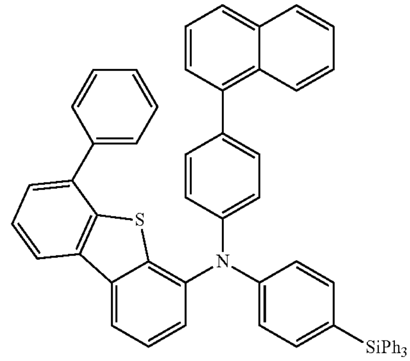
A32
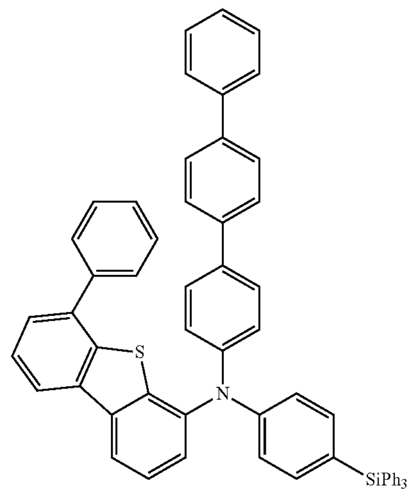
A33
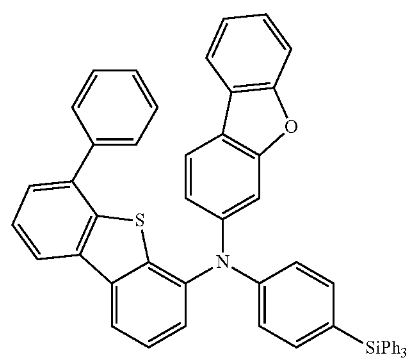
A34
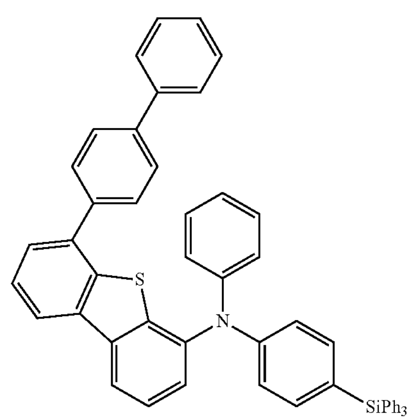

-continued
A35
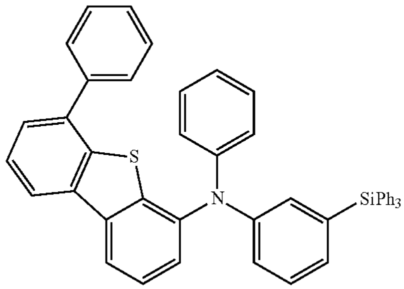
A36
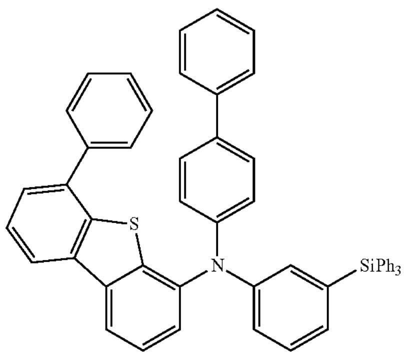
A37
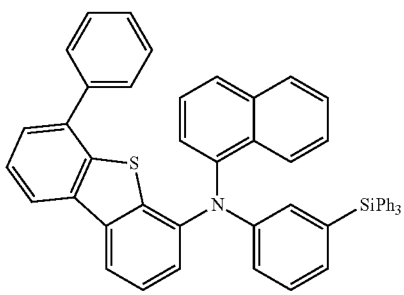
A38
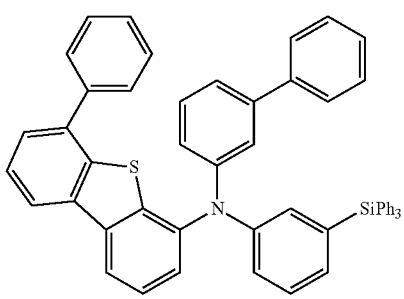
A39
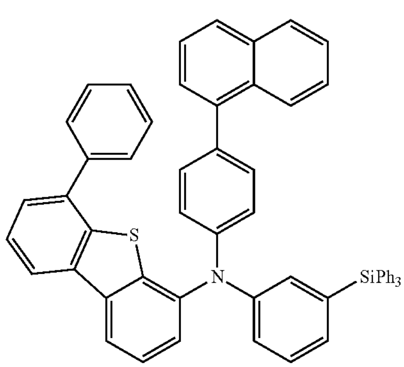
-continued
A40
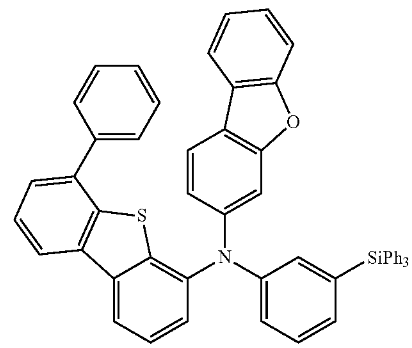
A41
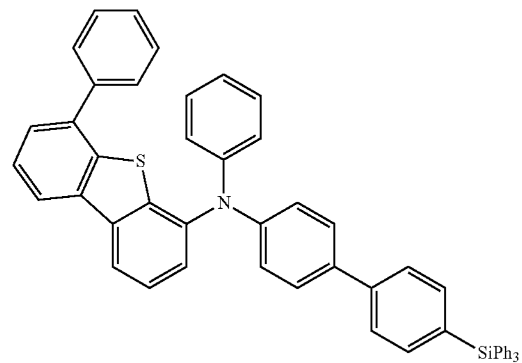
A42
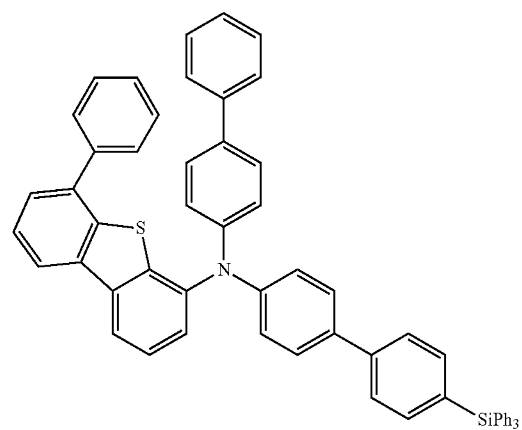
A43
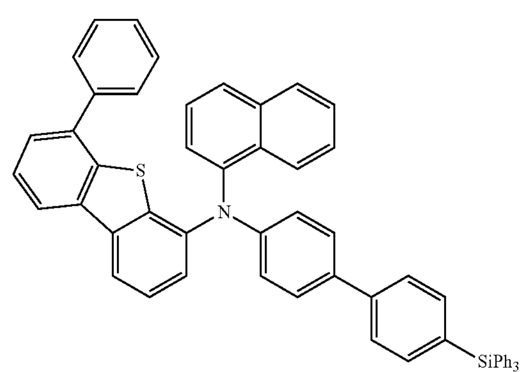

-continued
A44
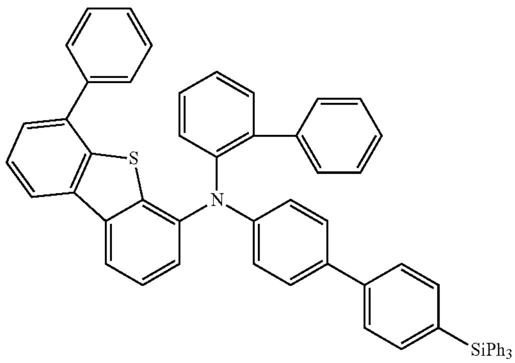
A45
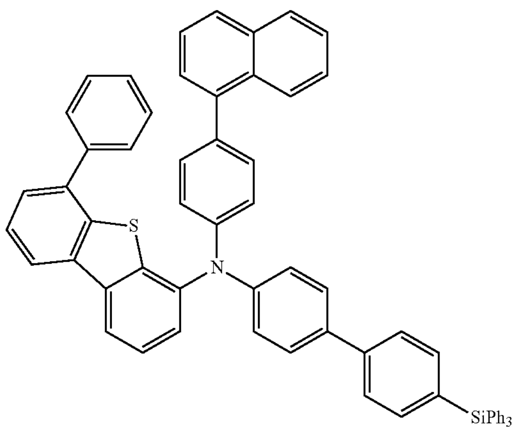
A46
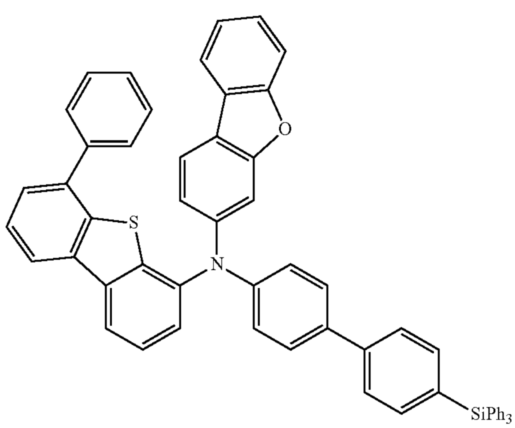
A47
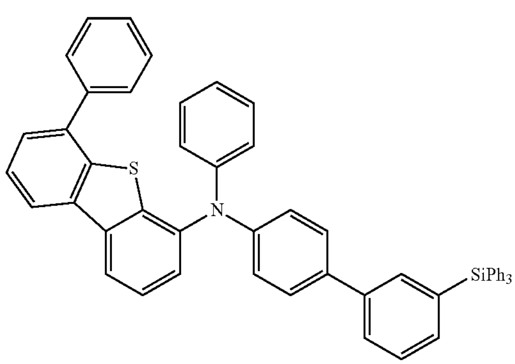
-continued
A48
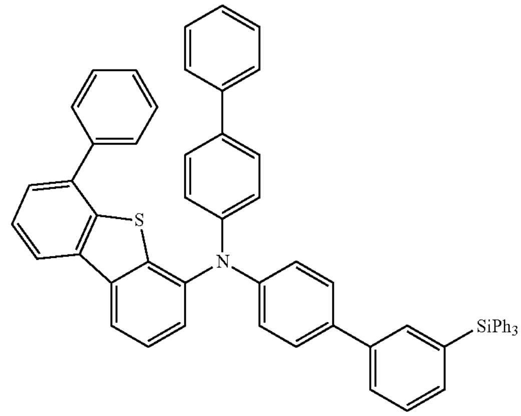
A49
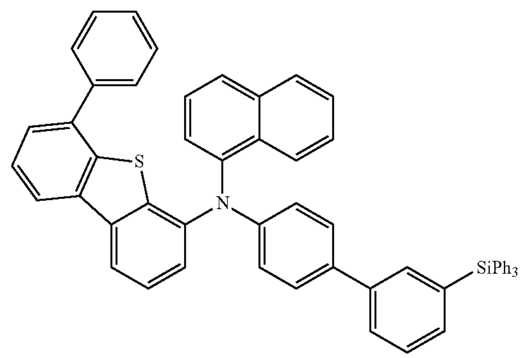
A50
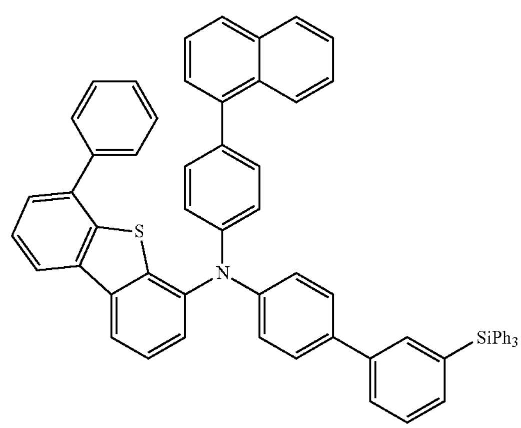
A51
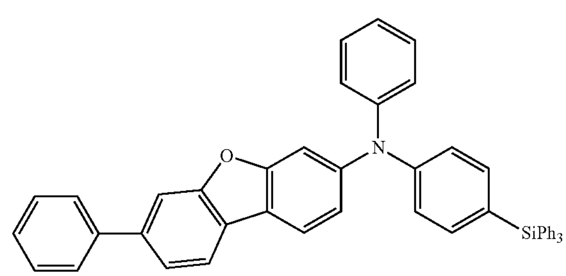

-continued
A52
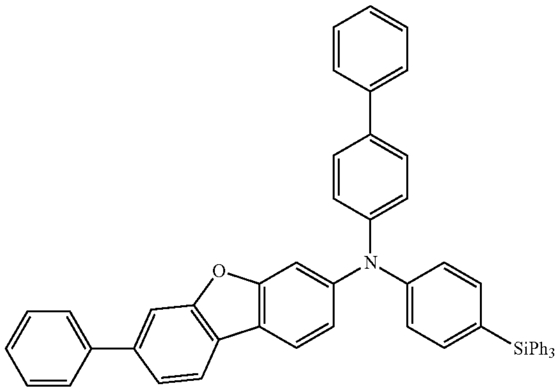
A53
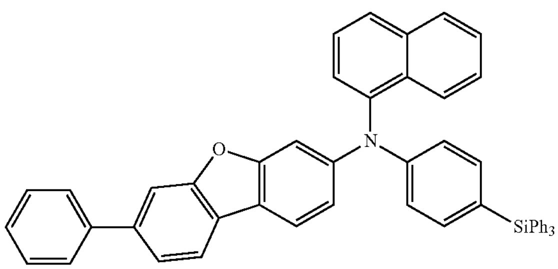
A54
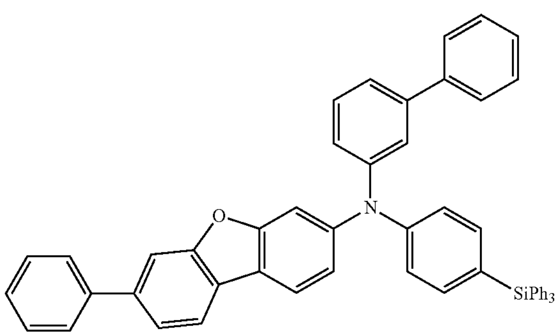
A55
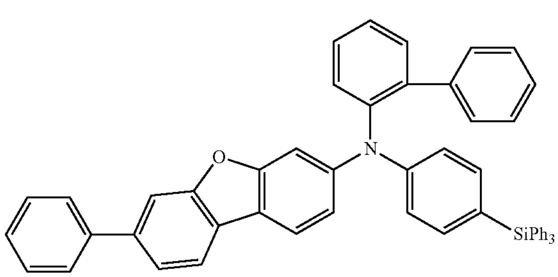
-continued
A56
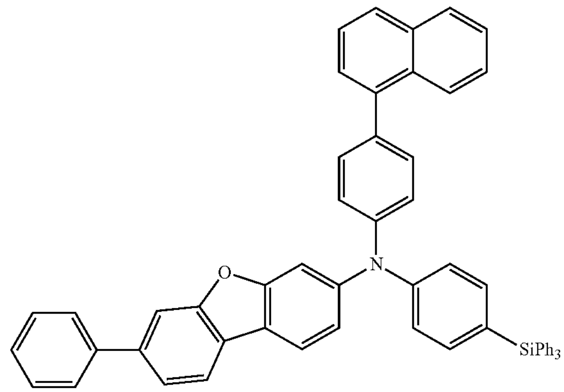
A57
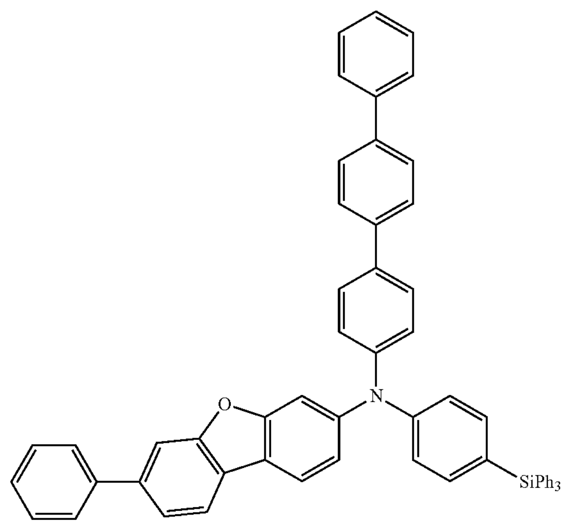
A58
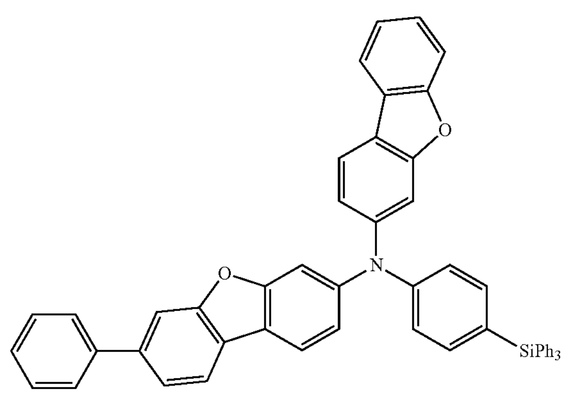
A59
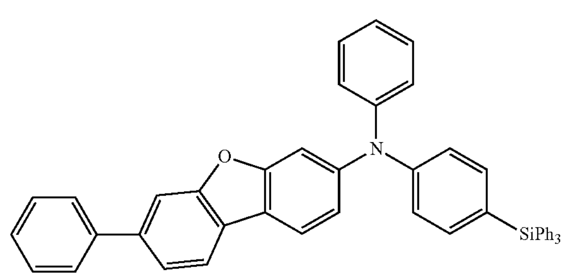

-continued
A60
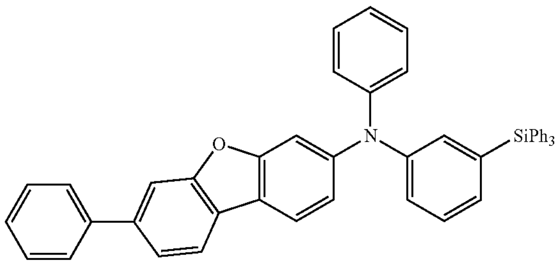
A61
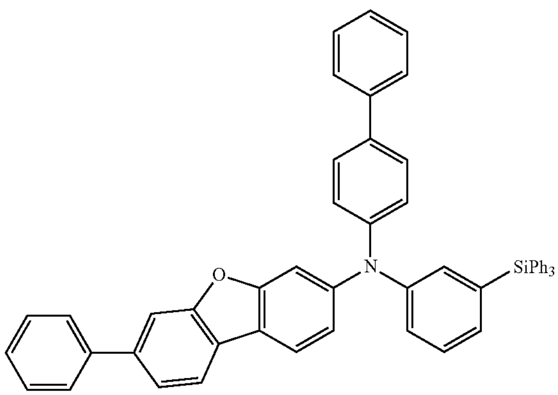
A62
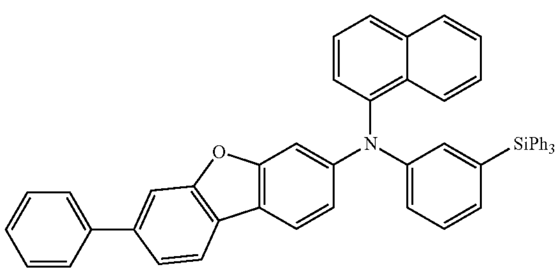
A63
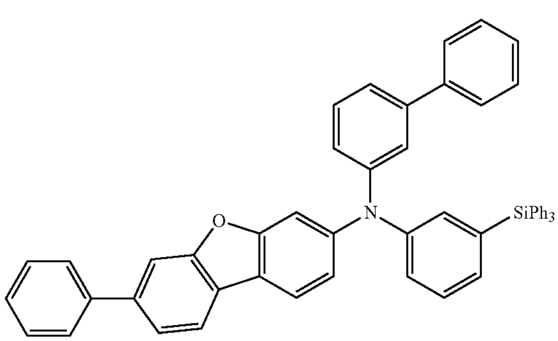
-continued
A64
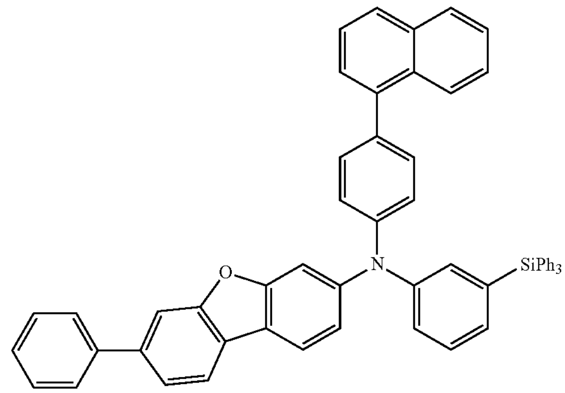
A65
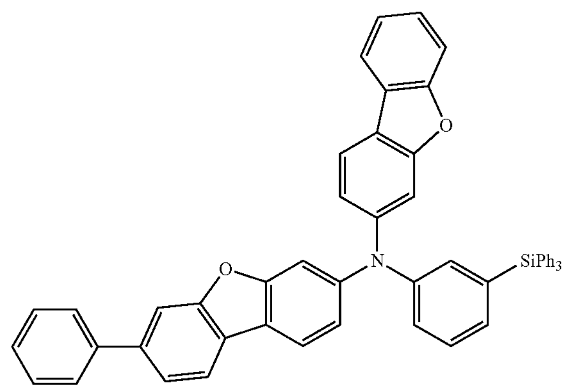
A66
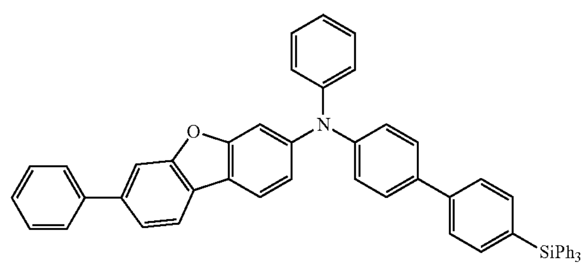
A67
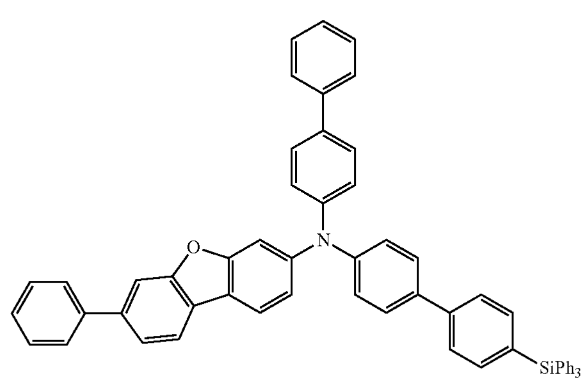

-continued
A68
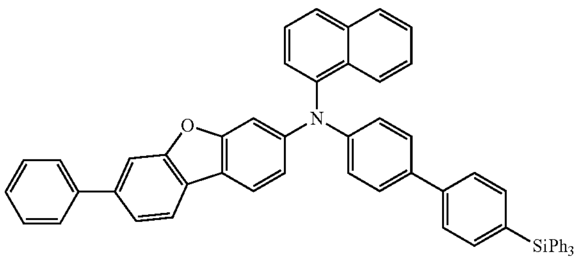
A69
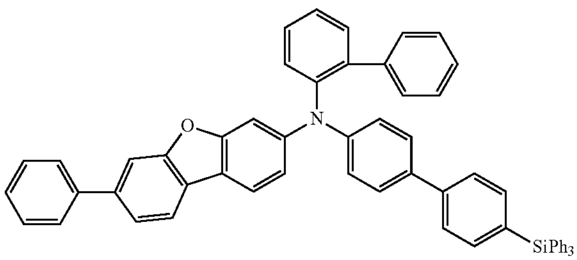
A70
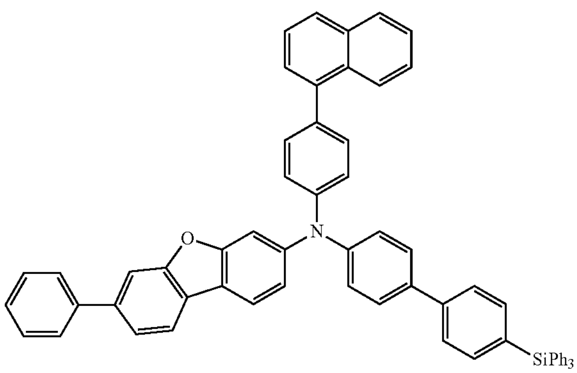
A71
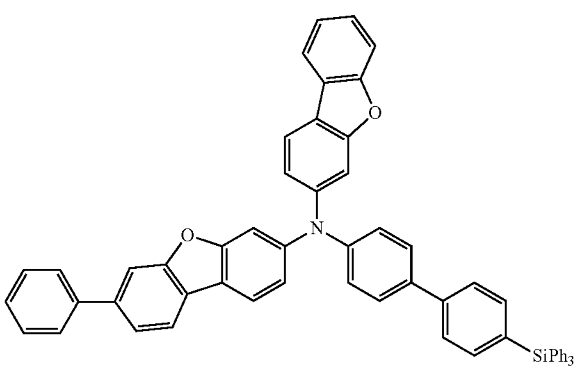
A72
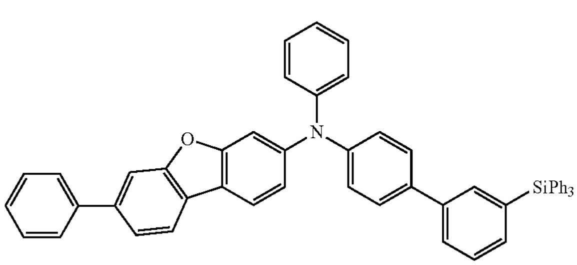
-continued
A73
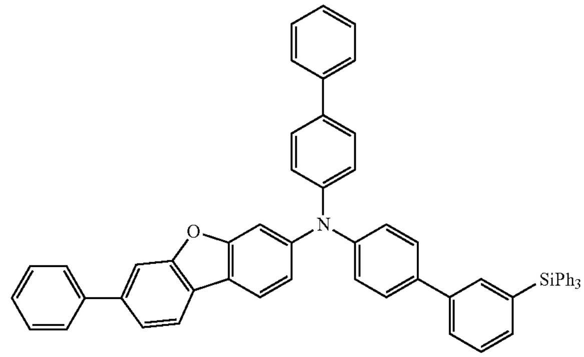
A74
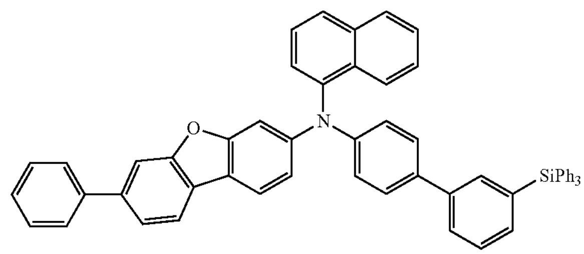
A75
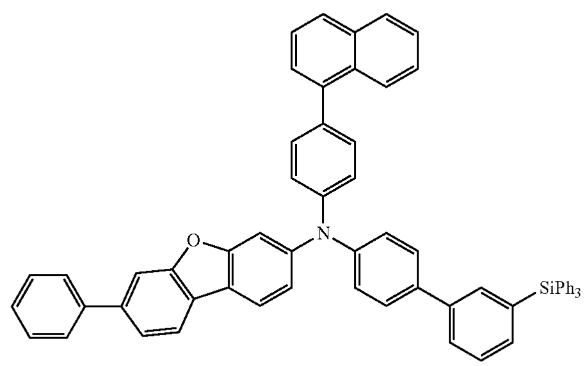
A76
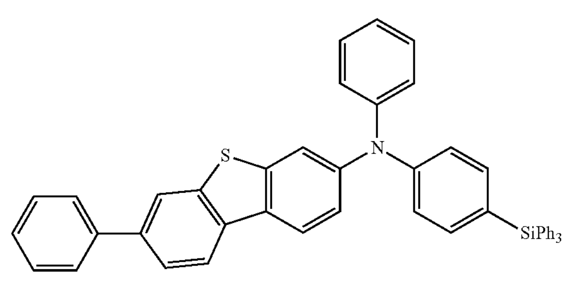

-continued
A77
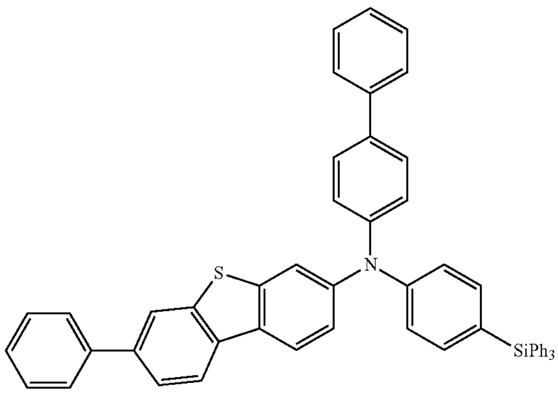
A78
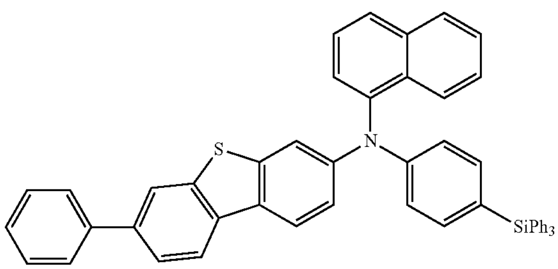
A79
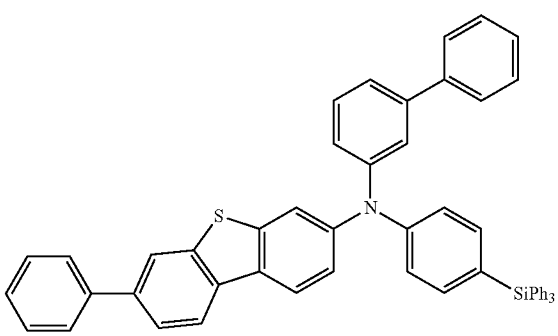
A80
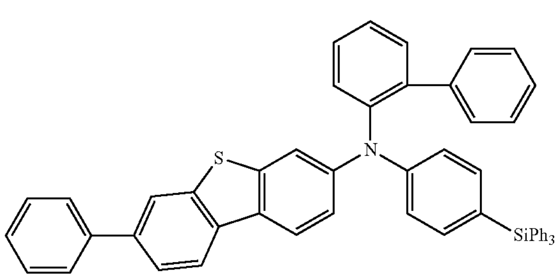
-continued
A81
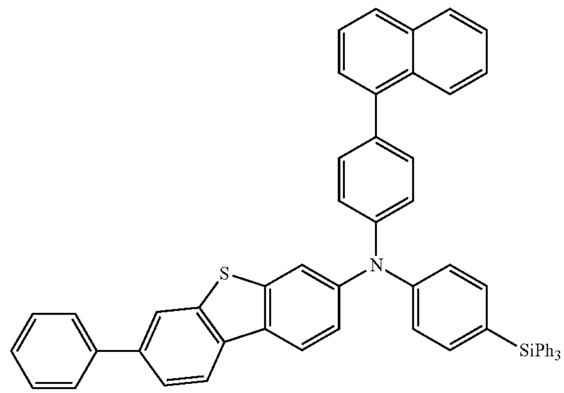
A82
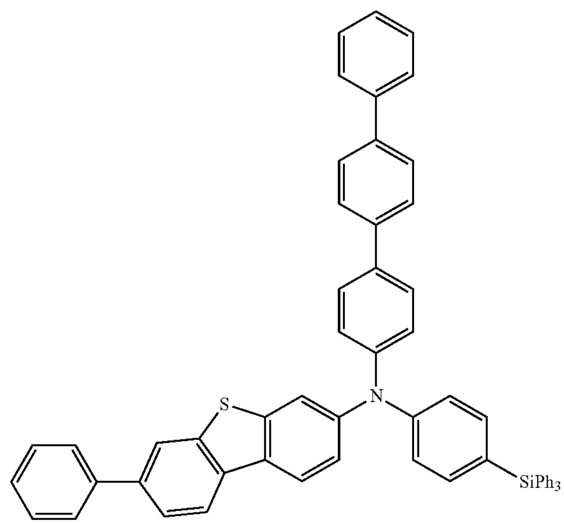
A83
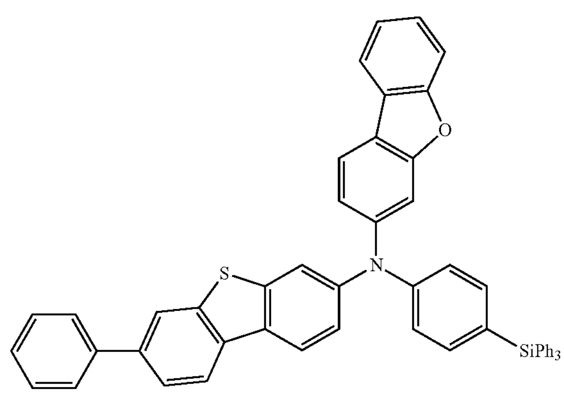
A84
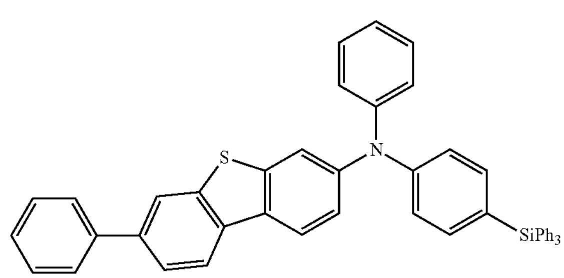

-continued
A85
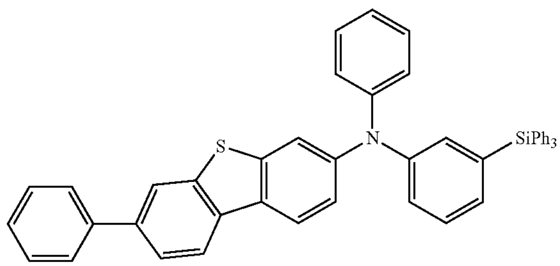
A86
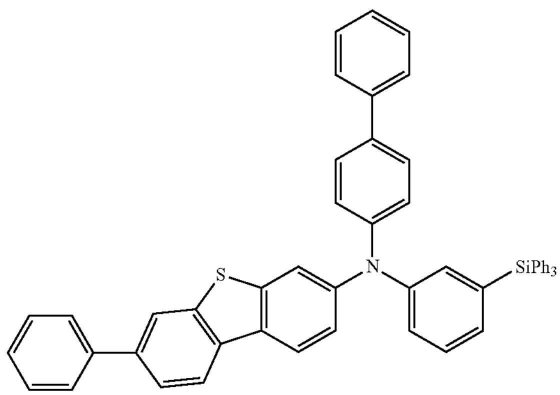
A87
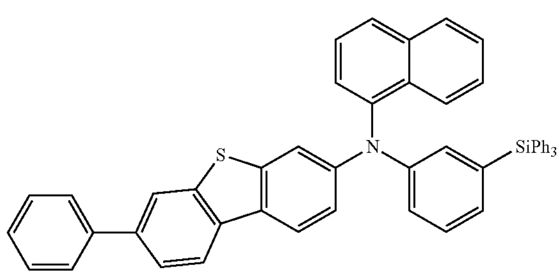
A88
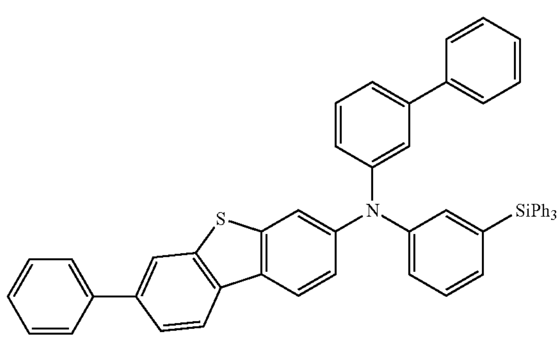
-continued
A89
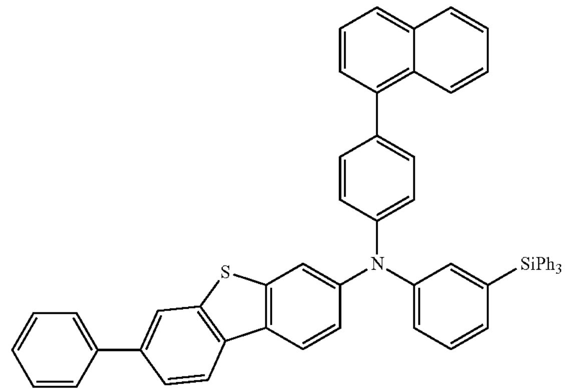
A90
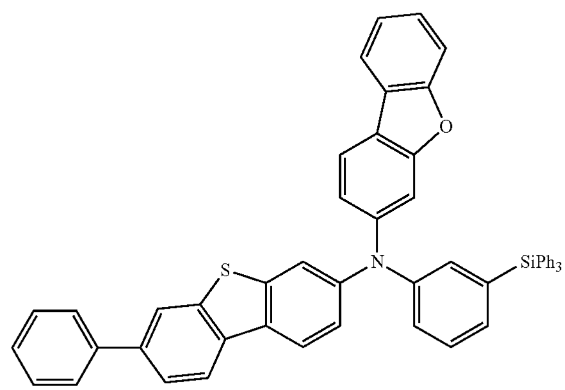
A91
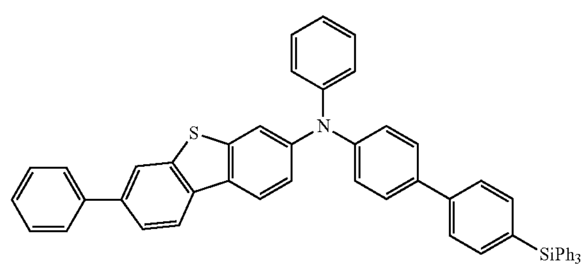
A92
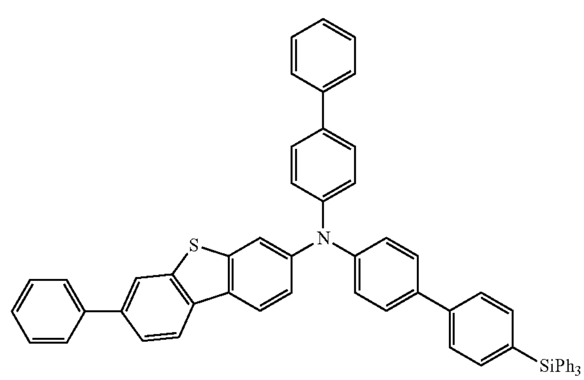

-continued
A93
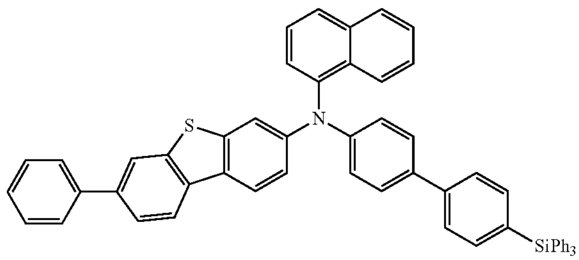
A94
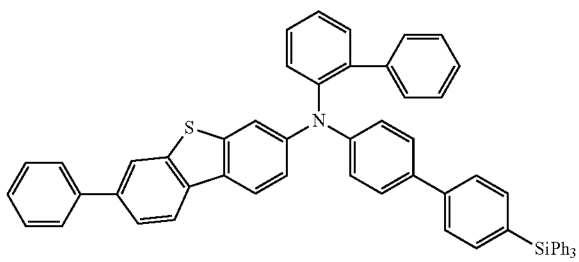
A95
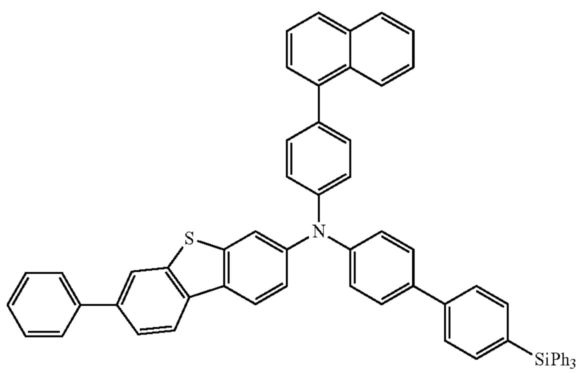
A96
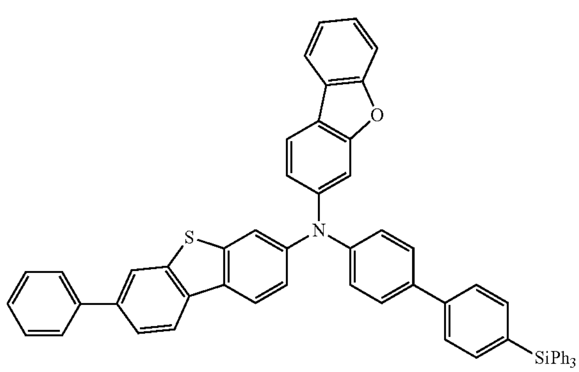
A97
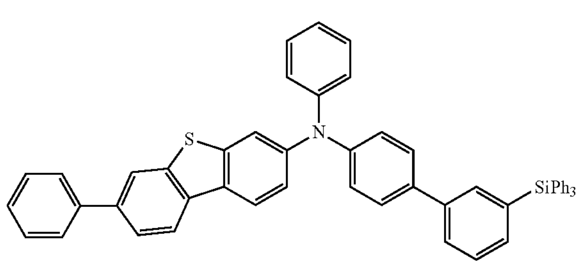
-continued
A98
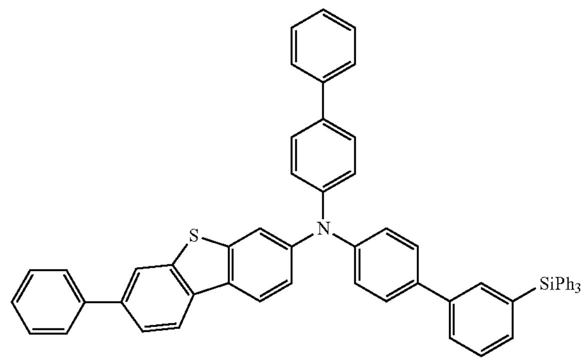
A99
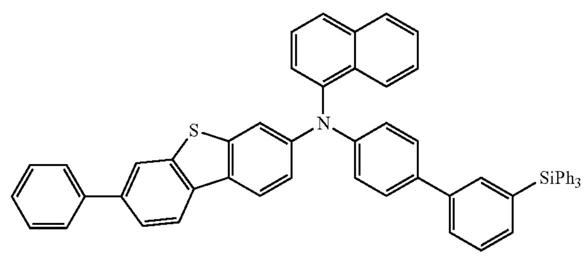
A100
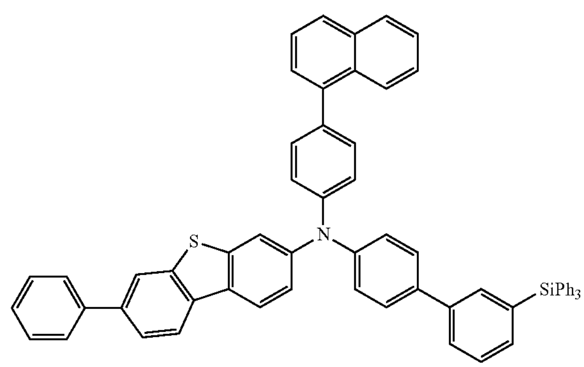
A101
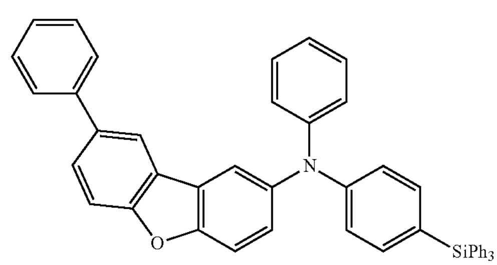

A102
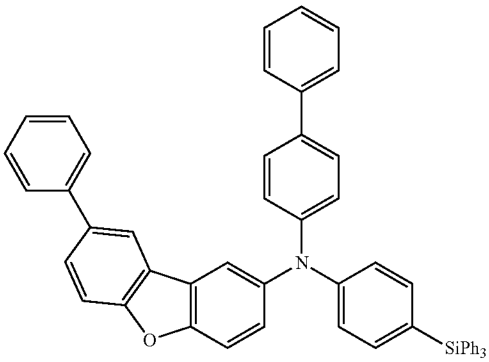
A103
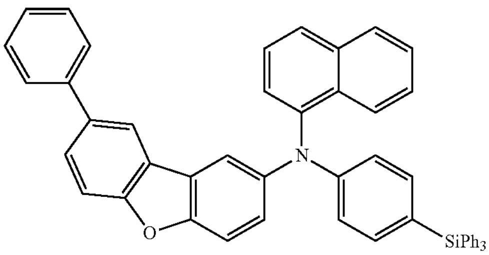
A104
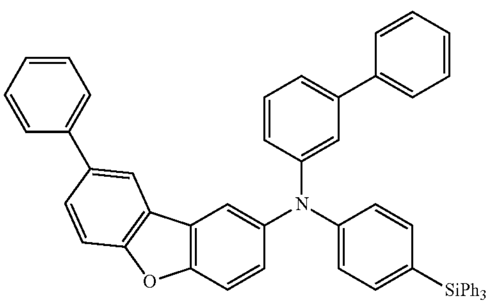
A105
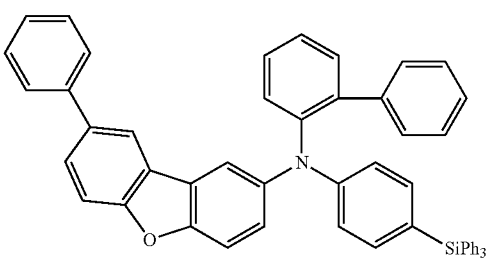
A106
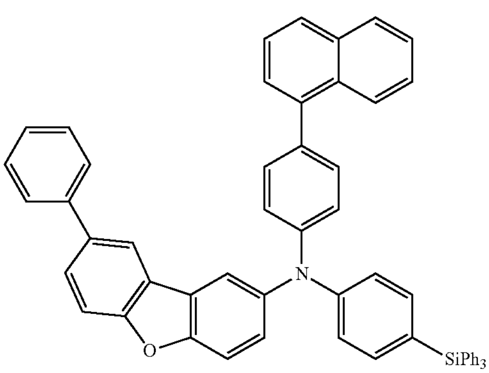
A107
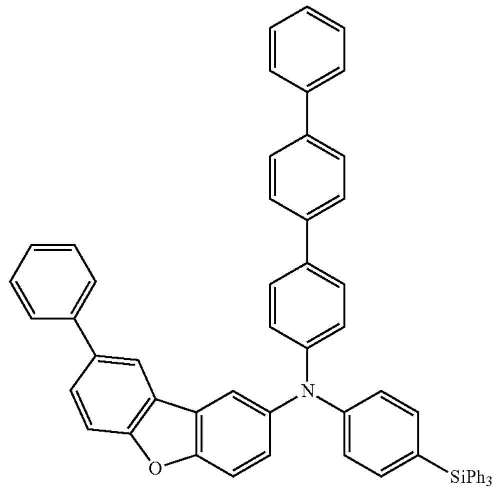
A108
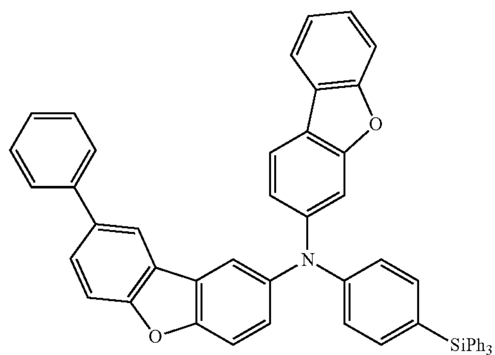
A109
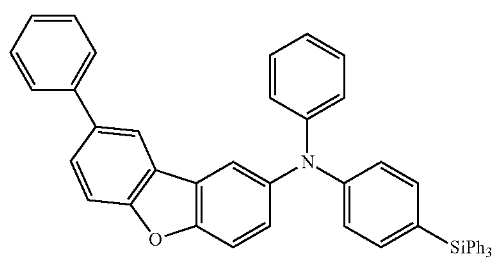
A110
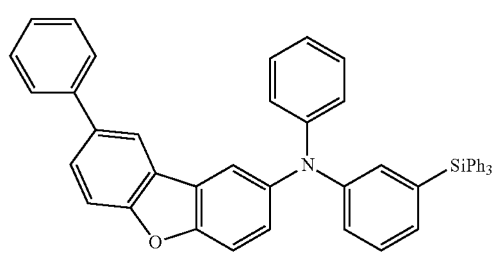

-continued
A111
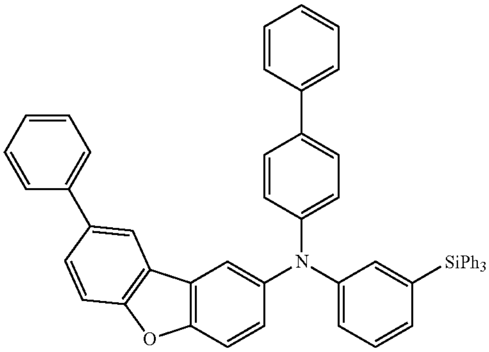
A112
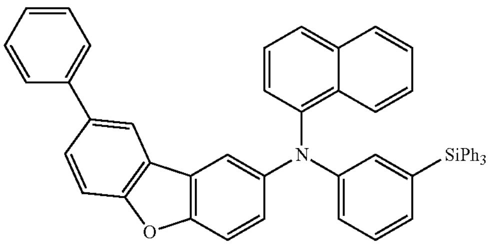
A113
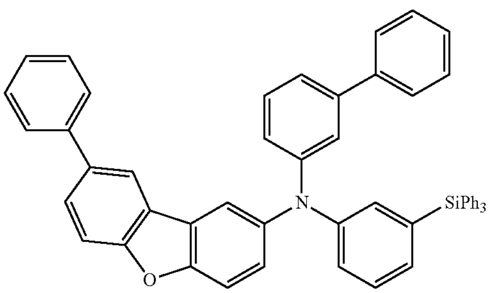
A114
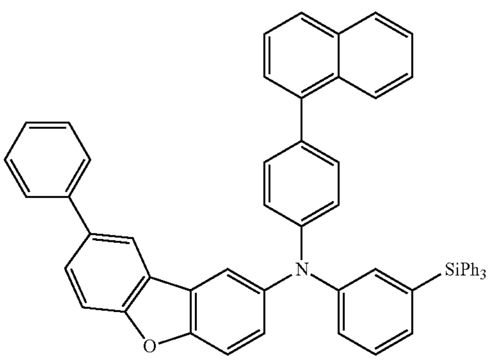
A115
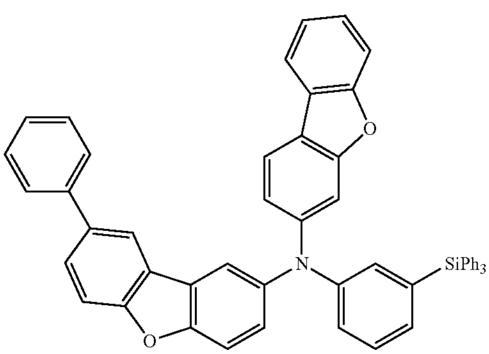
-continued
A116
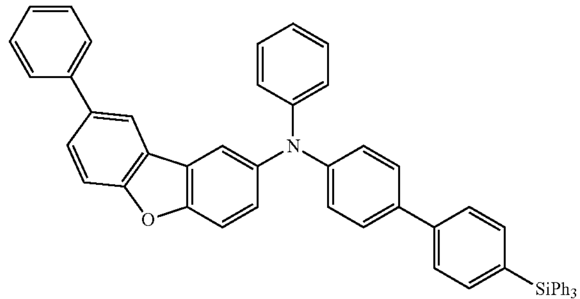
A117
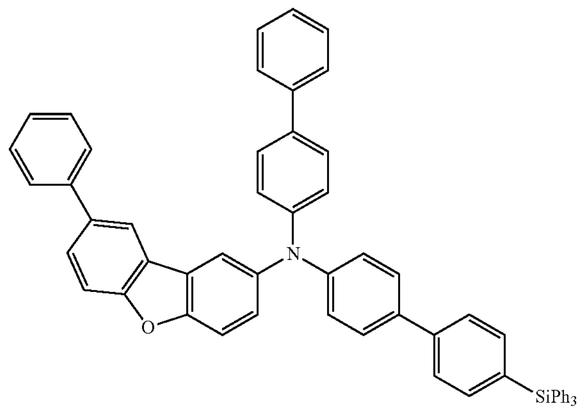
A118
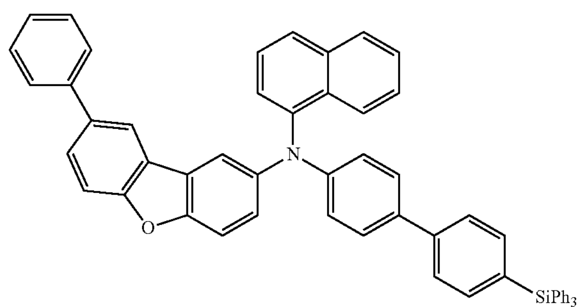
A119
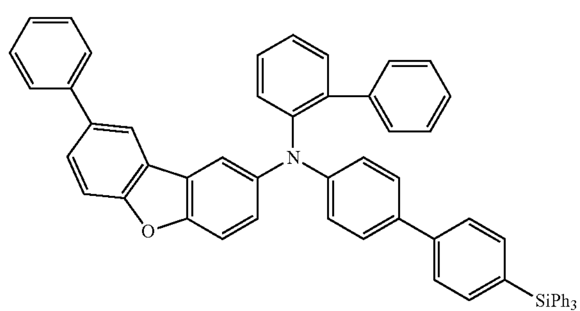

-continued
A120
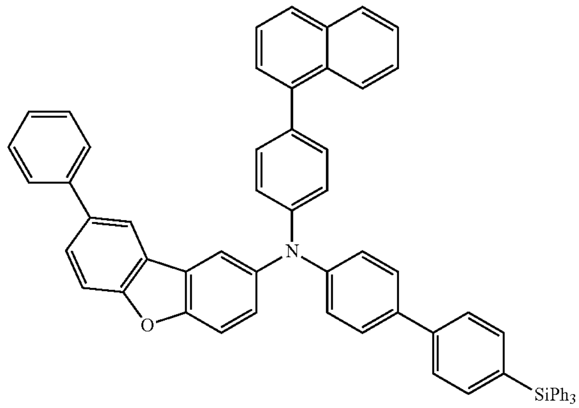
A121
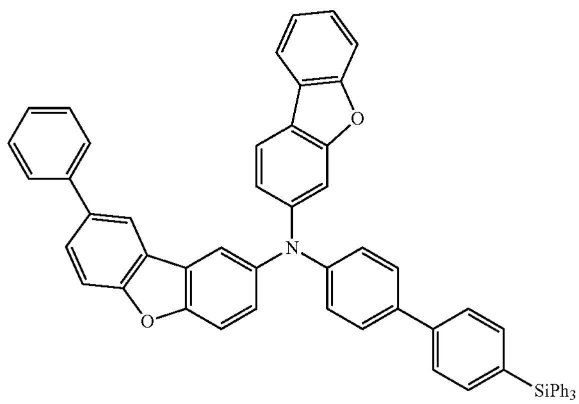
A122
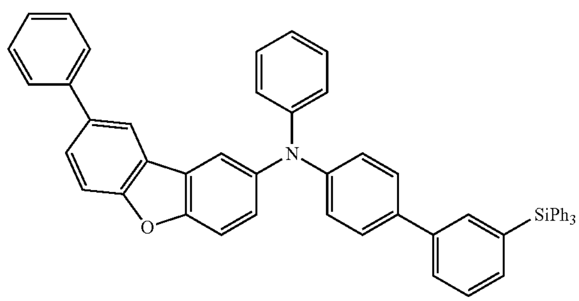
A123
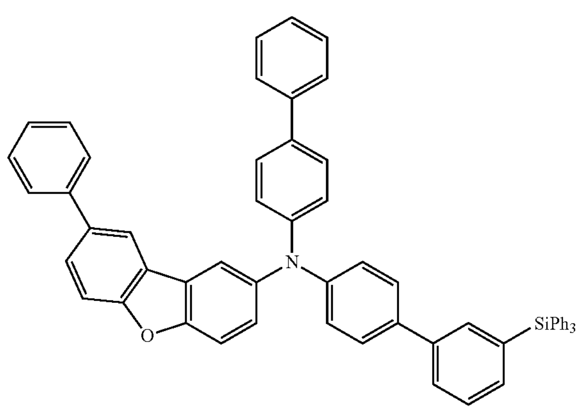
-continued
A124
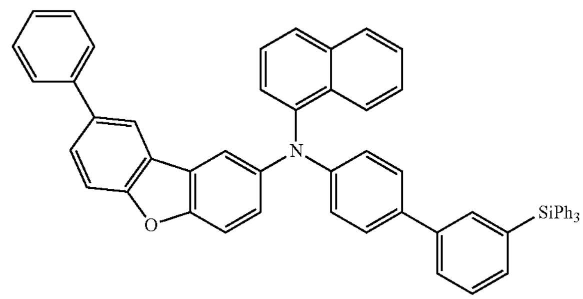
A125
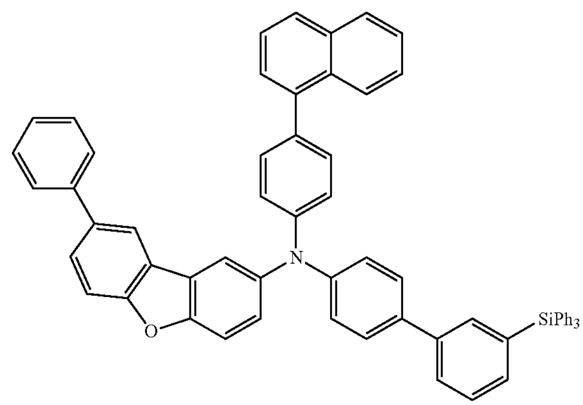
A126
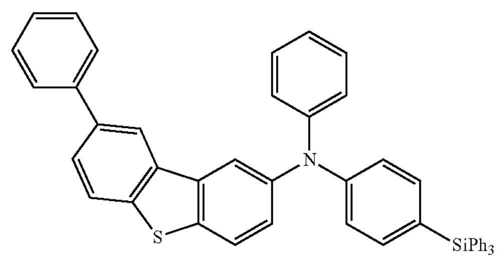
A127
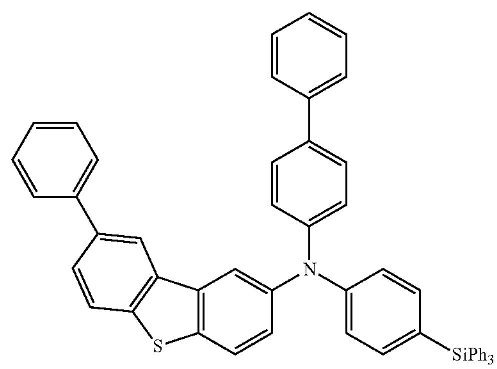
A128
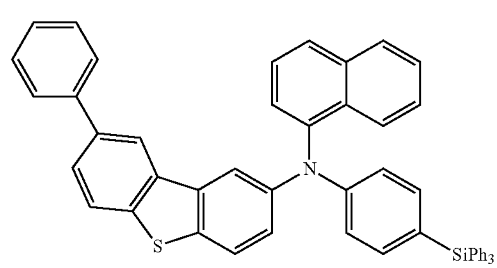

-continued
A129
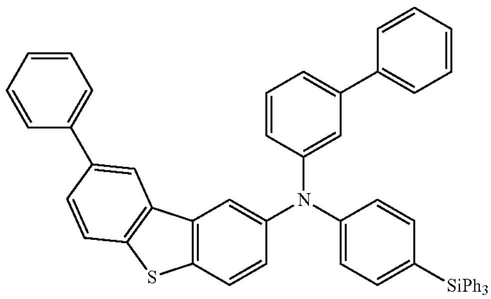
A130
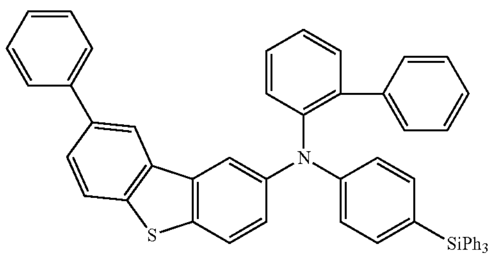
A131
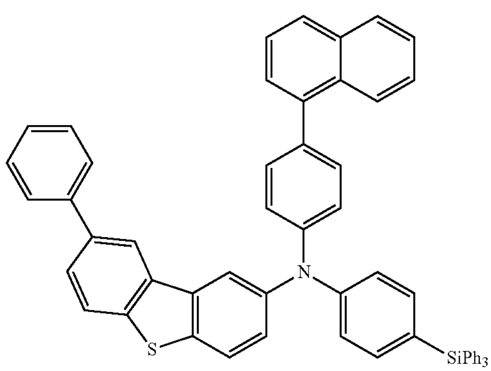
A132
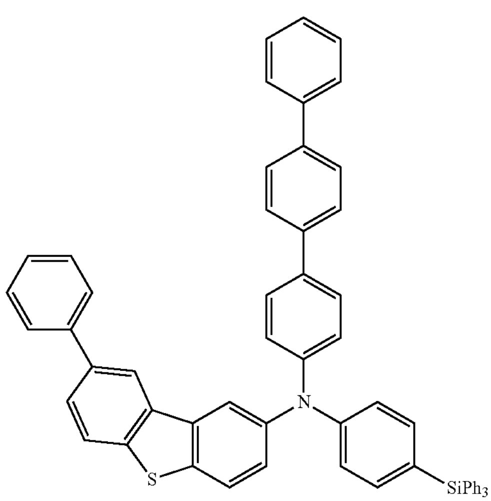
-continued
A133
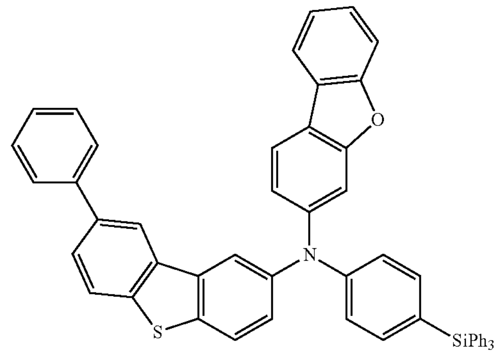
A134
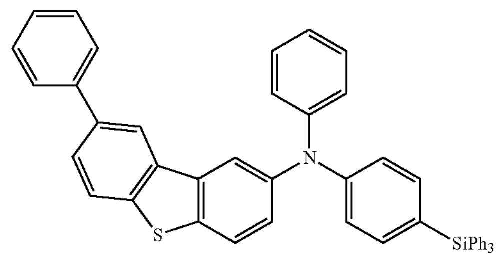
A135
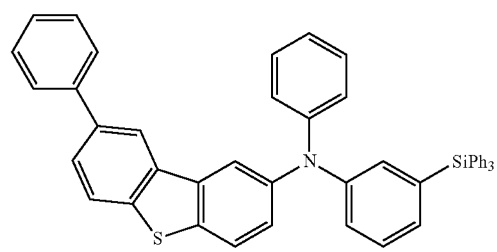
A136
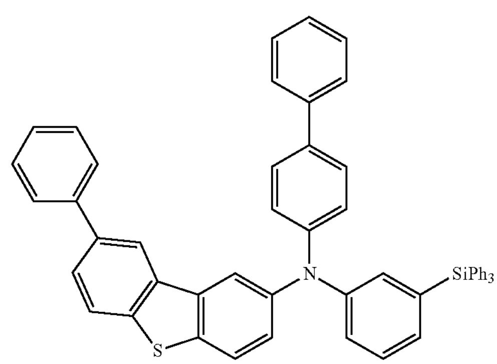
A137
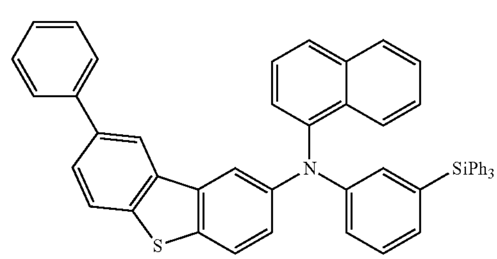

-continued
A138
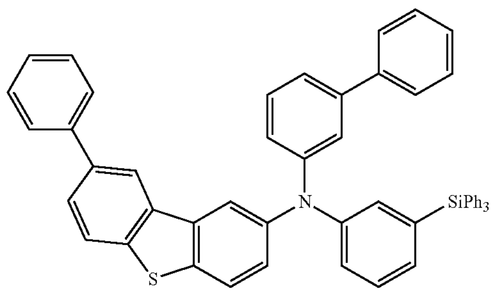
A139
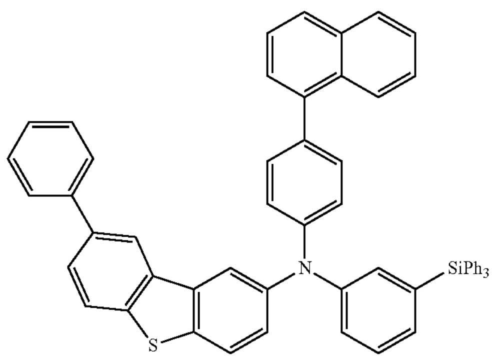
A140
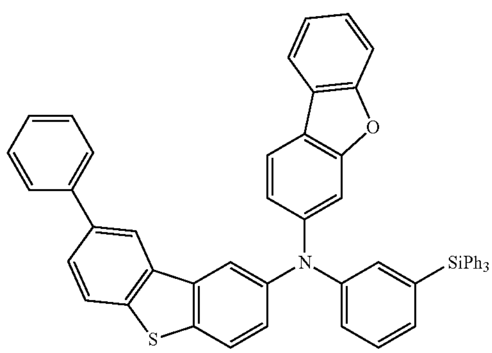
A141
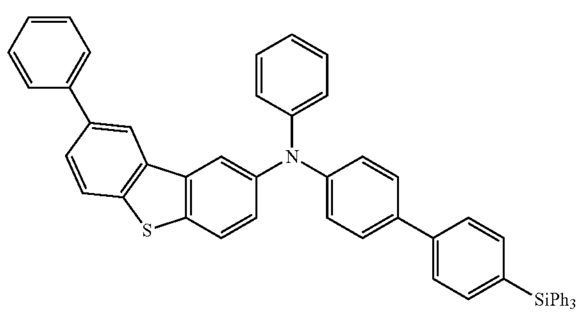
-continued
A142
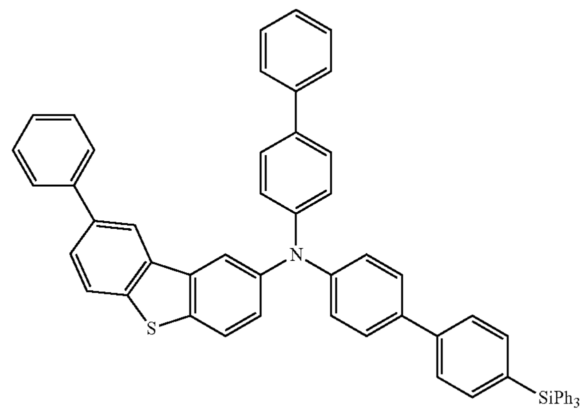
A143
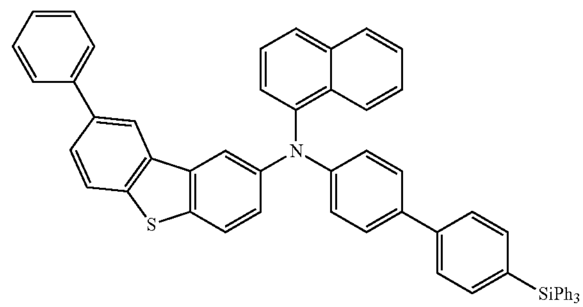
A144
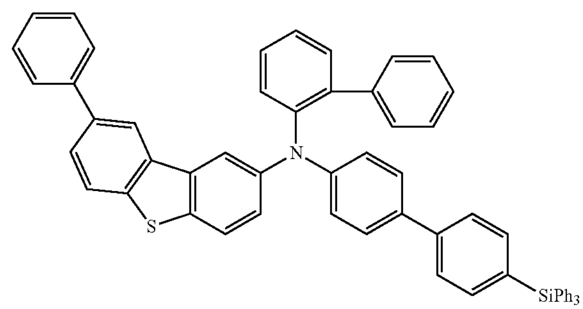
A145
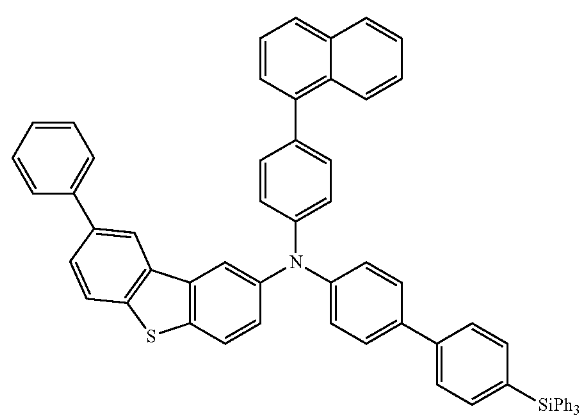

A146
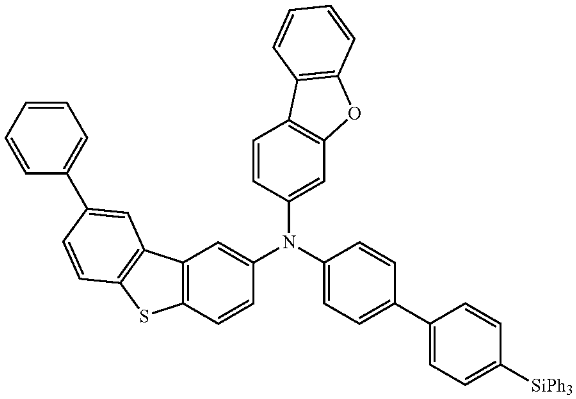
A147
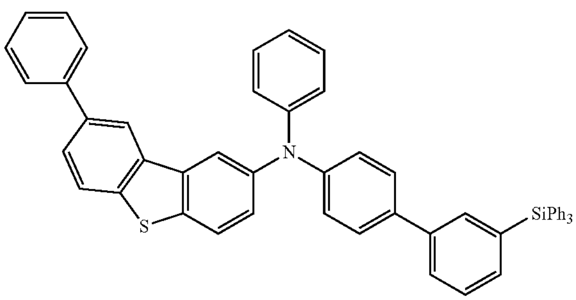
A148
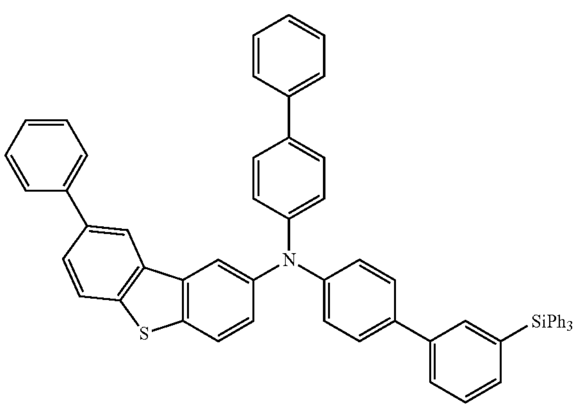
A149
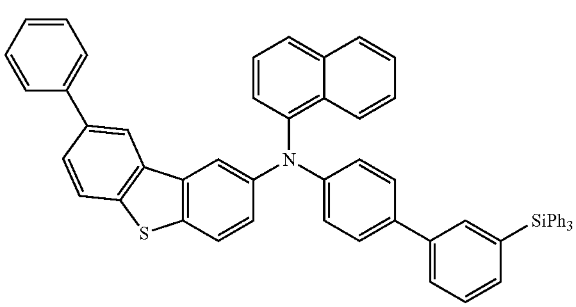
A150
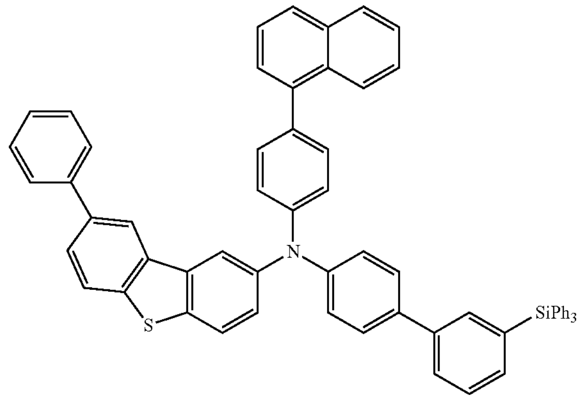
A151
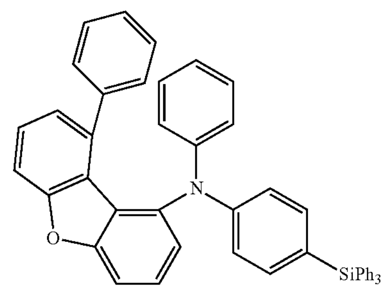
A152
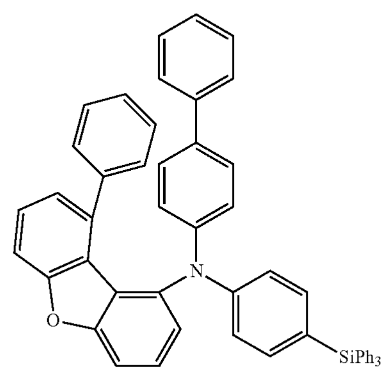
A153
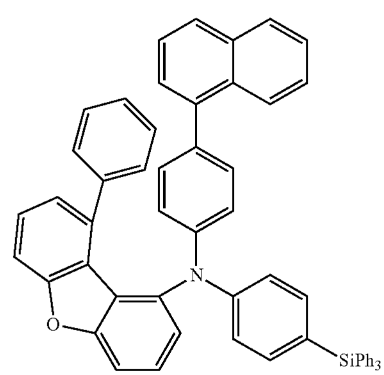

-continued
A154
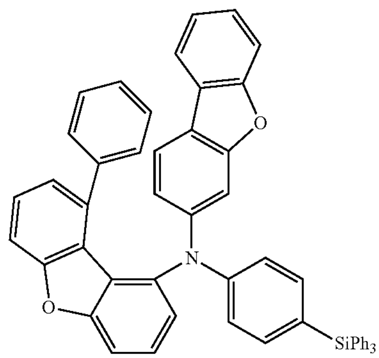
A155
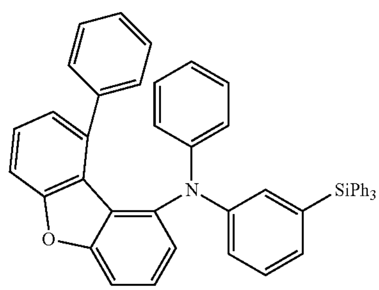
A156
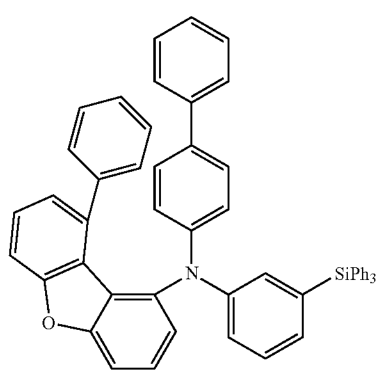
A157
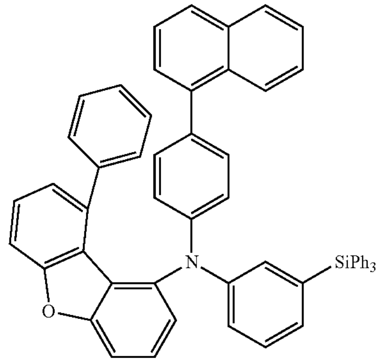
-continued
A158
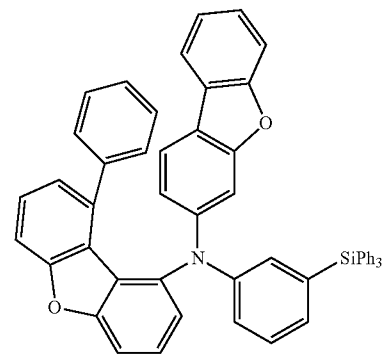
A159
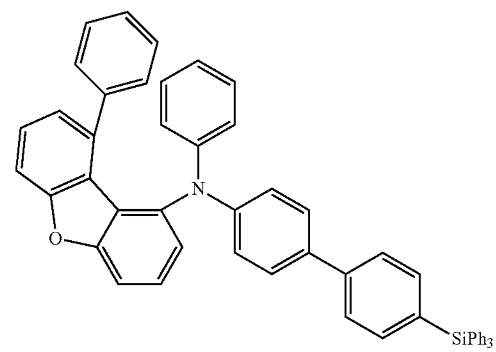
A160
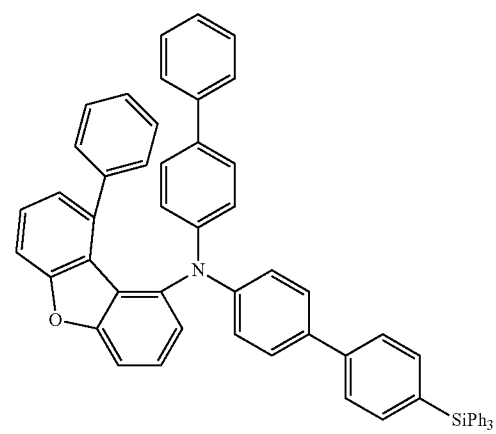
A161
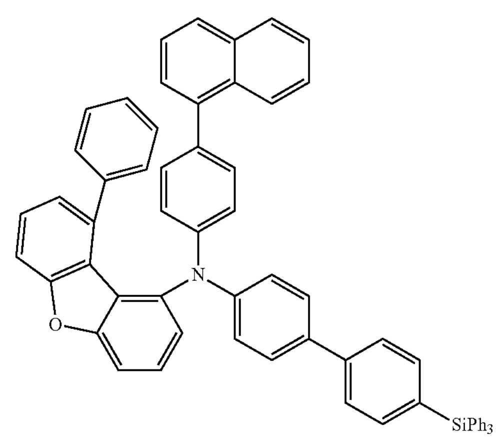

-continued
A162
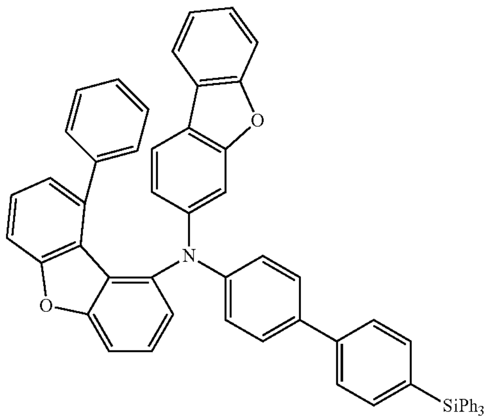
A163
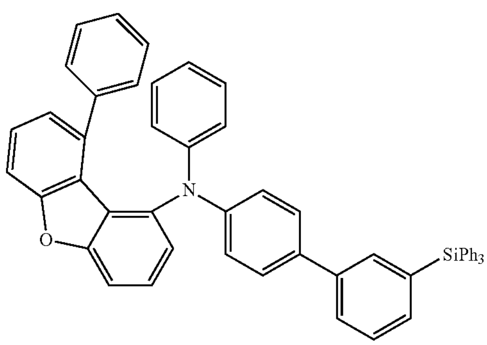
A164
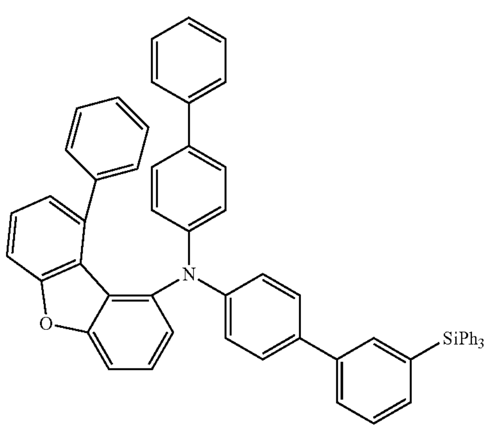
A165
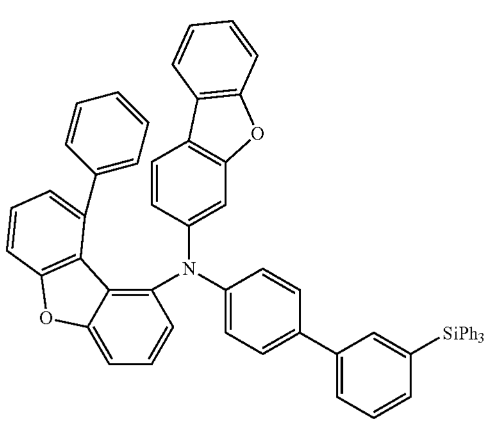
-continued
A166
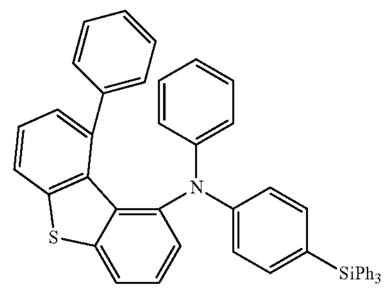
A167
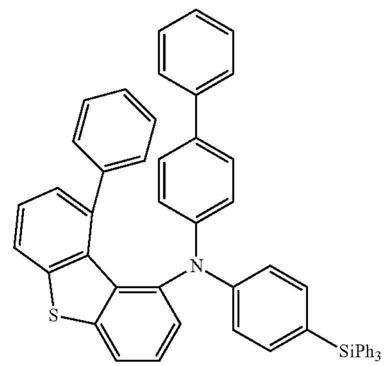
A168
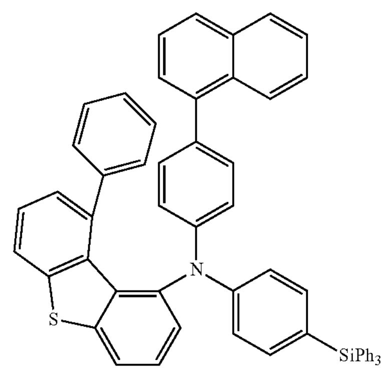
A169
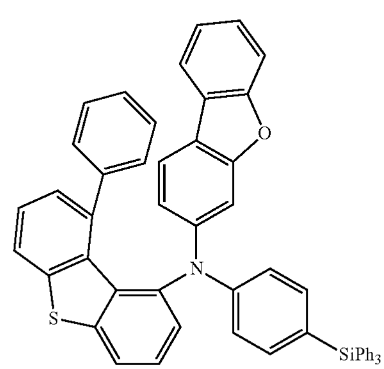

A170
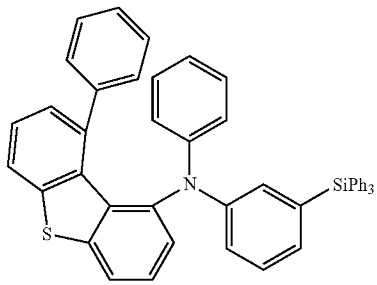
A171
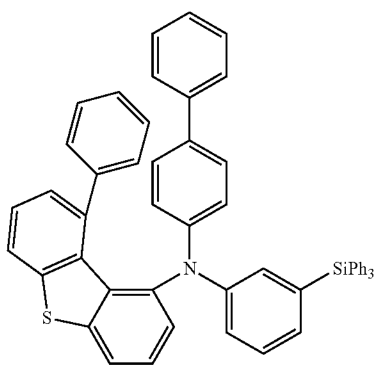
A172
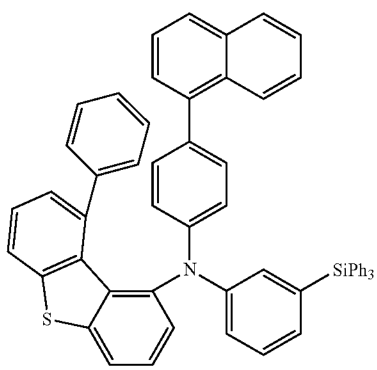
A173
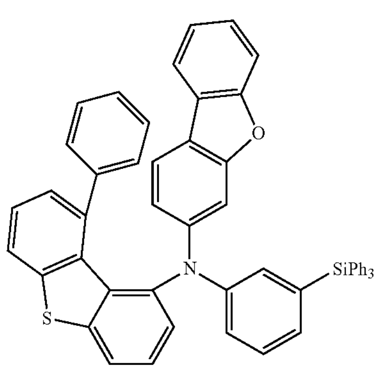
A174
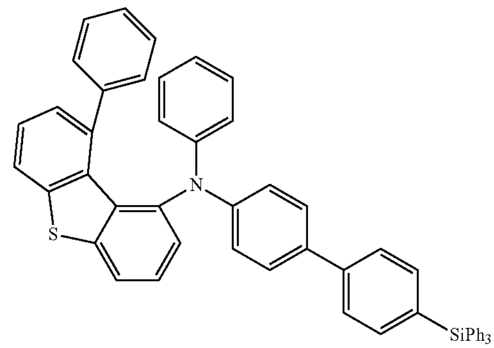
A175
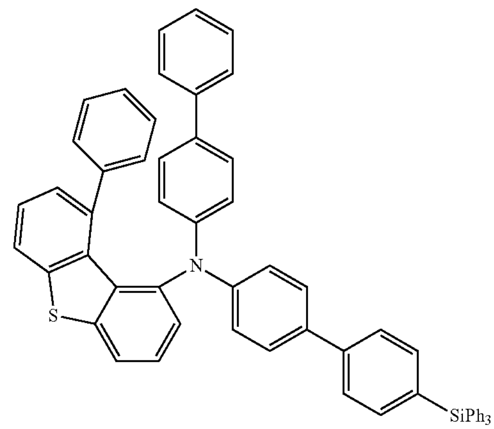
A176
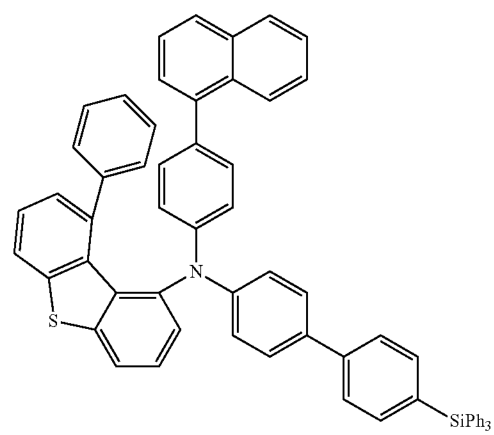
A177
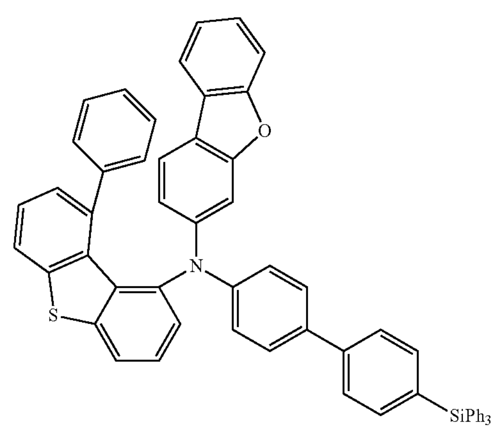

-continued
A178
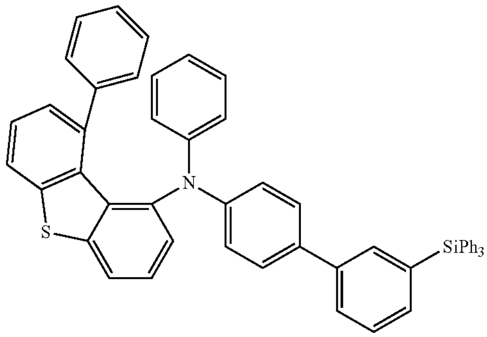
A179
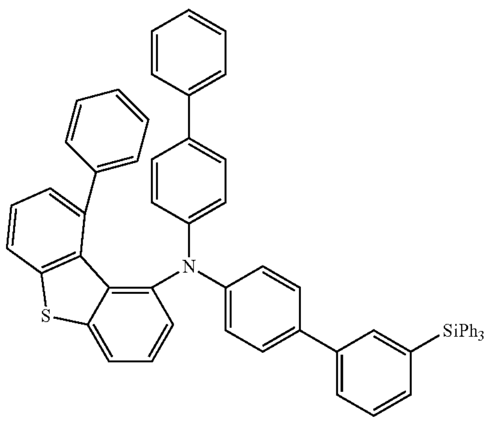
A180
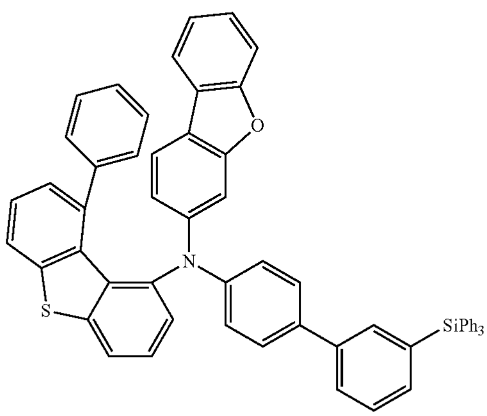
A181
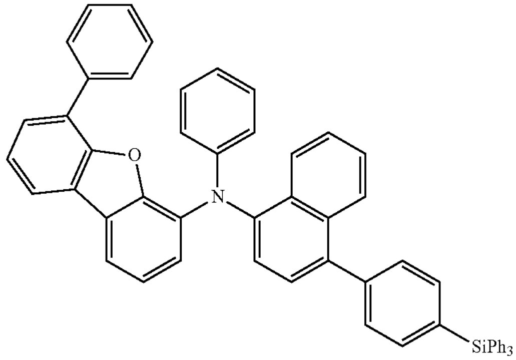
A182
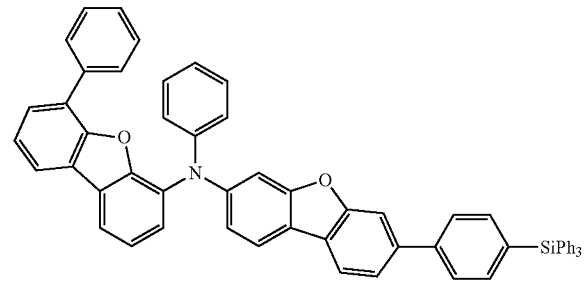
A183
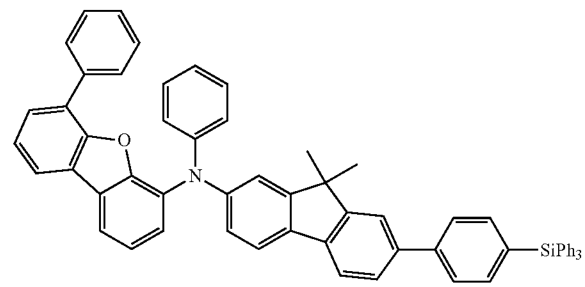
A184
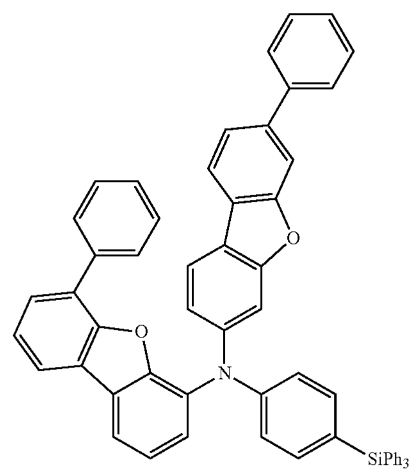
A185
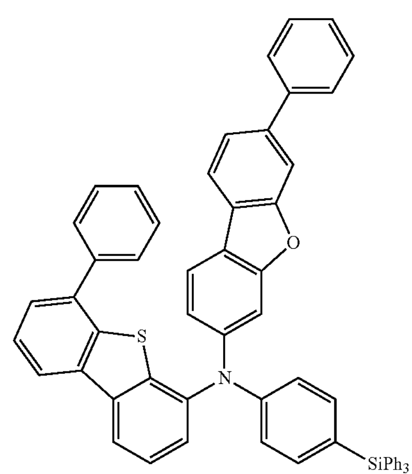

A186
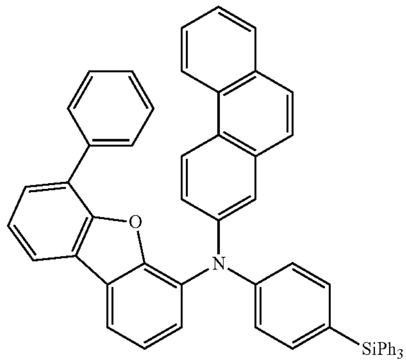
A187
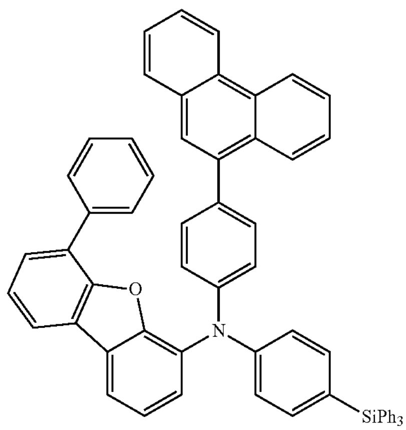
A188
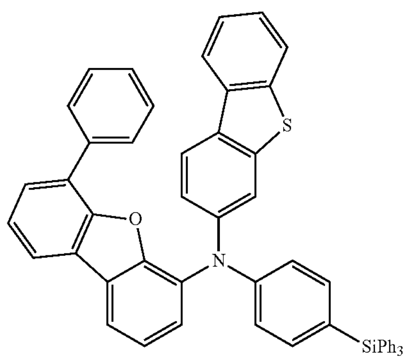
A189
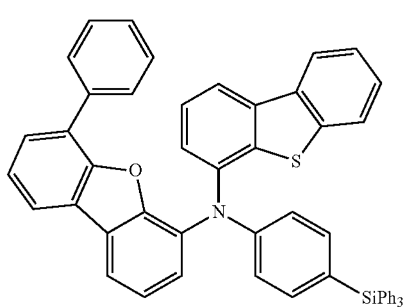
A190
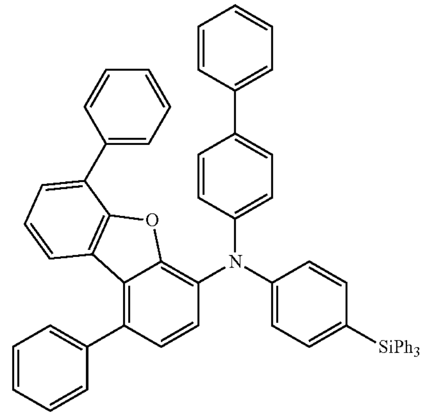
A191
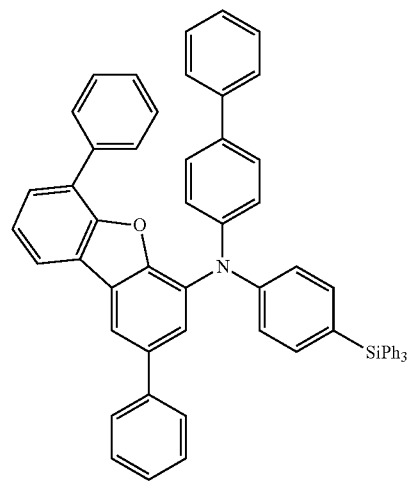
A192
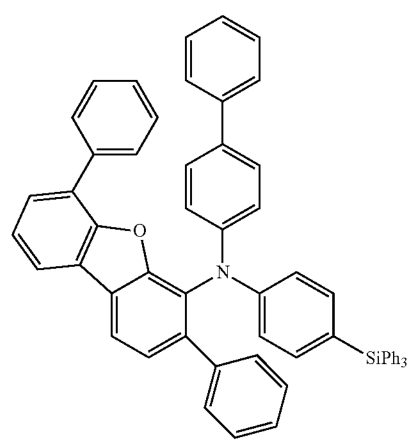

-continued
A193
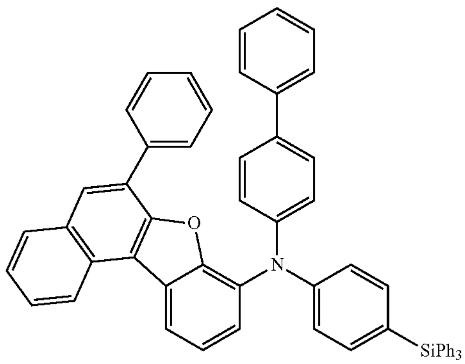
A194
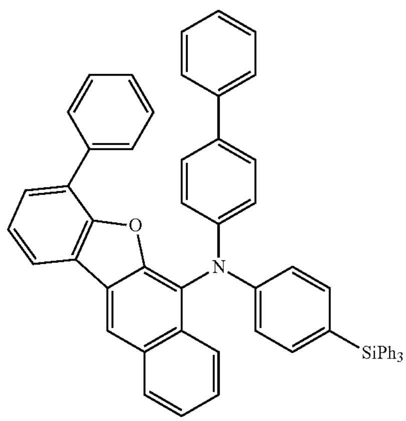
A195
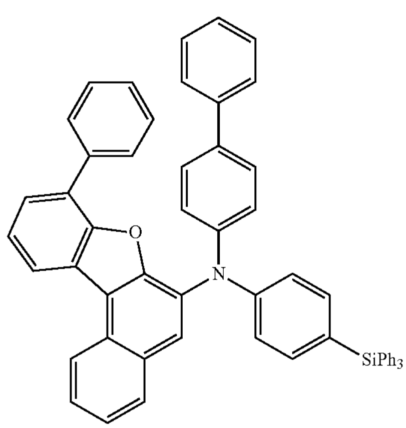
-continued
A196
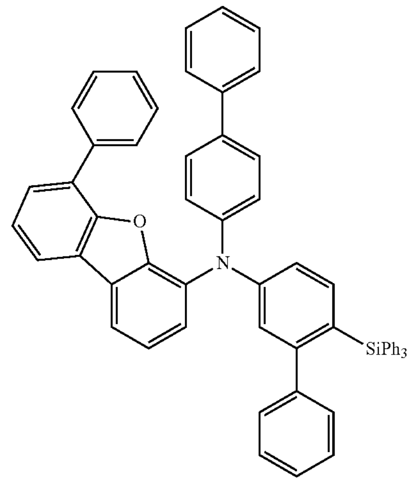
A197
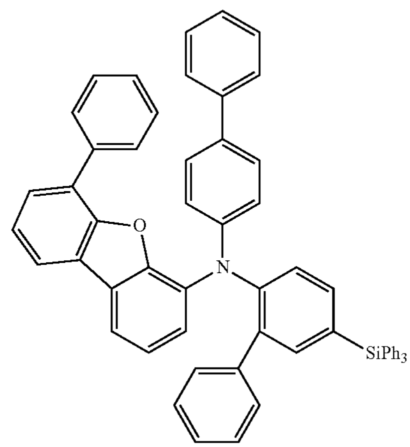
A198
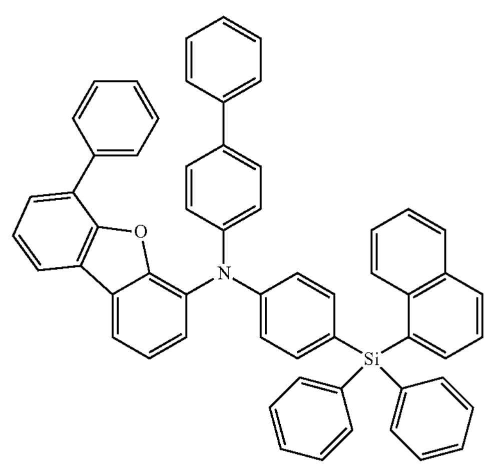

-continued
A199
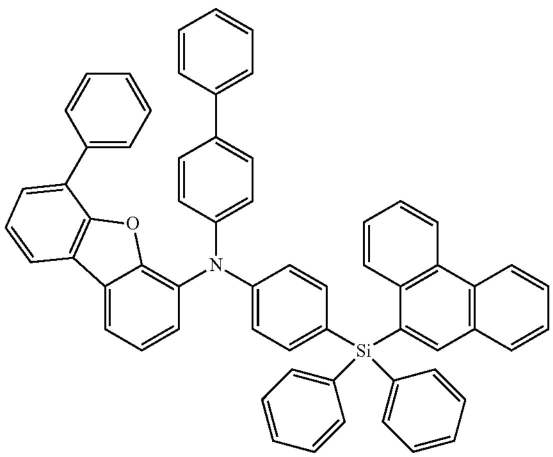
A200
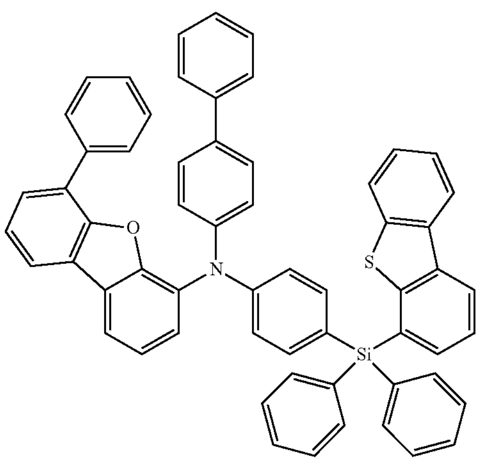
A201
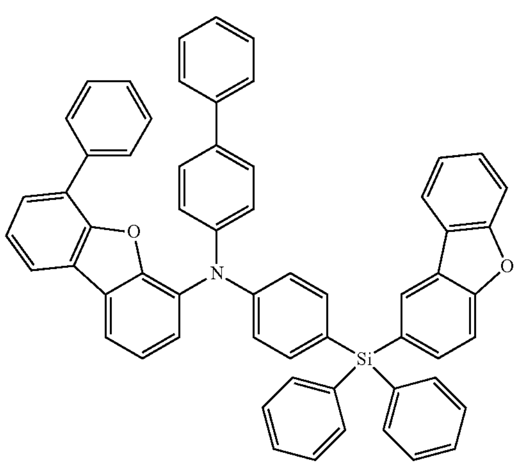
-continued
A202
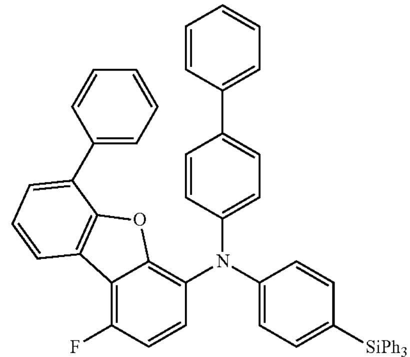
A203
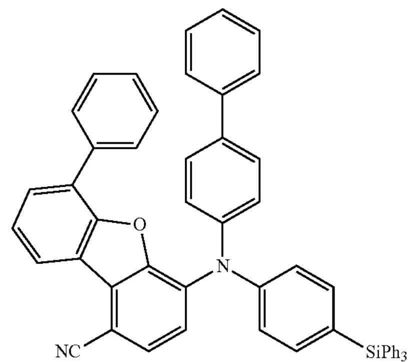
A204
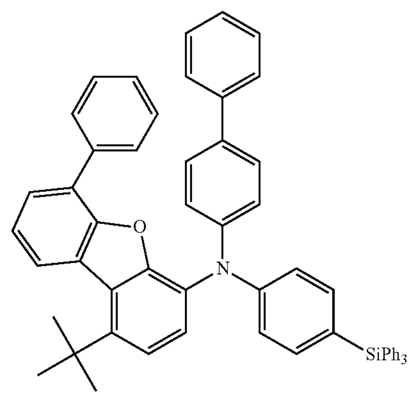
A205
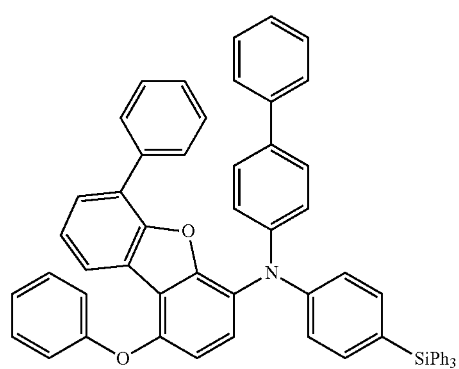

-continued

A206

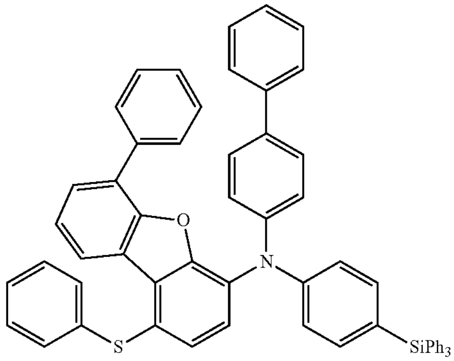

A207

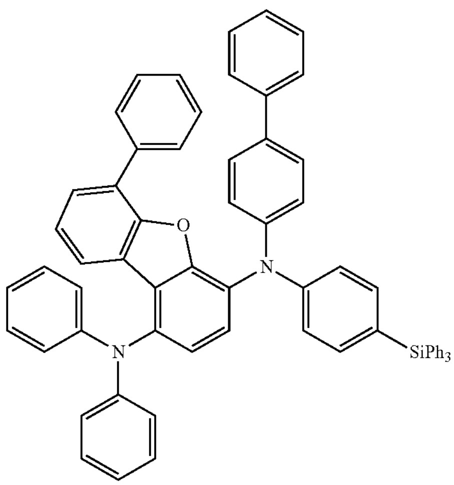

A208

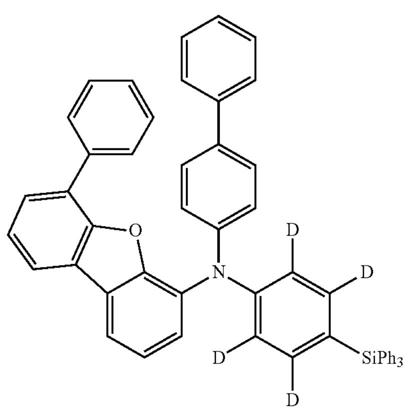

-continued

A209

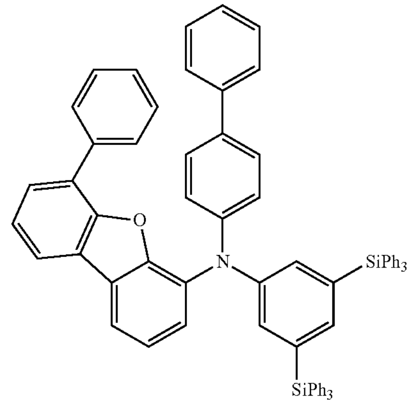

In addition, the amine compound of an embodiment, represented by Formula 1 may be any one selected from the compounds represented in Compound Group 2 below. The compounds represented in Compound Group 2 represent compounds of Formula 1 where Y is C. For example, the compounds represented in Compound Group 2 may represent particular examples of the amine compound represented by Formula 1-2. However, an embodiment of the inventive concept is not limited thereto.

[Compound Group 2]

B1

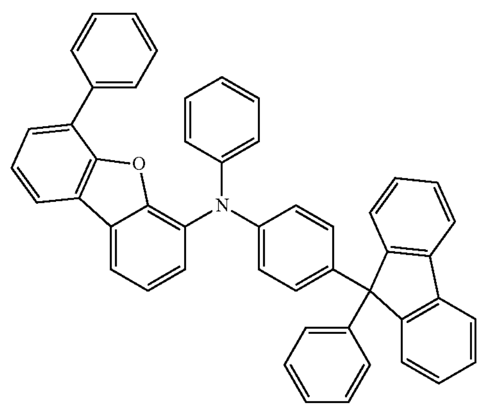

B2

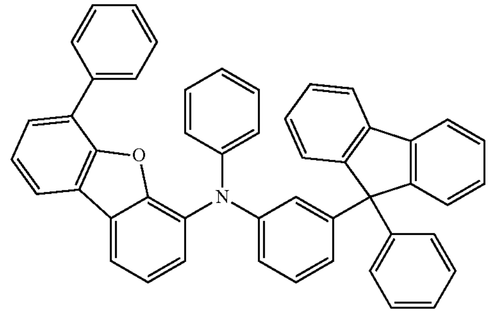

-continued
B3
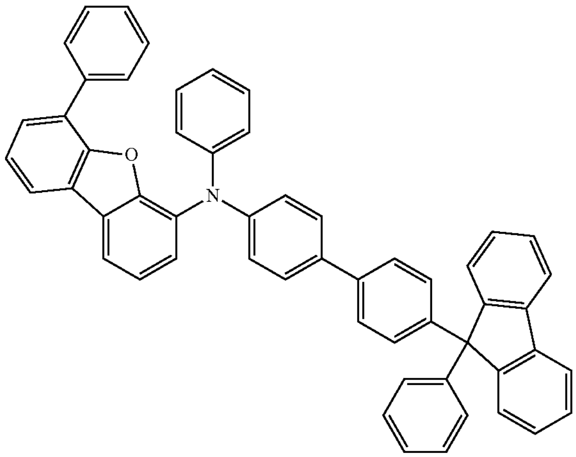
B4
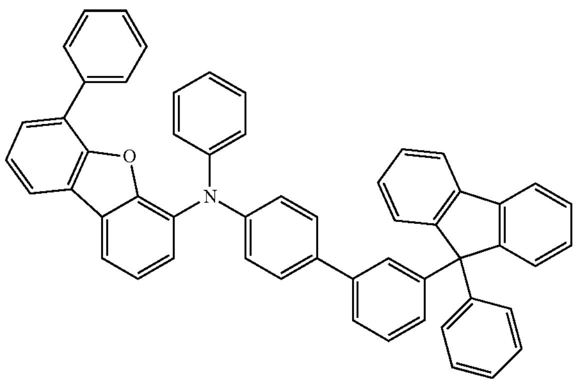
B5
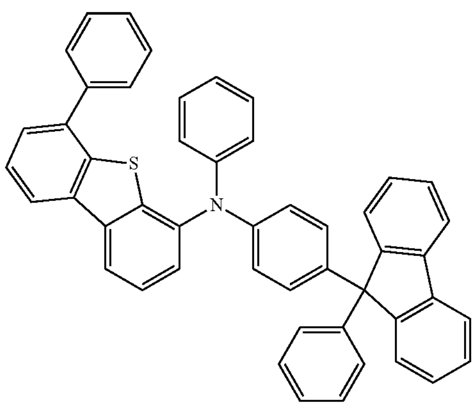
B6
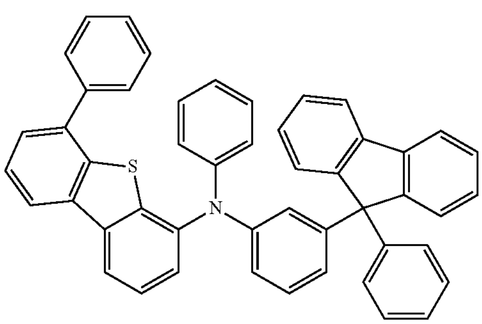
-continued
B7
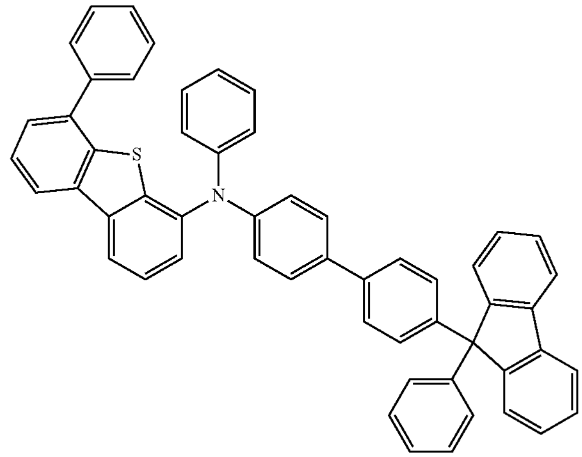
B8
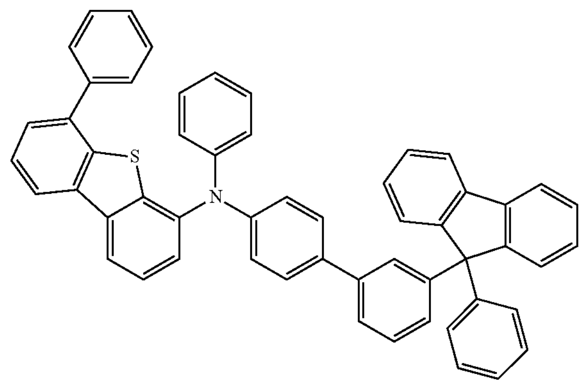
B9
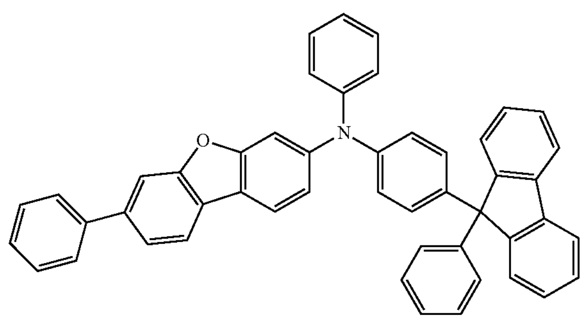
B10
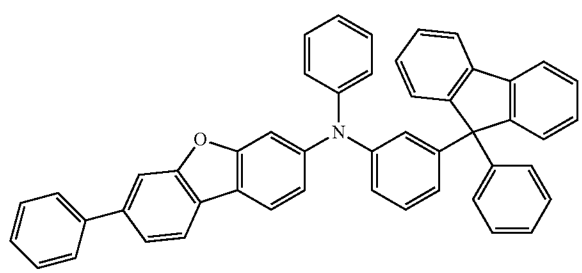

-continued
B11
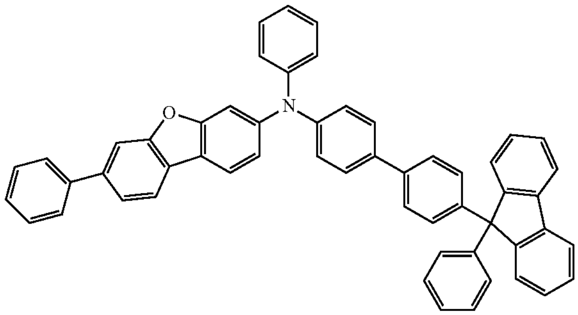
B12
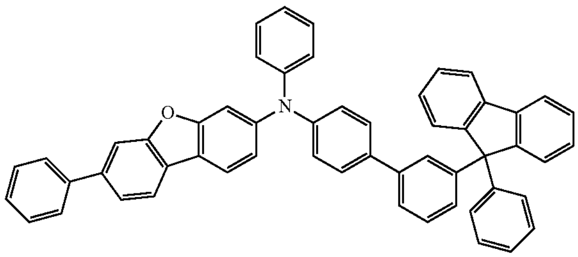
B13
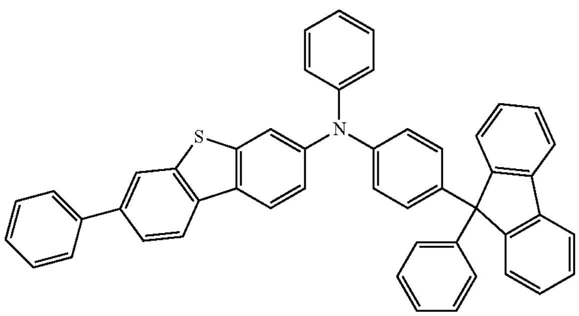
B14
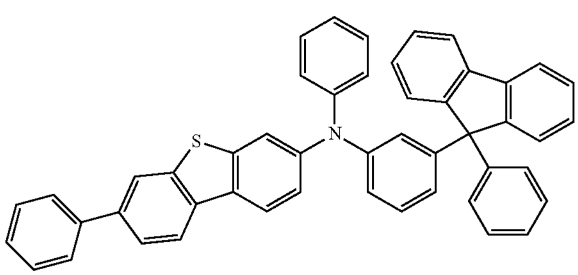
B15
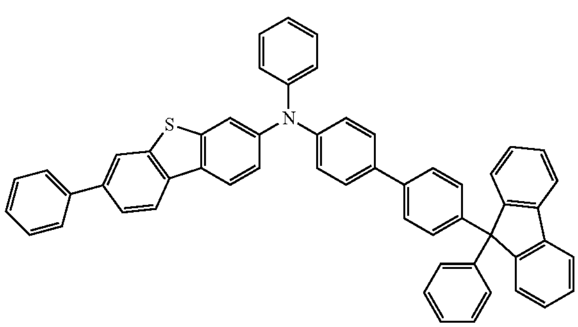
-continued
B16
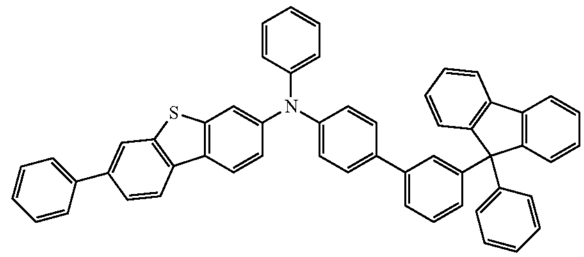
B17
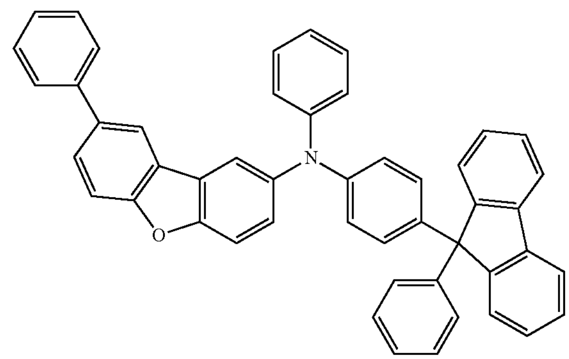
B18
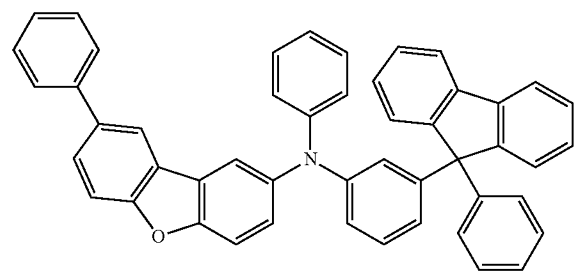
B19
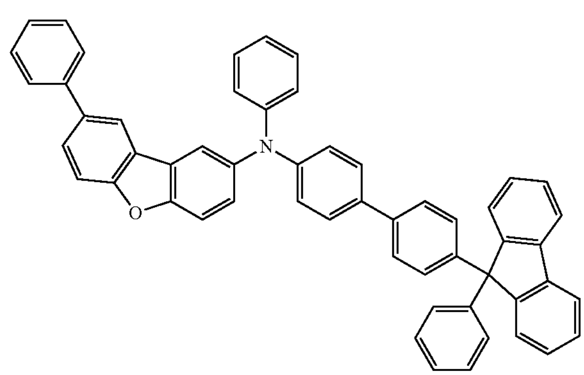

B20
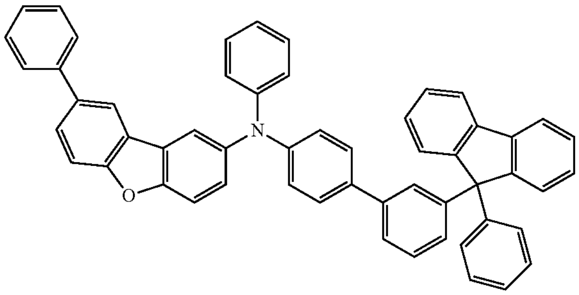
B21
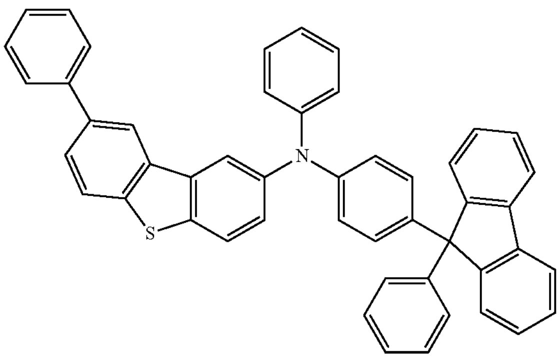
B22
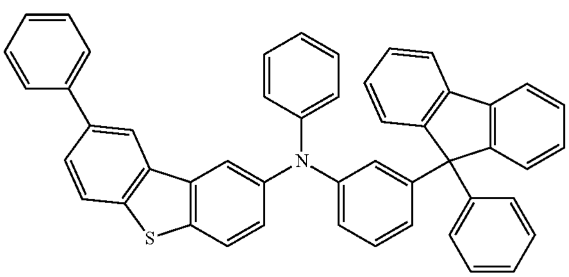
B23
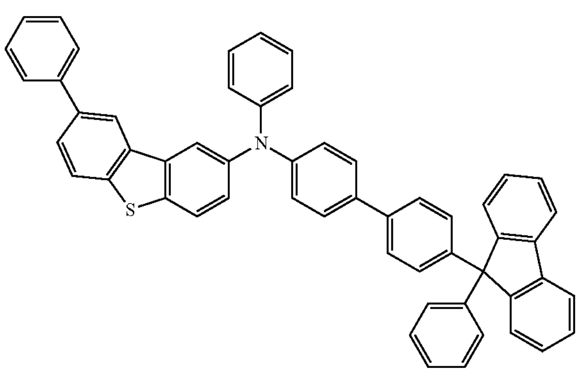
B24
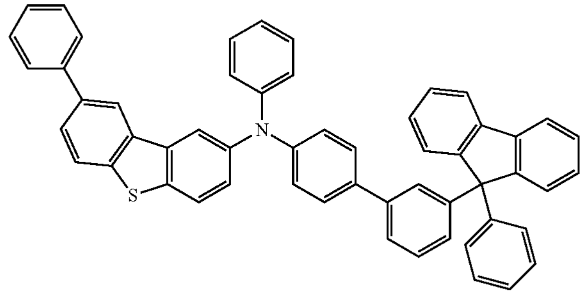
B25
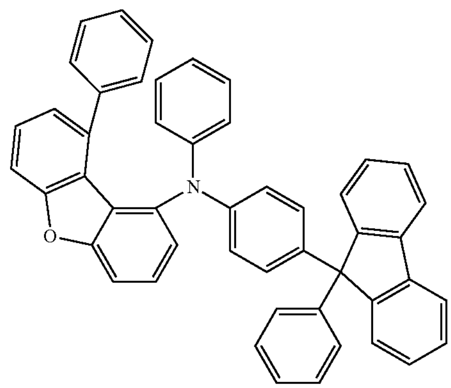
B26
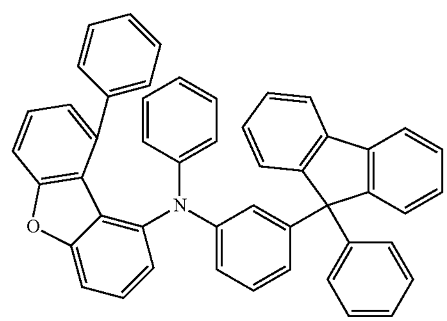
B27
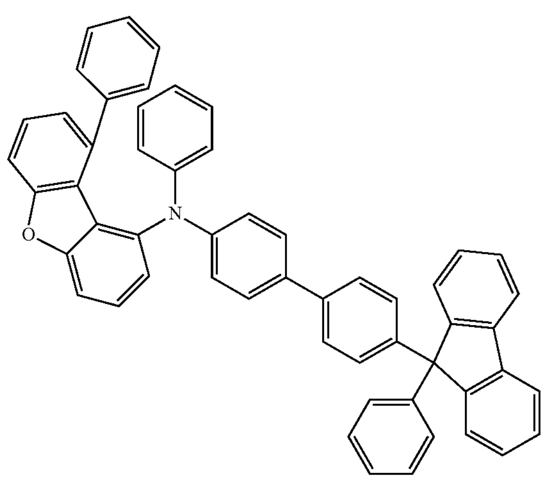

-continued
B28
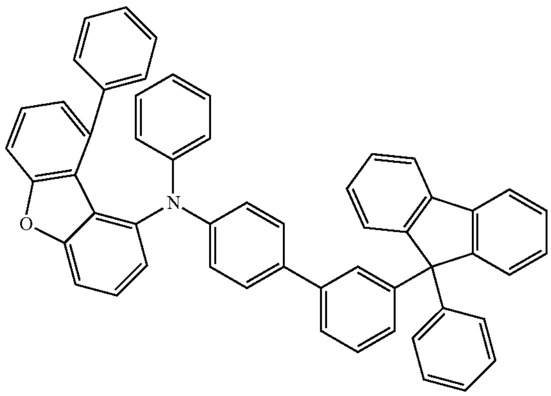
B29
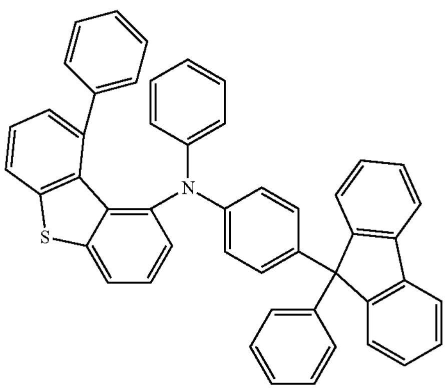
B30
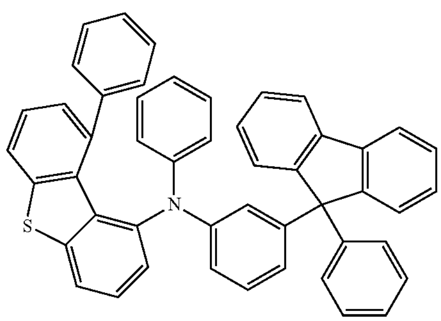
B31
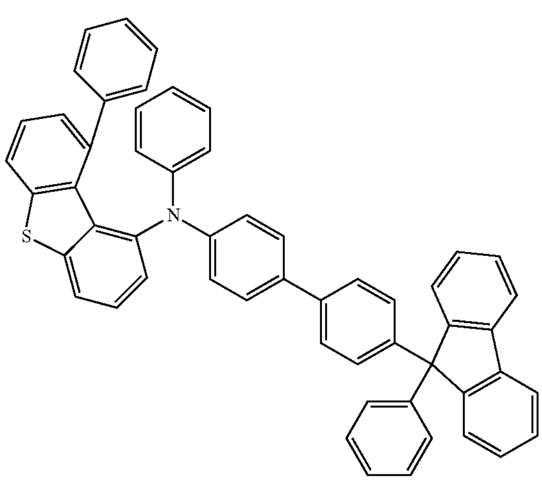
-continued
B32
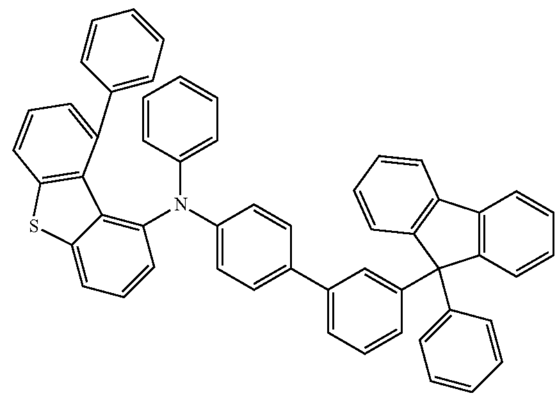
B33
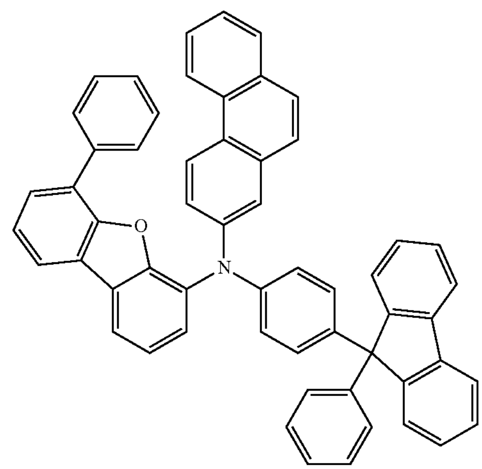
B34
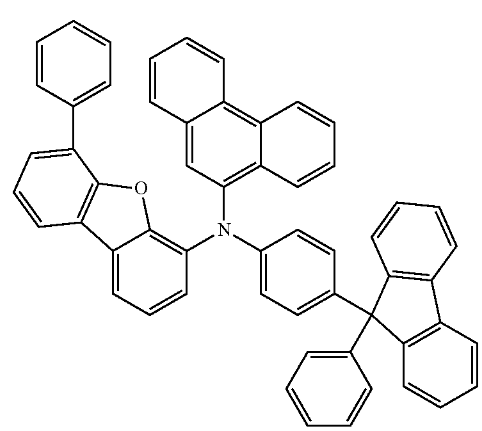

B35
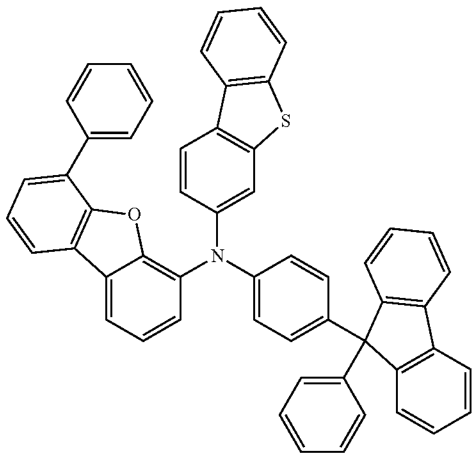
B36
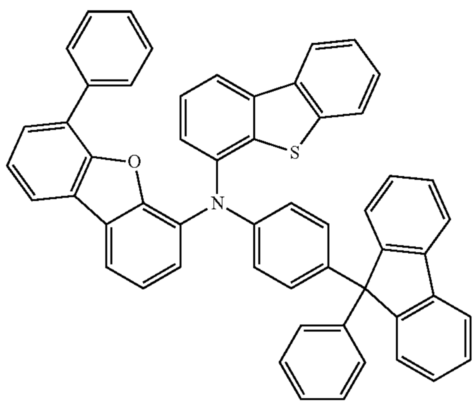
B37
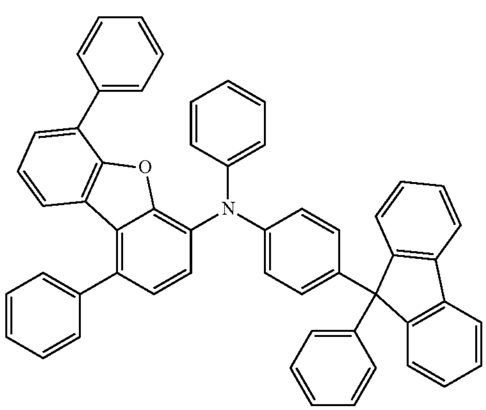
B38
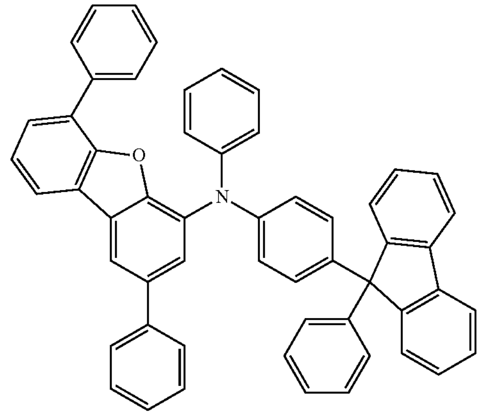
B39
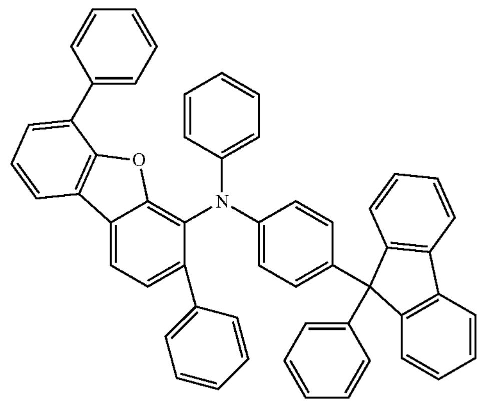
B40
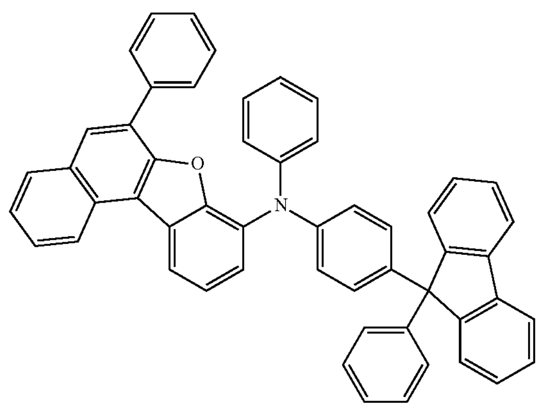
B41
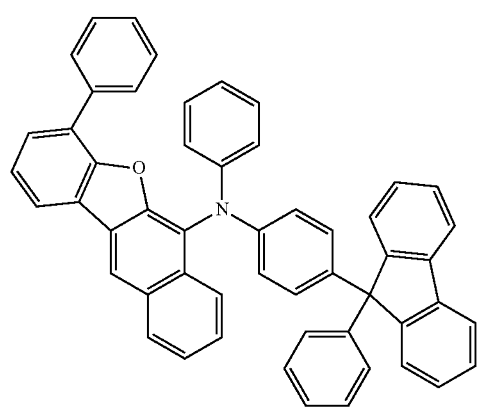

-continued
B42
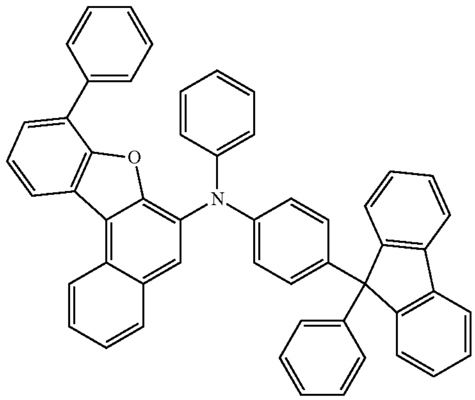
B43
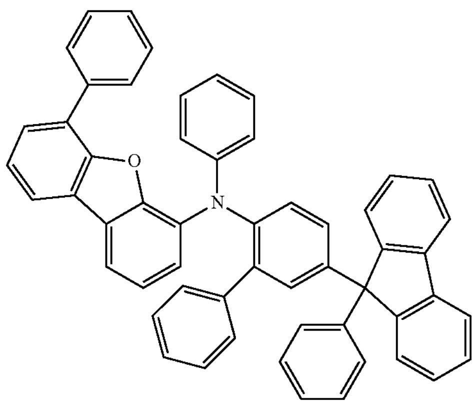
B44
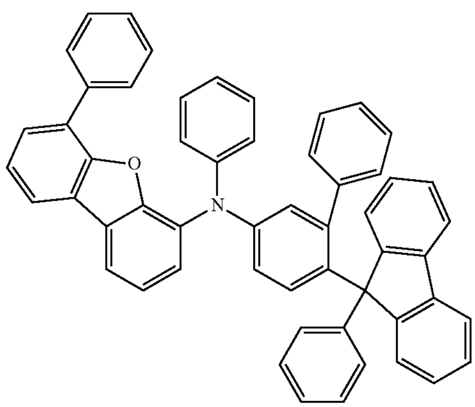
B45
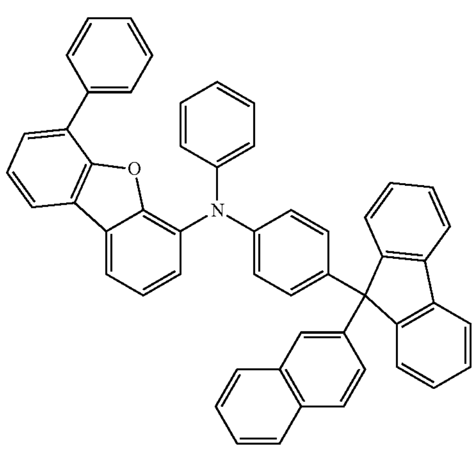
-continued
B46
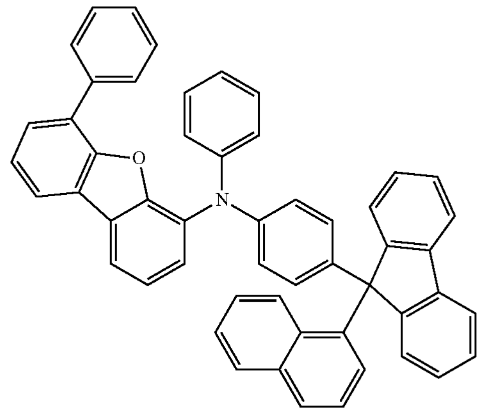
B47
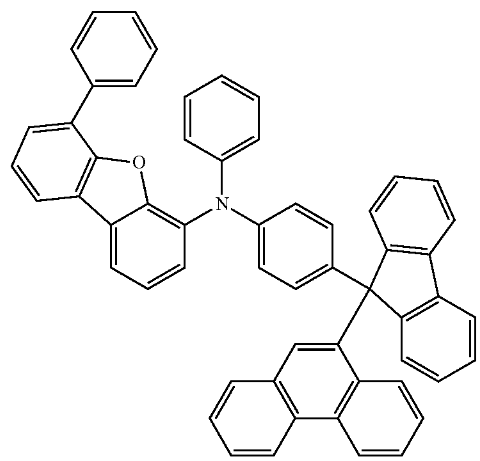
B48
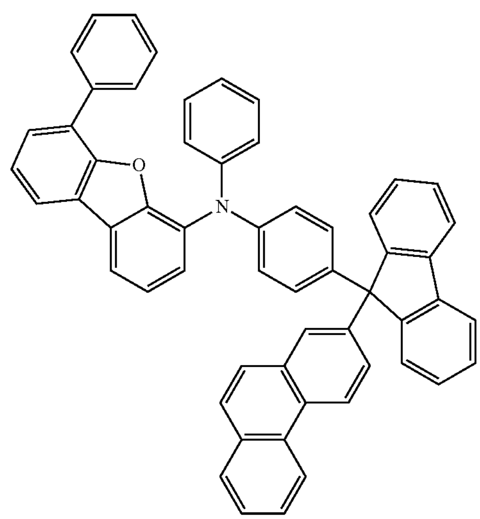

-continued
B49
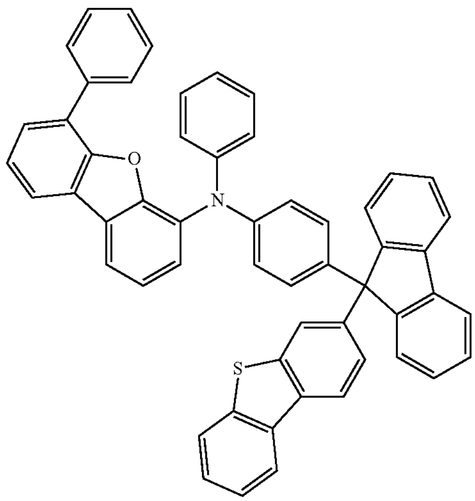
B50
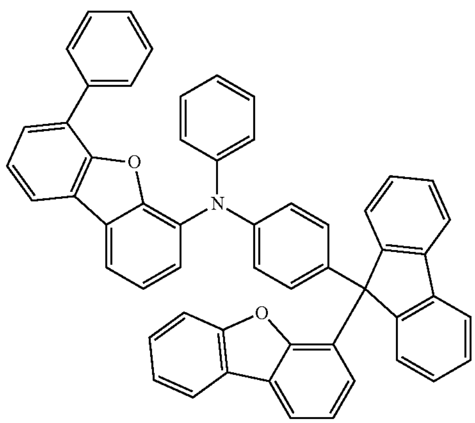
B51
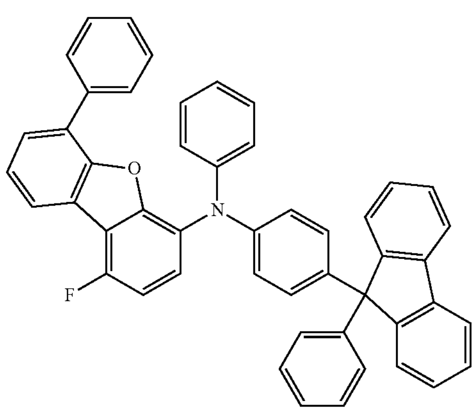
-continued
B52
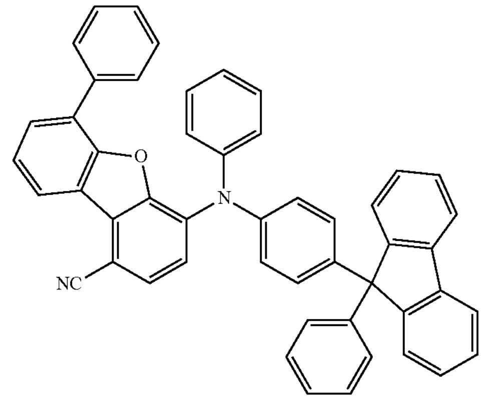
B53
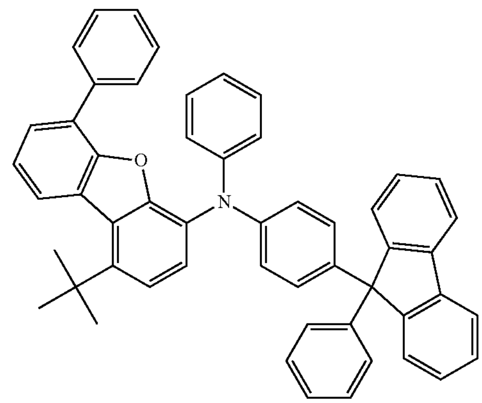
B54
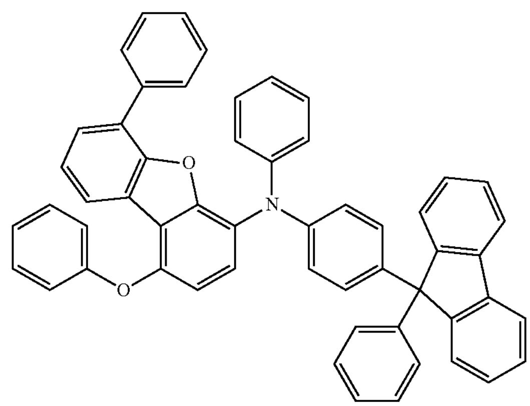
B55
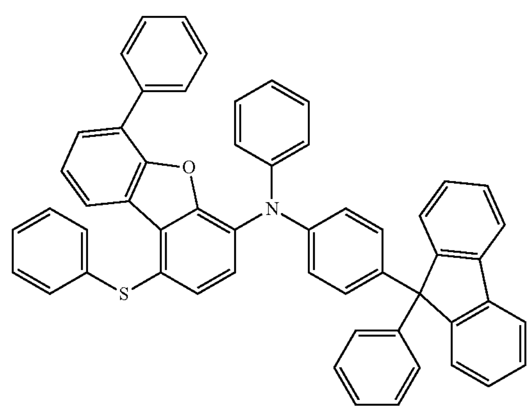

B56
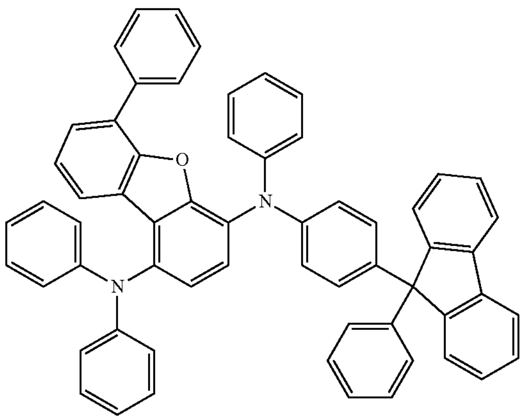
B57
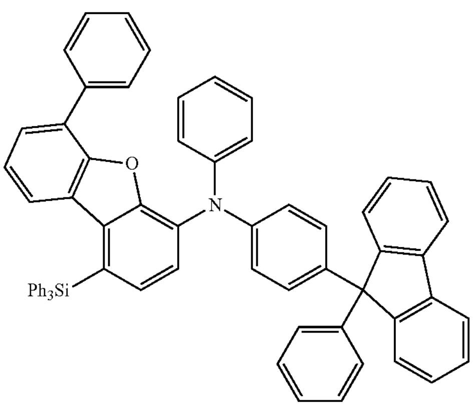
B58
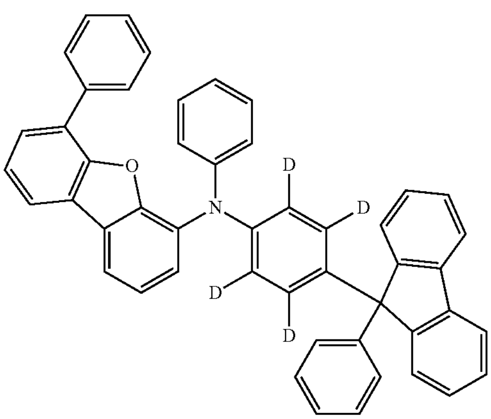
B59
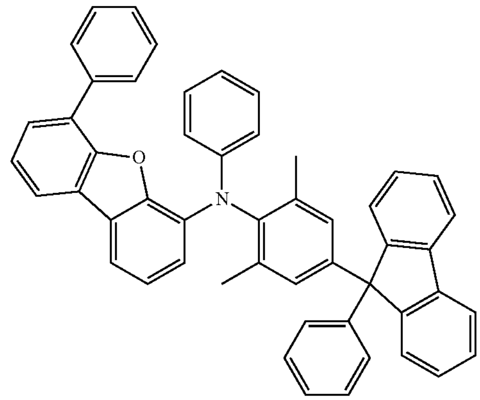
B60
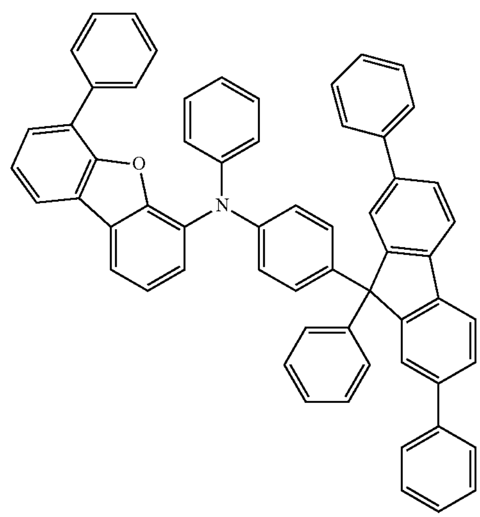
B61
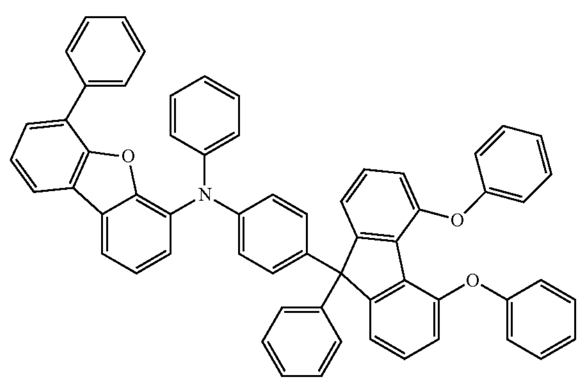

-continued

B62

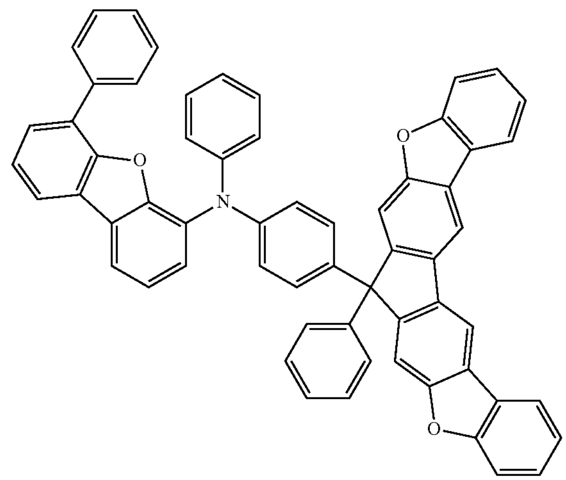

The amine compound of an embodiment may be used as a material for an organic electroluminescence device and may improve the emission efficiency of the organic electroluminescence device. The amine compound of an embodiment may have high lowest triplet excitation energy (T1). Since the amine compound of an embodiment has a high lowest triplet excitation energy value, the diffusion of triplet excitons produced in an emission layer to a hole transport region may be restrained and the emission efficiency of an organic electroluminescence device may be improved.

The amine compound of an embodiment may be used as a hole transport material of an organic electroluminescence device and may improve the emission efficiency and external quantum efficiency of the organic electroluminescence device.

Hereinafter, an organic electroluminescence device according to an embodiment of the inventive concept will be explained. Hereinafter, the above-described amine compound according to an embodiment of the inventive concept will not be explained in particular, and unexplained parts will follow the above explanation on the amine compound according to an embodiment of the inventive concept.

Figure 2:
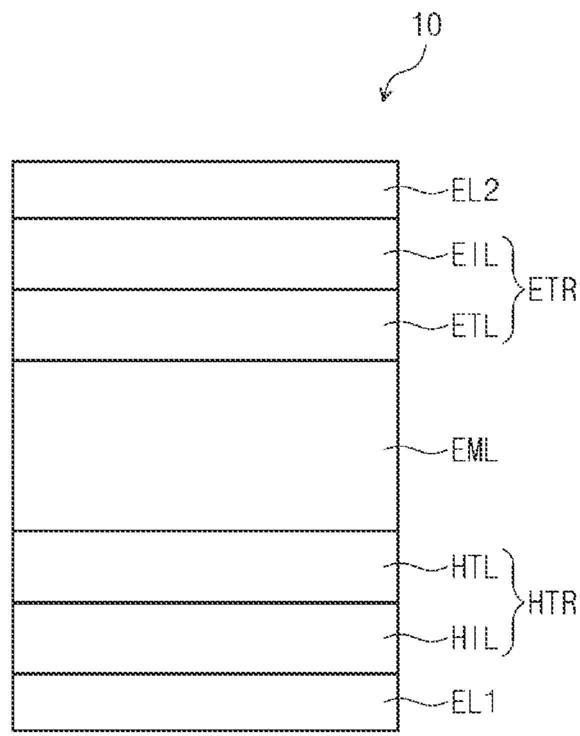
FIG. 2 is a cross-sectional view schematically illustrating an organic electroluminescence device according to an embodiment of the inventive concept.

FIGS. 1 and 2 are cross-sectional views schematically illustrating organic electroluminescence devices according to exemplary embodiments of the inventive concept. Referring to FIGS. 1 and 2, an organic electroluminescence device 10 according to an embodiment may include a first electrode EL1, a hole transport region HTR, an emission layer EML, an electron transport region ETR, and a second electrode EL2 laminated in order. Meanwhile, when compared with FIG. 1, FIG. 2 shows a cross-sectional view of an organic electroluminescence device of an embodiment, wherein a hole transport region HTR includes a hole injection layer HIL and a hole transport layer HTL, and an electron transport region ETR includes an electron injection layer EIL and an electron transport layer ETL.

The first electrode EL1 and the second electrode EL2 are oppositely disposed from each other, and a plurality of organic layers may be disposed between the first electrode EL1 and the second electrode EL2. The plurality of the organic layers may include the hole transport region HTR, the emission layer EML, and the electron transport region ETR.

The organic electroluminescence device 10 of an embodiment may include the amine compound of an embodiment in the hole transport region HTR.

The first electrode EL1 has conductivity. The first electrode EL1 may be formed using a metal alloy or a conductive compound. The first electrode EL1 may be an anode.

The first electrode EL1 may be a transmissive electrode, a transflective electrode, or a reflective electrode. If the first electrode EL1 is the transmissive electrode, the first electrode EL1 may be formed using a transparent metal oxide such as indium tin oxide (ITO), indium zinc oxide (IZO), zinc oxide (ZnO), and indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may have a structure of a plurality of layers including a reflective layer, or a transflective layer formed using the above materials, and a transmissive conductive layer formed using ITO, IZO, ZnO, or ITZO.

Hereinafter, a case where the amine compound of an embodiment is included in the hole transport region HTR will be explained. However, an embodiment of the inventive concept is not limited thereto. The amine compound according to an embodiment of the inventive concept may be included in at least one layer of one or more organic layers provided between the first electrode EL1 and the second electrode EL2. For example, the amine compound according to an embodiment of the inventive concept may be included in a hole transport layer HTL. Preferably, the amine compound according to an embodiment of the inventive concept may be included in at least one layer among a first hole transport layer HTL1 or a second hole transport layer HTL2. Particularly, the amine compound may be included in both the first hole transport layer HTL1 and the second hole transport layer HTL2, or one layer among the first hole transport layer HTL1 and the second hole transport layer HTL2.

The organic electroluminescence device 10 of an embodiment may include the amine compound of an embodiment in a hole transport region HTR. Particularly, the organic electroluminescence device 10 according to an embodiment of the inventive concept may include an amine compound represented by the following Formula 1 in a hole transport region HTR:

[Formula 1]

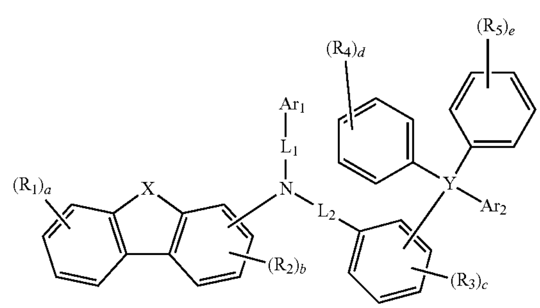

In Formula 1, X may be O or S.

Y may be C or Si.

$Ar_1$ and $Ar_2$ may be each independently a substituted or unsubstituted alkyl group having 1 to 50 carbon atoms, a substituted or unsubstituted aryl group having 6 to 50 carbon atoms for forming a ring, or a substituted or unsubstituted heteroaryl group having 2 to 50 carbon atoms for forming a ring, which includes 0 or S as a heteroatom.

$L_1$ and $L_2$ may be each independently a direct linkage, a substituted or unsubstituted arylene group having 6 to 30 carbon atoms for forming a ring, or a substituted or unsubstituted heteroarylene group having 2 to 30 carbon atoms for forming a ring.

$R_1$ may be a substituted or unsubstituted aryl group having 6 to 50 carbon atoms for forming a ring.

$R_2$ to $R_5$ may be each independently a hydrogen atom, a deuterium atom, a halogen atom, a cyano group, a substituted or unsubstituted silyl group, a substituted or unsubstituted alkyl group having 1 to 10 carbon atoms, a substituted or unsubstituted alkoxy group having 1 to 10 carbon atoms, a substituted or unsubstituted arylthio group having 1 to 10 carbon atoms, a substituted or unsubstituted alkylamino group having 1 to 10 carbon atoms, a substituted or unsubstituted arylamino group having 1 to 20 carbon atoms, a substituted or unsubstituted aryl group having 6 to 50 carbon atoms for forming a ring, or a substituted or unsubstituted heteroaryl group having 2 to 50 carbon atoms for forming a ring, or combined with an adjacent group to form a ring.

"a" may be an integer of 1 to 4, "b" may be an integer of 0 to 3, "c" may be 0 or 1, and "d" and "e" may be each independently an integer of 0 to 5.

In Formula 1, the same explanation on the amine compound of an embodiment may be applied to particular explanation on X, Y, $Ar_1$, $Ar_2$, $L_1$, $L_2$, $R_1$ to $R_5$, and "a" to "e".

The amine compound represented by Formula 1 has high lowest triplet excitation energy (T1). Particularly, the amine compound represented by Formula 1 may have about 3.2 eV or more of the lowest triplet excitation energy (T1).

The hole transport region HTR is provided on the first electrode EL1. The hole transport region HTR may include at least one of a hole injection layer HIL, a hole transport layer HTL, a hole buffer layer, or an electron blocking layer. The thickness of the hole transport region HTR may be, for example, from about 1,000 Å to about 1,500 Å.

The hole transport region HTR may have a single layer formed using a single material, a single layer formed using a plurality of different materials, or a multilayer structure including a plurality of layers formed using a plurality of different materials.

For example, the hole transport region HTR may have the structure of a single layer such as a hole injection layer HIL, or a hole transport layer HTL, and may have a structure of a single layer formed using a hole injection material and a hole transport material. Alternatively, the hole transport region HTR may have a structure of a single layer formed using a plurality of different materials, or a structure laminated from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer, without limitation.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR may include the amine compound according to an embodiment of the inventive concept. The hole transport region HTR may include the amine compound according to an embodiment of the inventive concept as a hole transport material.

A layer including the amine compound according to an embodiment of the inventive concept may be a layer adjacent to an emission layer EML. Particularly, as shown in FIG. 2, if a hole transport layer HTL in the hole transport region HTR is adjacent to the emission layer EML, the hole transport layer HTL may include the amine compound according to an embodiment of the inventive concept.

The hole transport layer HTL may include one or two or more kinds of the amine compounds represented by Formula 1. The hole transport layer HTL may further include a known material in addition to the amine compound represented by Formula 1.

If the hole transport layer HTL includes the amine compound according to an embodiment of the inventive concept, a hole injection layer HIL may include a known hole injection material. The known hole injection material included in the hole injection layer HIL may include, for example, triphenylamine-containing polyetherketone (TPAPEK), 4-isopropyl-4'-methyldiphenyliodoniumtetrakis(pentafluorophenyl)borate (PPBL), N,N'-diphenyl-N,N'-bis-[4-(phenyl-m-tolyl-amino)-phenyl]-phenyl-4,4'-diamine (DNTPD), a phthalocyanine compound such as copper phthalocyanine, 4,4',4"-tris(3-methylphenylphenylamino) triphenylamine (m-MTDATA), N,N'-di(1-naphthyl)-N,N'-diphenylbenzidine (NPB), 4,4',4"-tris(N,N-diphenylamino) triphenylamine (TDATA), 4,4',4"-tris{N-(1-naphthyl)-N-phenylamino}triphenylamine (1-TNATA), 4,4',4"-tris(N,N-2-naphthyphenylamino)triphenylamine (2-TNATA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), or polyaniline/poly(4-styrenesulfonate) (PANI/PSS). However, an embodiment of the inventive concept is not limited thereto.

As described above, the hole transport layer HTL may further include a known compound other than the amine compound according to an embodiment of the inventive concept. In this case, the known hole transport material may include, for example, 1,1-bis[(di-4-trileamino)phenyl]cyclohexane (TAPC), carbazole derivatives such as N-phenyl carbazole and polyvinyl carbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), N,N'-di(1-naphtyl)-N,N'-diphenylbenzidine (NPB), etc. However, an embodiment of the inventive concept is not limited thereto.

The thickness of the hole transport region HTR may be from about 100 Å to about 10,000 Å, for example, from about 100 Å to about 1,000 Å. If the hole transport region HTR includes both the hole injection layer HIL and the hole transport layer HTL, the thickness of the hole injection layer HIL may be from about 100 Å to about 1000 Å, and the thickness of the hole transport layer HTL may be from about 30 Å to about 1,000 Å. If the thicknesses of the hole transport region HTR, the hole injection layer HIL, and the hole transport layer HTL satisfy the above-described ranges, satisfactory hole transport properties may be achieved without substantial increase of a driving voltage.

The hole transport region HTR may further include a charge generating material in addition to the above-described materials to increase conductivity. The charge generating material may be dispersed uniformly or non-uniformly in the hole transport region HTR. The charge generating material may be, for example, a p-dopant. The p-dopant may be one of quinone derivatives, metal oxides, or cyano group-containing compounds, without limitation.

For example, non-limiting examples of the p-dopant may include quinone derivatives such as tetracyanoquinodimethane (TCNQ) and 2,3,5,6-tetrafluoro-tetracyanoquinodimethane (F4-TCNQ), metal oxides such as tungsten oxide and molybdenum oxide, without limitation.

As described above, the hole transport region HTR may further include at least one of a hole buffer layer or an electron blocking layer (not shown) in addition to the hole injection layer HIL and the hole transport layer HTL. The hole buffer layer may compensate an optical resonance distance according to the wavelength of light emitted from the emission layer EML and increase light emission efficiency. Materials included in the hole transport region HTR may be used as materials included in the hole buffer layer. The electron blocking layer (not shown) is a layer playing the role of preventing the injection of electrons from the electron transport region ETR to the hole transport region HTR.

For example, in an embodiment, the hole transport region HTR may include a hole injection layer HIL, a hole transport layer HTL and an electron blocking layer (not shown). In addition, in an embodiment, the amine compound represented by Formula 1 may be included in the hole transport layer HTL.

In an organic electroluminescence device 10 of an embodiment, a hole transport region HTR may include one or two or more kinds of the amine compounds represented by Formula 1. For example, an organic electroluminescence device 10 of an embodiment may include at least one of the compounds represented in the following Compound Group 1 or Compound Group 2 in a hole transport region HTR.

[Compound Group 1]

A1

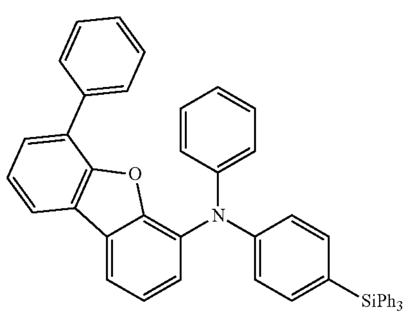

A2

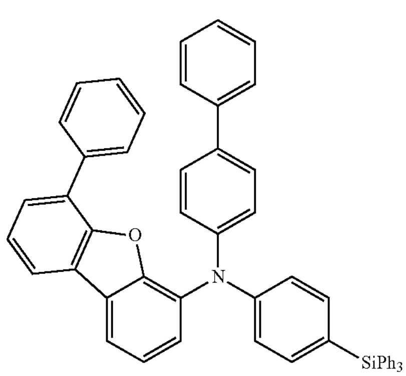

-continued

A3

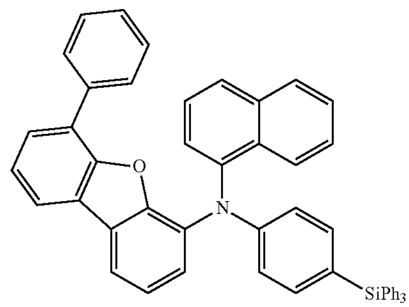

A4

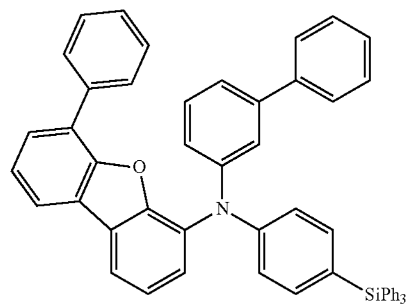

A5

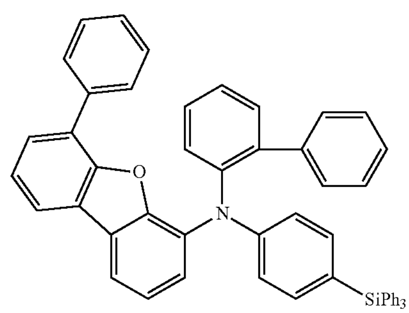

A6

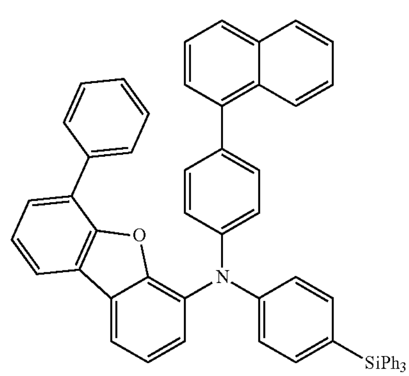

-continued
A7
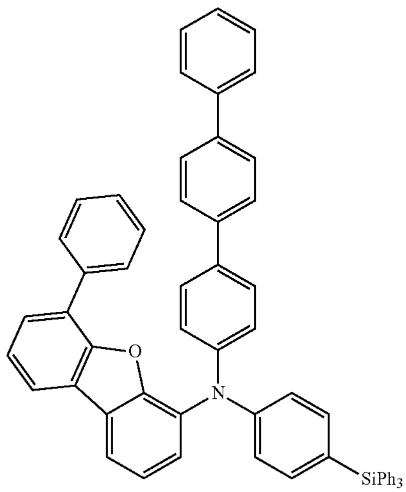
A8
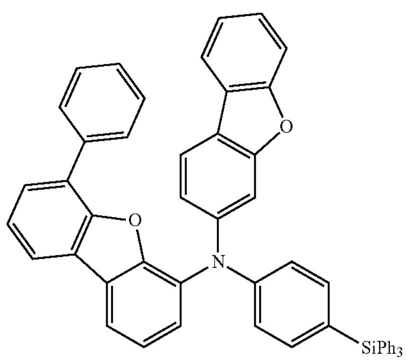
A9
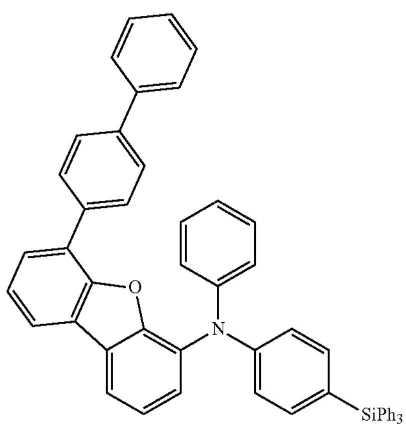
A10
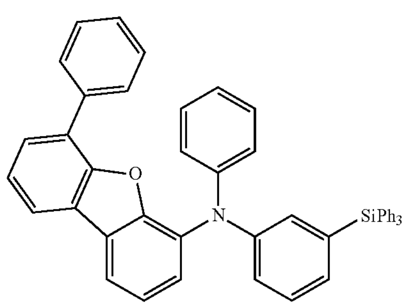
-continued
A11
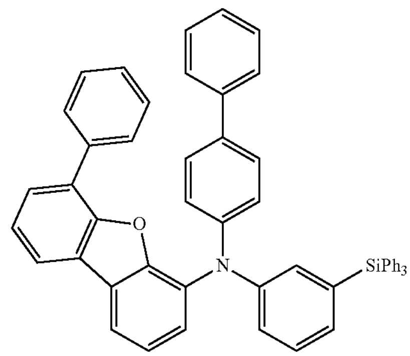
A12
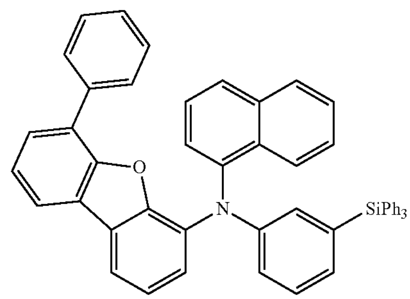
A13
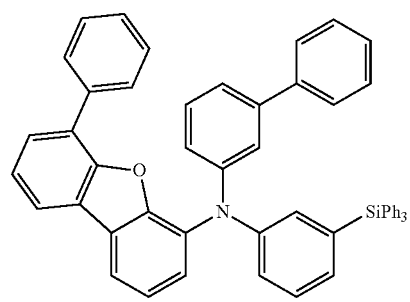
A14
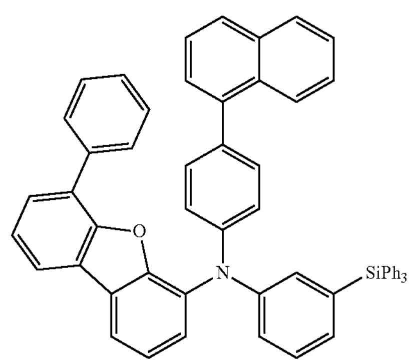

-continued
A15
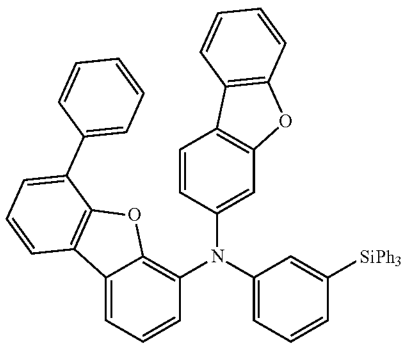
A16
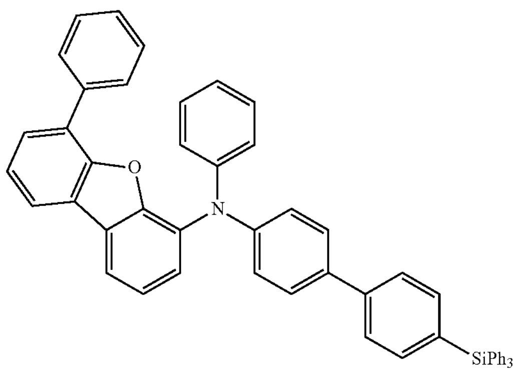
A17
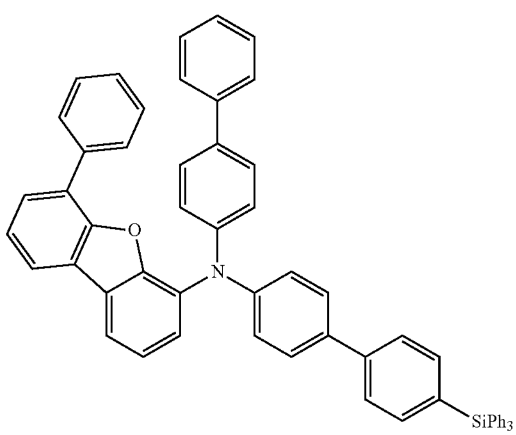
A18
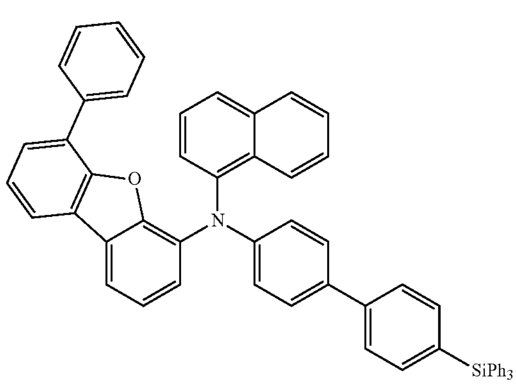
-continued
A19
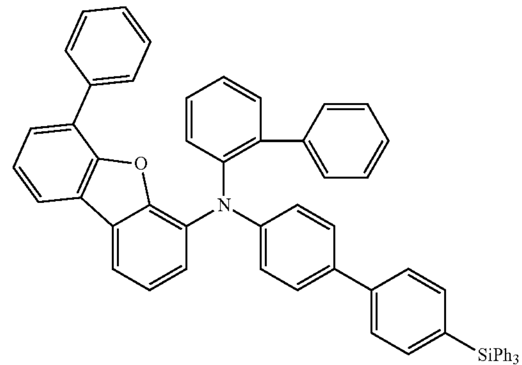
A20
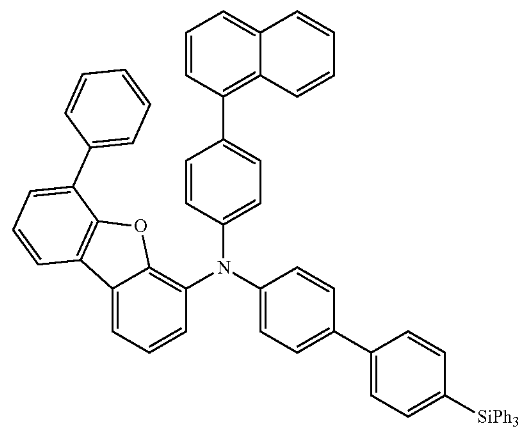
A21
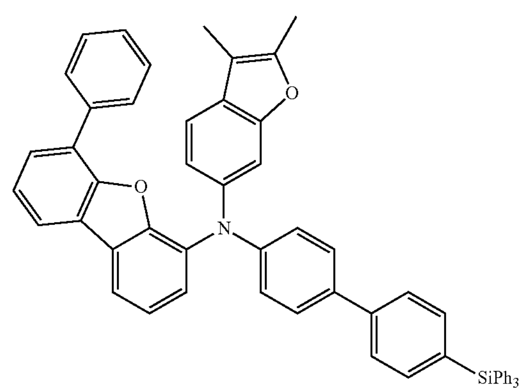
A22
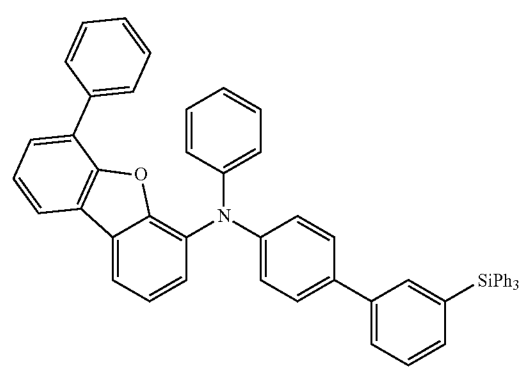

A23
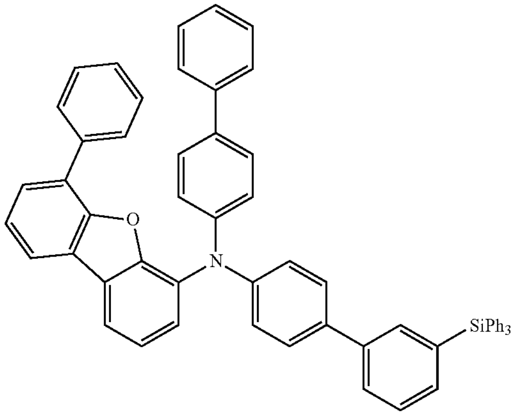
A24
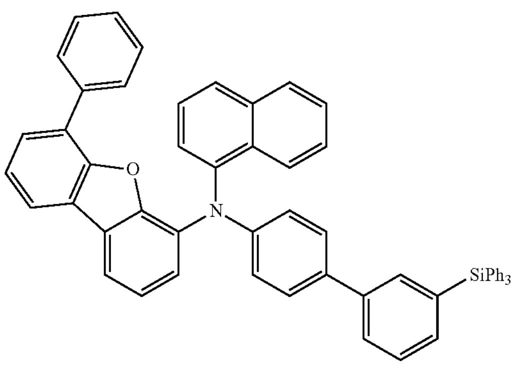
A25
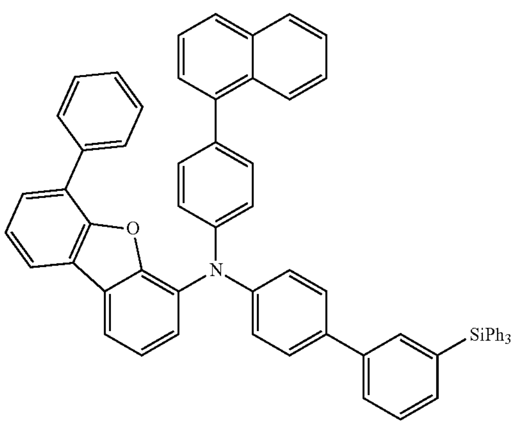
A26
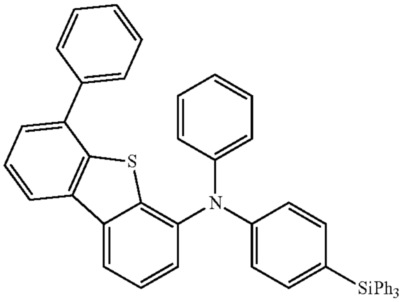
A27
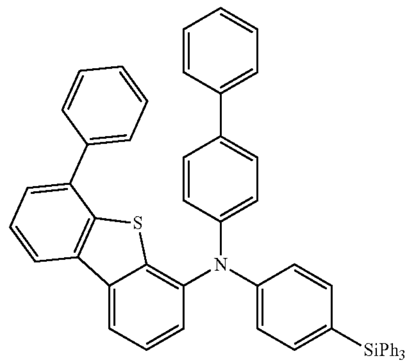
A28
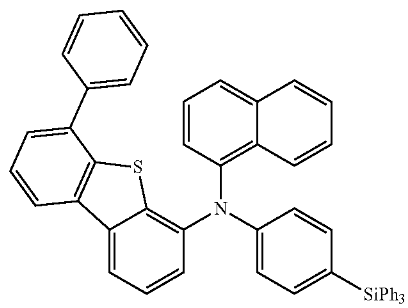
A29
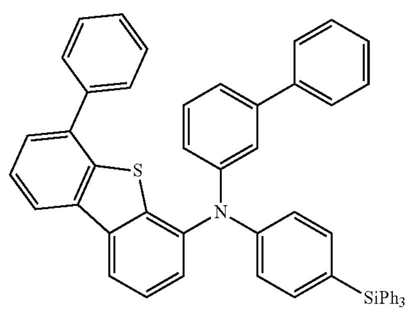
A30
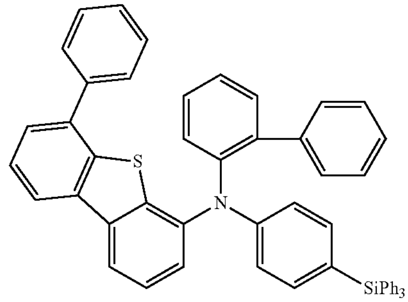

-continued
A31
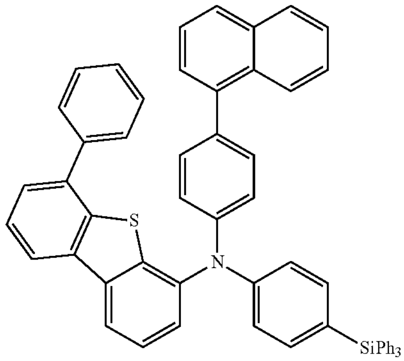
A32
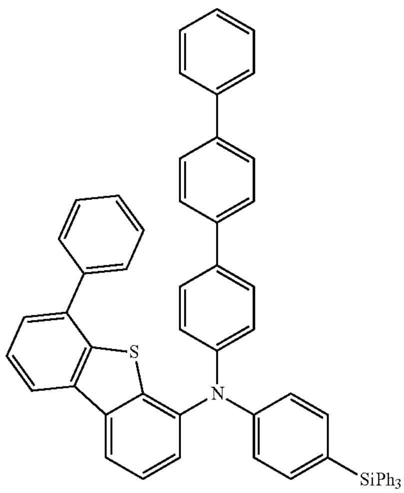
A33
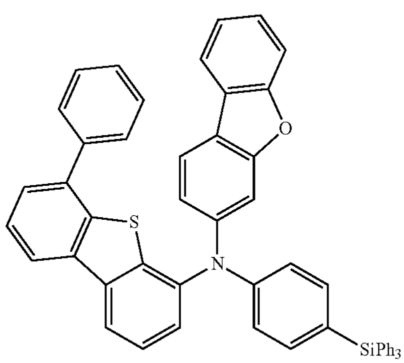
A34
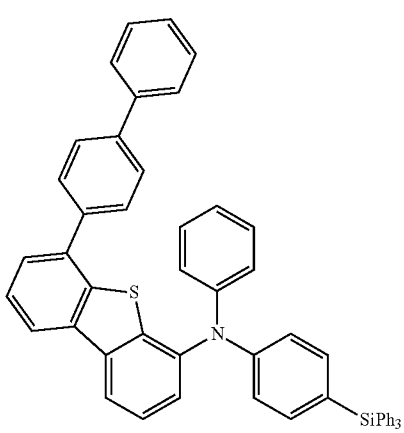
-continued
A35
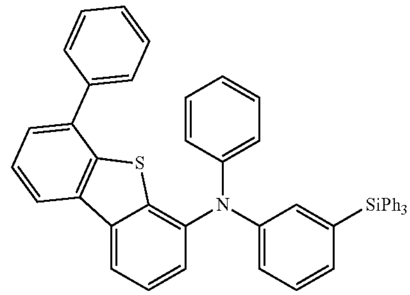
A36
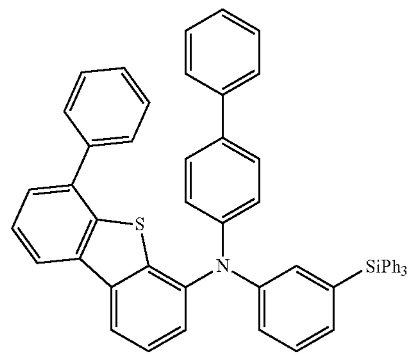
A37
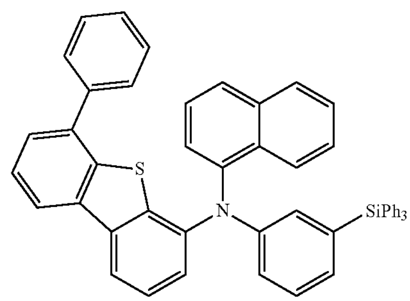
A38
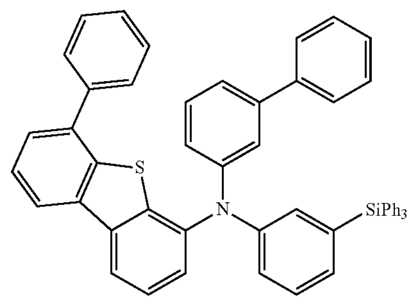
A39
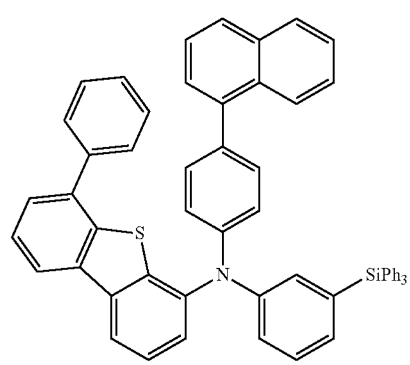

-continued
A40
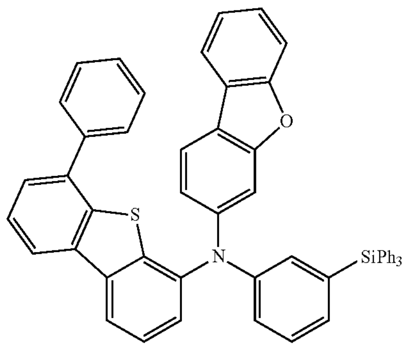
A41
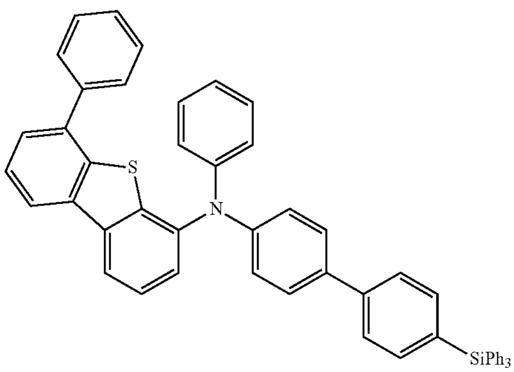
A42
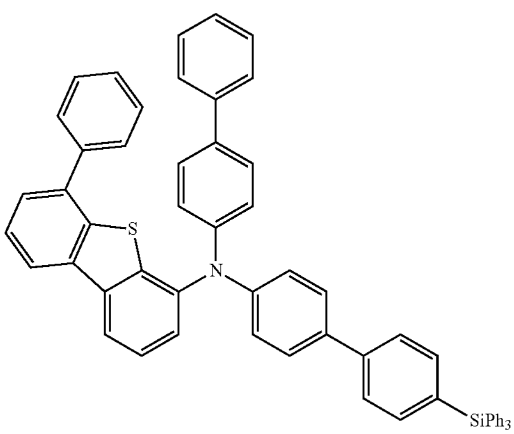
A43
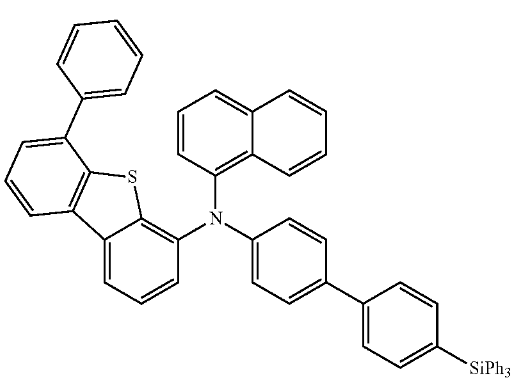
-continued
A44
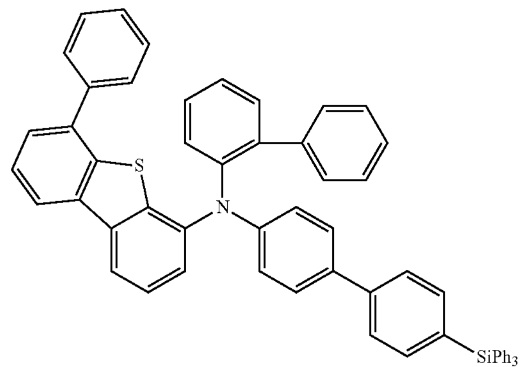
A45
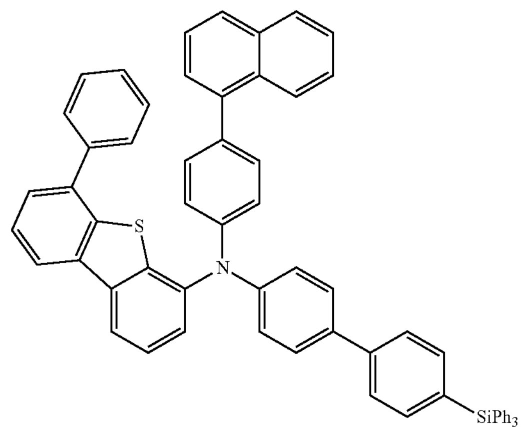
A46
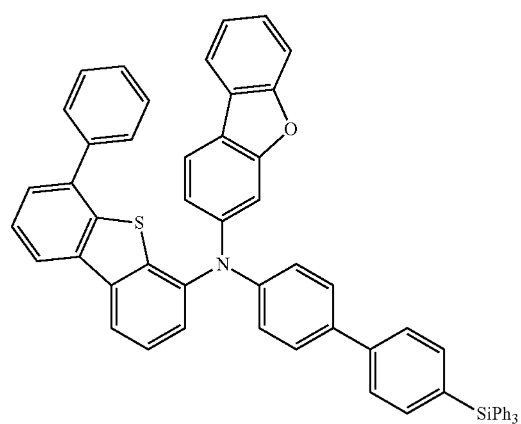
A47
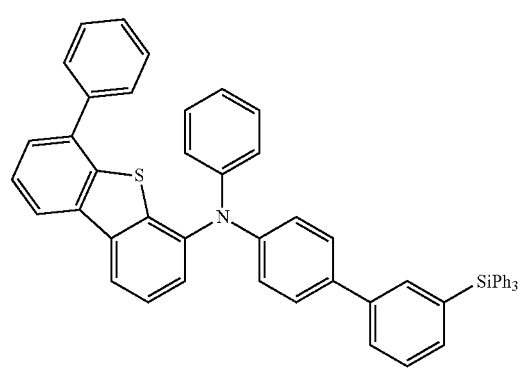

-continued
A48
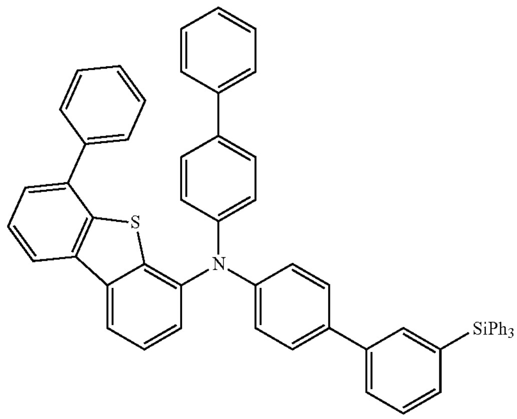
A49
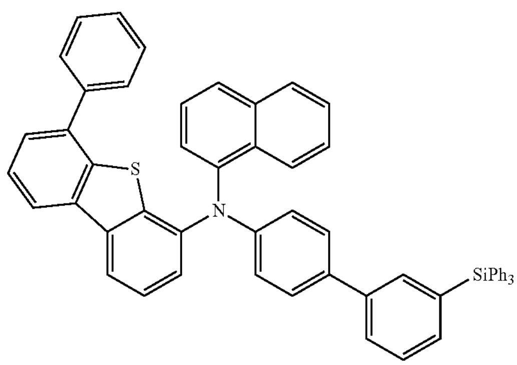
A50
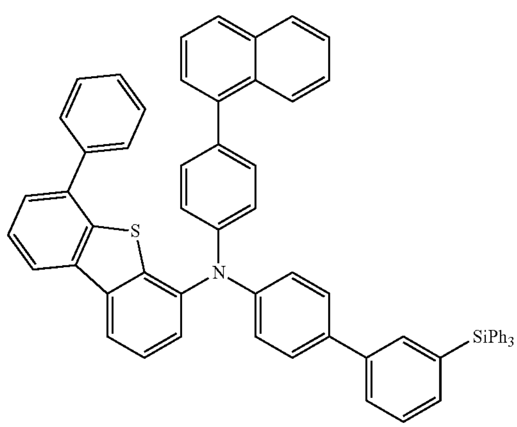
A51
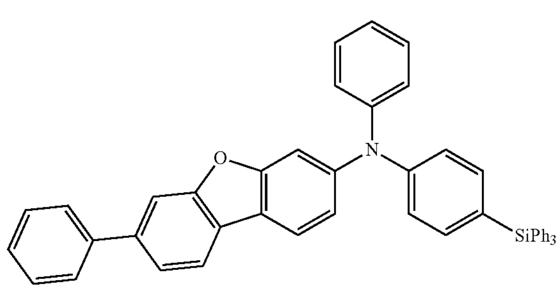
-continued
A52
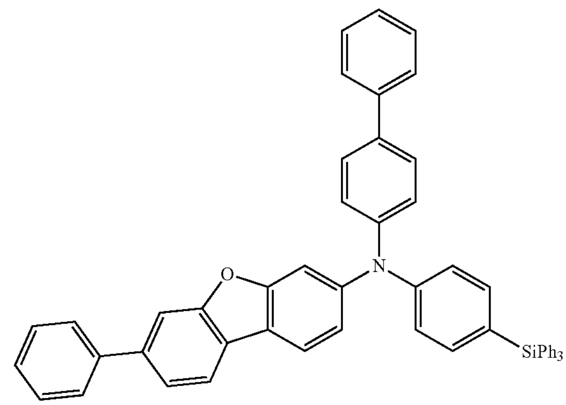
A53
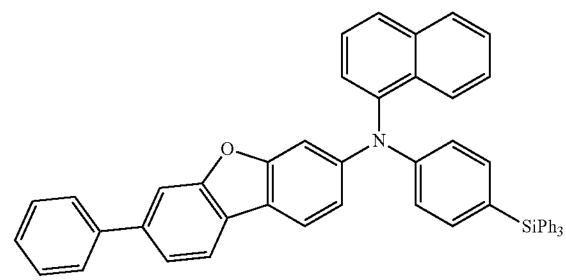
A54
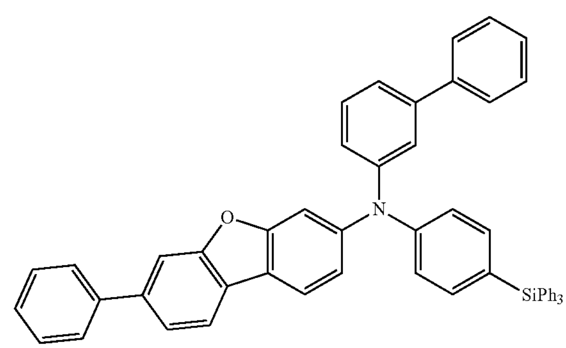
A55
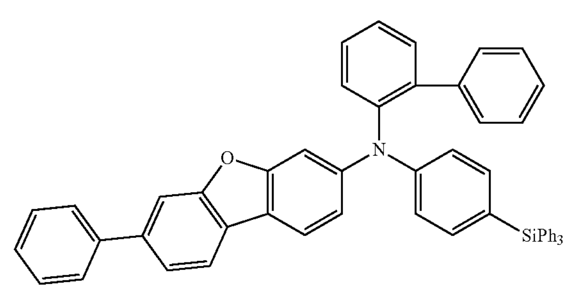

-continued
A56
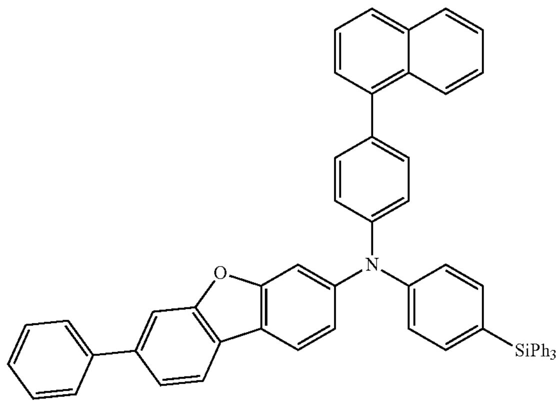
A57
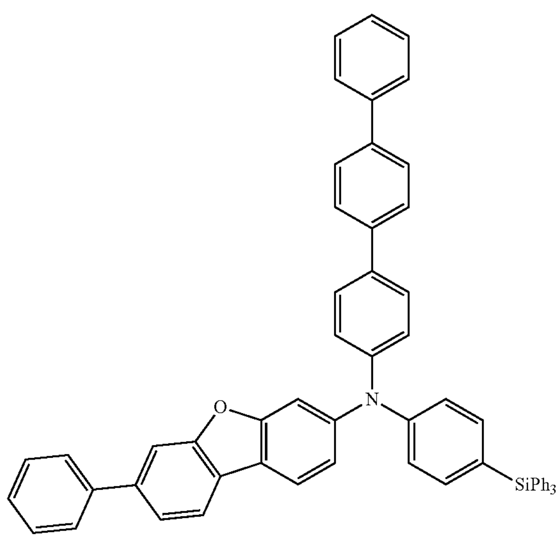
A58
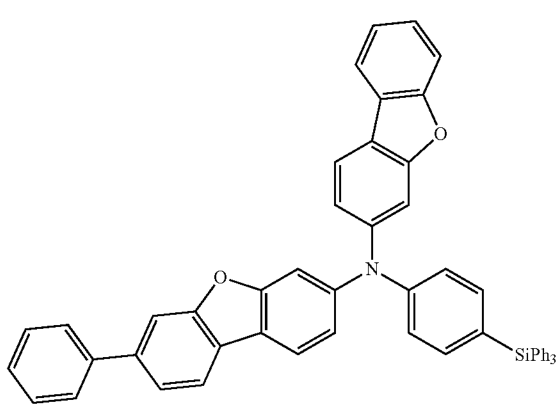
-continued
A59
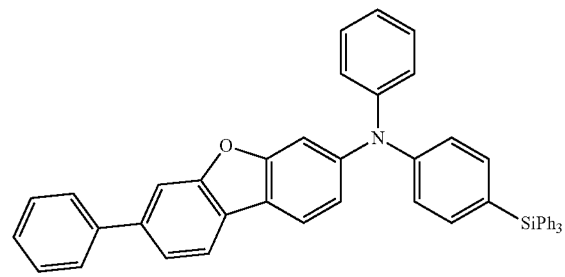
A60
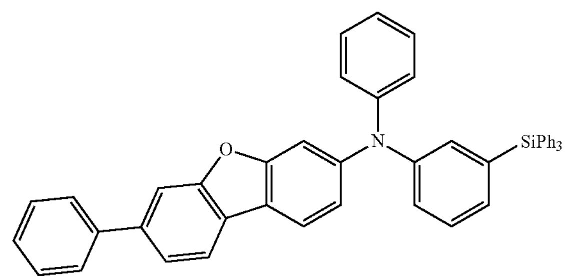
A61
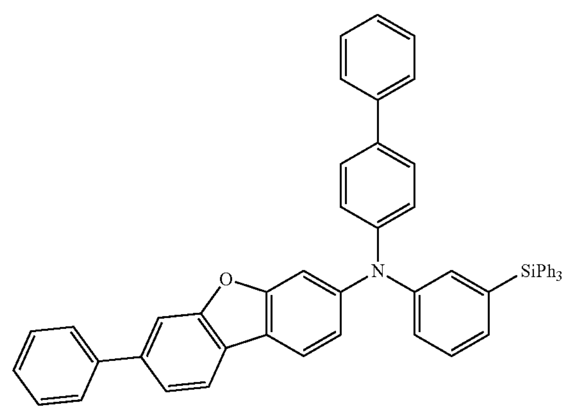
A62
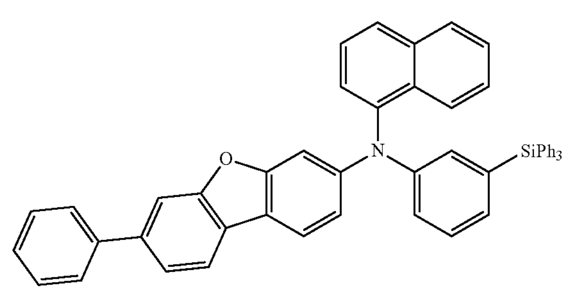

A63
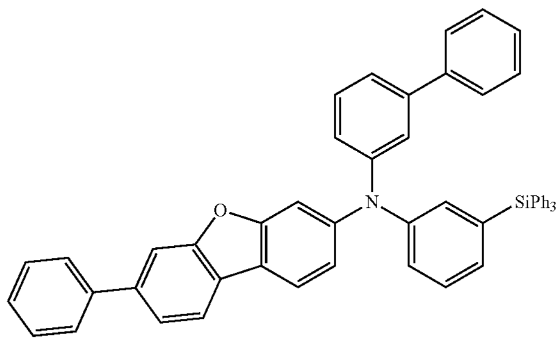
A64
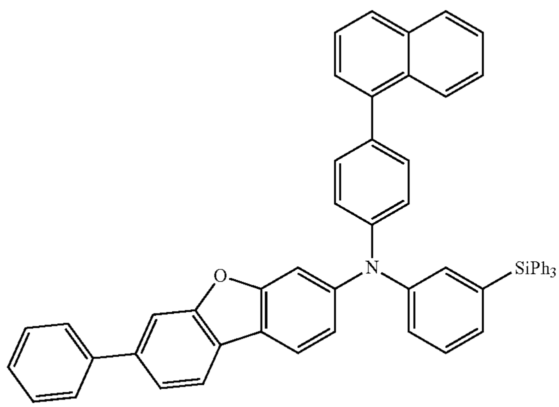
A65
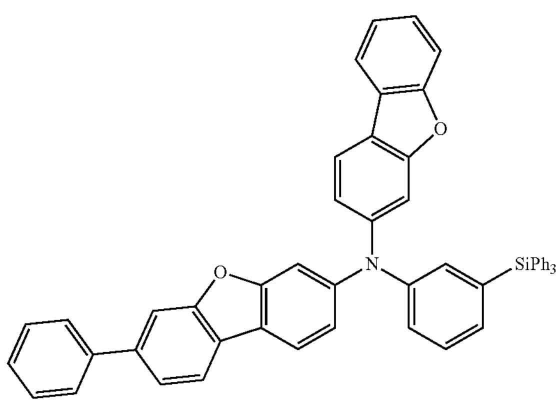
A66
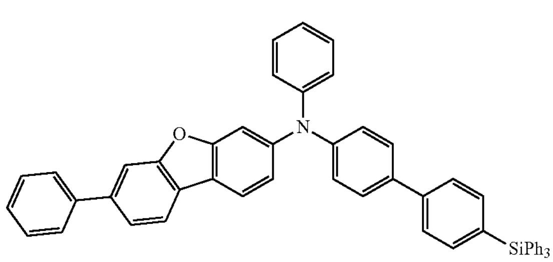
A67
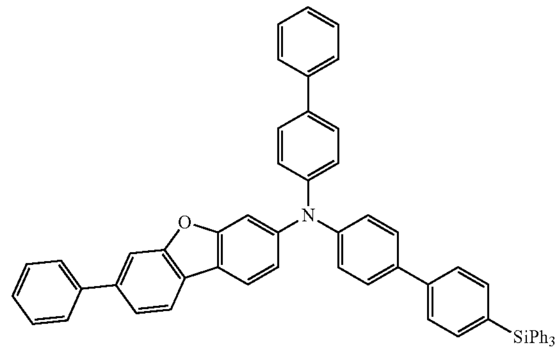
A68
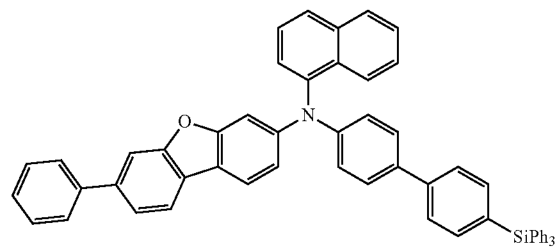
A69
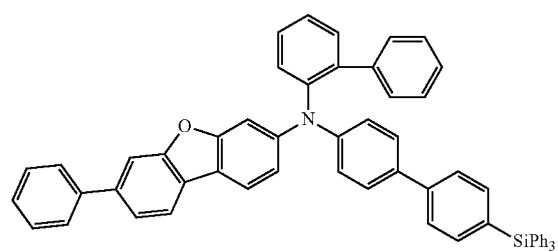
A70
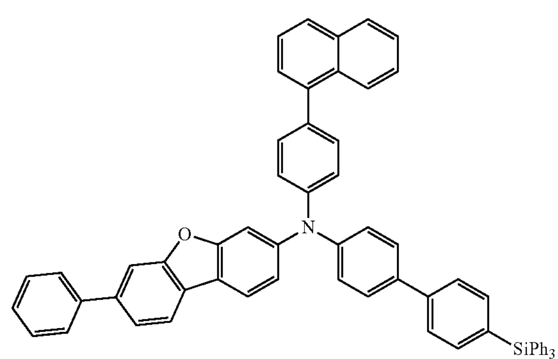

-continued
A71
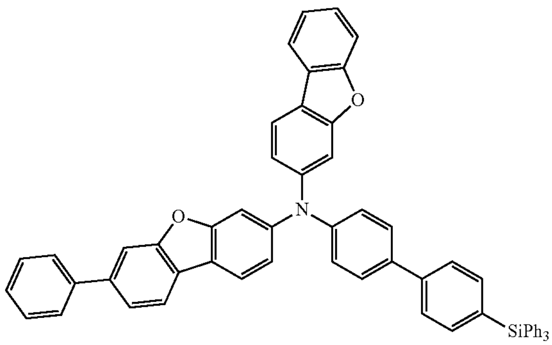
A72
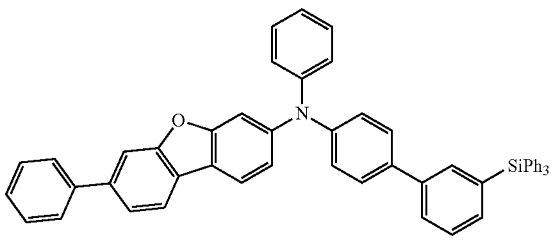
A73
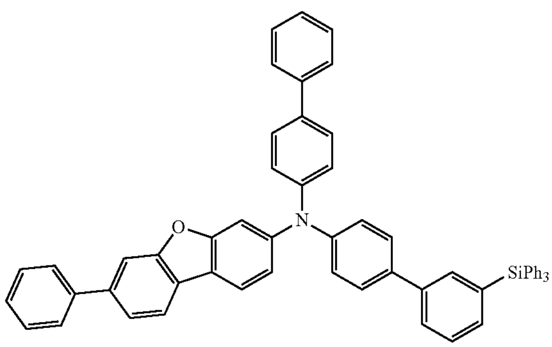
A74
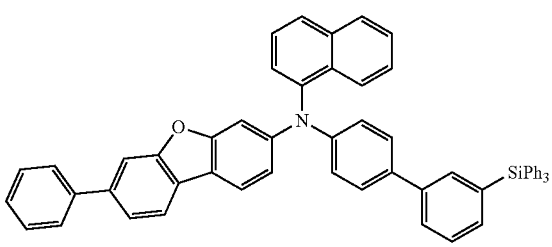
A75
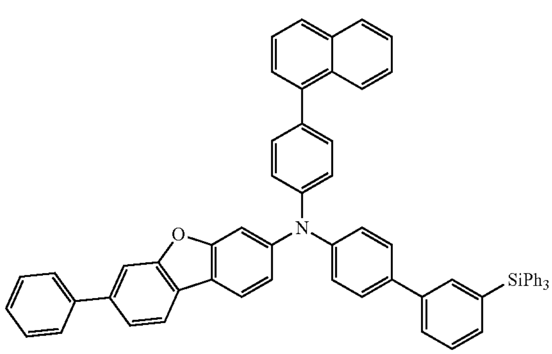
-continued
A76
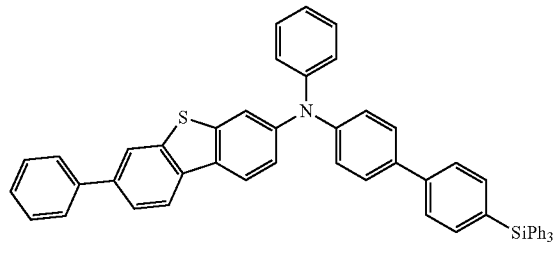
A77
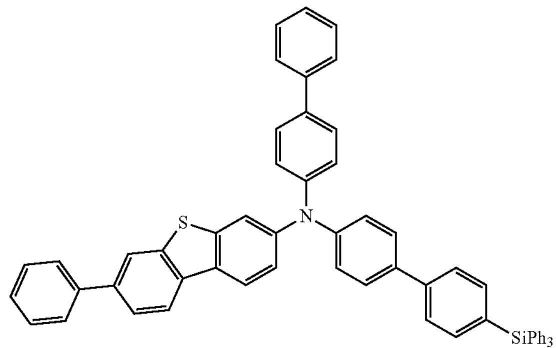
A78
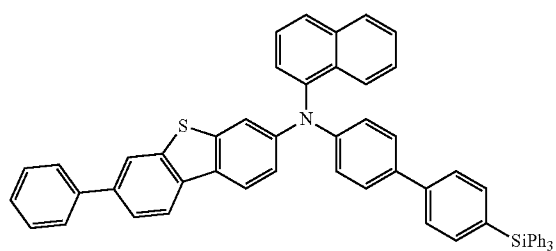
A79
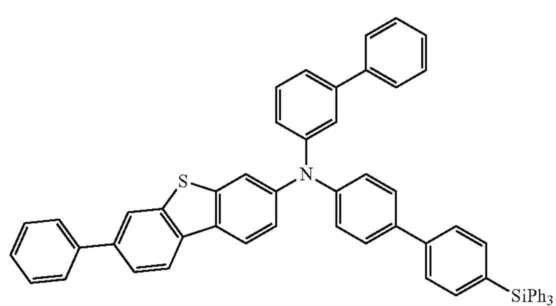
A80
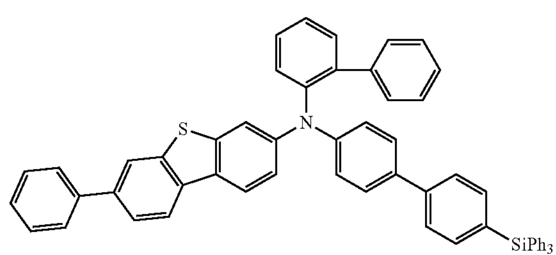

-continued
A81
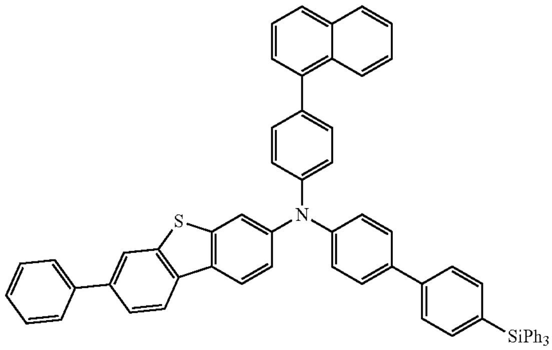
A82
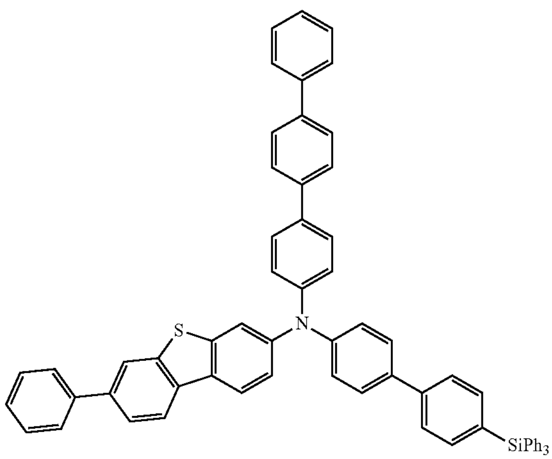
A83
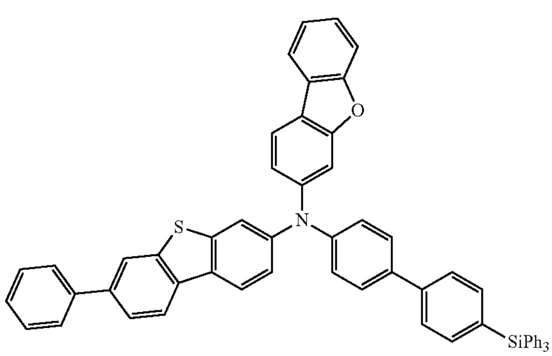
A84
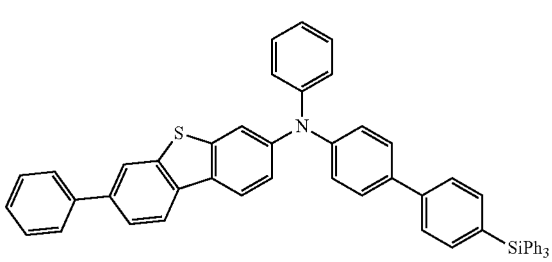
-continued
A85
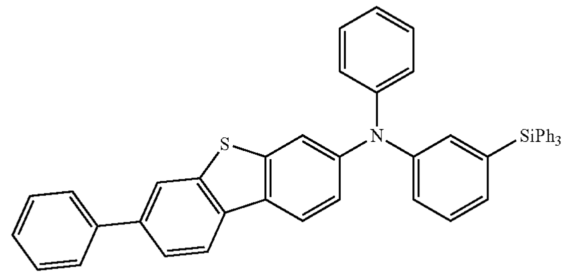
A86
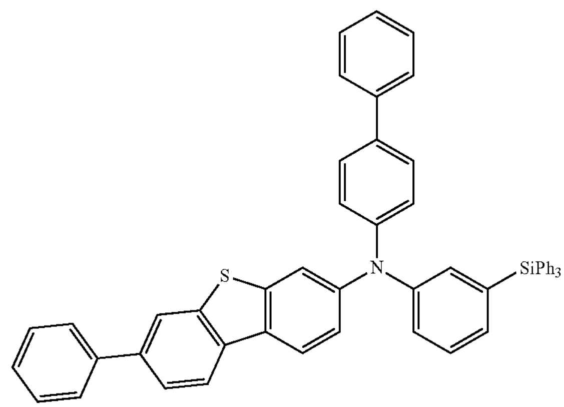
A87
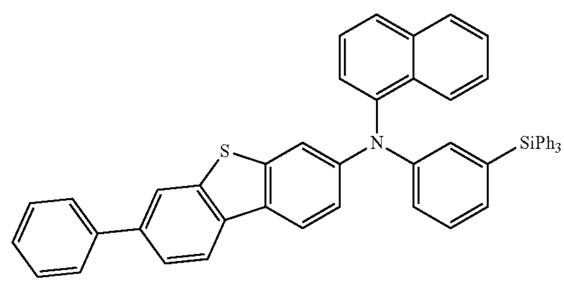
A88
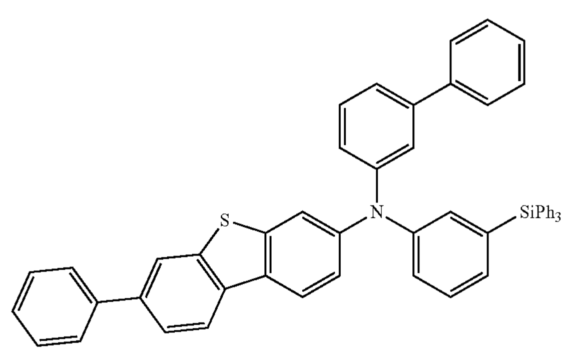

-continued
A89
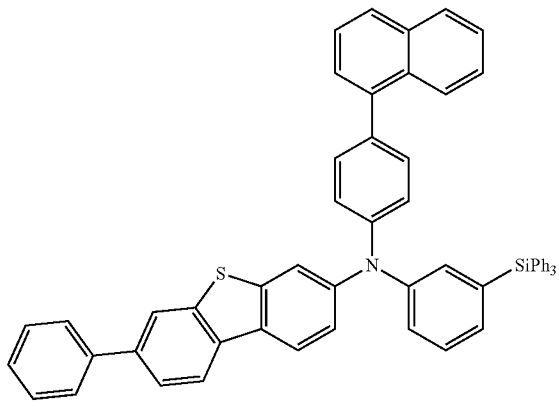
A90
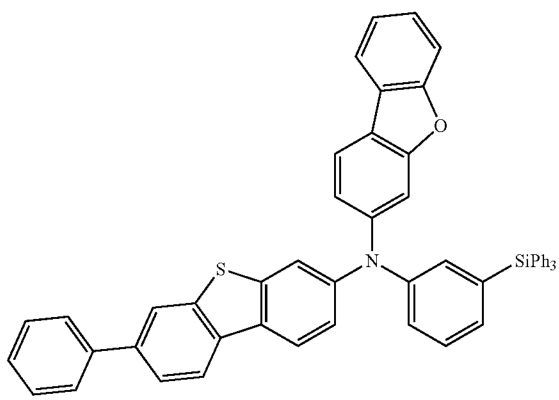
A91
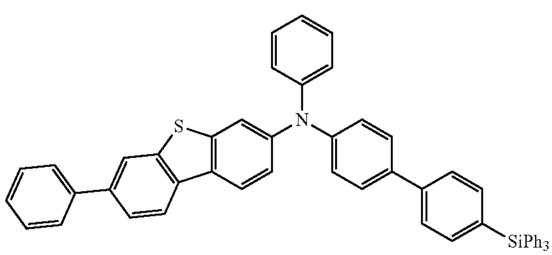
A92
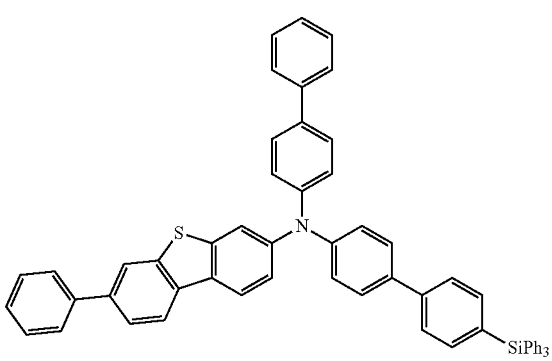
-continued
A93
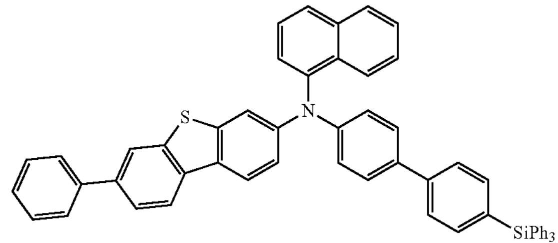
A94
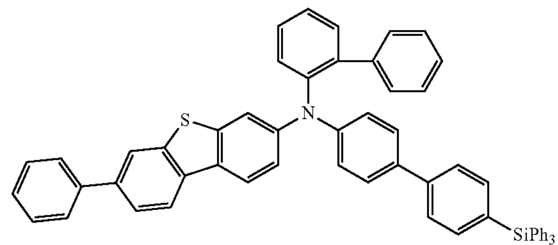
A95
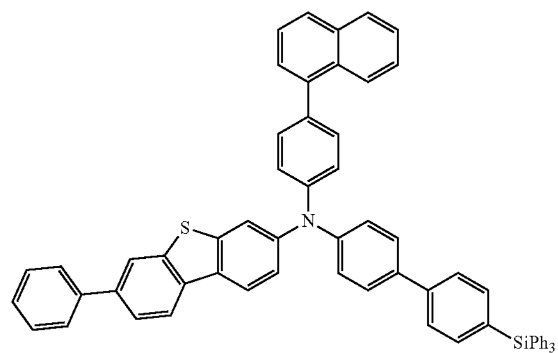
A96
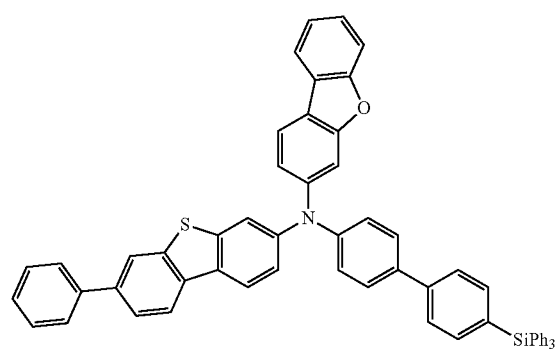
A97
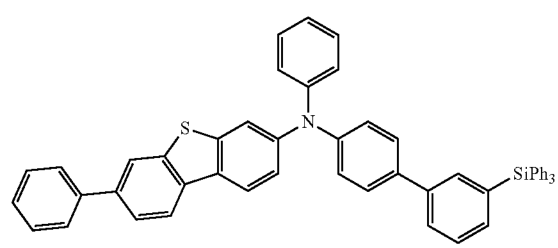

-continued
A98
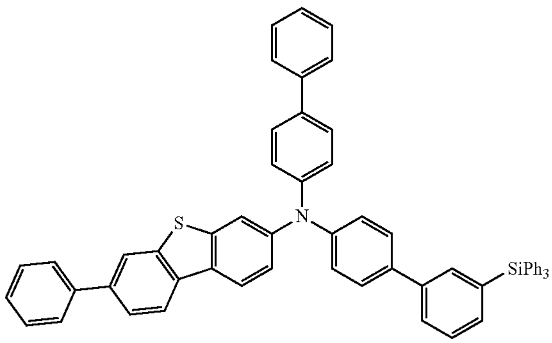
A99
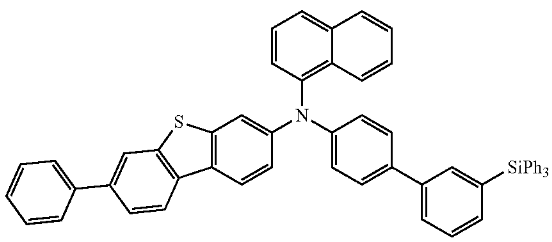
A100
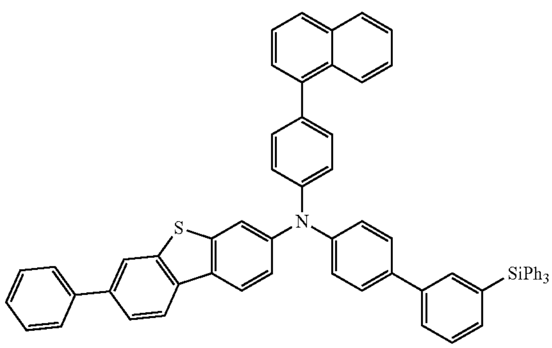
A101
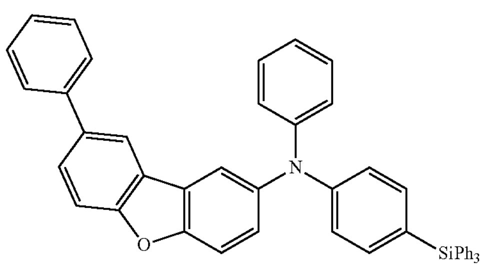
A102
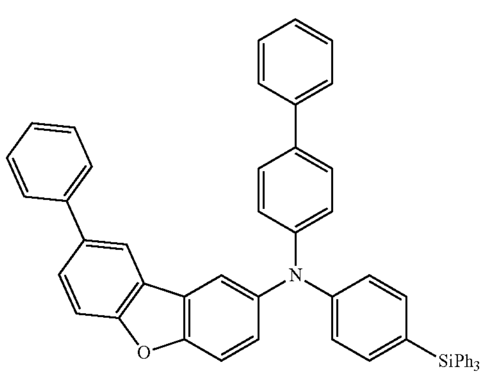
-continued
A103
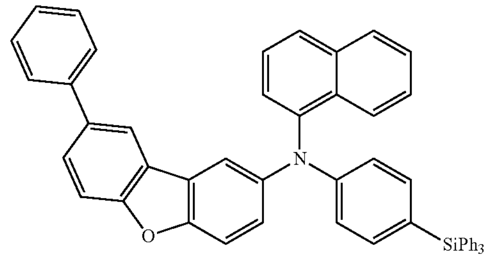
A104
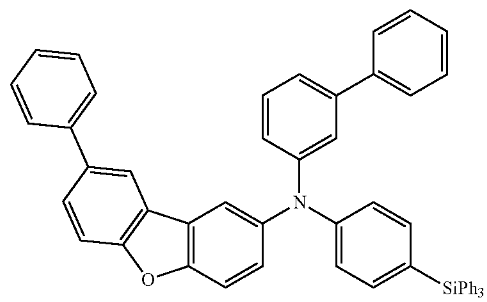
A105
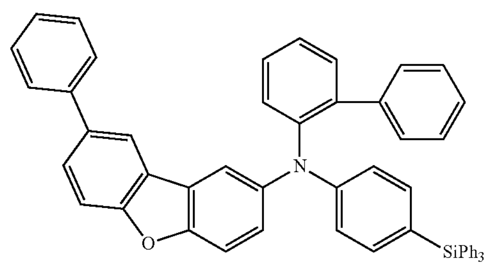
A106
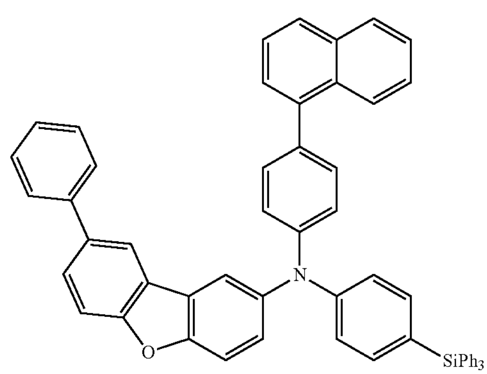

-continued
A107
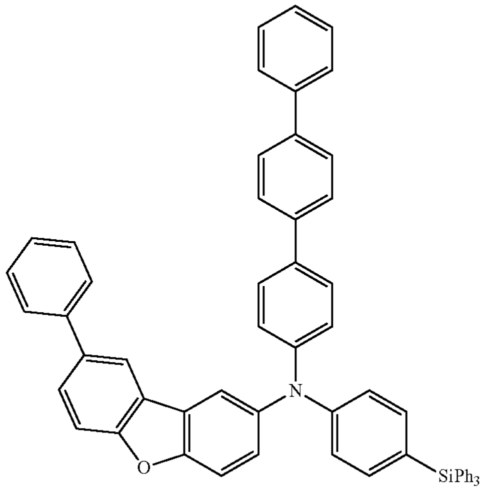
A108
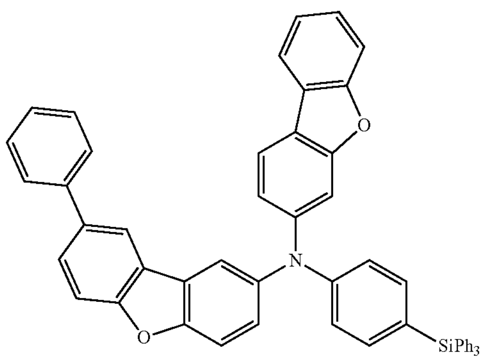
A109
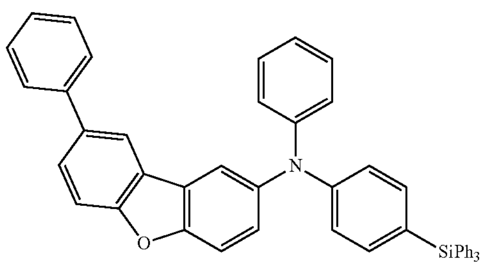
A110
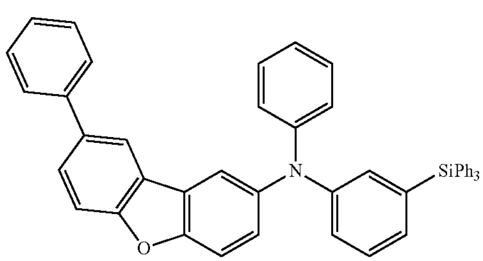
-continued
A11
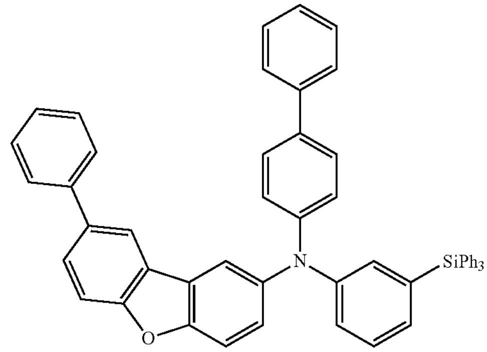
A112
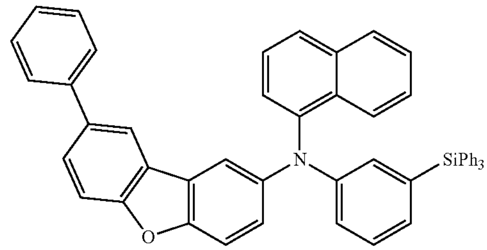
A113
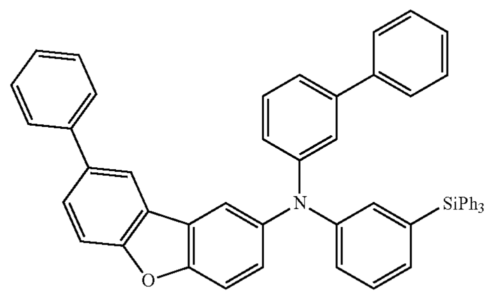
A114
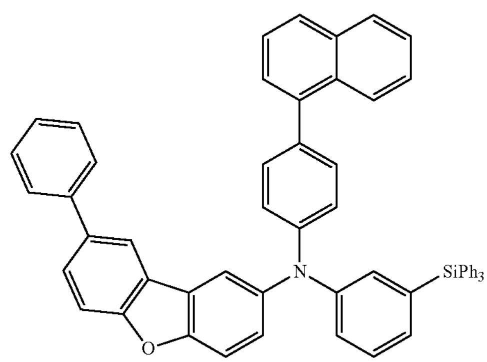
A115
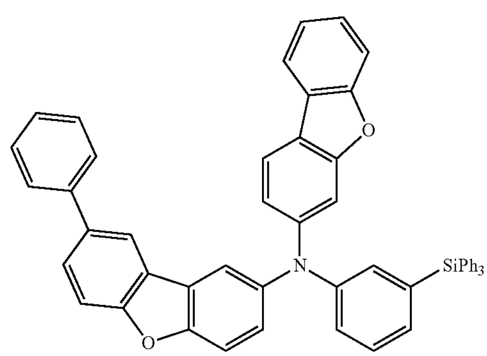

A116
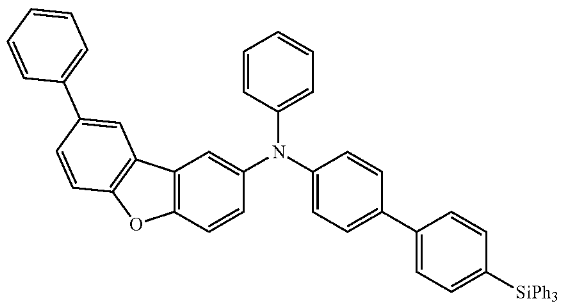
A117
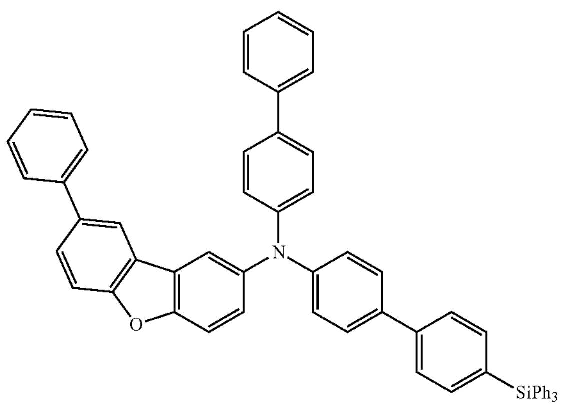
A118
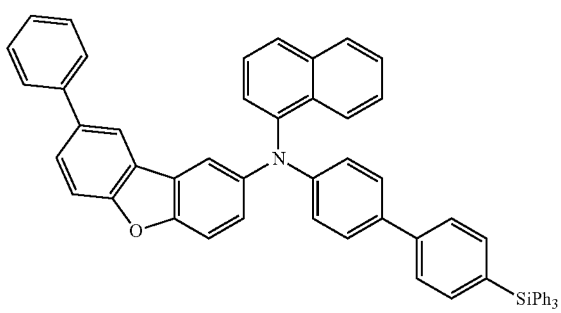
A119
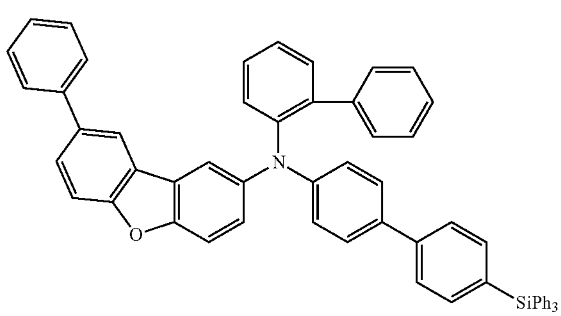
A120
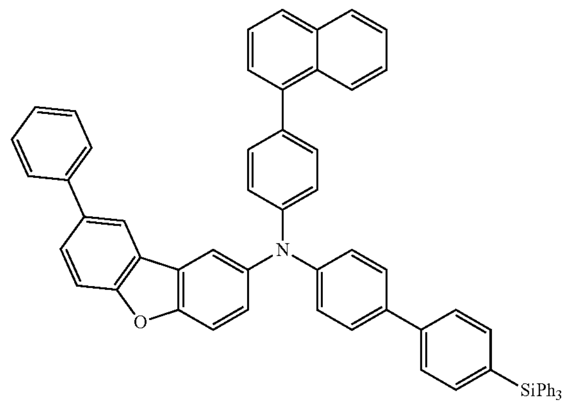
A121
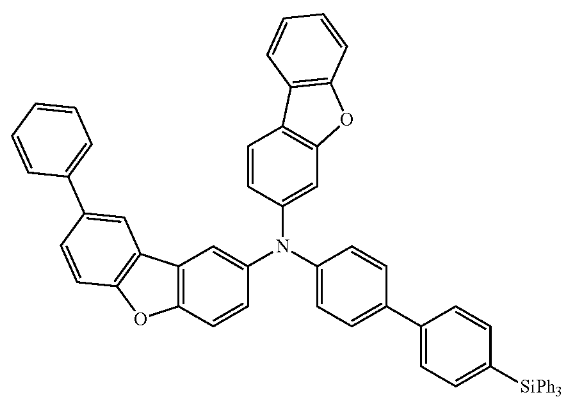
A122
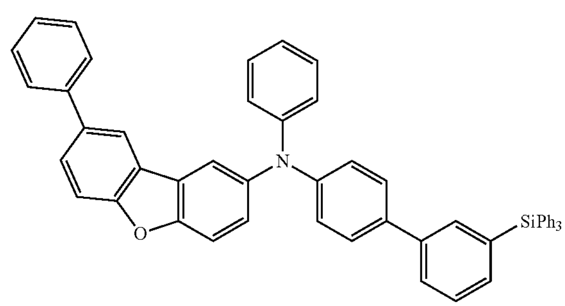
A123
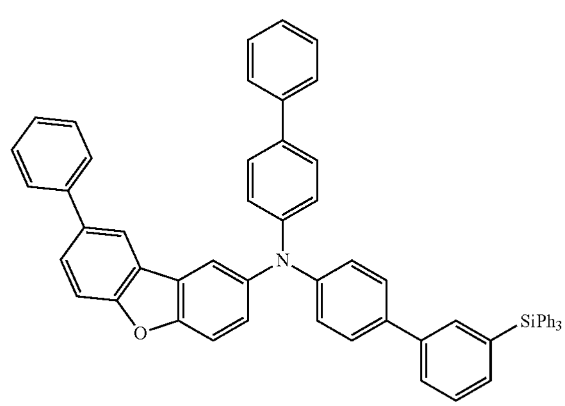

-continued
A124
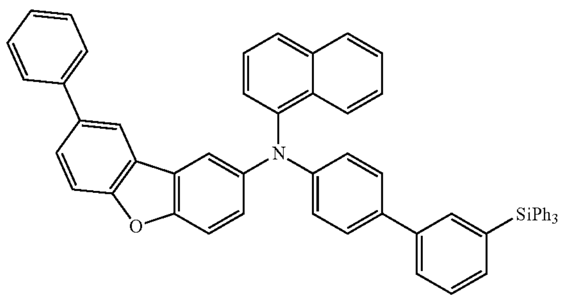
A125
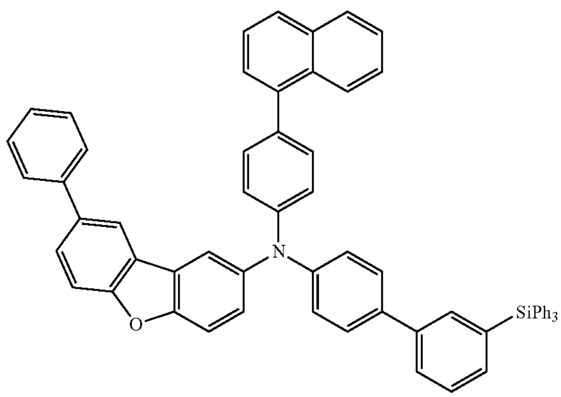
A126
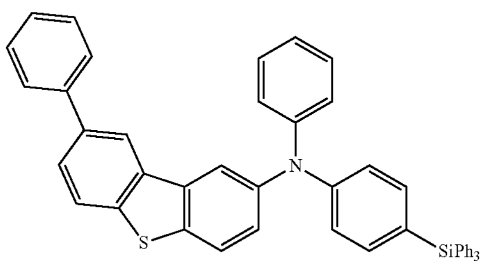
A127
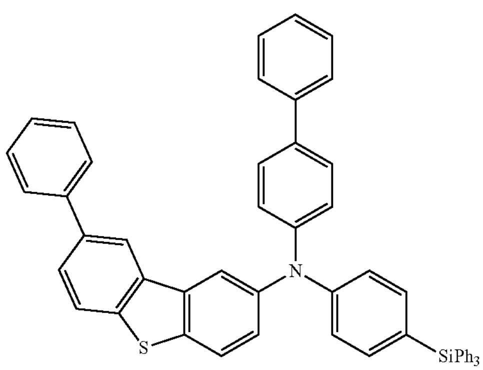
A128
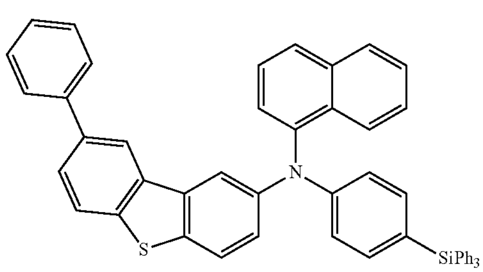
-continued
A129
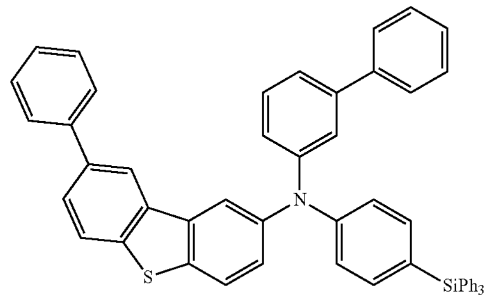
A130
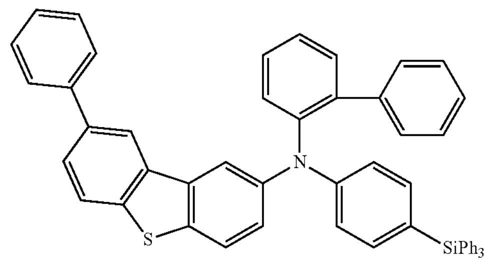
A131
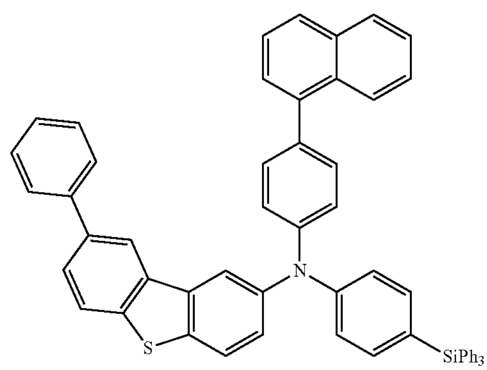
A132
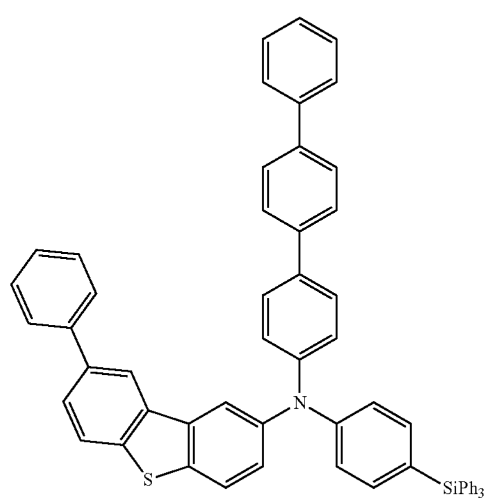

-continued
A133
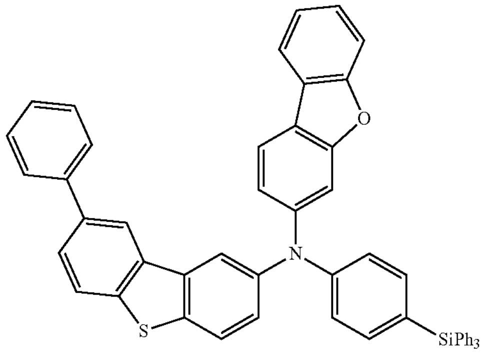
A134
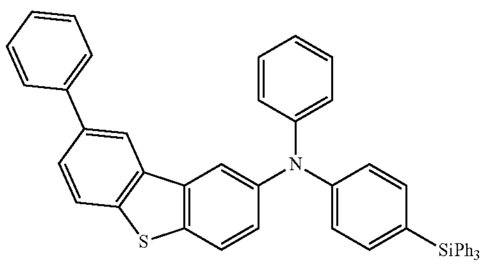
A135
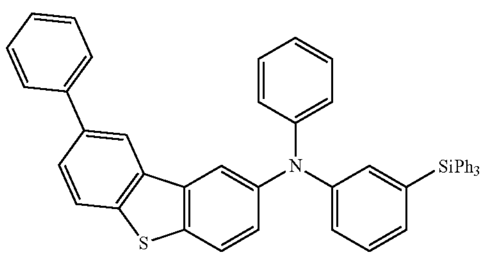
A136
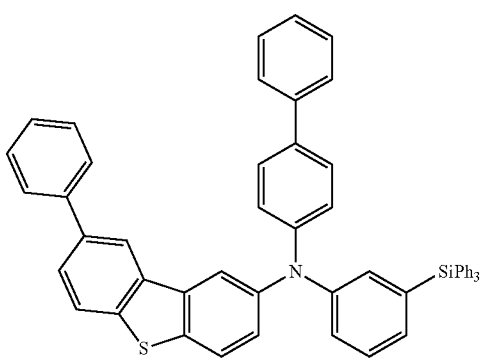
A137
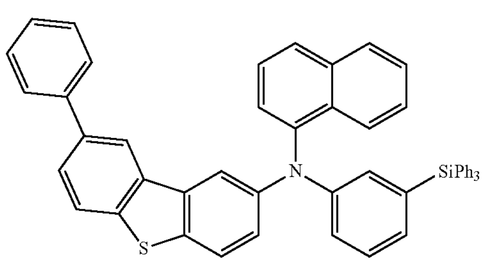
A138
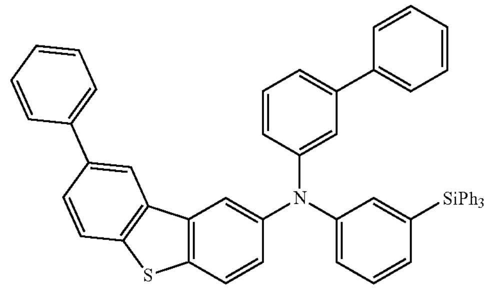
A139
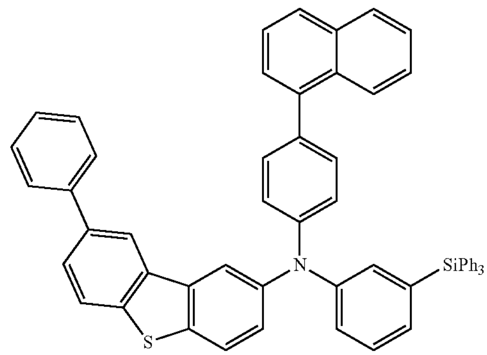
A140
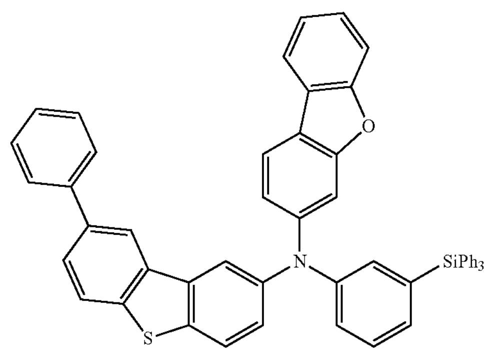
A141
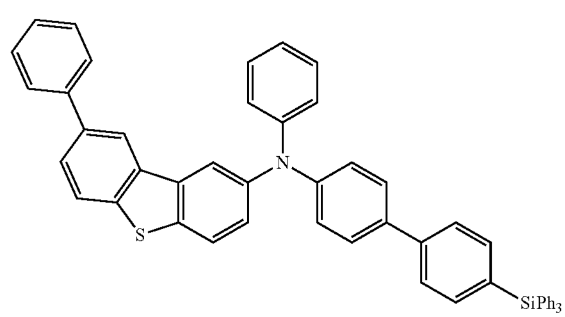

-continued
A142
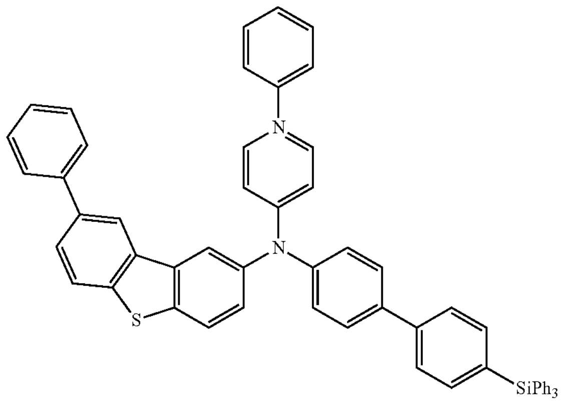
A143
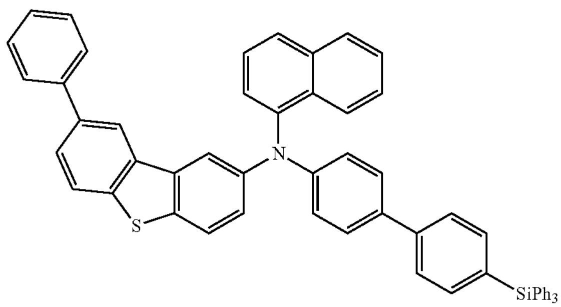
A144
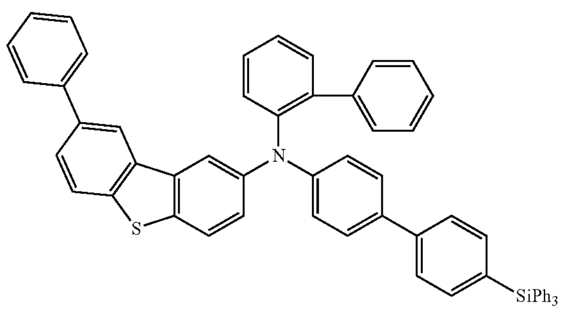
A145
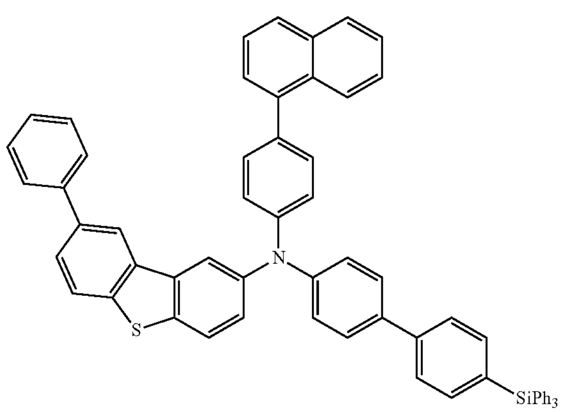
-continued
A146
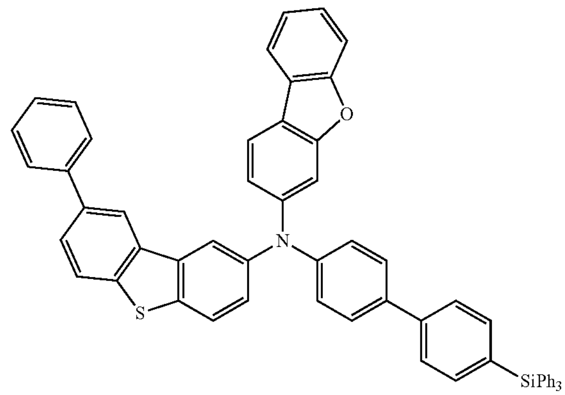
A147
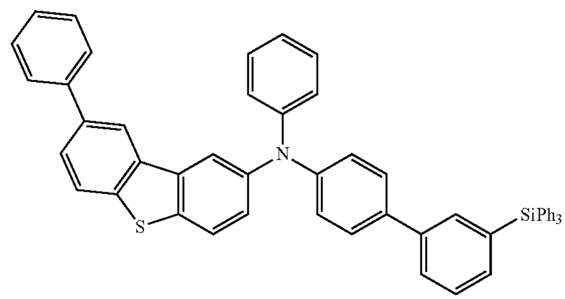
A148
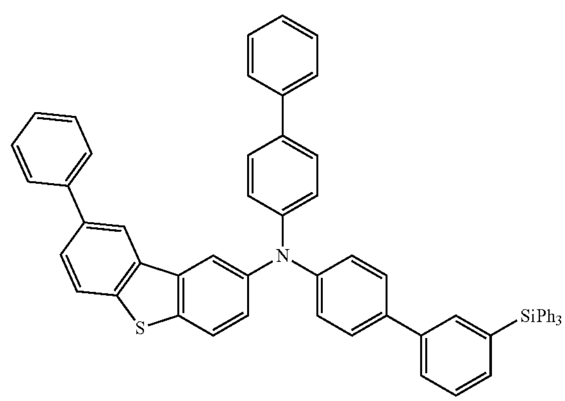
A149
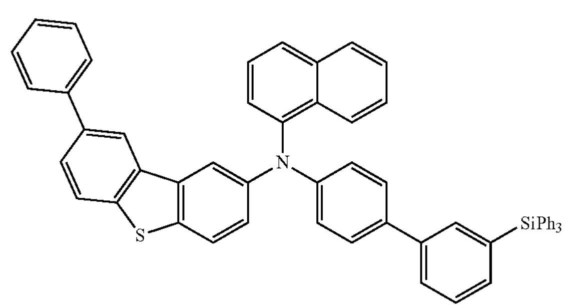

-continued
A150
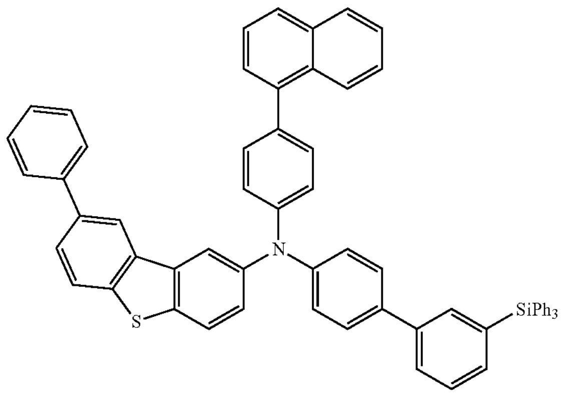
A151
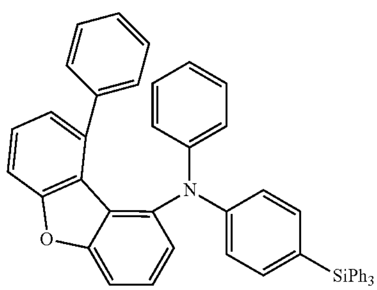
A152
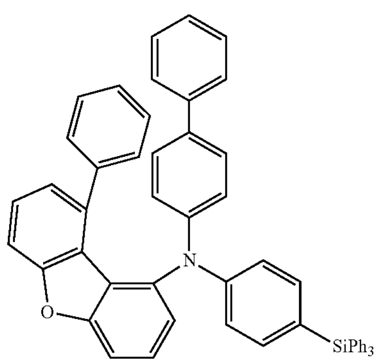
A153
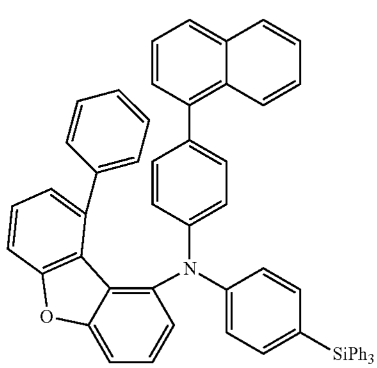
-continued
A154
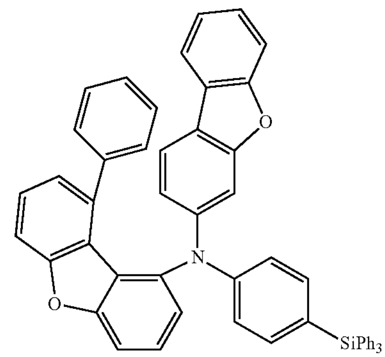
A155
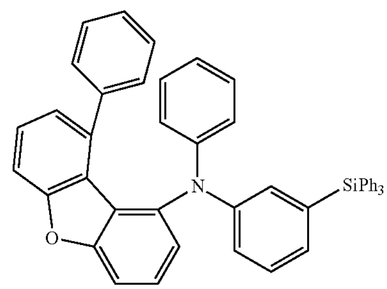
A156
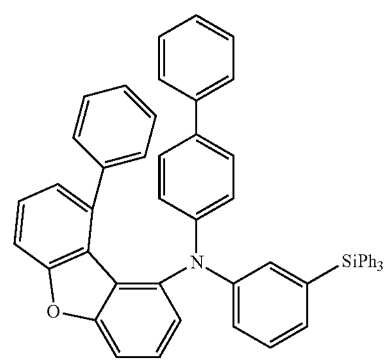
A157
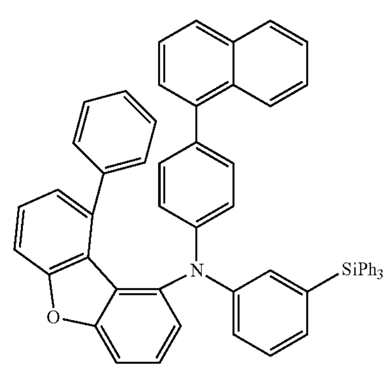

A158
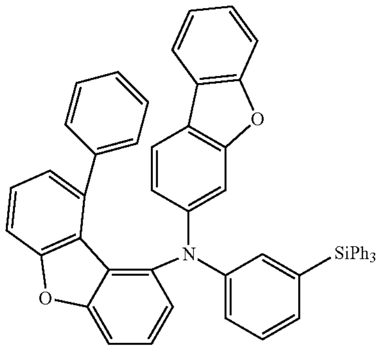
A159
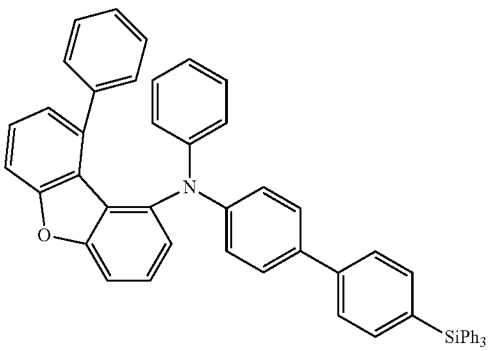
A160
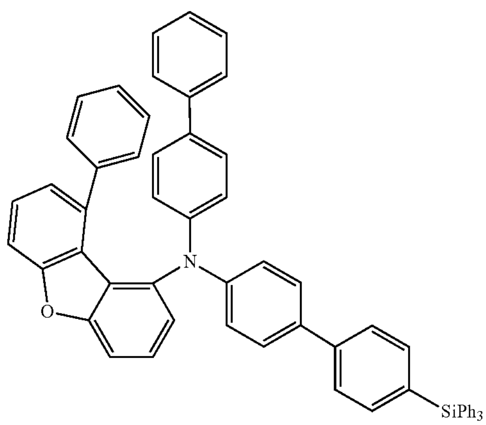
A161
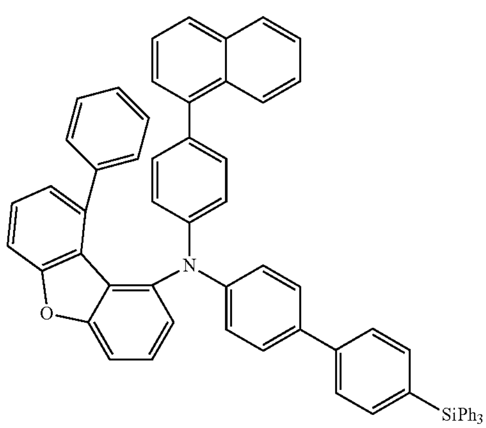
A162
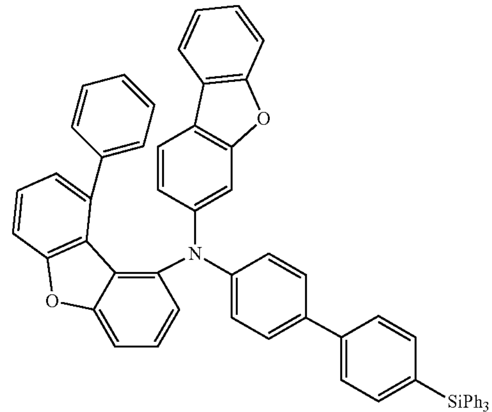
A163
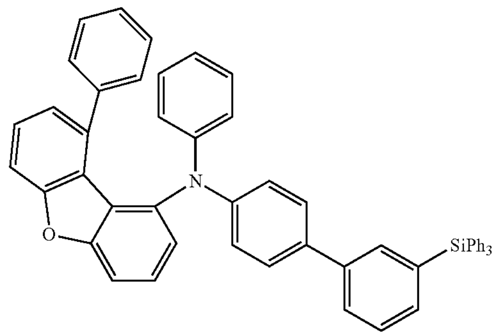
A164
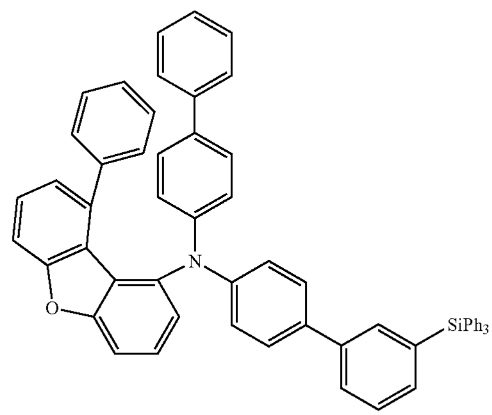
A165
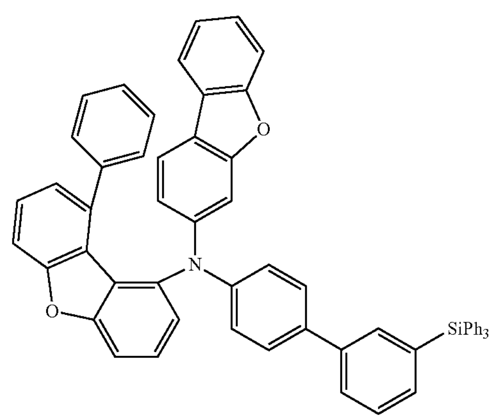

-continued
A166
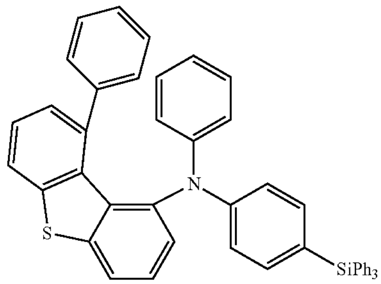
A167
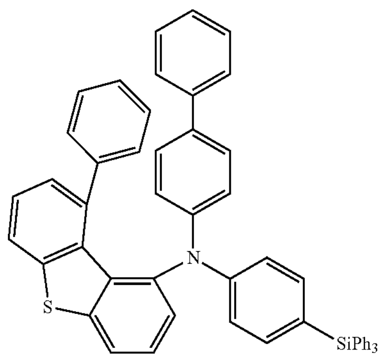
A168
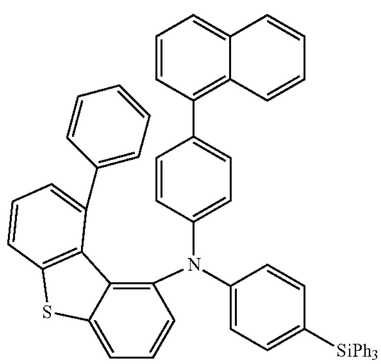
A169
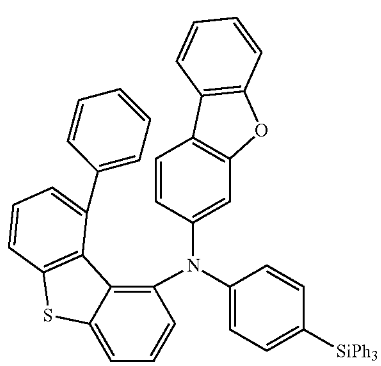
-continued
A170
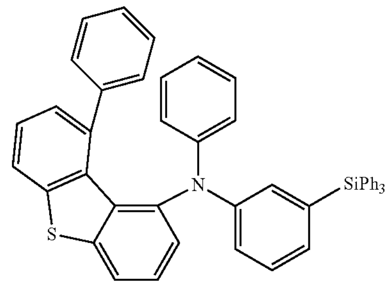
A171
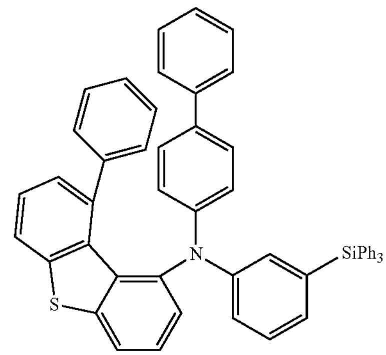
A172
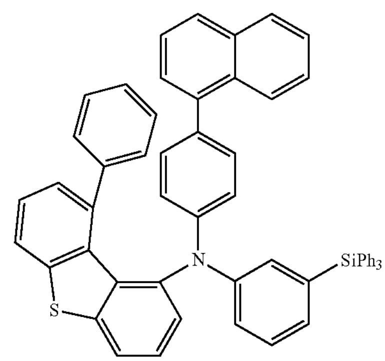
A173
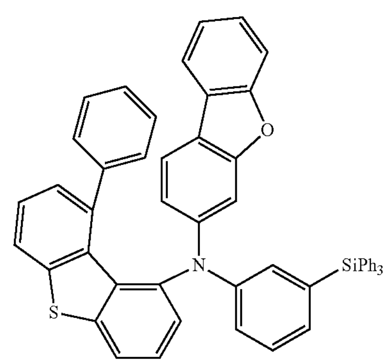

-continued
A174
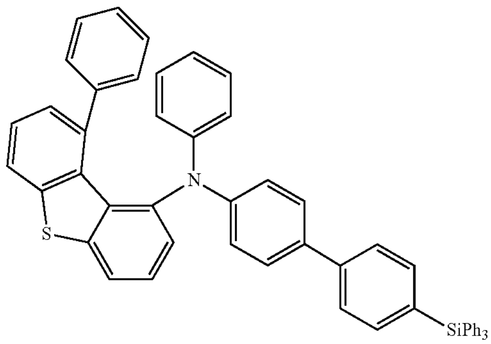
A175
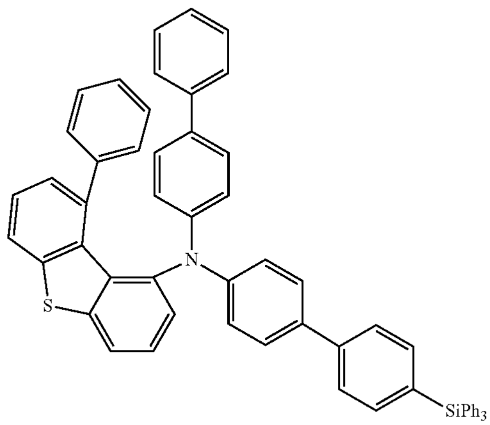
A176
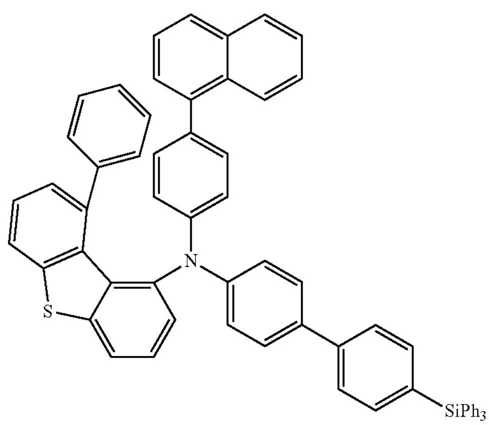
A177
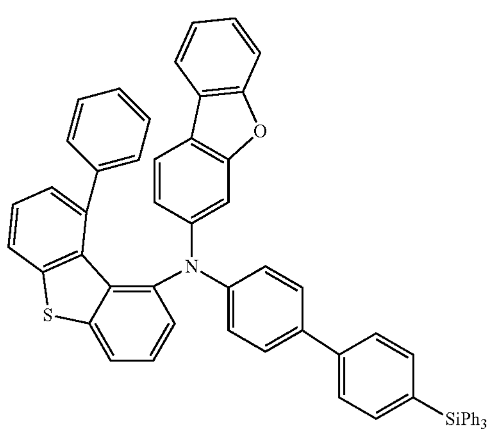
-continued
A178
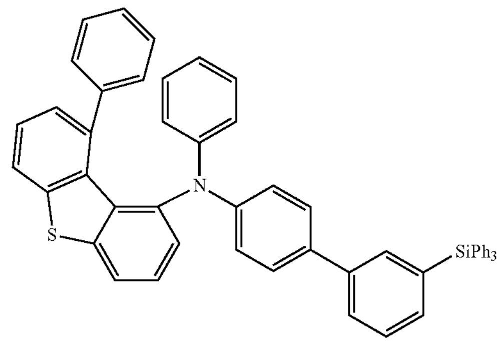
A179
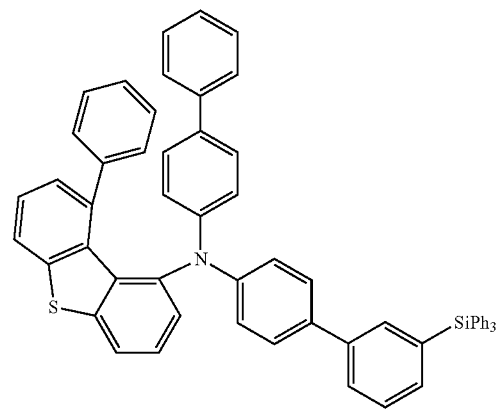
A180
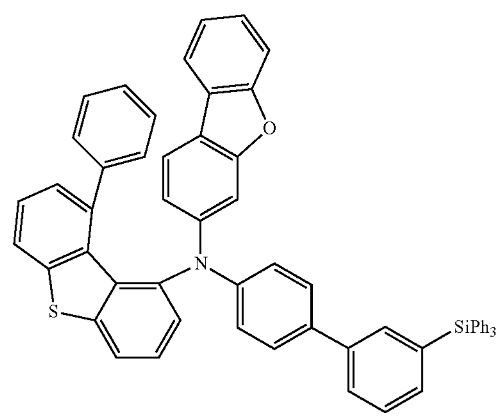
A181
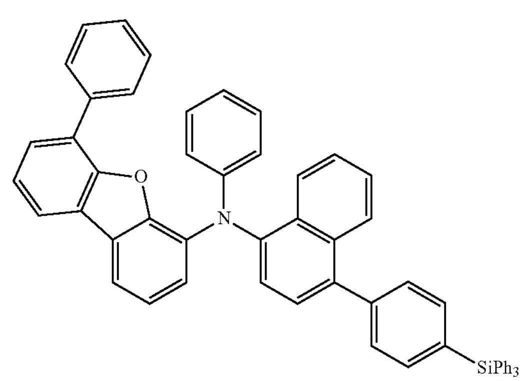

A182
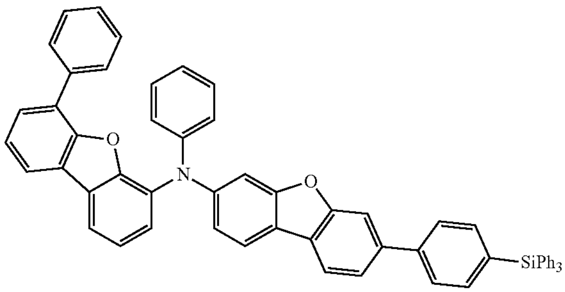
A183
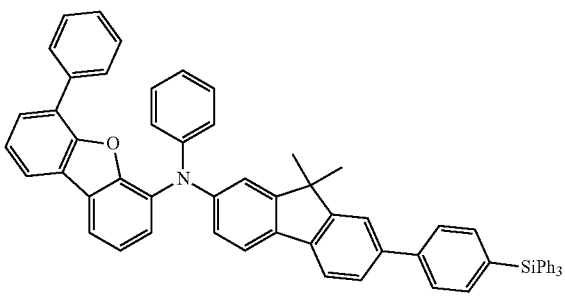
A184
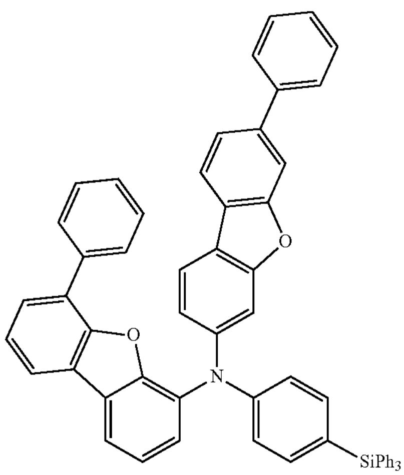
A185
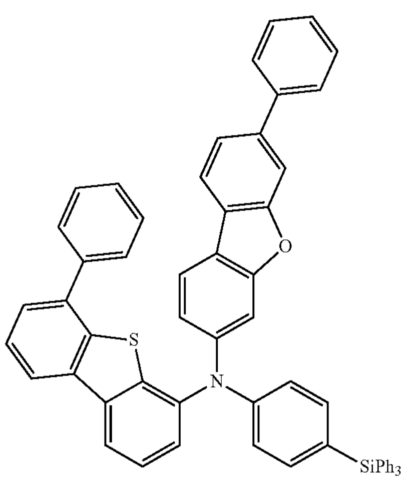
A186
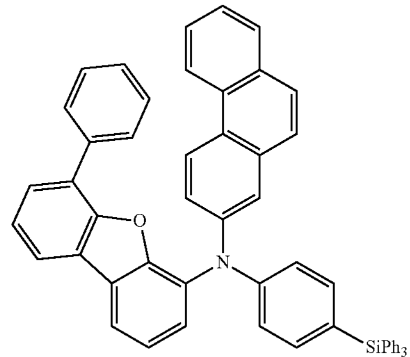
A187
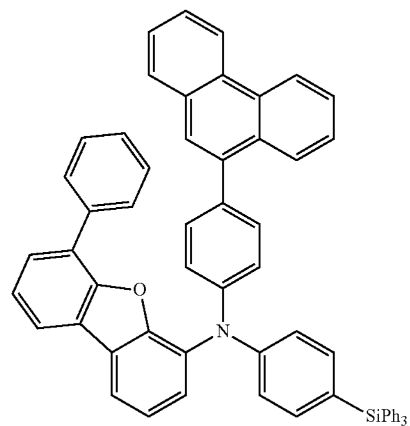
A188
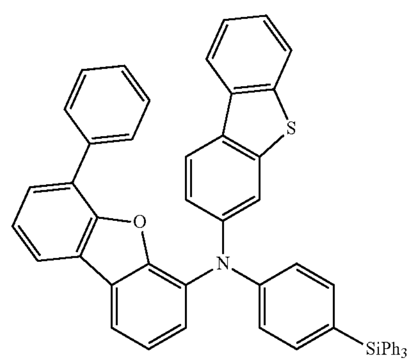
A189
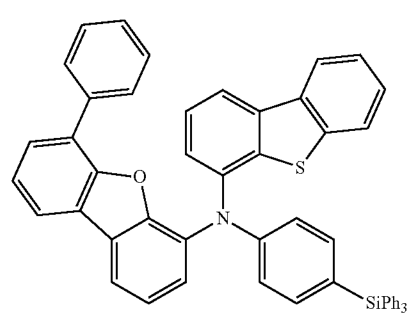

A190
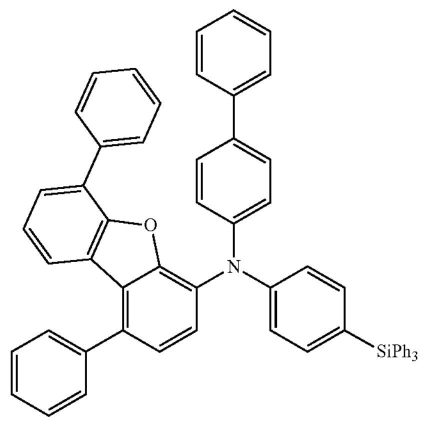
A191
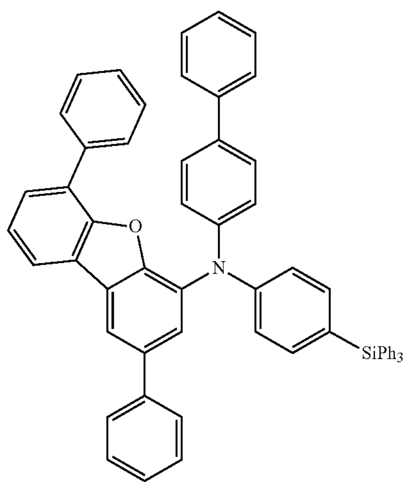
A192
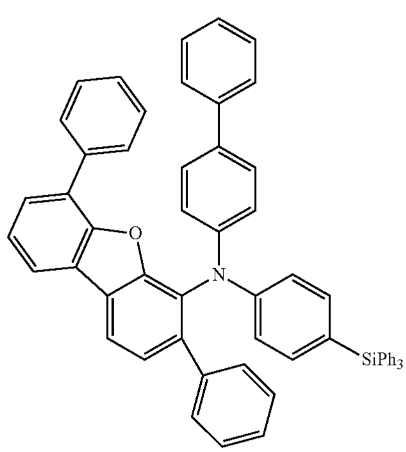
A193
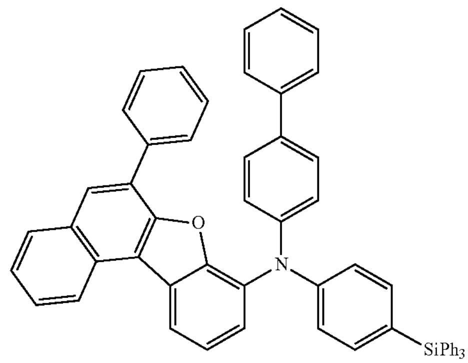
A194
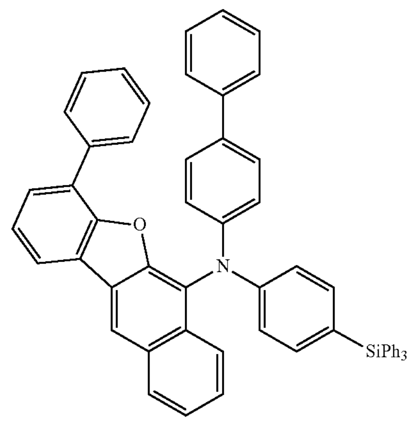
A195
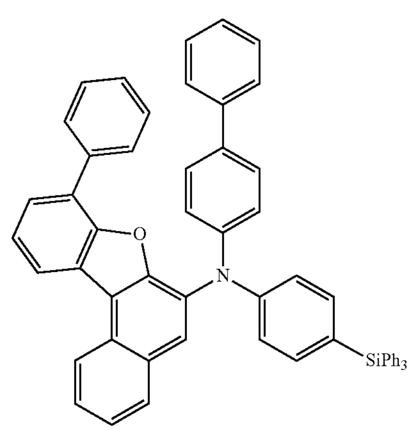

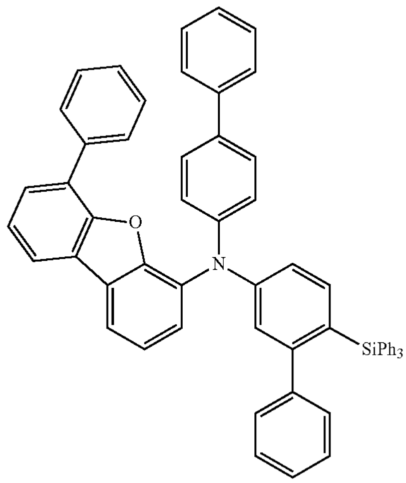
A196
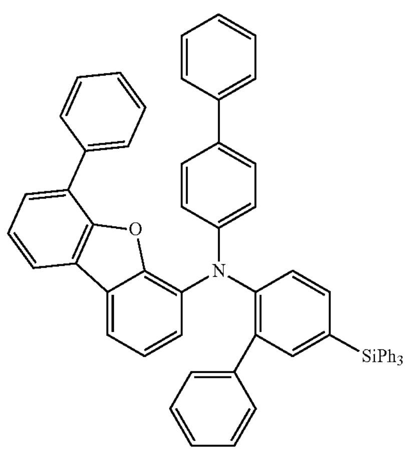
A197
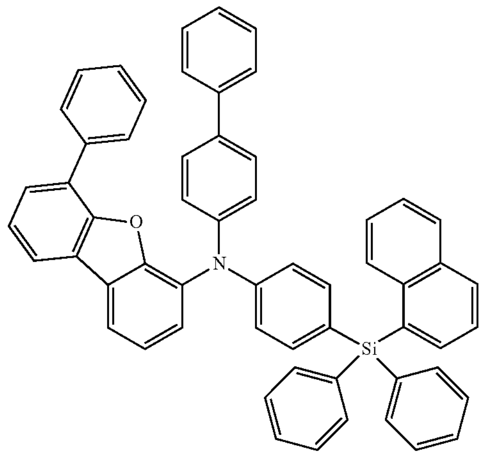
A198
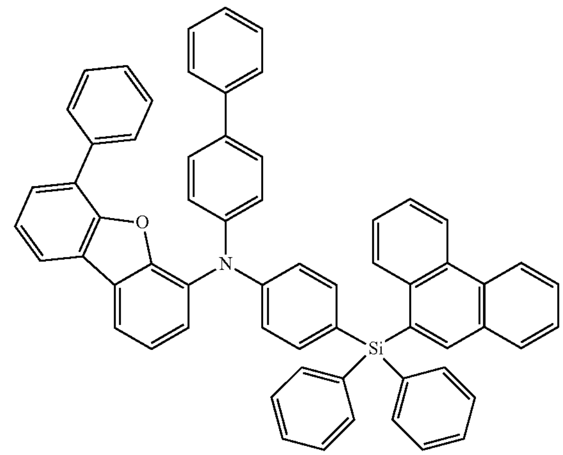
A199
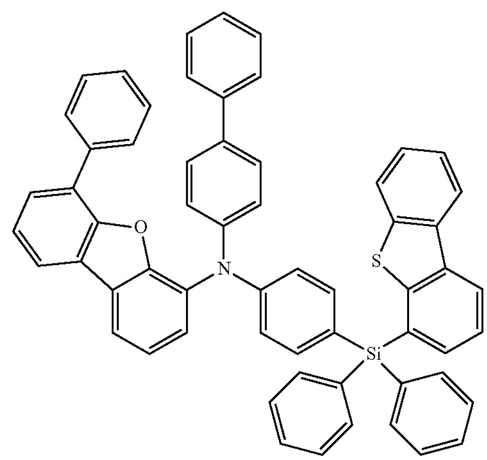
A200
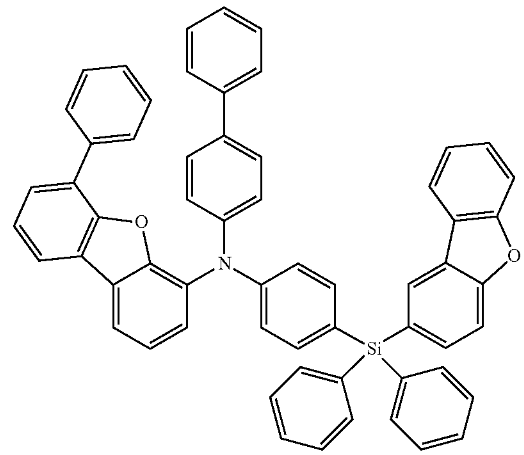
A201

-continued
A202
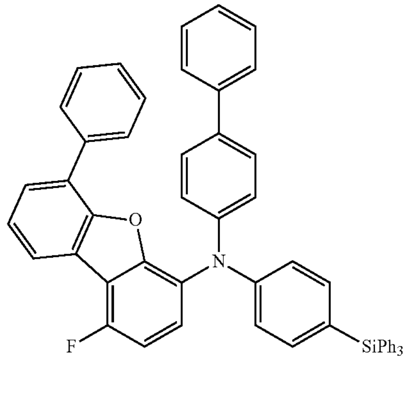
A203
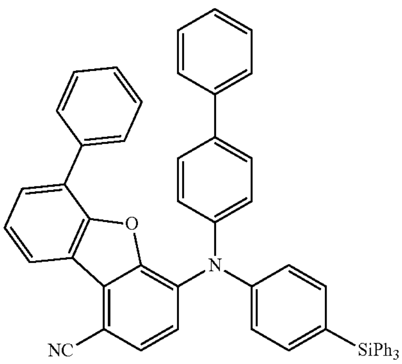
A204
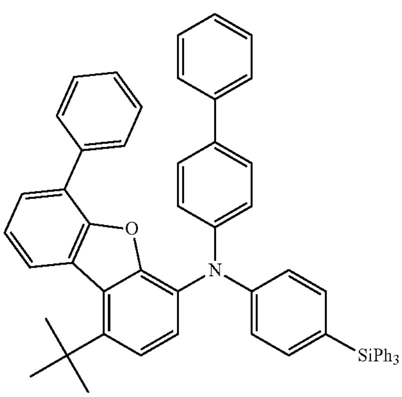
A205
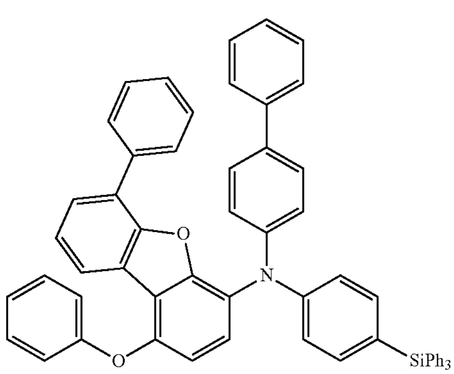
-continued
A206
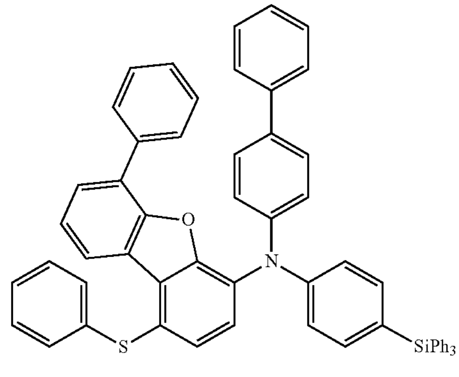
A207
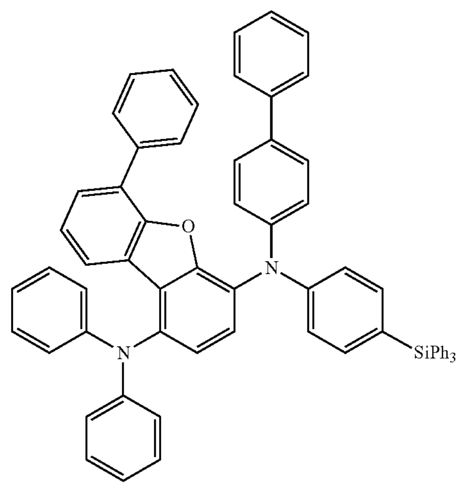
A208
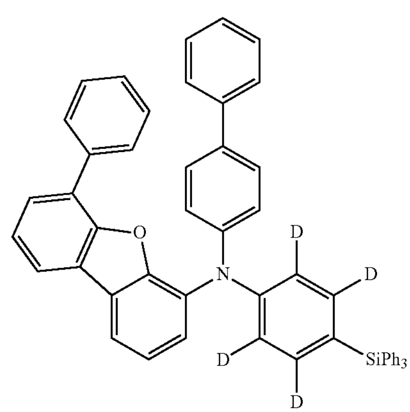

-continued
A209
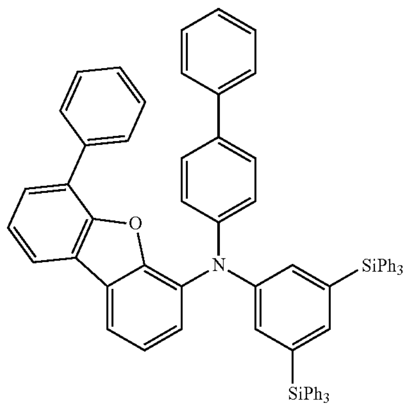
[Compound Group 2]
B1
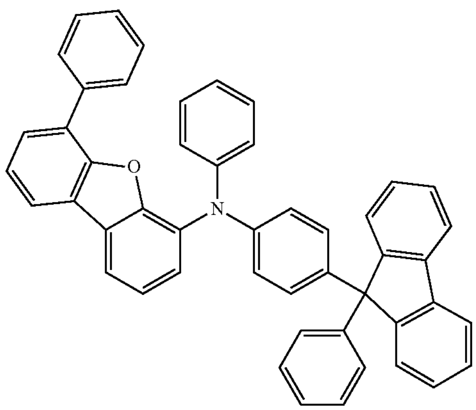
B2
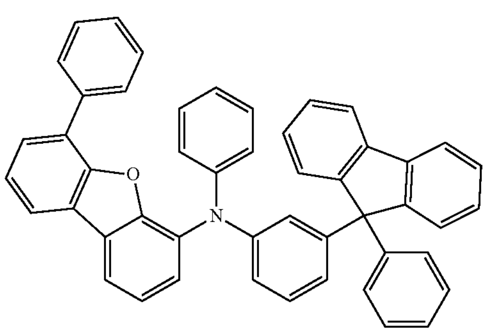
-continued
B3
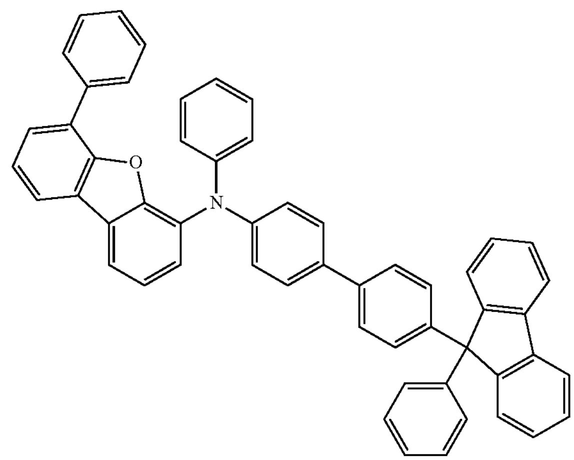
B4
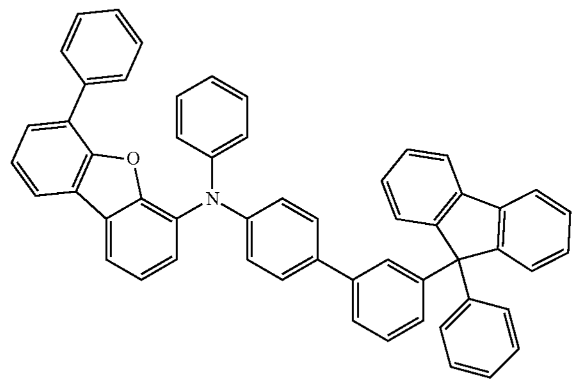
B5
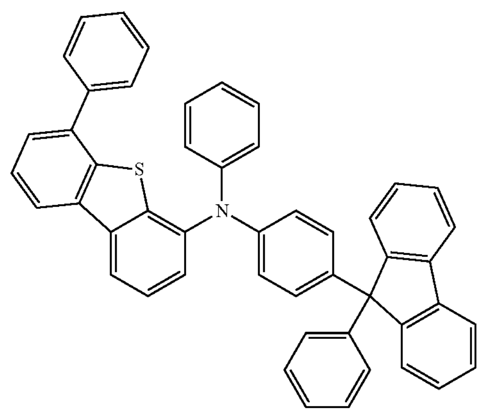
B6
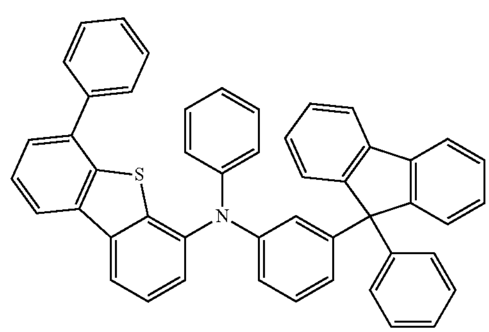

-continued
B7
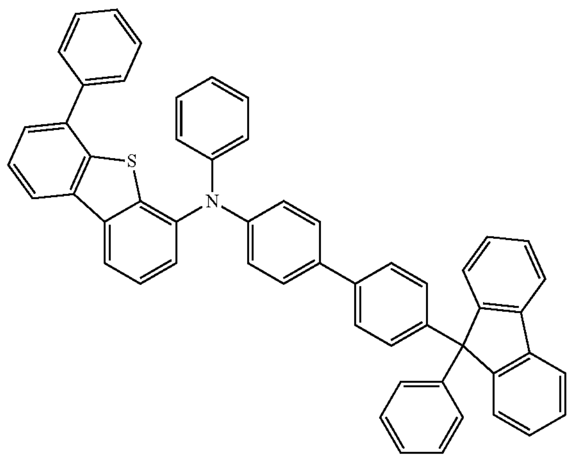
B8
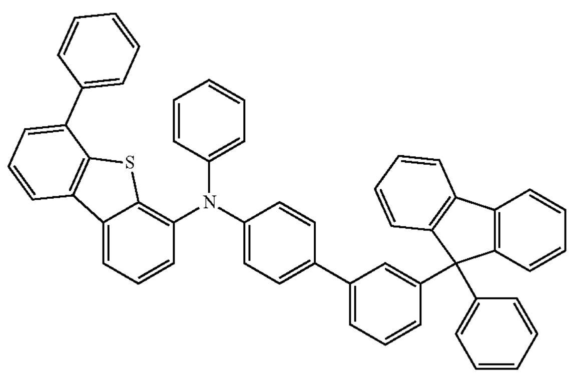
B9
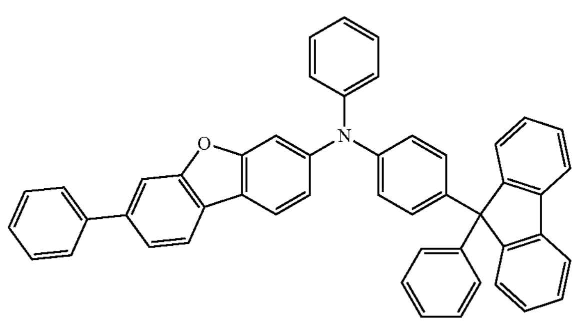
B10
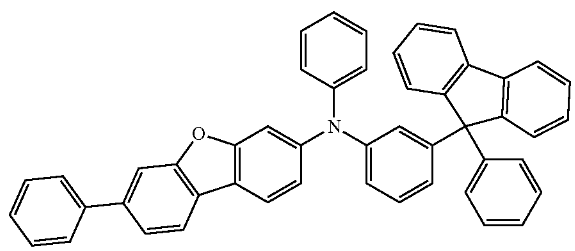
-continued
B11
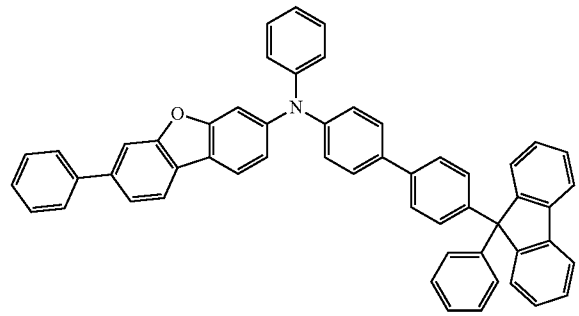
B12
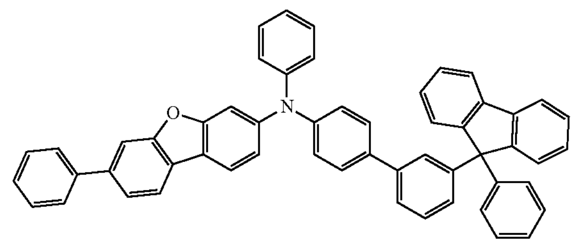
B13
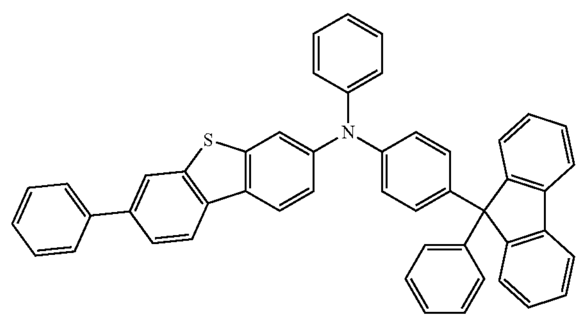
B14
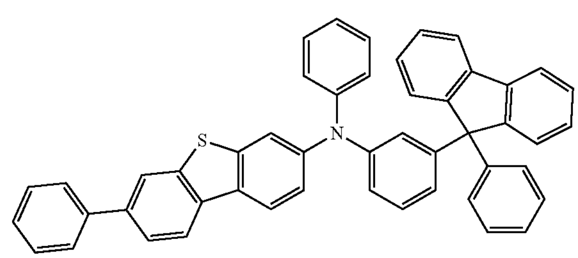
B15
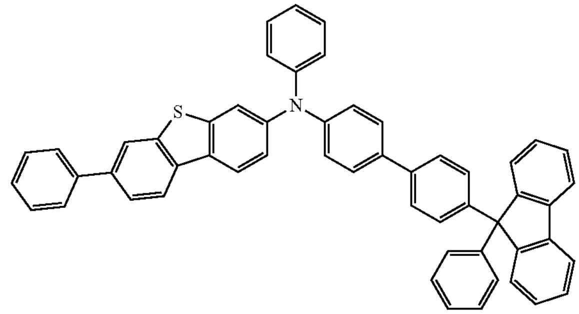

B16
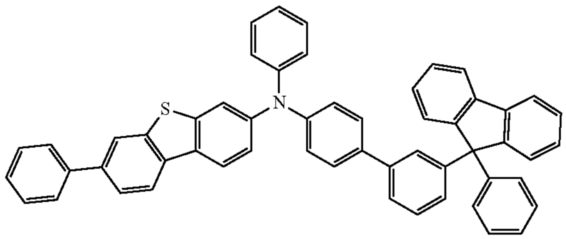
B17
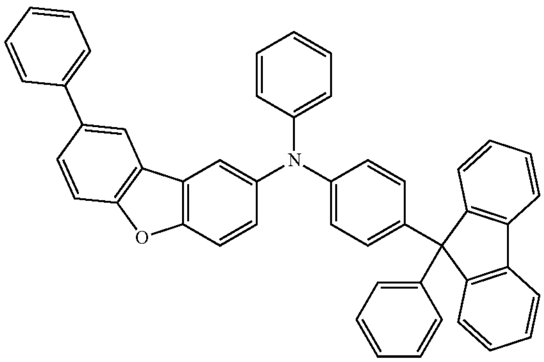
B18
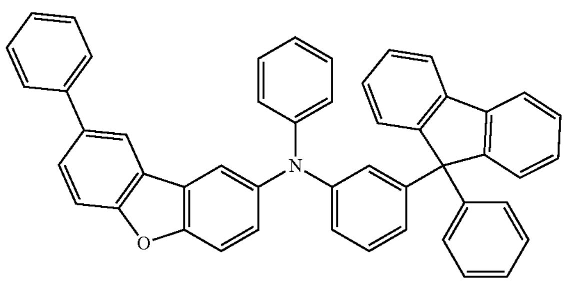
B19
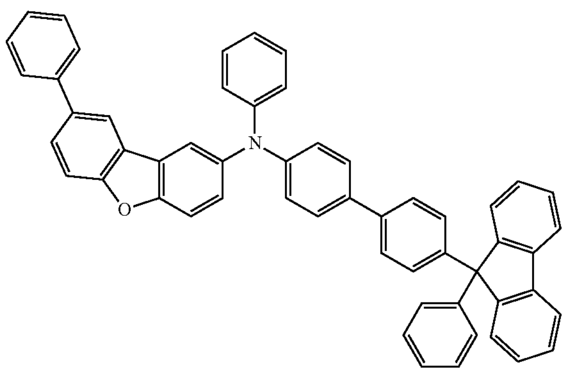
B20
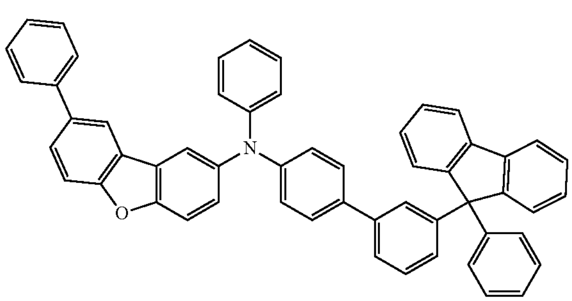
B21
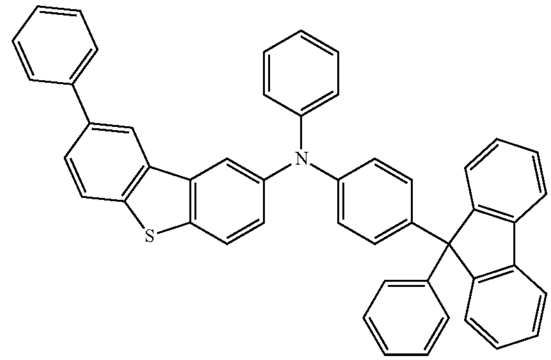
B22
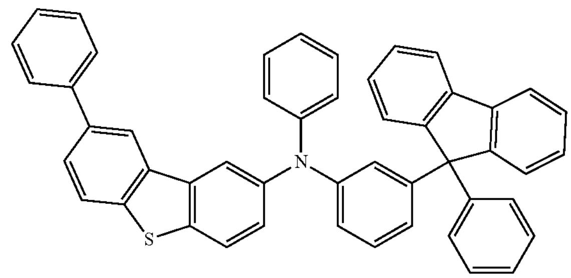
B23
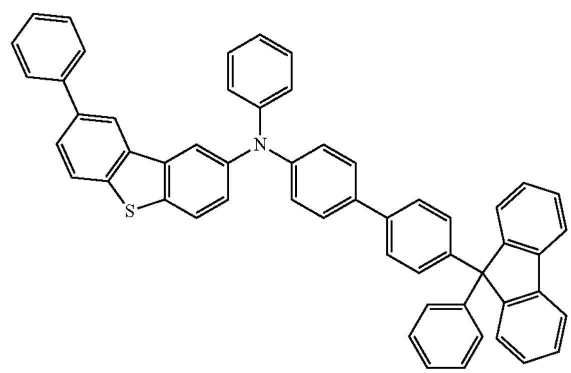
B24
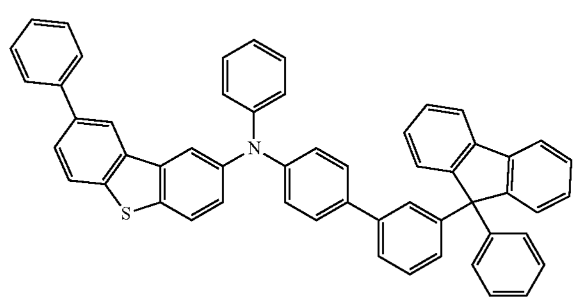

B25
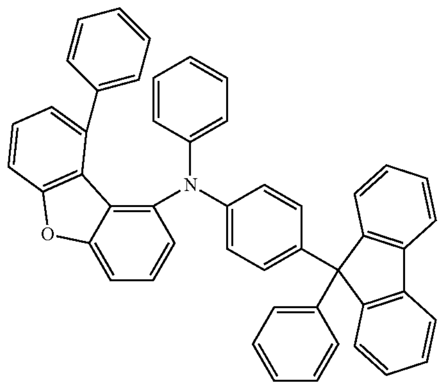
B26
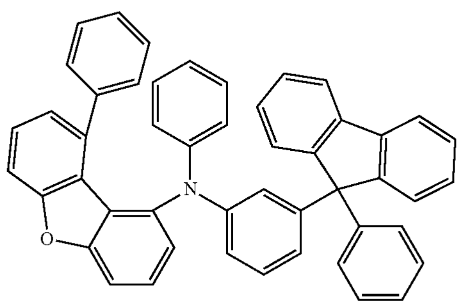
B27
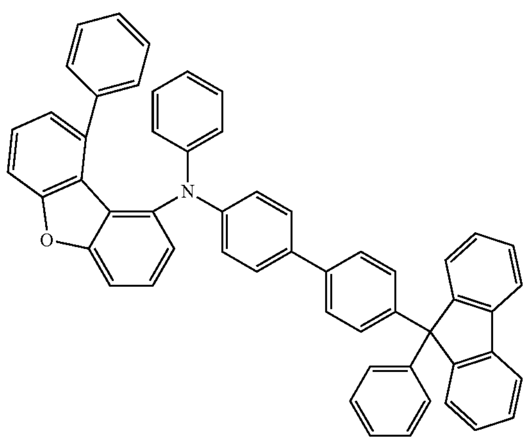
B28
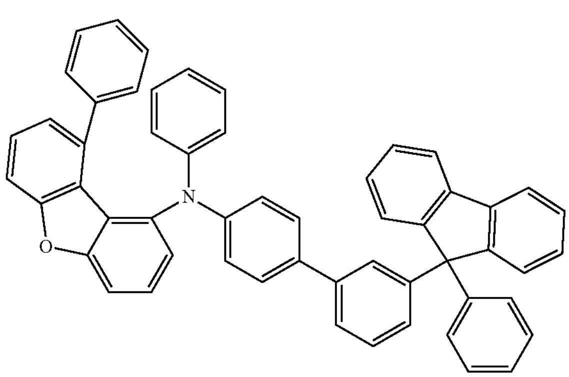
B29
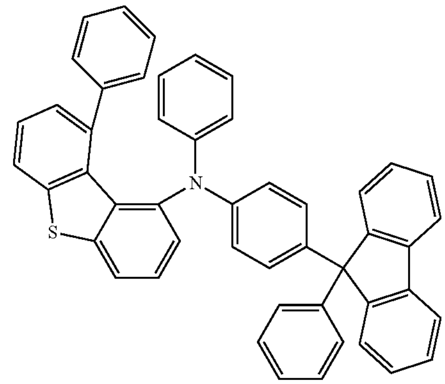
B30
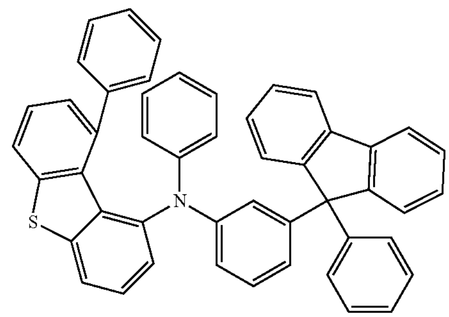
B31
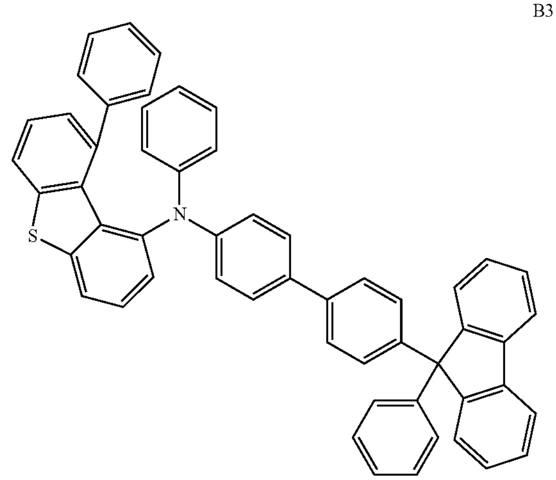
B32
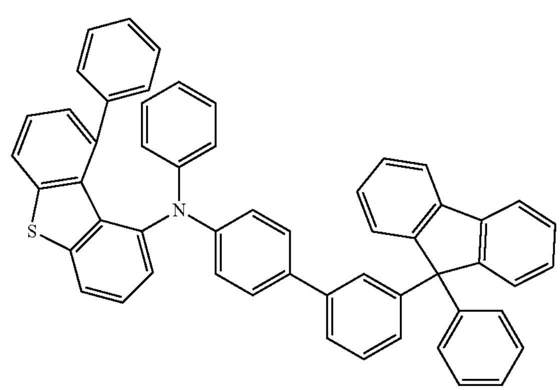

-continued
B33
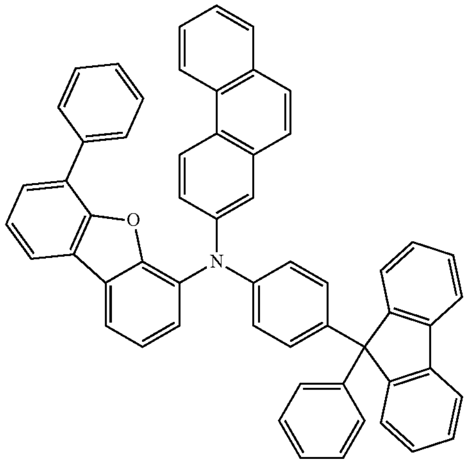
B34
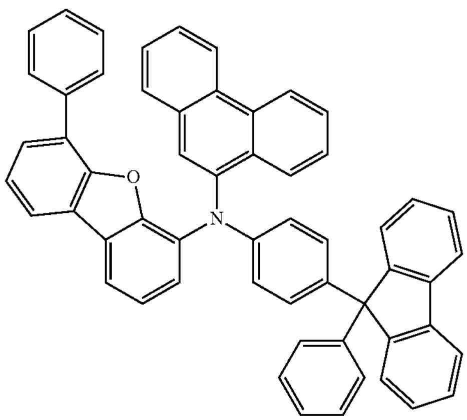
B35
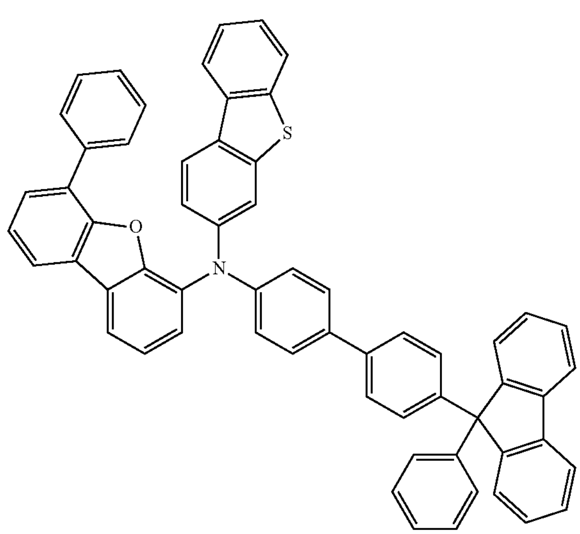
-continued
B36
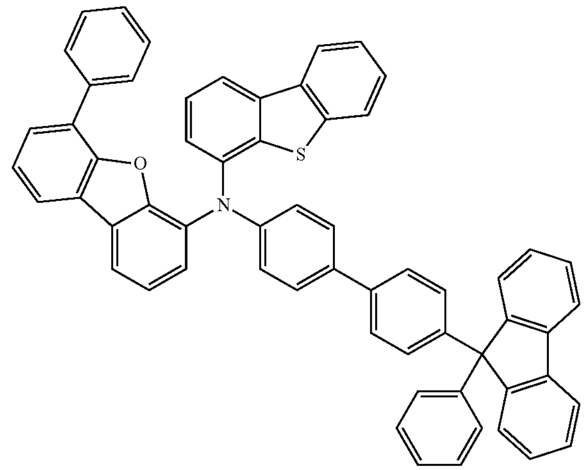
B37
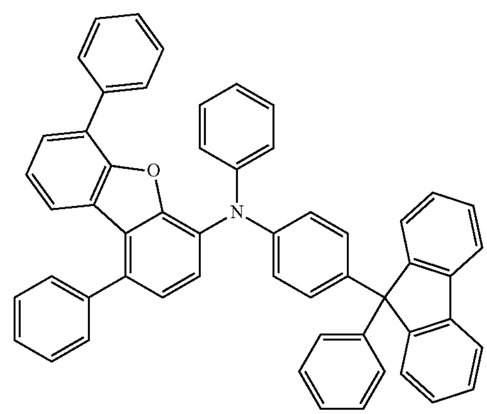
B38
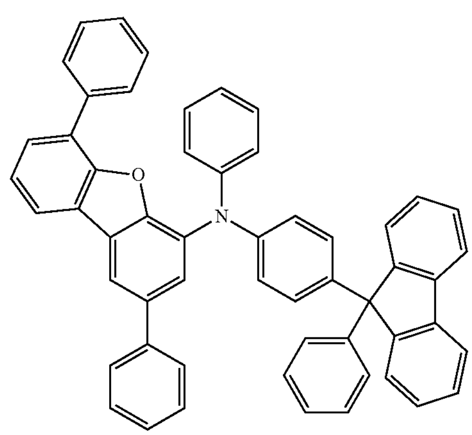

B39
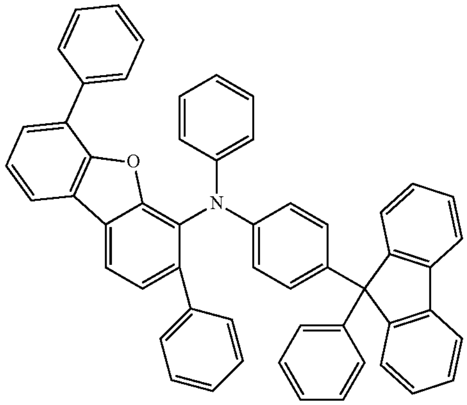
B40
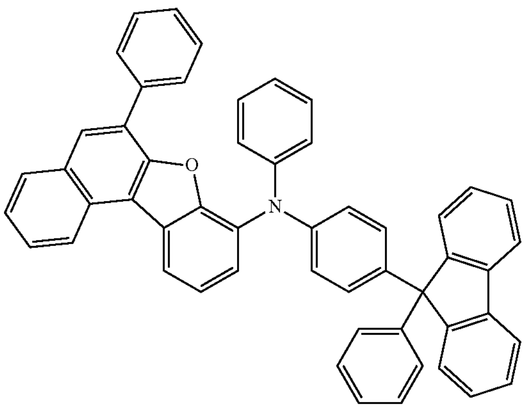
B41
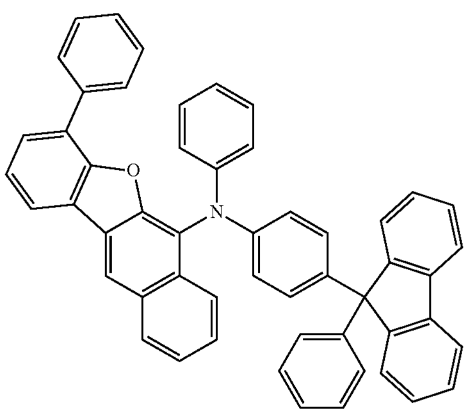
B42
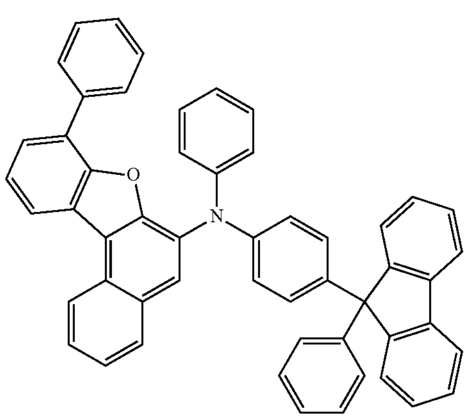
B43
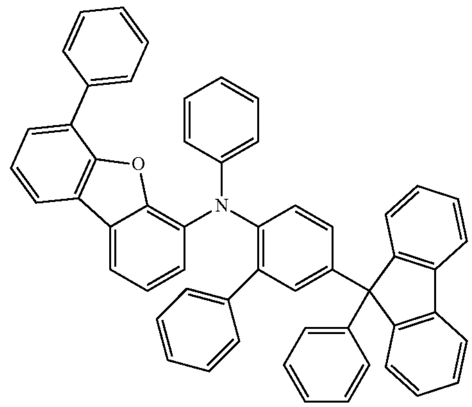
B44
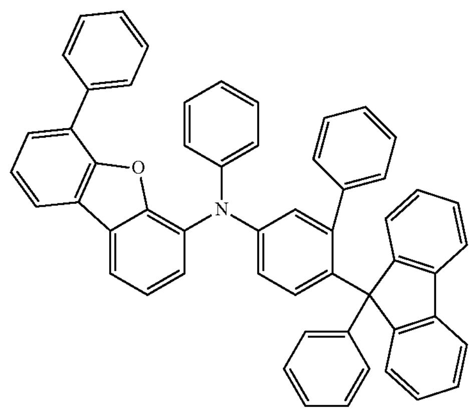
B45
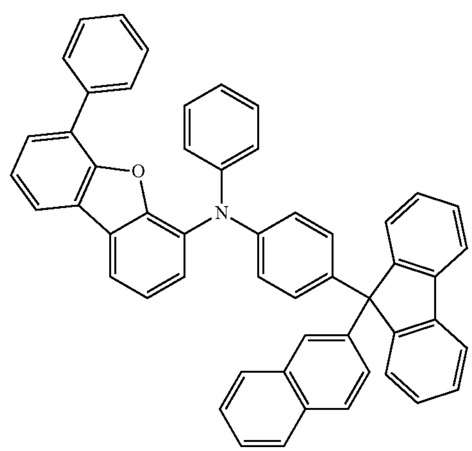

-continued
B46
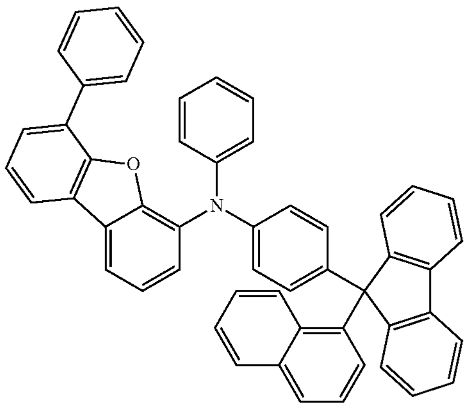
B47
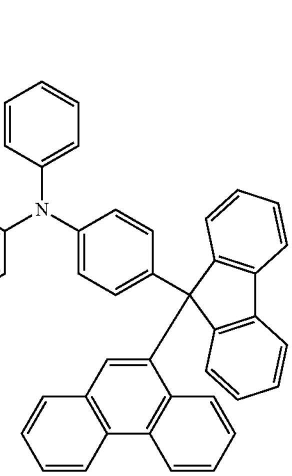
B48
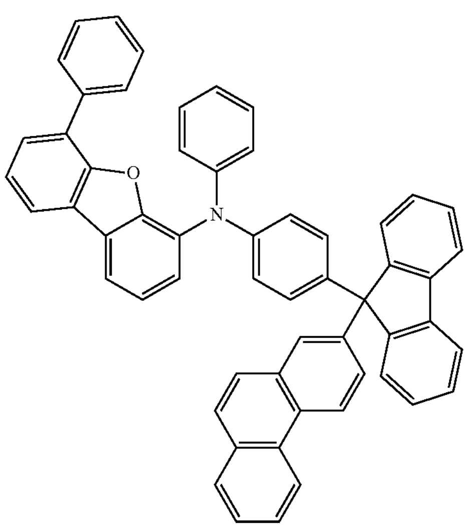
-continued
B49
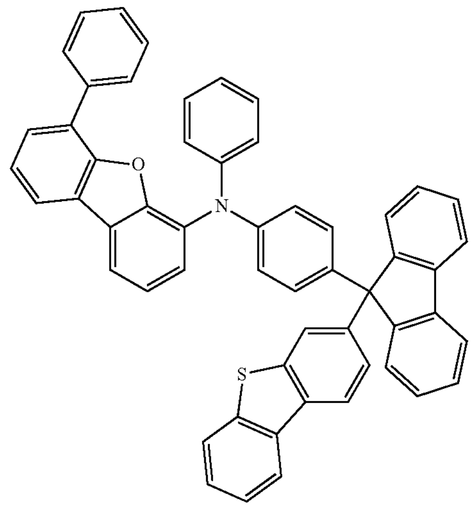
B50
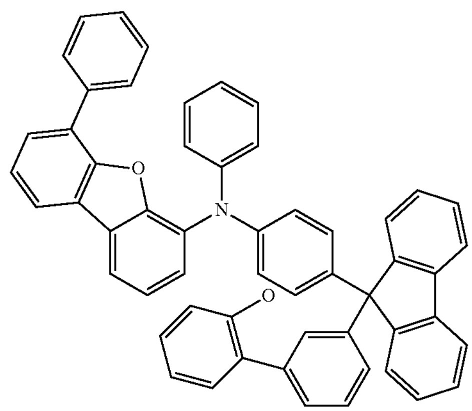
B51
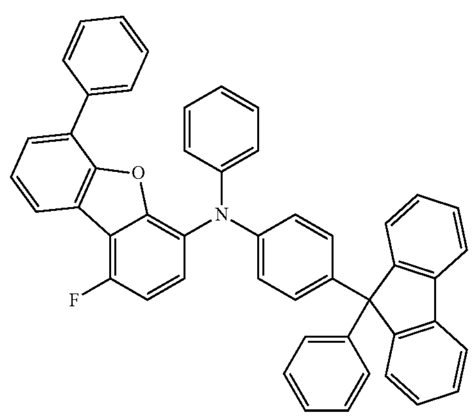

-continued
B52
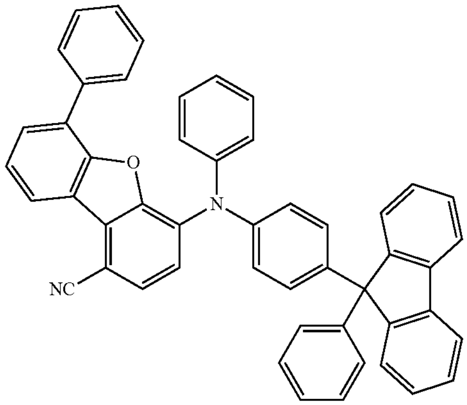
B53
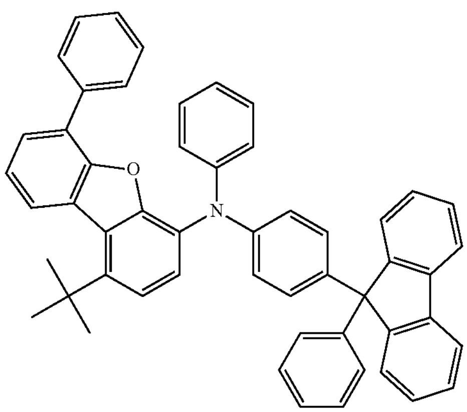
B54
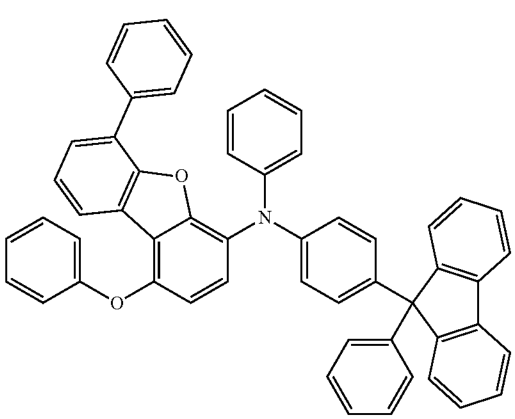
-continued
B55
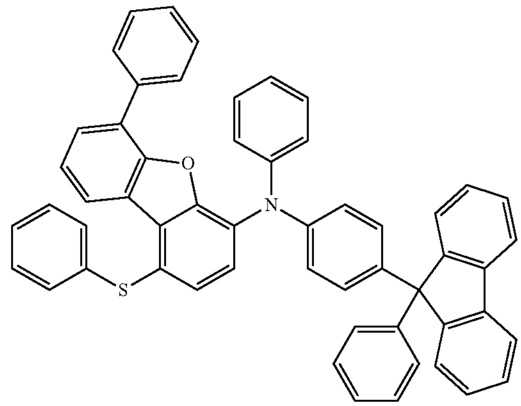
B56
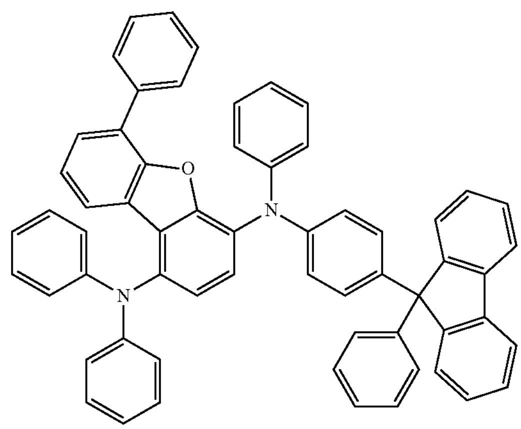
B57
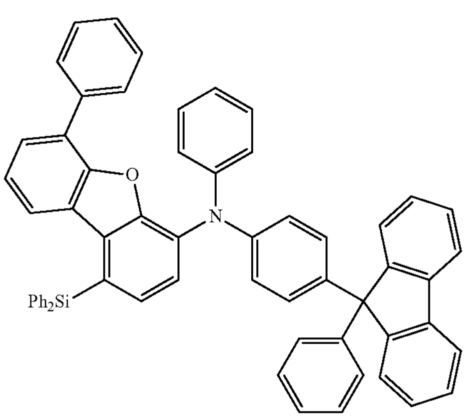

-continued

B58

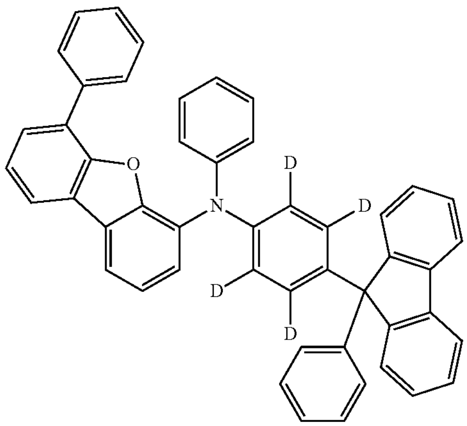

B59

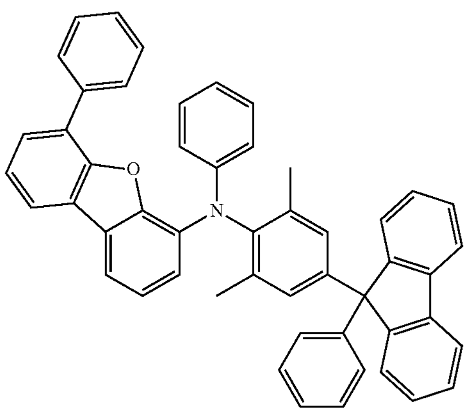

B60

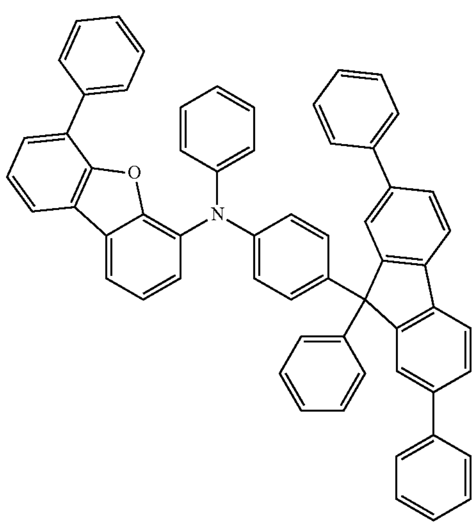

-continued

B61

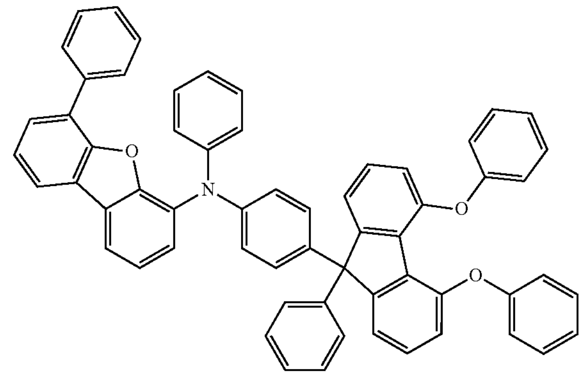

B62

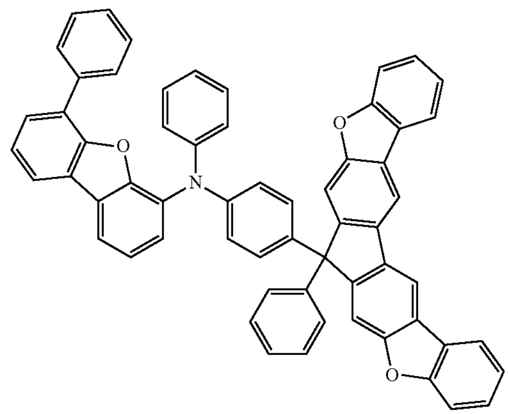

The organic electroluminescence device 10 of an embodiment may include the amine compound of an embodiment, represented by Formula 1 in the hole transport region HTR and may have improved emission efficiency. In addition, the organic electroluminescence device 10 of an embodiment may include the amine compound of an embodiment, represented by Formula 1 in the hole transport region HTR and may have improved external quantum efficiency.

The emission layer EML is provided on the hole transport region HTR. The thickness of the emission layer EML may be, for example, from about 100 Å to about 600 Å. The emission layer EML may have a single layer formed using a single material, a single layer formed using a plurality of different materials, or a multilayer structure having a plurality of layers formed using a plurality of different materials.

The emission layer EML may emit one of red, green, blue, white, yellow or cyan light. For example, in an organic electroluminescence device of an embodiment, the emission layer EML may emit blue light.

The emission layer EML may include a fluorescence material or a phosphorescence material. In addition, the emission layer EML may include a host and a dopant.

The emission layer EML may include a host. The host may be any commonly used material, without specific limitation, for example, tris(8-hydroxyquinolino)aluminum (Alq3), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2, 2'-dimethyl-biphenyl (CDBP), 2-methyl-9,10-bis(naphthalen-2-yl)anthracene (MADN), bis[2-(diphenylphosphino) phenyl] ether oxide (DPEPO), hexaphenyl cyclotriphosphazene (CPI), 1,4-bis(triphenylsilyl)benzene (UGH2), hexaphenylcyclotrisiloxane ($DPSiO_3$), octaphenylcyclotetrasiloxane ($DPSiO_4$), 2,8-bis(diphenylphosphoryl)dibenzofuran (PPF), etc.

The dopant may include, for example, styryl derivatives (for example, 1,4-bis[2-(3-N-ethylcarbazoryl)vinyl]benzene (BCzVB), 4-(di-p-tolylamino)-4'-[(di-p-tolylamino)styryl] stilbene (DPAVB), and N-(4-((E)-2-(6-((E)-4-(diphenylamino)styryl)naphthalen-2-yl)vinyl)phenyl)-N-phenylbenzenamine (N-BDAVBi), perylene and the derivatives thereof (for example, 2,5,8,11-tetra-t-butylperylene (TBP)), pyrene and the derivatives thereof (for example, 1,1-dipyrene, 1,4-dipyrenylbenzene, 1,4-bis(N,N-diphenylamino)pyrene), etc.

If the emission layer EML emits red light, the emission layer EML may further include a fluorescence material including tris(dibenzoylmethanato)phenanthroline europium (PBD:Eu(DBM)3(Phen)) or perylene. If the emission layer EML emits red color, the dopant included in the emission layer EML may be selected from, for example, a metal complex or an organometallic complex such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr) and octaethylporphyrin platinum (PtOEP), rubrene and the derivatives thereof, and 4-dicyanomethylene-2-(p-dimethylaminostyryl)-6-methyl-4H-pyrane (DCM) and the derivatives thereof.

If the emission layer EML emits green light, the emission layer EML may further include a fluorescence material including tris(8-hydroxyquinolino)aluminum (Alq3). If the emission layer EML emits green light, the dopant included in the emission layer EML may be selected from, for example, a metal complex or an organometallic complex such as fac-tris(2-phenylpyridine)iridium (Ir(ppy)3), and coumarin and the derivatives thereof.

If the emission layer EML emits blue light, the emission layer EML may further include a fluorescence material including, for example, any one selected from the group consisting of spiro-DPVBi, Spiro-6P, distyryl-benzene (DSB), distyryl-arylene (DSA), and polyfluorene (PFO)-based polymer and poly(p-phenylene vinylene (PPV)-based polymer. If the emission layer EML emits blue light, the dopant included in the emission layer EML may be, for example, selected from a metal complex or an organometallic complex such as (4,6-F2ppy)2Irpic, and perylene and the derivatives thereof.

The electron transport region ETR is provided on the emission layer EML. The electron transport region ETR may include at least one of a hole blocking layer, an electron transport layer ETL or an electron injection layer EIL. However, an embodiment of the inventive concept is not limited thereto.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of the electron injection layer EIL or the electron transport layer ETL, or a single layer structure formed using an electron injection material and an electron transport material. Further, the electron transport region ETR may have a single layer structure having a plurality of different materials, or a structure laminated from the first electrode EL1 of electron transport layer ETL/electron injection layer EIL, or hole blocking layer/electron transport layer ETL/electron injection layer EIL, without limitation. The thickness of the electron transport region ETR may be, for example, from about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

If the electron transport region ETR includes an electron transport layer ETL, the electron transport region ETR may include a known material. For example, the electron transport region ETR may include tris(8-hydroxyquinolinato) aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq2), 9,10-di (naphthalene-2-yl)anthracene (ADN), or a mixture thereof, without limitation.

If the electron transport region ETR includes the electron transport layer ETL, the thickness of the electron transport layer ETL may be from about 100 Å to about 1,000 Å and may be, for example, from about 150 Å to about 500 Å. If the thickness of the electron transport layer ETL satisfies the above-described range, satisfactory electron transport properties may be obtained without substantial increase of a driving voltage.

If the electron transport region ETR includes the electron injection layer EIL, the electron transport region ETR may include a known material. For example, the electron transport region ETR may include LiF, lithium quinolate (LiQ), $Li_2O$, BaO, NaCl, CsF, a metal in lanthanoides such as Yb, or a metal halide such as RbCl, and RbI. However, an embodiment of the inventive concept is not limited thereto. The electron injection layer EIL also may be formed using a mixture material of an electron transport material and an insulating organo metal salt. The organo metal salt may be a material having an energy band gap of about 4 eV or more. Particularly, the organo metal salt may include, for example, metal acetates, metal benzoates, metal acetoacetates, metal acetylacetonates, or metal stearates.

If the electron transport region ETR includes the electron injection layer EIL, the thickness of the electron injection layer EIL may be from about 1 Å to about 100 Å, from about 3 Å to about 90 Å. If the thickness of the electron injection layer EIL satisfies the above described range, satisfactory electron injection properties may be obtained without inducing the substantial increase of a driving voltage.

The electron transport region ETR may include a hole blocking layer as described above. The hole blocking layer may include, for example, at least one of 2,9-dimethyl-4,7-diphenyl-1,10-phenanthroline (BCP), or 4,7-diphenyl-1,10-phenanthroline (Bphen). However, an embodiment of the inventive concept is not limited thereto.

The second electrode EL2 is provided on the electron transport region ETR. The second electrode EL2 has conductivity. The second electrode EL2 may be formed using a metal alloy or a conductive compound. The second electrode EL2 may be a cathode. The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed using the above-described materials and a transparent conductive layer formed using ITO, IZO, ZnO, ITZO, etc.

Though not shown, the second electrode EL2 may be connected with an auxiliary electrode. If the second electrode EL2 is connected with the auxiliary electrode, the resistance of the second electrode EL2 may decrease.

In the organic electroluminescence device 10, according to the application of a voltage to each of the first electrode EL1 and second electrode EL2, holes injected from the first electrode EL1 may move via the hole transport region HTR to the emission layer EML, and electrons injected from the second electrode EL2 may move via the electron transport region ETR to the emission layer EML. The electrons and the holes are recombined in the emission layer EML to produce excitons, and the excitons may emit light via transition from an excited state to a ground state.

If the organic electroluminescence device 10 is a top emission type, the first electrode EU may be a reflective electrode and the second electrode EL2 may be a transmissive electrode or a transflective electrode. If the organic electroluminescence device 10 is a bottom emission type, the first electrode EL1 may be a transmissive electrode or a transflective electrode and the second electrode EL2 may be a reflective electrode.

The organic electroluminescence device of an embodiment includes the amine compound of an embodiment and may have improved emission efficiency. In addition, the organic electroluminescence device of an embodiment includes the amine compound having high lowest triplet energy in a hole transport region, and the diffusion of triplet excitons produced in the emission layer may be restrained and high external quantum efficiency may be achieved.

Meanwhile, the organic electroluminescence device of an embodiment may be a blue light-emitting device, a green light-emitting device, a red light-emitting device or a white light-emitting device. In addition, if the organic electroluminescence device is a blue light-emitting device, high emission efficiency may be shown. However, an embodiment of the inventive concept is not limited thereto.

Hereinafter an amine compound according to an embodiment and an organic electroluminescence device including the amine compound according to an embodiment will be explained in more detail with reference to embodiments and comparative embodiments. The following embodiments are only illustrations to assist the understanding of the inventive concept, and the scope of the inventive concept is not limited thereto

EXAMPLES

1. Synthesis of Amine Compound

First, the synthetic method of the amine compound according to an embodiment of the inventive concept will be particularly explained referring to the synthetic methods of Compounds A1, A76, A126 and A151 in Compound Group 1 and Compound B15 in Compound Group 2. In addition, the synthetic method of an amine compound explained below is only an embodiment, and the synthetic method of an amine compound according to an embodiment of the inventive concept is not limited thereto.

(Synthesis of Compound A1)

An amine compound according to an embodiment, Compound A1 may be synthesized, for example, by performing the steps of Reaction 1 to Reaction 3 below.

(1) Synthesis of Intermediate A

[Reaction 1]

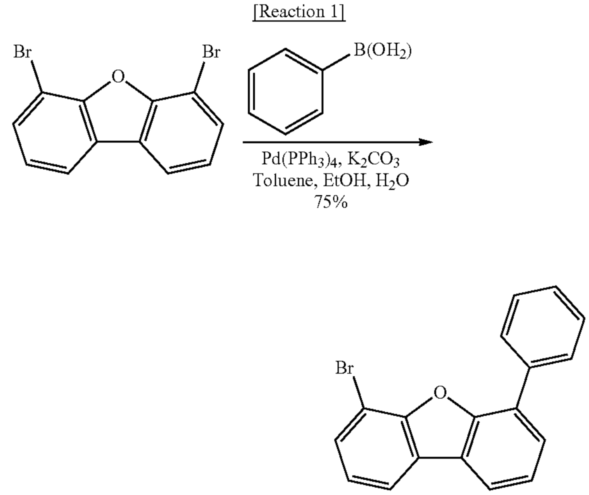

A

Under an argon atmosphere, to a 1,000 ml Erlenmeyer flask, 4,6-dibromodibenzofuran (16.3 g, 50 mmol), phenylboronic acid (6.71 g, 55 mmol), $K_2CO_3$ (20.7 g, 150 mmol), $Pd(PPh_3)_4$ (2.89 g, 2.5 mmol), 500 ml of a mixture solution of toluene/EtOH/$H_2O$ (4/2/1) were added in order, followed by heating and refluxing at a temperature of about 80° C. for about 5 hours. Then, the reaction mixture was cooled to room temperature, and toluene was added thereto. An aqueous layer was removed, and an organic layer was washed with a saline solution and dried with $MgSO_4$. $MgSO_4$ was filtered and separated, and an organic layer was concentrated. The crude product thus obtained was separated by silica gel column chromatography (using a mixture solvent of hexane/toluene) and recrystallized to obtain Intermediate A as a white solid (12.1 g, yield 75%). The structure of the product was identified using FAB-MS (m/z=323).

(2) Synthesis of Intermediate B

[Reaction 2]

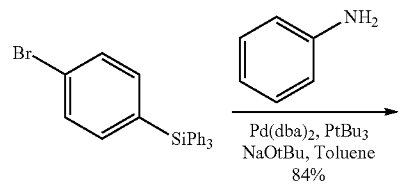

-continued

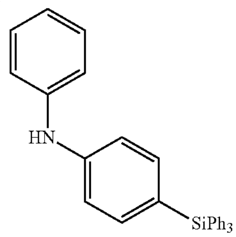

B

Under an argon atmosphere, to a 500 ml Erlenmeyer flask, 4-bromotetraphenylsilane (20.77 g, 50 mmol), $Pd(dba)_2$ (0.86 g, 1.5 mmol), NaOtBu (4.80 g, 50 mmol), toluene (250 ml), aniline (5.12 g, 55 mmol), $PtBu_3$ (1.01 g, 5 mmol) were added in order, followed by heating and refluxing for about 6 hours. Then, the reaction mixture was cooled to room temperature, and toluene was added thereto. An aqueous layer was removed, and an organic layer was washed with a saline solution and dried with $MgSO_4$. $MgSO_4$ was filtered and separated, and an organic layer was concentrated. The crude product thus obtained was separated by silica gel column chromatography (using a mixture solvent of hexane/toluene) and recrystallized to obtain Intermediate B as a white solid (17.96 g, yield 84%). The structure of the product was identified using FAB-MS (m/z=427).

(3) Synthesis of Compound A1

[Reaction 3]

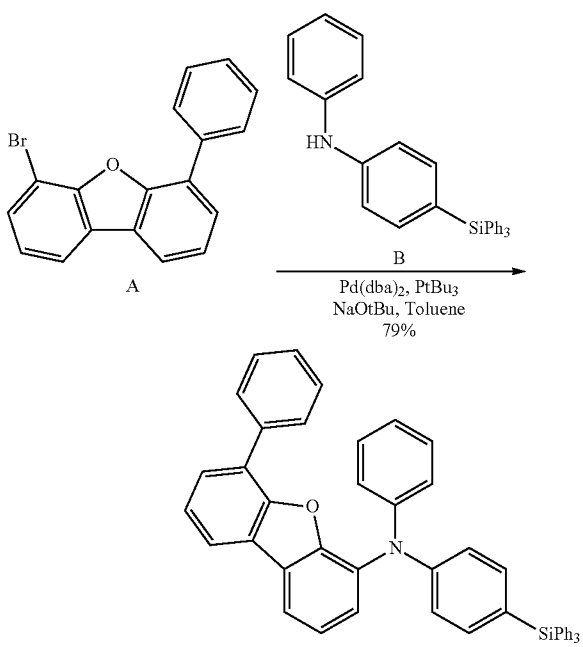

A1

Under an argon atmosphere, to a 300 ml Erlenmeyer flask, Intermediate A (3.86 g, 11.96 mmol), Intermediate B (4.86 g, 11.39 mmol), $Pd(dba)_2$ (0.196 g, 0.34 mmol), NaOtBu (1.64 g, 17.1 mmol), toluene (100 ml), and $PtBu_3$ (0.23 g, 1.1 mmol) were added in order, followed by heating and refluxing for about 6 hours. Then, the reaction mixture was cooled to room temperature, and toluene was added thereto. An aqueous layer was removed, and an organic layer was washed with a saline solution and dried with $MgSO_4$. $MgSO_4$ was filtered and separated, and an organic layer was concentrated. The crude product thus obtained was separated by silica gel column chromatography (using a mixture solvent of hexane/toluene) and recrystallized to obtain Compound A1 as a white solid (6.03 g, yield 79%). The structure of the product was identified using FAB-MS (m/z=699).

(Synthesis of Compound A76)

An amine compound according to an embodiment, Compound A76 may be synthesized by performing the steps of Reaction 4 and Reaction 5 below.

(1) Synthesis of Intermediate C

[Reaction 4]

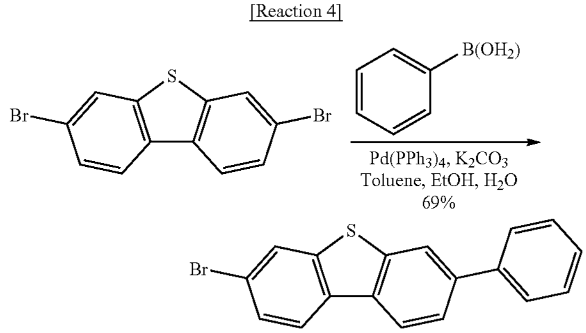

C

The same method as the synthetic method of Intermediate A was conducted except for using 3,7-dibromodibenzothiophene (17.1 g, 50 mmol) instead of 4,6-dibromodibenzofuran (16.3 g, 50 mmol) to obtain Intermediate C as a white solid (14.04 g, yield 69%). The structure of the product was identified using FAB-MS (m/z=339).

(2) Synthesis of Compound A76

[Reacton 5]

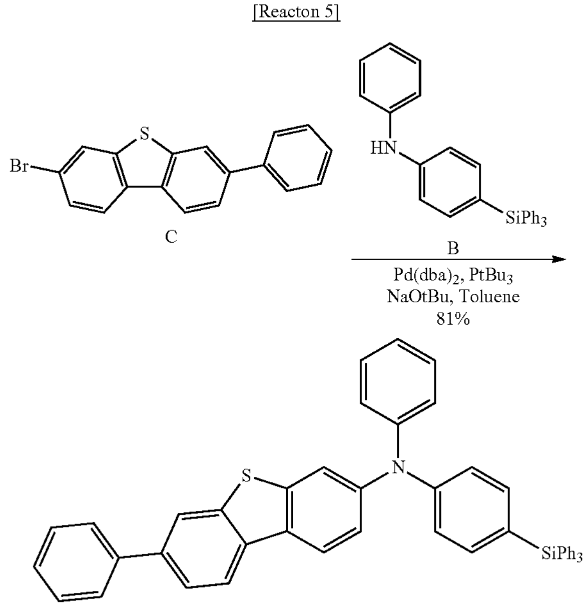

A76

The same method as the synthetic method of Compound A1 was conducted except for using Intermediate C (4.07 g, 12 mmol) and Intermediate B (4.88 g, 11.43 mmol) instead of Intermediate A (3.86 g, 11.96 mmol) and Intermediate B (4.86 g, 11.39 mmol) to obtain Compound A76 as a white solid (6.35 g, yield 81%). The structure of the product was identified using FAB-MS (m/z=685).

(Synthesis of Compound B15)

An amine compound according to an embodiment, Compound B15 may be synthesized by performing the steps of Reaction 6 and Reaction 7 below.

(1) Synthesis of Intermediate D

[Reaction 6]

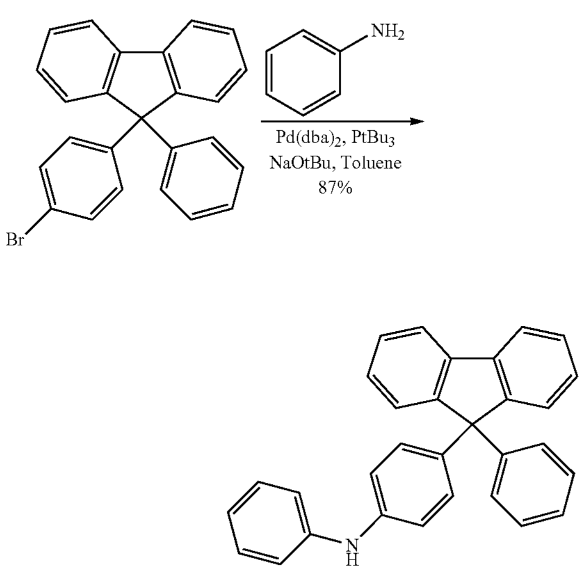

D

The same method as the synthetic method of Intermediate B was conducted except for using 9-(4-bromophenyl)-9-phenyl-9H-fluorene (19.87 g, 50 mmol) instead of 4-bromotetraphenylsilane (20.77 g, 50 mmol) to obtain Intermediate D as a white solid (17.81 g, yield 87%). The structure of the product was identified using FAB-MS (m/z=409).

(2) Synthesis of Compound B15

[Reaction 7]

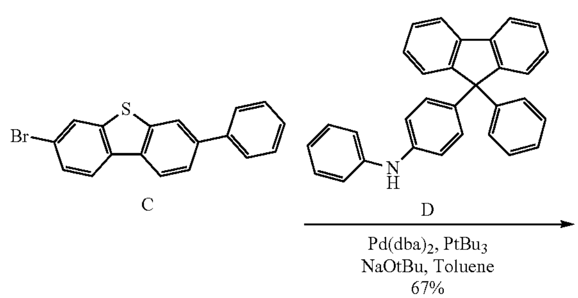

-continued

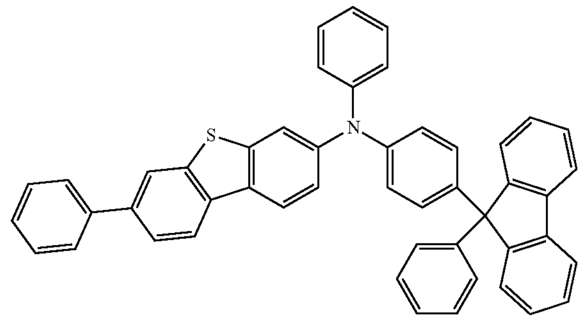

B15

The same method as the synthetic method of Compound A1 was conducted except for using Intermediate C (4.07 g, 12 mmol) and Intermediate D (4.67 g, 11.43 mmol) instead of Intermediate A (3.86 g, 11.96 mmol) and Intermediate B (4.86 g, 11.39 mmol) to obtain Compound B15 as a white solid (5.11 g, yield 67%). The structure of the product was identified using FAB-MS (m/z=667).

(Synthesis of Compound A126)

An amine compound according to an embodiment, Compound A126 may be synthesized by performing the steps of Reaction 8 and Reaction 9 below.

(1) Synthesis of Intermediate E

[Reaction 8]

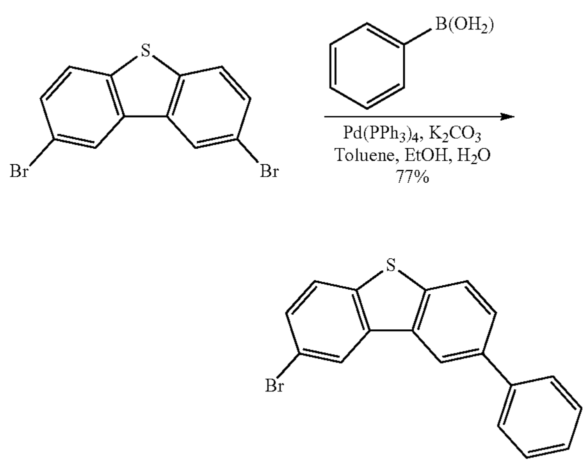

E

The same method as the synthetic method of Intermediate A was conducted except for using 2,8-dibromodibenzothiophene (17.1 g, 50 mmol) instead of 4,6-dibromodibenzofuran (16.3 g, 50 mmol) to obtain Intermediate E as a white solid (13.05 g, yield 77%). The structure of the product was identified using FAB-MS (m/z=339).

(2) Synthesis of Compound A126

[Reaction 9]

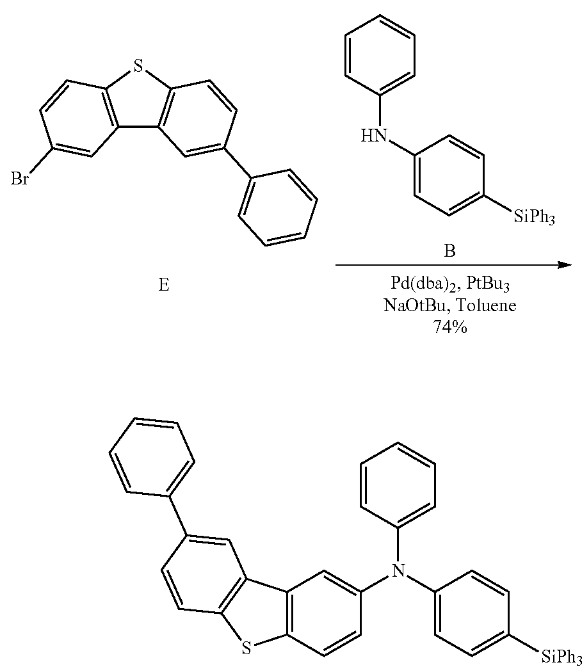

A126

The same method as the synthetic method of Compound A1 was conducted except for using Intermediate E (4.07 g, 12 mmol) and Intermediate B (4.88 g, 11.43 mmol) instead of Intermediate A (3.86 g, 11.96 mmol) and Intermediate B (4.86 g, 11.39 mmol) to obtain Compound A126 as a white solid (5.80 g, yield 74%). The structure of the product was identified using FAB-MS (m/z=685).

(Synthesis of Compound A151)

An amine compound according to an embodiment, Compound A151 may be synthesized by performing the steps of Reaction 10 and Reaction 11 below.

(1) Synthesis of Intermediate F

[Reaction 10]

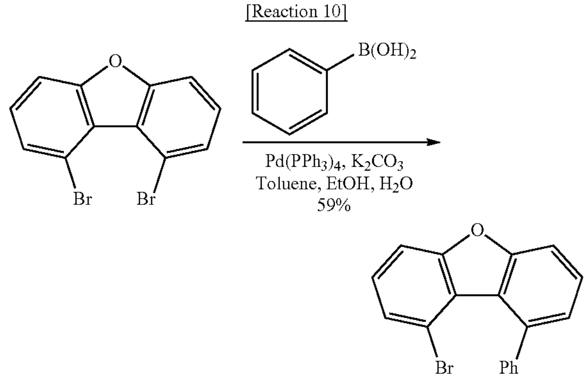

F

The same method as the synthetic method of Intermediate A was conducted except for using 1,9-dibromodibenzofuran (16.3 g, 50 mmol) instead of 4,6-dibromodibenzofuran (16.3 g, 50 mmol) to obtain Intermediate F as a white solid (9.53 g, yield 59%). The structure of the product was identified using FAB-MS (m/z=323).

(2) Synthesis of Compound A151

[Reaction 11]

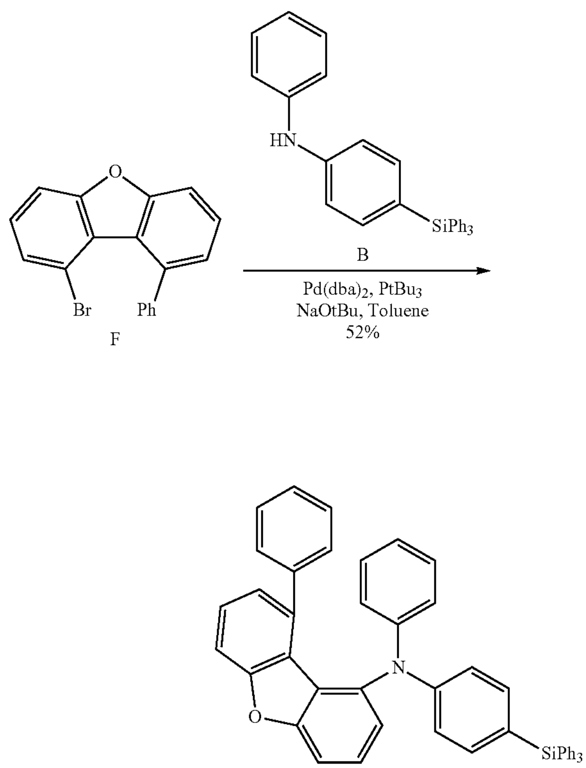

A151

The same method as the synthetic method of Compound A1 was conducted except for using Intermediate F (3.86 g, 11.96 mmol) instead of Intermediate A (3.86 g, 11.96 mmol) to obtain Compound A151 as a white solid (4.15 g, yield 52%). The structure of the product was identified using FAB-MS (m/z=699)

2. Manufacture and Evaluation of Organic Electroluminescence Device Including an Amine Compound (Manufacture of Organic Electroluminescence Device)

An organic electroluminescence device of an embodiment including the amine compound of an embodiment in a hole transport layer was manufactured by the method described below. Organic electroluminescence devices of Examples 1 to 5 were manufactured using the amine compounds of Compounds A1, A76, B15, A126 and A151 as materials for a hole transport layer. Organic electroluminescence devices of Comparative Examples 1 to 10 were manufactured using Comparative Compounds C1 to C10 below as materials for a hole transport layer.

The compounds used in Examples 1 to 5 and Comparative Examples 1 to 10 are listed in Table 1.

[Table 1]
TABLE 1
Compound A1
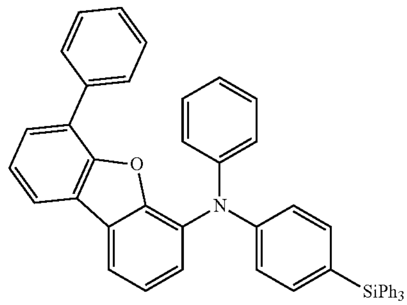
A1
Compound A76
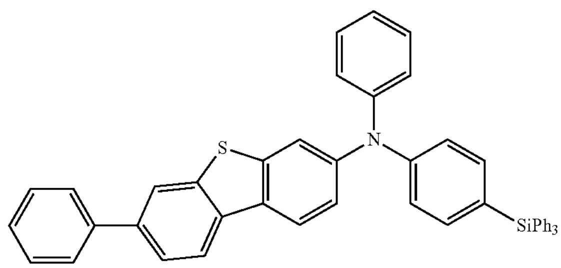
A76
Compound B15
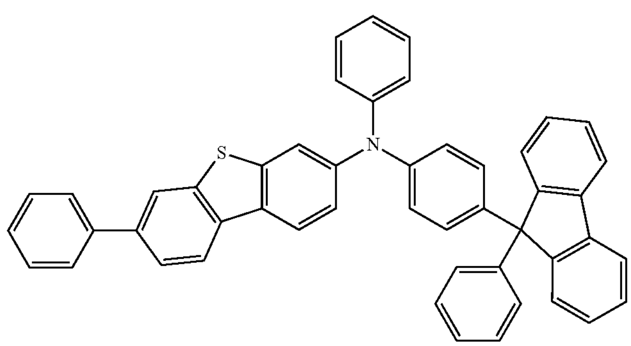
B15
Compound A126
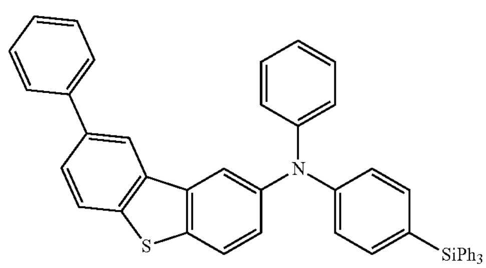
A126

TABLE 1-continued
Compound A151
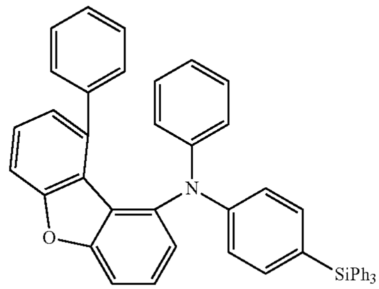
A151
Comparative Compound C1
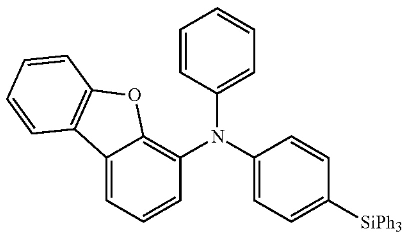
C1
Comparative Compound C2
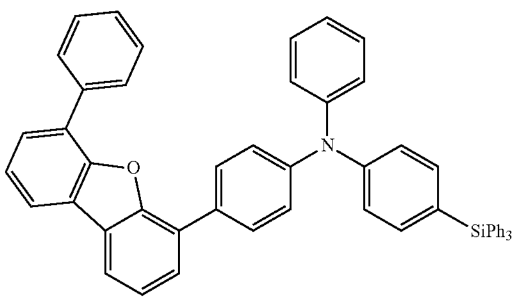
C2
Comparative Compound C3
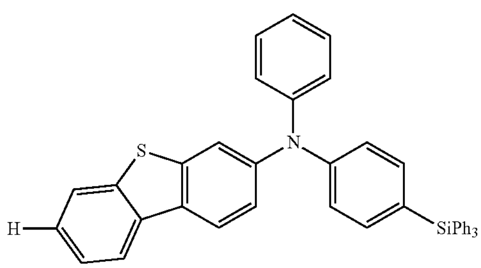
C3
Comparative Compound C4
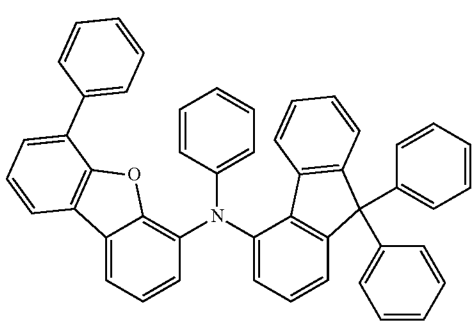
C4

TABLE 1-continued
Comparative Compound C5
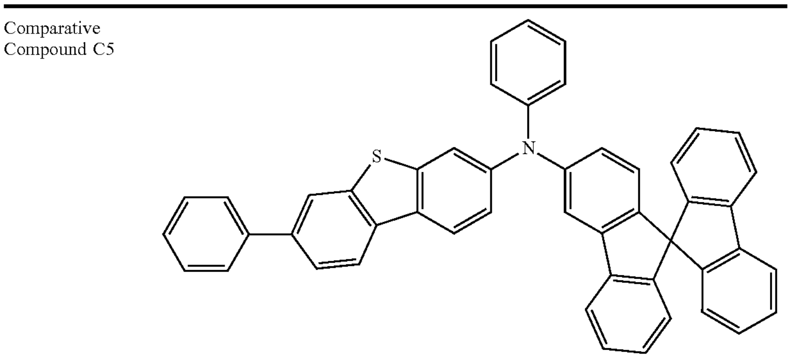
C5
Comparative Compound C6
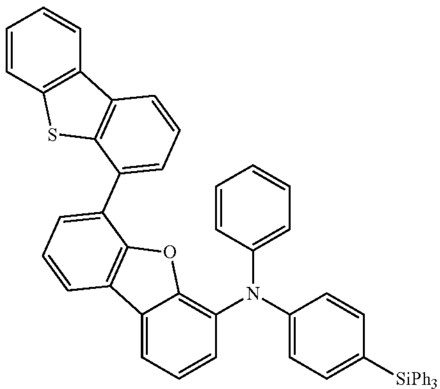
C6
Comparative Compound C7
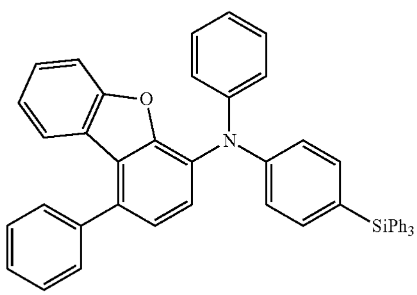
C7
Comparative Compound C8
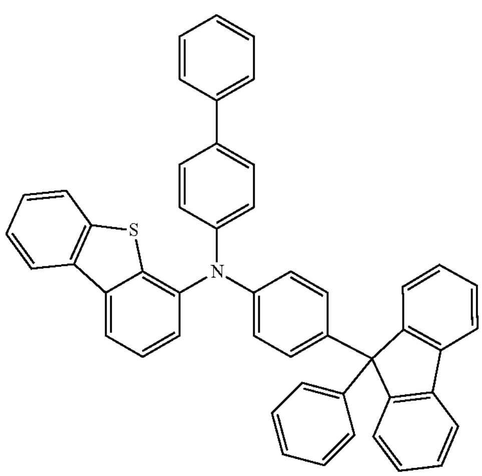
C8

TABLE 1-continued

| | |
|---|---|
| Comparative Compound C9 | 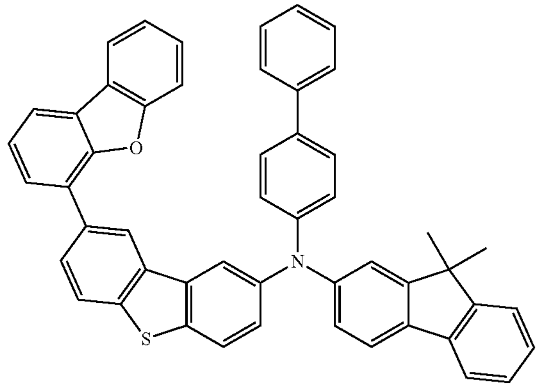 C9 |
| Comparative Compound C10 | 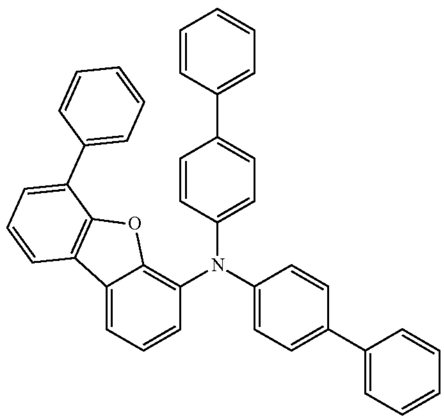 C10 |

The organic electroluminescence devices of the examples and the comparative examples were manufactured by the method described below.

On a glass substrate, ITO with a thickness of about 150 nm was patterned and washed with ultra-pure water, and a UV ozone treatment was conducted for about 10 minutes. Then, a hole injection layer was formed using 4,4',4"-tris{N-(1-naphthyl)-N-phenylamino}-triphenylamine (1-TNANA) to a thickness of about 60 nm, and a hole transport layer was formed using the example compound or the comparative compound to a thickness of about 30 nm.

Then, an emission layer was formed using dinaphthylanthracene (ADN) doped with 3% 2,5,8,11-tetra-tert-butylperylene (TBP) to a thickness of about 25 nm, and an electron transport layer was formed using Alq3 to a thickness of about 25 nm. Then, an electron injection layer was formed using LiF to a thickness of about 1 nm, and a second electrode was formed using aluminum (Al) to a thickness of about 100 nm.

In the embodiments, a hole injection layer, a first hole transport layer, a second hole transport layer, an emission layer, a first electron transport layer, a second electron transport layer, an electron injection layer and a second electrode were formed by using a vacuum deposition apparatus.

The materials used in the organic electroluminescence device may be represented by the formulae below.

(Evaluation of Properties of Organic Electroluminescence Device)

In order to evaluate the properties of the organic electroluminescence devices according to the examples and the comparative examples, emission efficiency at a current density of about 10 mA/cm$^2$ was evaluated. The voltage and current density of the organic electroluminescence device were measured using a Source meter (Keithley Instrument Co., 2400 series), and half life represents time required for decreasing luminance from an initial luminance of about 1,000 cd/m$^2$ to half. The evaluation results of the properties of the organic electroluminescence devices are shown in Table 2.

TABLE 2

| Division | Hole transport layer | Voltage (V) | Efficiency (cd/A) | Life $LT_{50}$(h) |
|---|---|---|---|---|
| Example 1 | Compound A1 | 5.4 | 7.8 | 189 |
| Example 2 | Compound A76 | 5.5 | 7.6 | 196 |
| Example 3 | Compound B15 | 5.6 | 7.6 | 194 |
| Example 4 | Compound A126 | 5.7 | 7.5 | 185 |
| Example 5 | Compound A151 | 5.6 | 7.7 | 184 |
| Comparative Example 1 | Comparative Compound C1 | 6.2 | 5.5 | 159 |
| Comparative Example 2 | Comparative Compound C2 | 6.5 | 6.5 | 165 |
| Comparative Example 3 | Comparative Compound C3 | 6.3 | 6.0 | 167 |
| Comparative Example 4 | Comparative Compound C4 | 6.4 | 5.2 | 165 |

TABLE 2-continued

| Division | Hole transport layer | Voltage (V) | Efficiency (cd/A) | Life $LT_{50}$(h) |
|---|---|---|---|---|
| Comparative Example 5 | Comparative Compound C5 | 6.1 | 5.2 | 164 |
| Comparative Example 6 | Comparative Compound C6 | 5.9 | 6.9 | 169 |
| Comparative Example 7 | Comparative Compound C7 | 6.0 | 6.2 | 172 |
| Comparative Example 8 | Comparative Compound C8 | 6.2 | 5.7 | 156 |
| Comparative Example 9 | Comparative Compound C9 | 5.9 | 6.4 | 167 |
| Comparative Example 10 | Comparative Compound C10 | 6.6 | 5.4 | 142 |

Referring to Table 2, the organic electroluminescence devices of Examples 1 to 5 showed improved properties of a low voltage, long life and high efficiency when compared to Comparative Examples 1 to 10.

Particularly, Examples 1 to 5 used amine derivatives including a dibenzoheterole group which was substituted with a phenyl group, and the properties of a low voltage, long life and high efficiency of organic electroluminescence devices were improved.

In addition, since the amine compound of the inventive concept included a triarylsilyl group or a fluorenyl group, having excellent thermal and charge tolerance, the properties of an amine could be maintained and the life of a device could be increased due to excellent thermal and charge tolerance. Since the amine compound of the inventive concept included a dibenzoheterole group including a substituent, the efficiency of a device could be improved by restraining the crystallinity by the deterioration of the symmetric performance of an entire molecule and by accommodating the improvement of a layer quality.

Particularly, Examples 1, 4 and 5, in which the substitution positions of a dibenzoheterole group, that is, the connecting positions of a dibenzoheterole group and an amine group were 4, 2 and 1, respectively, were found to have improved efficiency. This phenomenon was considered to be achieved, because a substituted dibenzoheterole group itself formed a folded conformation toward a nitrogen atom, a hole transport degree was controlled in a state where the volume of an entire molecule was increased and crystallinity was restrained, thereby increasing recombination probability of holes and electrons in an emission layer.

In addition, Examples 2 and 3, including a compound of which substitution position of a dibenzoheterole group was 3 were found to have increased life.

Meanwhile, when comparing Comparative Example 3 and Example 2, which included a compound not including a substituent at a position 7 of a dibenzoheterole group, it may be found that effect of long life by the introduction of a substituent was remarkable. This phenomenon was obtained because the stability of a radical state was improved due to the appropriate increase of a HOMO conjugation system around a nitrogen atom.

Meanwhile, for Comparative Examples 1 and 8, it may be found that an amine derivative having a dibenzofuranyl group was included but the dibenzofuranyl group did not include a substituent, and charge tolerance was insufficient. In addition, since the volume of a molecule was small and stacking in a molecule was induced resulting in easy crystallization, the life and efficiency of a device were reduced. In addition, in the compound of Comparative Example 2, a nitrogen atom and a dibenzofuranyl group were connected via a phenylene group, and the volume around a nitrogen atom was smaller than that of the compounds of an embodiment, and the efficiency of a device was reduced when compared to Example 1.

In addition, the compound of Comparative Example 4 is a compound making a direct bond to a fluorene skeleton, and the compound of Comparative Example 5 is a compound including a spirobifluorenyl group which is a Spiro type, the volume around a nitrogen atom is too large, the degree of freedom of a molecular structure is reduced, and thermal decomposition is liable to occur. In addition, since the distance between molecules is large, the propagation rate of holes is slow, and the life and efficiency properties of a device are deteriorated when compared to those of the examples.

In the compounds of Comparative Examples 6 and 9, a heteroaryl group is substituted at a dibenzofuran or dibenzothiophene skeleton to lapse carrier balance, and the efficiency of a device was reduced when compared to Example 1. The compound of Comparative Example 7 includes a dibenzofuran substituted with a phenyl group at the ring side in the same direction as a nitrogen atom, and a it conjugation system was increased to increase the life of a device, but the planarity of a molecule was increased and the distance between molecules was decreased, thereby reducing hole transport properties and decreasing the efficiency of a device.

When comparing Example 1 and Comparative Example 10, the compound of Comparative Example 10 does not include a triarylsilyl group or a fluorenyl group, and thermal and charge tolerance was weak, and thus the life of a device was reduced.

Examples 1 to 5 were found to have the effect of increasing emission efficiency and emission life at the same time when compared to Comparative Examples 1 to 10.

From the results, the amine compound of an embodiment was found to achieve the increase of efficiency and life of an organic electroluminescence device by combining a dibenzoheterole group including a substituent with a nitrogen atom.

Particularly, it may be found that the increase of efficiency and life of an organic electroluminescence device may be achieved by combining a nitrogen atom of an amine at a position of an atomic number 4 of a dibenzoheterole group and a substituent at a position of an atomic number 6 of a dibenzoheterole group, by combining a nitrogen atom of an amine at a position of an atomic number 3 of a dibenzoheterole group and a substituent at a position of an atomic number 7 of a dibenzoheterole group, by combining a nitrogen atom of an amine at a position of an atomic number 2 of a dibenzoheterole group and a substituent at a position of an atomic number 8 of a dibenzoheterole group, or by combining a nitrogen atom of an amine at a position of an atomic number 1 of a dibenzoheterole group and a substituent at a position of an atomic number 9 of a dibenzoheterole group.

The amine compound of an embodiment may improve the emission efficiency and life of an organic electroluminescence device.

The organic electroluminescence device of an embodiment includes the amine compound of an embodiment in a hole transport region, specifically a hole transport layer, and may achieve high efficiency.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An amine compound represented by the following Formula 1:

[Formula 1]

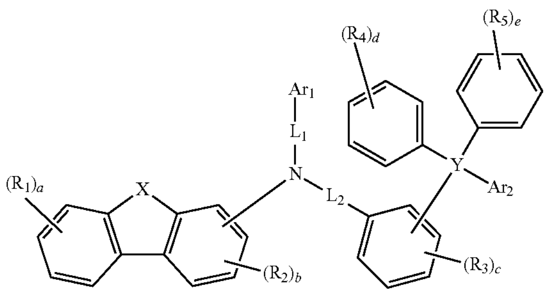

wherein

X is O or S,

Y is C, each of $Ar_1$ and $Ar_2$ is independently a substituted or unsubstituted alkyl group having 1 to 50 carbon atoms, a substituted or unsubstituted aryl group having 6 to 50 carbon atoms for forming a ring, or a substituted or unsubstituted heteroaryl group having 2 to 50 carbon atoms for forming a ring, which includes O or S as a heteroatom, each of $L_1$ and $L_2$ is independently a direct linkage, a substituted or unsubstituted arylene group having 6 to 30 carbon atoms for forming a ring, or a substituted or unsubstituted heteroarylene group having 2 to 30 carbon atoms for forming a ring, $R_1$ is a substituted or unsubstituted aryl group having 6 to 50 carbon atoms for forming a ring, each of $R_2$ to $R_5$ is independently a hydrogen atom, a deuterium atom, a halogen atom, a cyano group, a substituted or unsubstituted silyl group, a substituted or unsubstituted alkyl group having 1 to 10 carbon atoms, a substituted or unsubstituted alkoxy group having 1 to 10 carbon atoms, a substituted or unsubstituted arylthio group having 1 to 10 carbon atoms, a substituted or unsubstituted alkylamino group having 1 to 10 carbon atoms, a substituted or unsubstituted arylamino group having 1 to 20 carbon atoms, a substituted or unsubstituted aryl group having 6 to 50 carbon atoms for forming a ring, or a substituted or unsubstituted heteroaryl group having 2 to 50 carbon atoms for forming a ring, or combined with an adjacent group to form a ring, "a" is an integer 1 to 4, "b" is an integer of 0 to 3, "c" is 0 or 1, and "d" and "e" are each independently an integer of 0 to 5.

2. The amine compound of claim 1, wherein Formula 1 is represented by the following Formula 1-2:

[Formula 1-2]

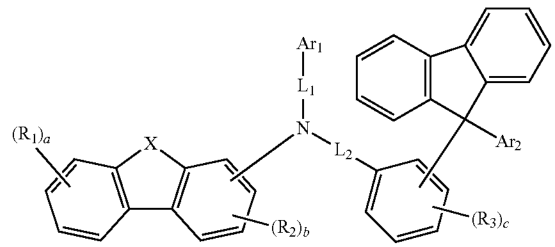

wherein

X, $Ar_1$, $Ar_2$, $L_1$, $L_2$, $R_1$ to $R_3$, and "a" to "c" are the same as defined in Formula 1.

3. The amine compound of claim 1, wherein

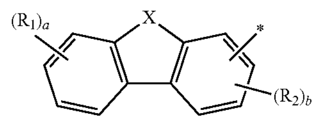

part in Formula 1 is represented by one of the following H-1 to H-4:

H-1

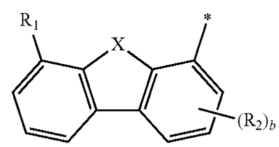

H-2

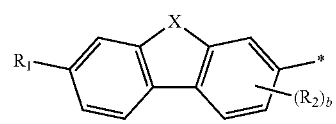

H-3

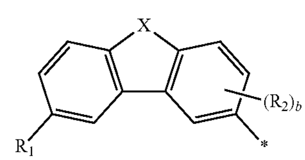

H-4

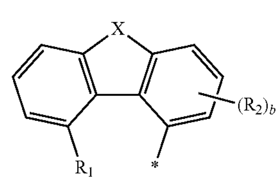

in H-1 to H-4,

X, $R_1$, $R_2$ and "b" are the same as defined in Formula 1.

4. The amine compound of claim 1, wherein $Ar_1$ is a substituted or unsubstituted phenyl group, a substituted or unsubstituted biphenyl group, a substituted or unsubstituted terphenyl group, a substituted or unsubstituted naphthyl group, or a substituted or unsubstituted phenanthryl group.

5. The amine compound of claim 1, wherein $Ar_1$ is a substituted or unsubstituted dibenzofuranyl group, or a substituted or unsubstituted dibenzothiophene group.

6. The amine compound of claim 1, wherein Are is a substituted or unsubstituted phenyl group, a substituted or unsubstituted naphthyl group, a substituted or unsubstituted phenanthryl group, a substituted or unsubstituted dibenzofuranyl group, or a substituted or unsubstituted dibenzothiophene group.

7. The amine compound of claim 1, wherein $L_1$ and $L_2$ are each independently a direct linkage, a substituted or unsubstituted phenylene group, a substituted or unsubstituted dibenzofuranylene group, a substituted or unsubstituted naphthalene group, or a substituted or unsubstituted fluorenylene group.

8. The amine compound of claim 1, wherein $R_1$ is a substituted or unsubstituted phenyl group, and each of $R_2$ to $R_5$ is a hydrogen atom, a substituted or unsubstituted phenyl group, or a substituted or unsubstituted triphenylsilyl group, or combined with an adjacent group to form a ring.

9. The amine compound of claim 1, wherein Formula 1 is any one selected from compounds represented in the following Compound Group 2:

[Compound Group 2]

B1

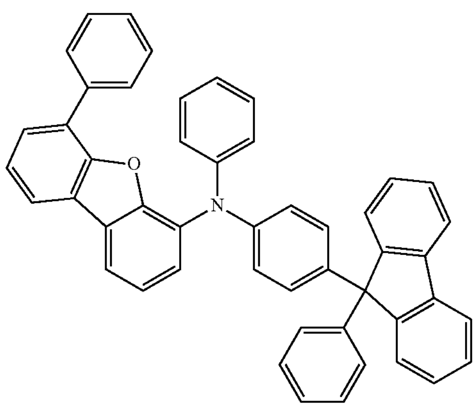

B2

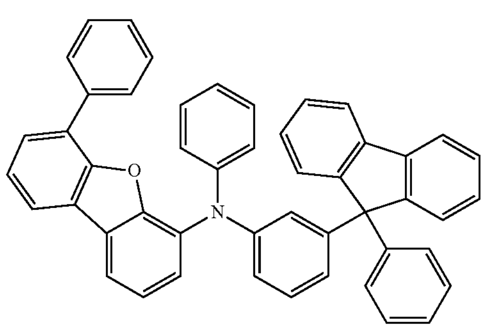

-continued

B3

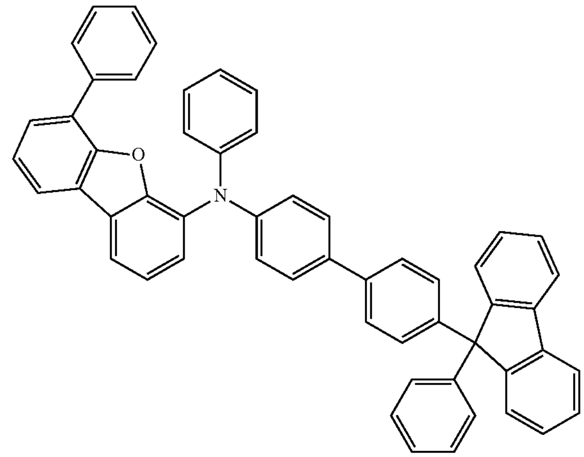

B4

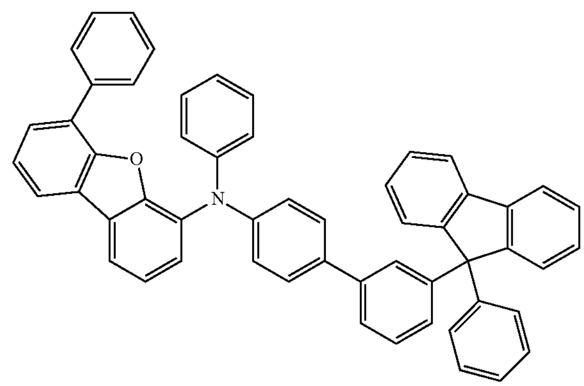

B5

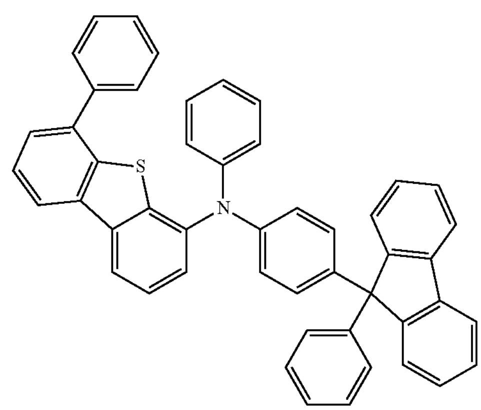

B6

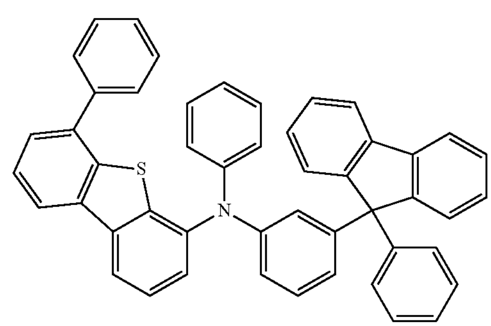

-continued
B7
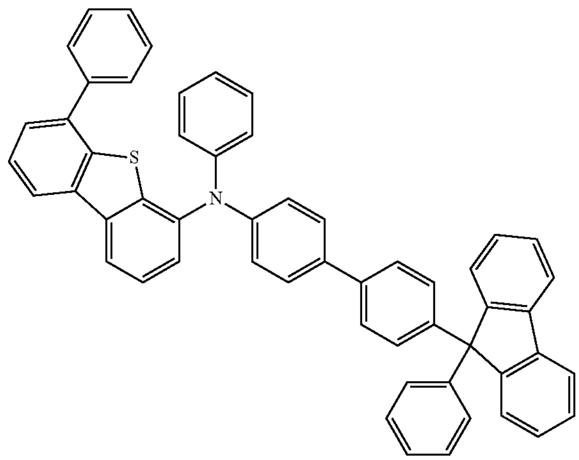
B8
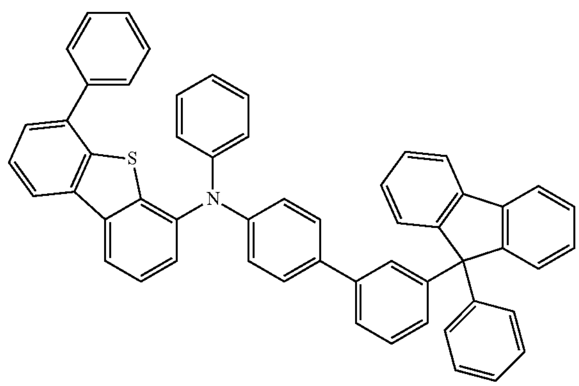
B9
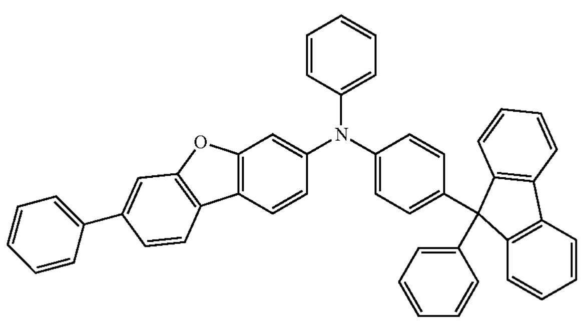
B10
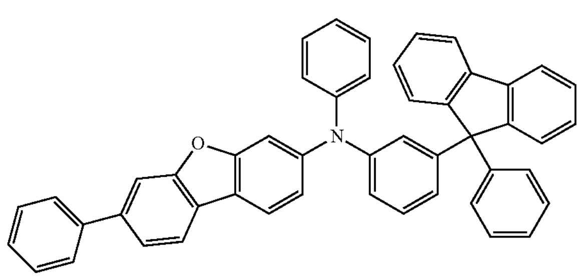
-continued
B11
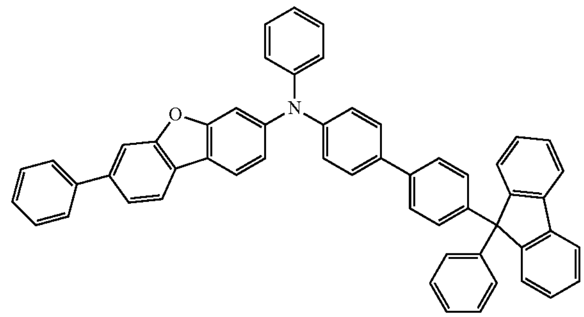
B12
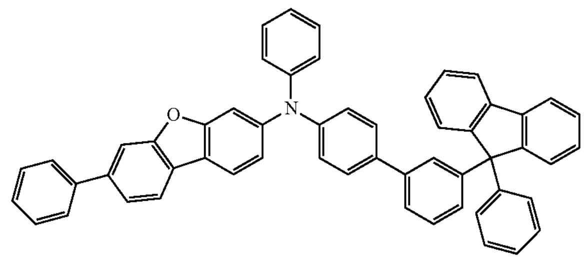
B13
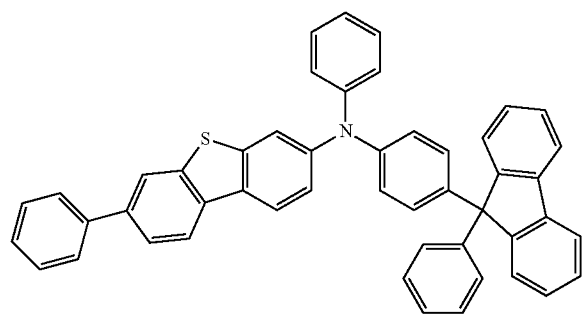
B14
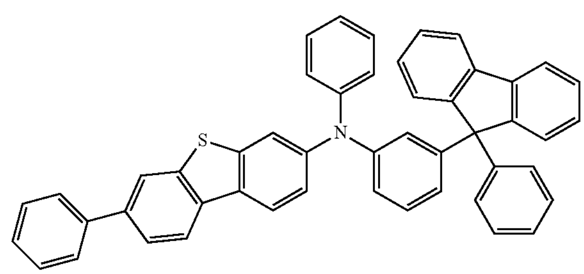
B15
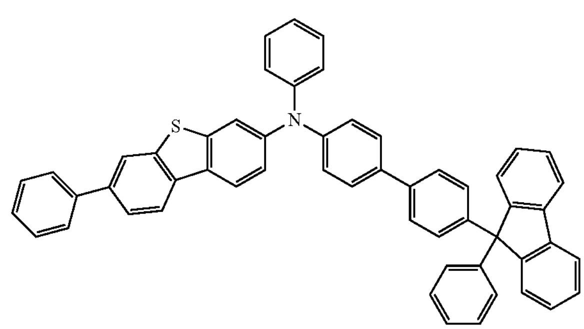

B16
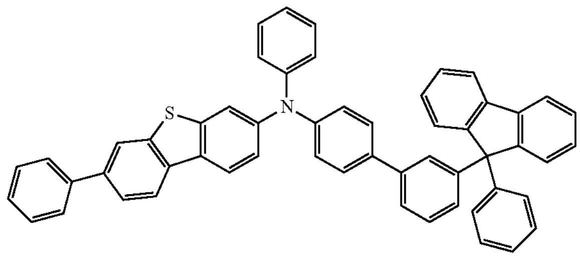
B17
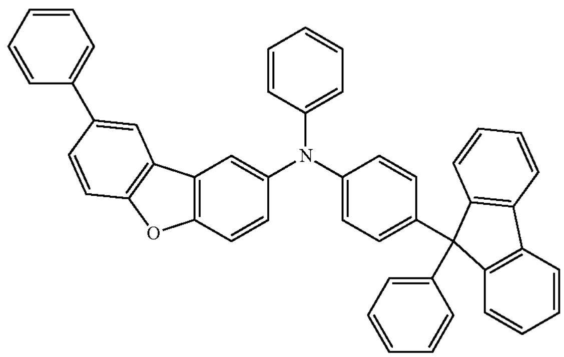
B18
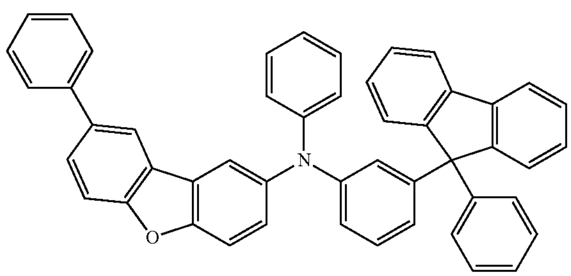
B19
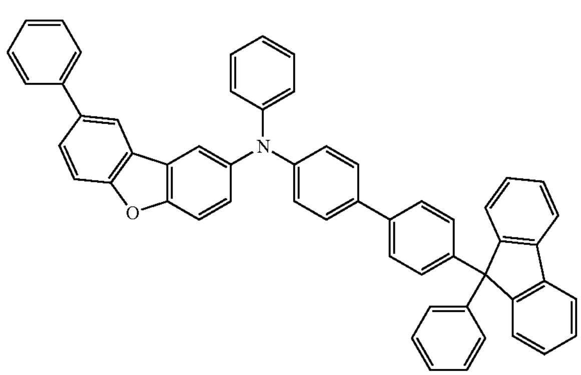
B20
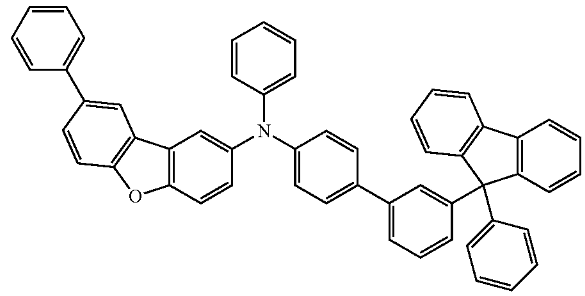
B21
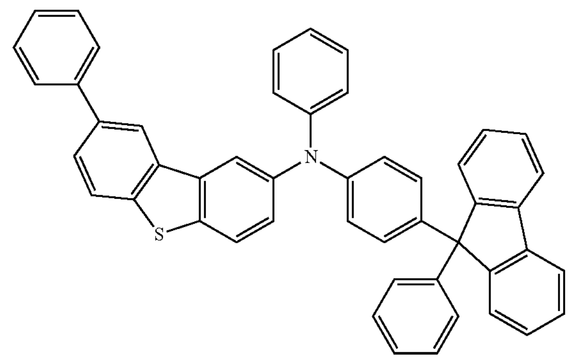
B22
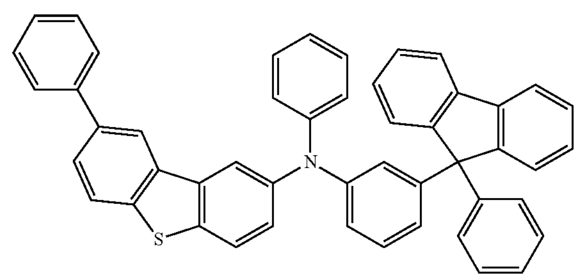
B23
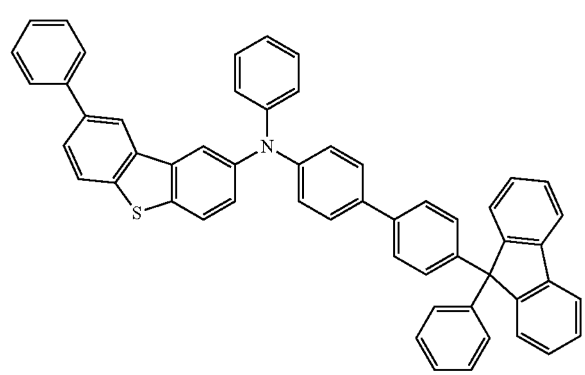

-continued
B24
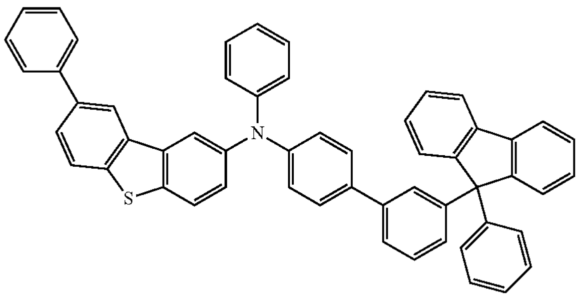
B25
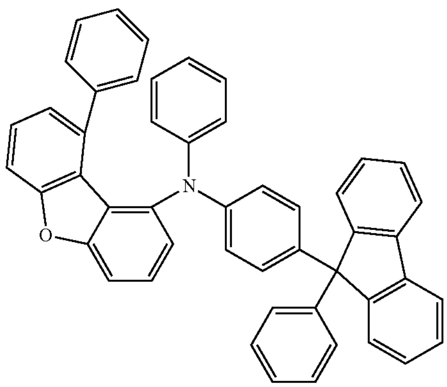
B26
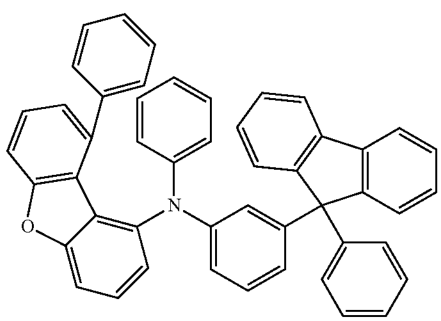
B27
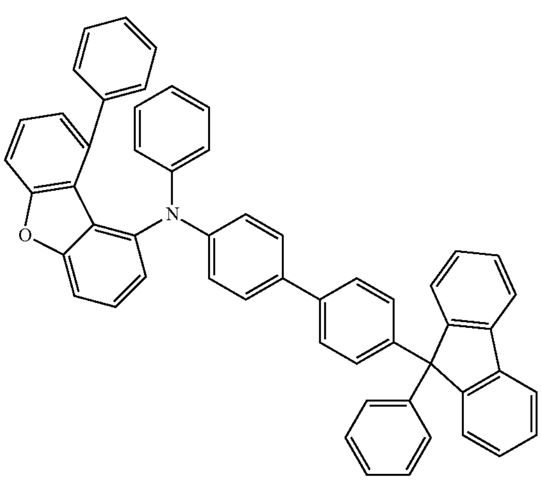
-continued
B28
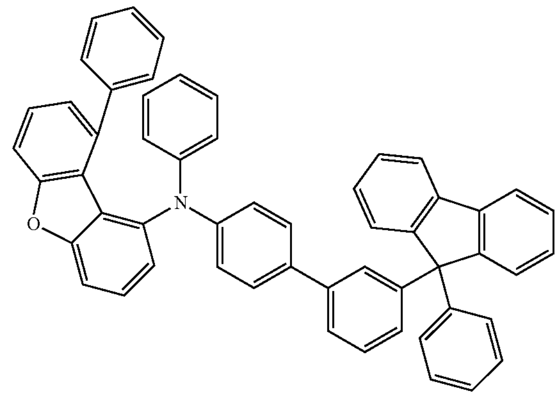
B29
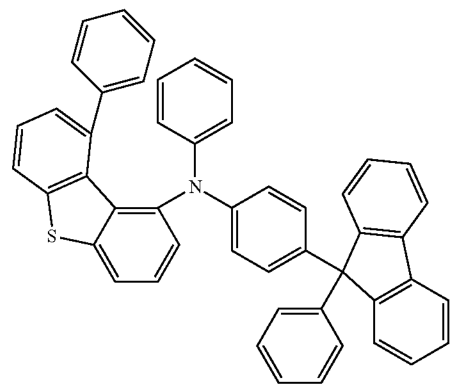
B30
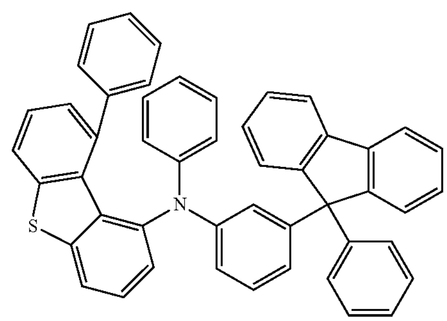
B31
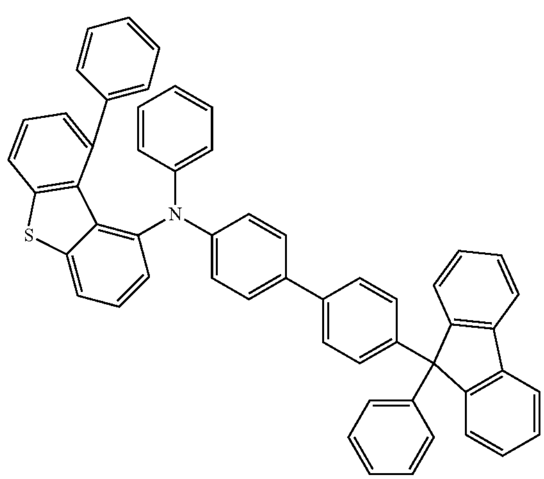

B32
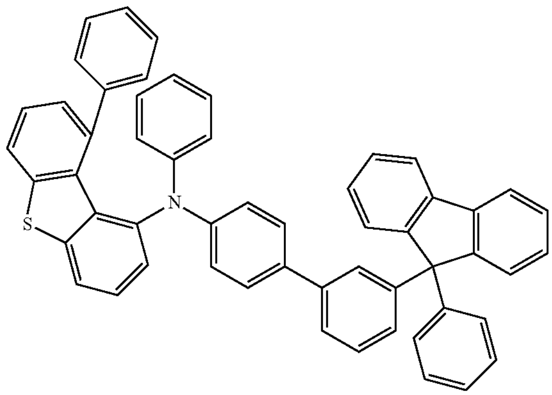
B33
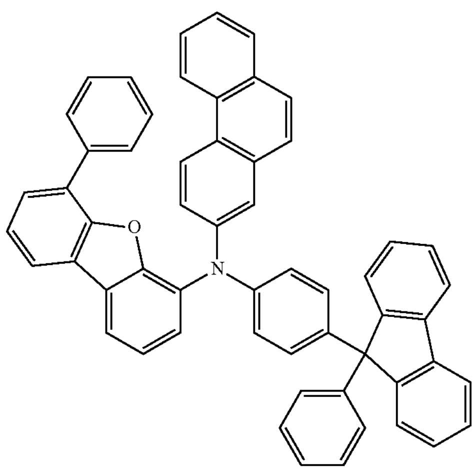
B34
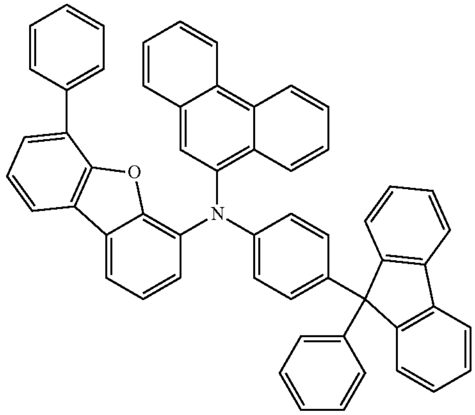
B35
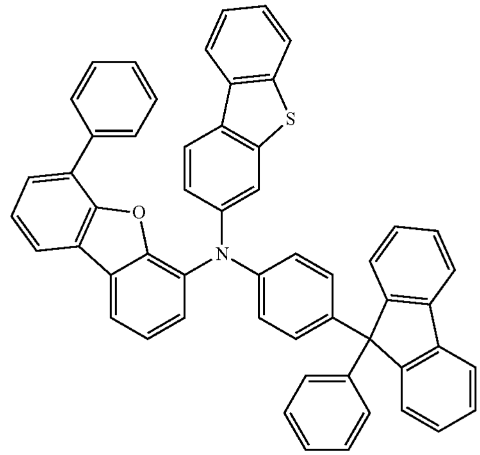
B36
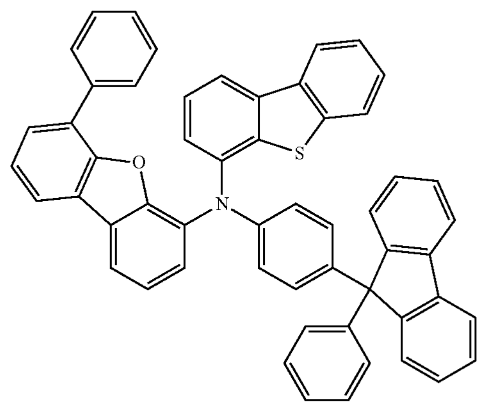
B37
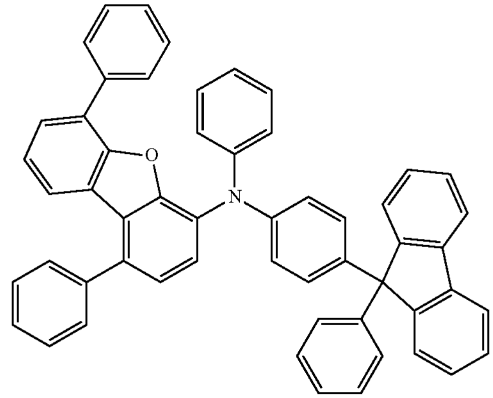

-continued
B38
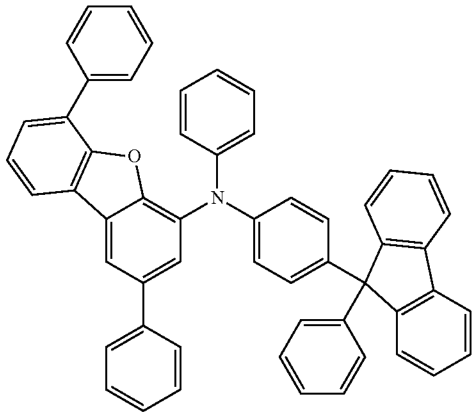
B39
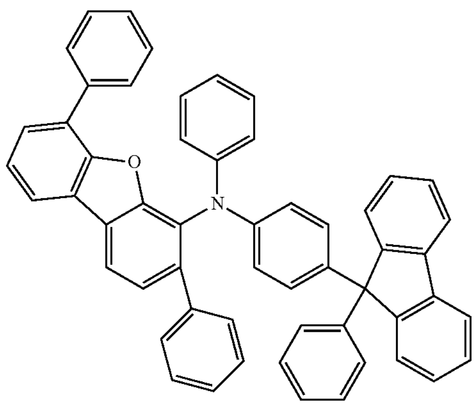
B40
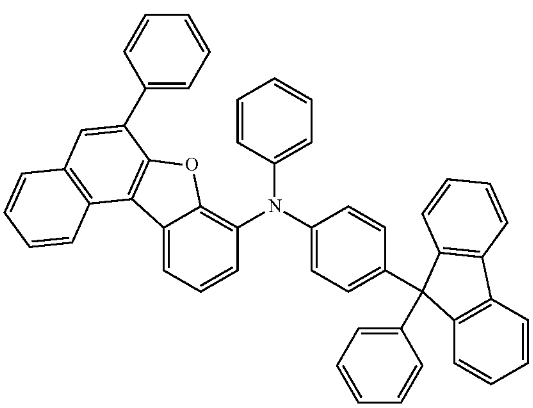
B41
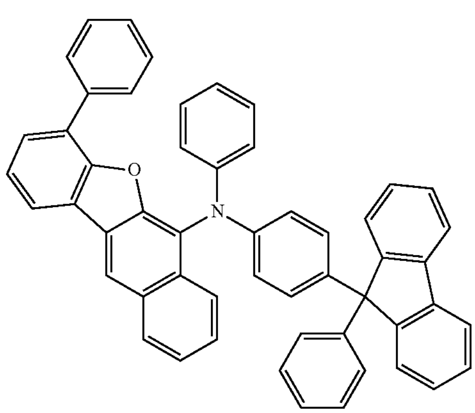
-continued
B42
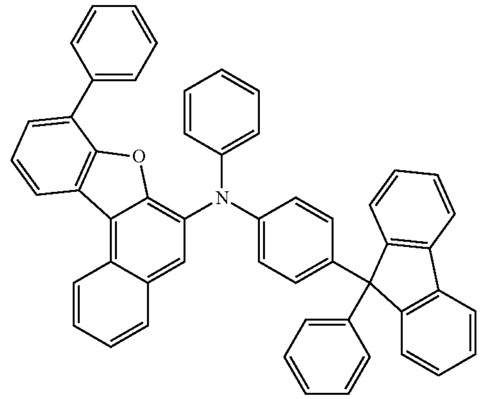
B43
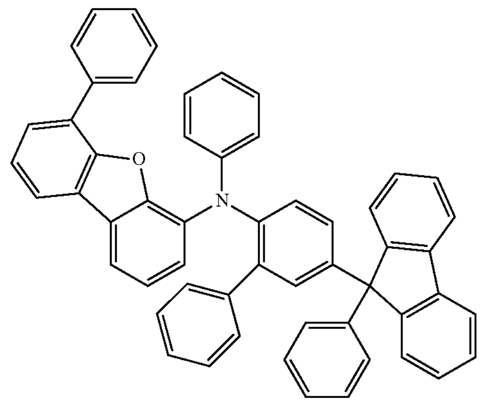
B44
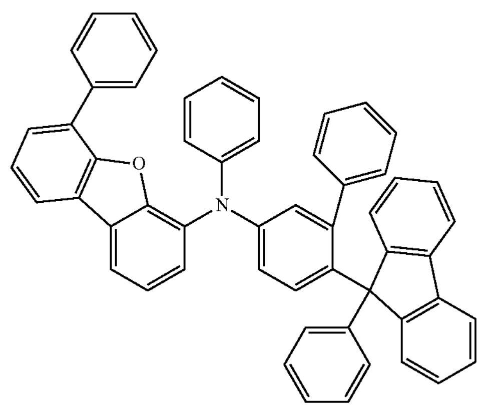
B45
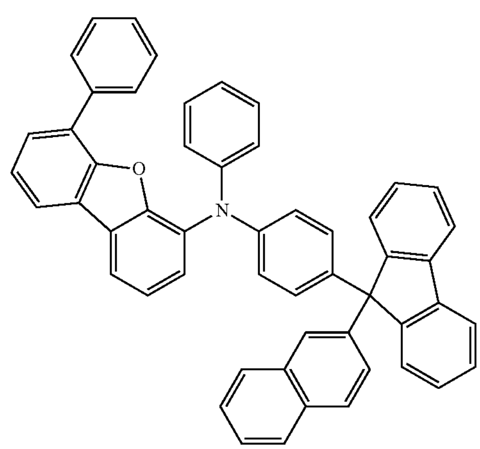

B46
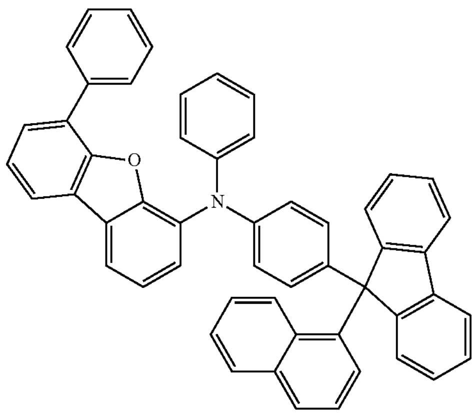
B47
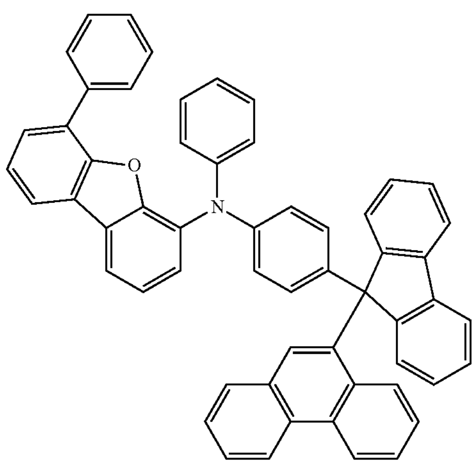
B48
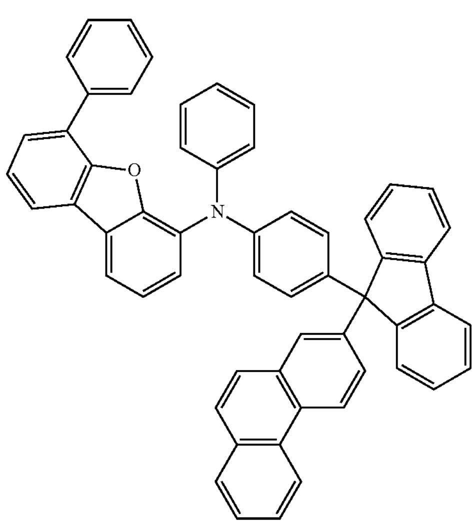
B49
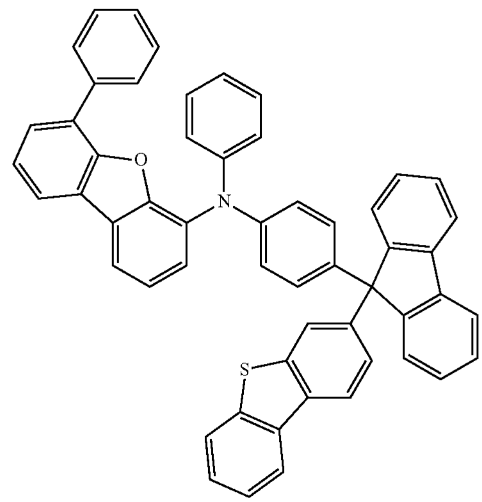
B50
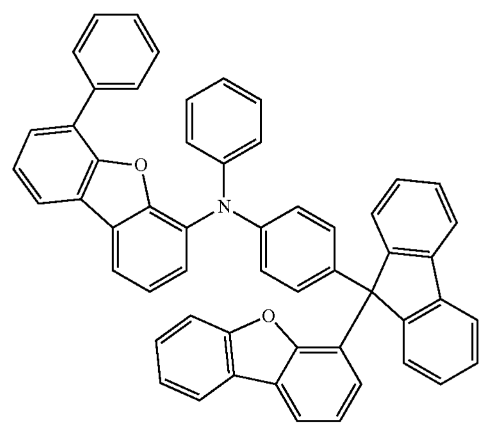
B51
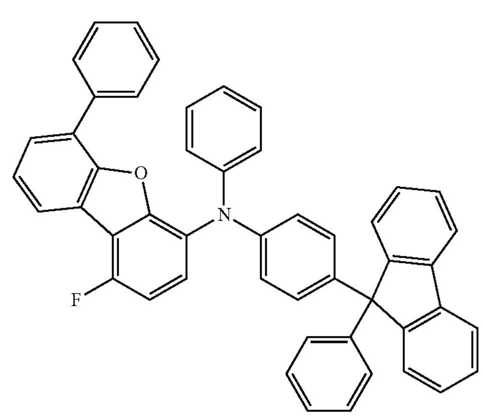

-continued
B52
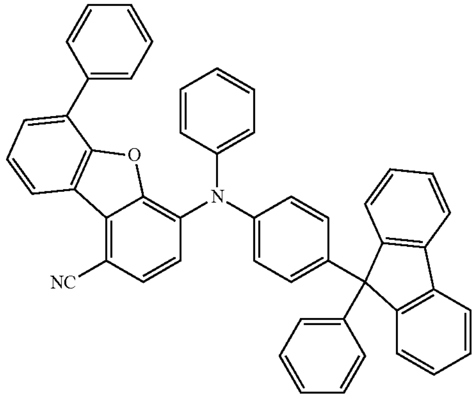
B53
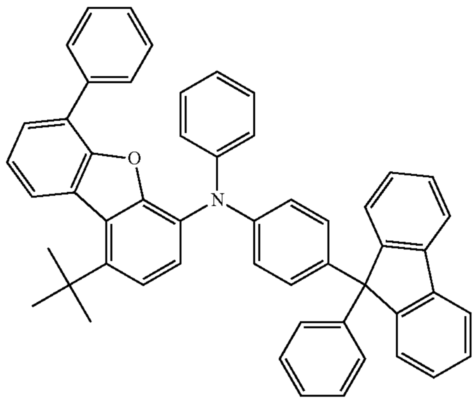
B54
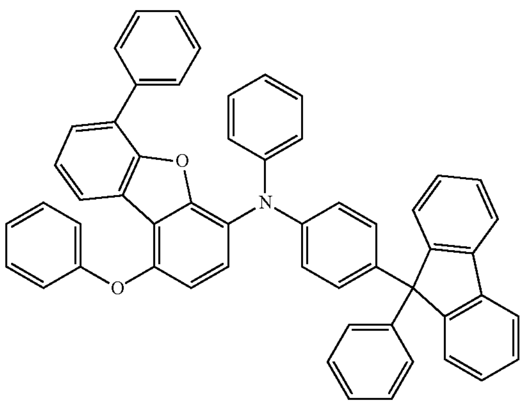
B55
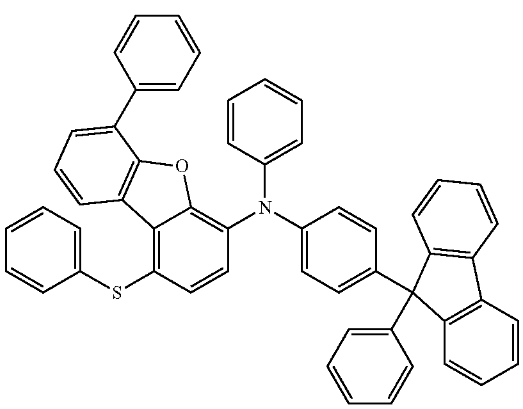
-continued
B56
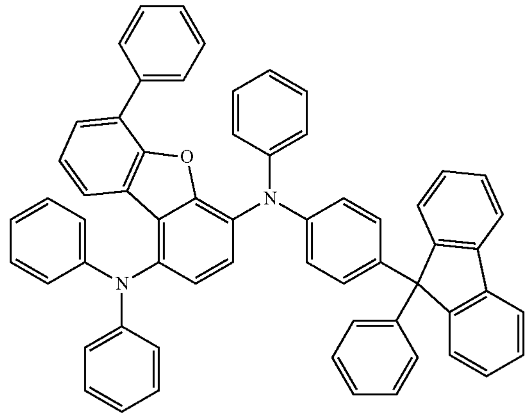
B57
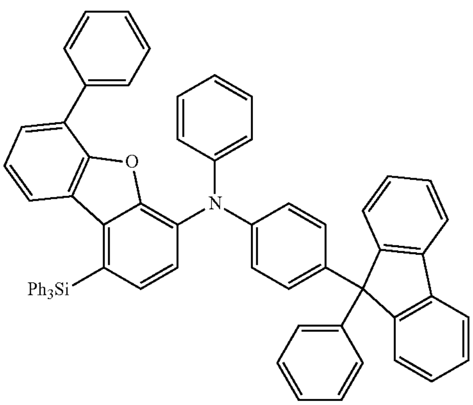
B58
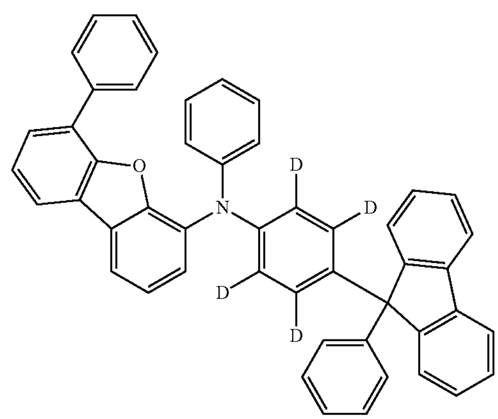

-continued

B59

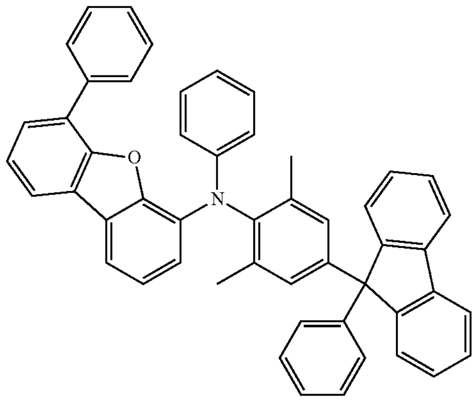

B60

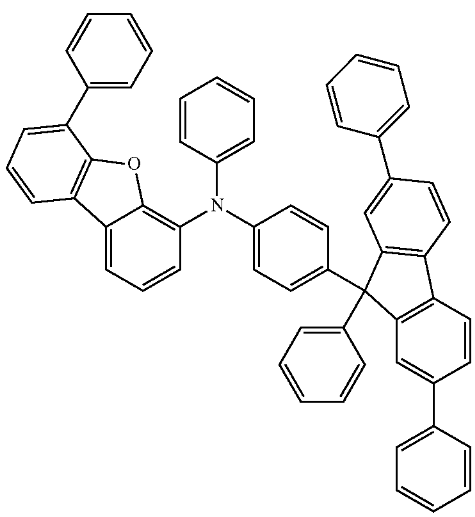

B61

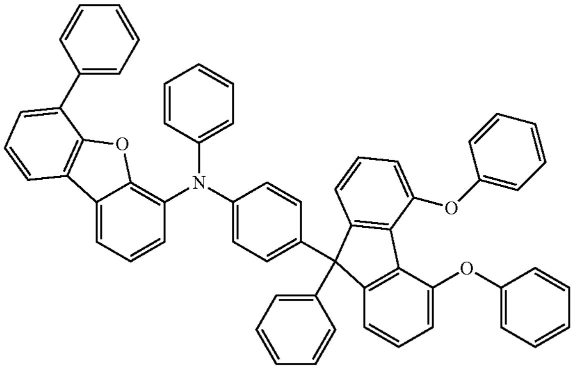

-continued

B62

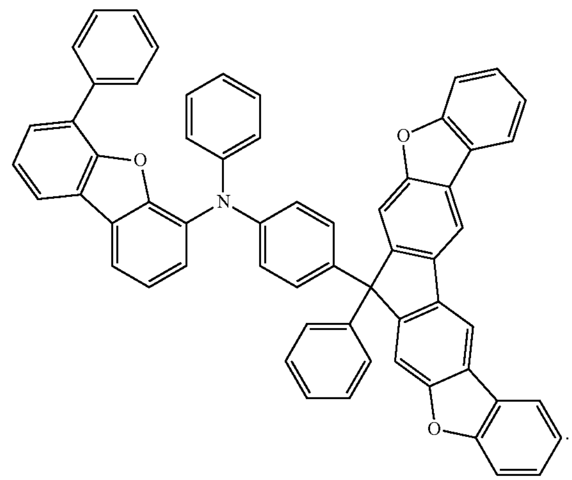

10. An organic electroluminescence device, comprising:
a first electrode;
a hole transport region disposed on the first electrode;
an emission layer disposed on the hole transport region;
an electron transport region disposed on the emission layer; and
a second electrode disposed on the electron transport region,
wherein the hole transport region comprises an amine compound represented by the following Formula 1:

[Formula 1]

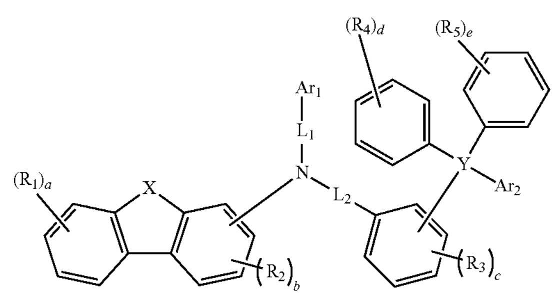

wherein
X is O or S,
Y is C,
each of $Ar_1$ and $Ar_2$ is independently a substituted or unsubstituted alkyl group having 1 to 50 carbon atoms, a substituted or unsubstituted aryl group having 6 to 50 carbon atoms for forming a ring, or a substituted or unsubstituted heteroaryl group having 2 to 50 carbon atoms for forming a ring, which includes 0 or S as a heteroatom,
each of $L_1$ and $L_2$ is independently a direct linkage, a substituted or unsubstituted arylene group having 6 to 30 carbon atoms for forming a ring, or a substituted or unsubstituted heteroarylene group having 2 to 30 carbon atoms for forming a ring,
$R_1$ is a substituted or unsubstituted aryl group having 6 to 50 carbon atoms for forming a ring,
each of $R_2$ to $R_5$ is independently a hydrogen atom, a deuterium atom, a halogen atom, a cyano group, a substituted or unsubstituted silyl group, a substituted or unsubstituted alkyl group having 1 to 10 carbon atoms, a substituted or unsubstituted alkoxy group having 1 to 10 carbon atoms, a substituted or unsubstituted arylthio group having 1 to 10 carbon atoms, a substituted or unsubstituted alkylamino group having 1 to 10 carbon atoms, a substituted or unsubstituted arylamino group having 1 to 20 carbon atoms, a substituted or unsubstituted aryl group having 6 to 50 carbon atoms for forming a ring, or a substituted or unsubstituted heteroaryl group having 2 to 50 carbon atoms for forming a ring, or combined with an adjacent group to form a ring, "a" is an integer of 1 to 4, "b" is an integer of 0 to 3, "c" is 0 or 1, and "d" and "e" are each independently an integer of 0 to 5.

11. The organic electroluminescence device of claim 10, wherein the hole transport region comprises:

a hole injection layer; and a hole transport layer disposed between the hole injection layer and the emission layer, wherein the hole transport layer comprises the amine compound represented by Formula 1.

12. The organic electroluminescence device of claim 10, wherein the emission layer emits blue light.

13. The organic electroluminescence device of claim 10, wherein Formula 1 is represented by the following Formula 1-2:

[Formula 1-2]

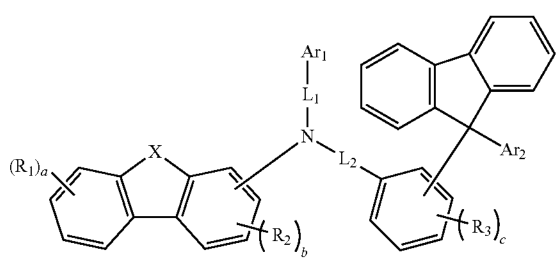

wherein, in Formula 1-1 and Formula 1-2,

X, $Ar_1$, $Ar_2$, $L_1$, $L_2$, $R_1$ to $R_3$, and "a" to "c" are the same as defined in Formula 1.

14. The organic electroluminescence device of claim 10, wherein

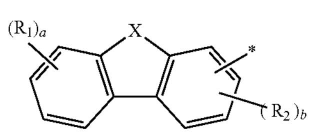

part in Formula 1 is represented by one of the following H-1 to H-4:

H-1

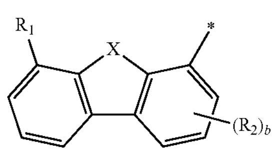

-continued

H-2

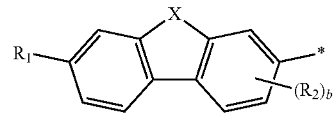

H-3

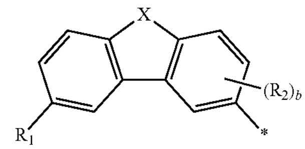

H-4

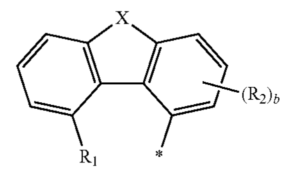

in H-1 to H-4,

X, $R_1$, $R_2$ and "b" are the same as defined in Formula 1.

15. The organic electroluminescence device of claim 10, wherein $Ar_1$ is a substituted or unsubstituted phenyl group, a substituted or unsubstituted biphenyl group, a substituted or unsubstituted terphenyl group, a substituted or unsubstituted naphthyl group, a substituted or unsubstituted phenanthryl group, a substituted or unsubstituted dibenzofuranyl group, or a substituted or unsubstituted dibenzothiophene group.

16. The organic electroluminescence device of claim 10, wherein Are is a substituted or unsubstituted phenyl group, a substituted or unsubstituted naphthyl group, a substituted or unsubstituted phenanthryl group, a substituted or unsubstituted dibenzofuranyl group, or a substituted or unsubstituted dibenzothiophene group.

17. The organic electroluminescence device of claim 10, wherein $L_1$ and $L_2$ are each independently a direct linkage, a substituted or unsubstituted phenylene group, a substituted or unsubstituted dibenzofuranylene group, a substituted or unsubstituted naphthalene group, or a substituted or unsubstituted fluorenylene group.

18. The organic electroluminescence device of claim 10, wherein the hole transport region comprises at least one of amine compounds represented in the following Compound Group 2:

[Compound Group 2]

B1

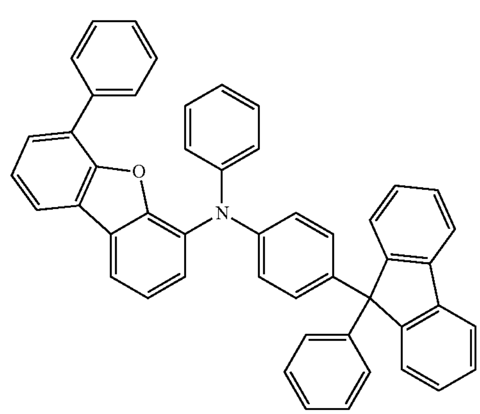

B2
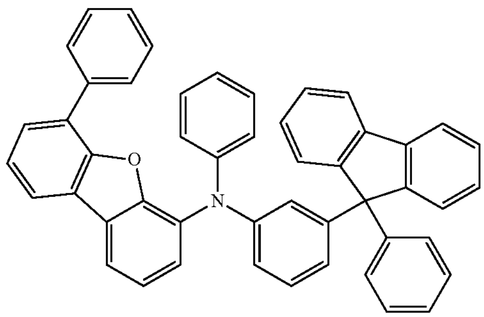
B3
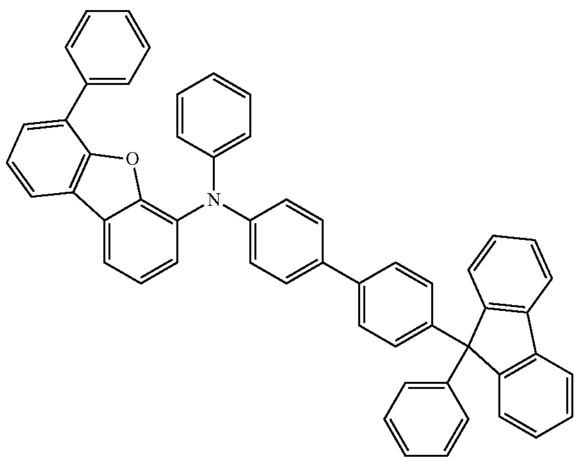
B4
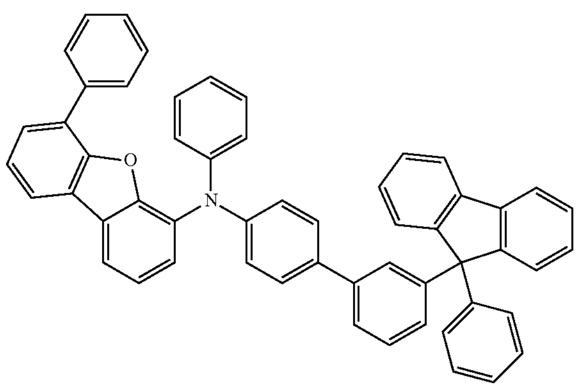
B5
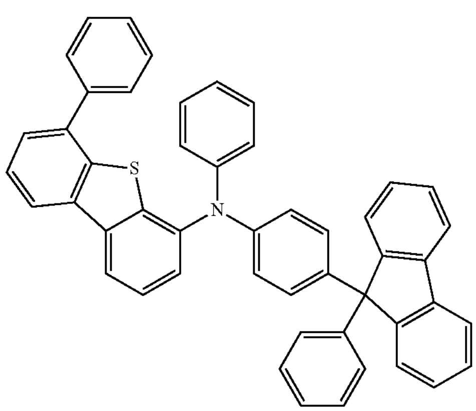
B6
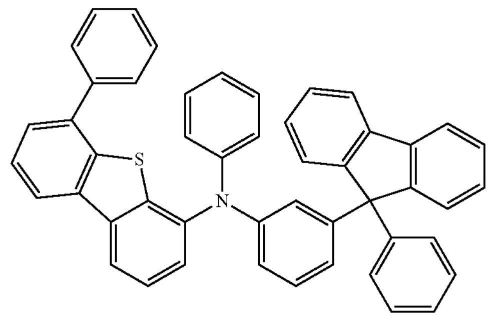
B7
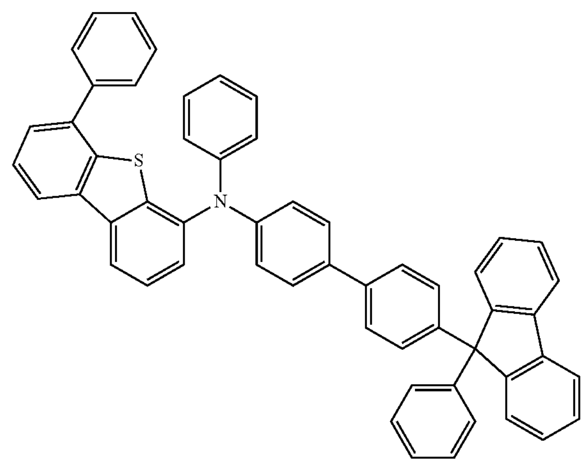
B8
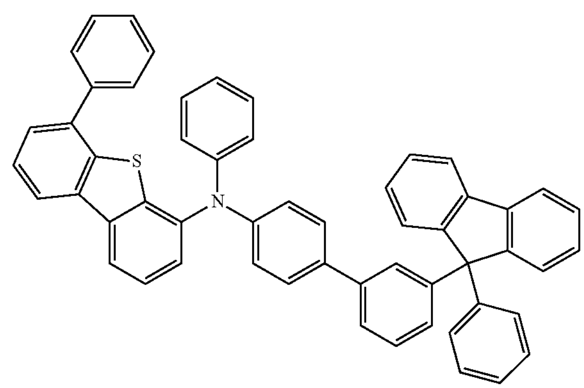
B9
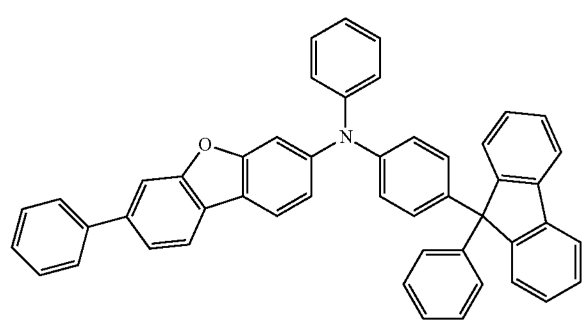

-continued
B10
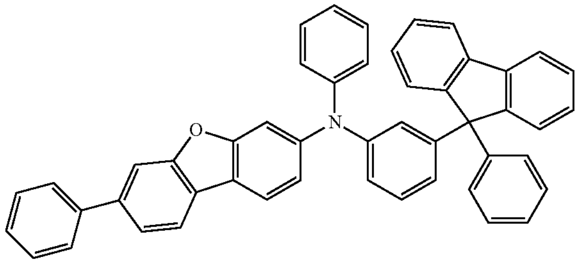
B11
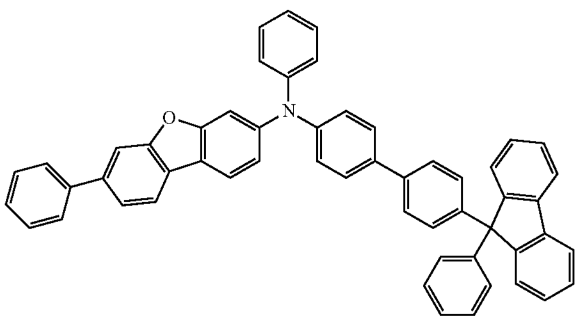
B12
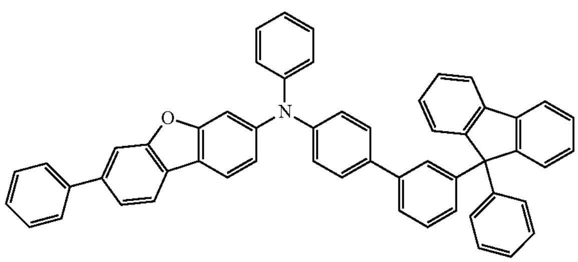
B13
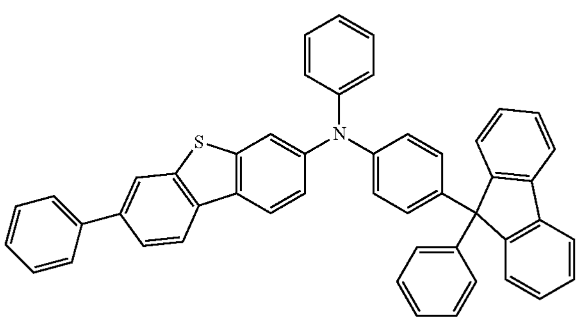
B14
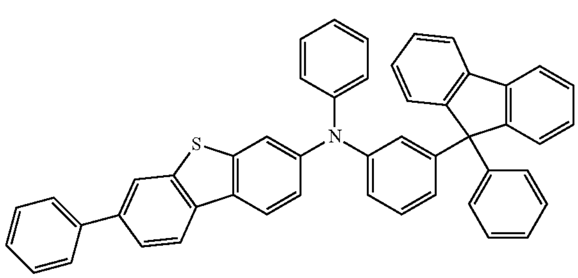
-continued
B15
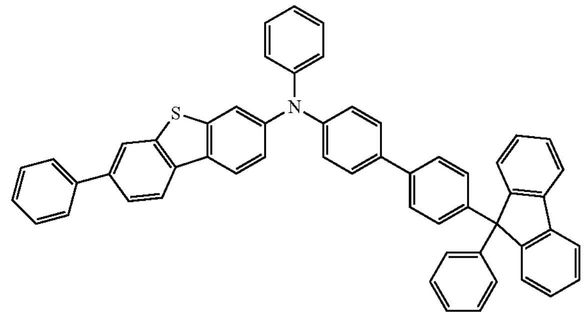
B16
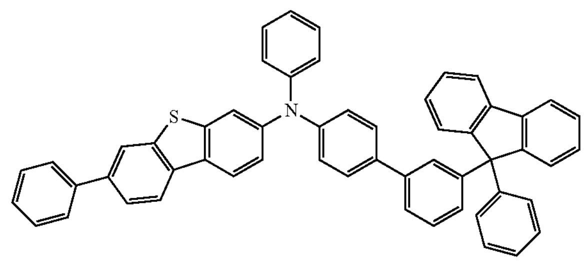
B17
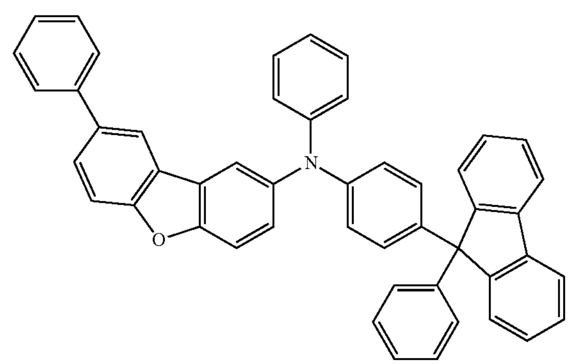
B18
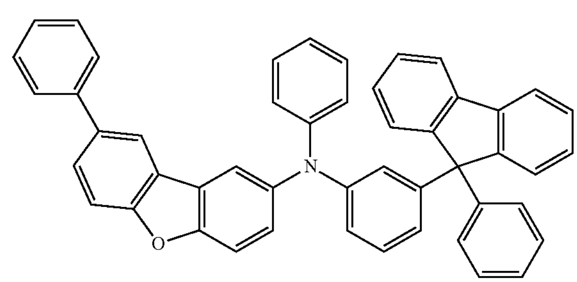

-continued
B19
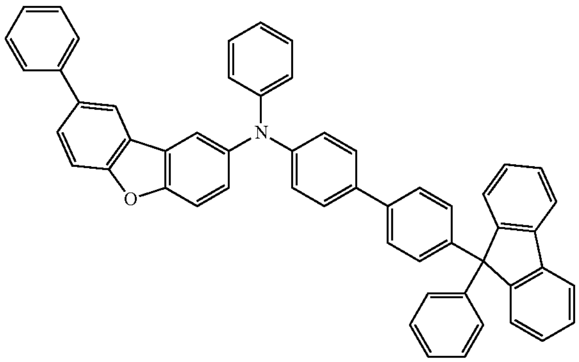
B20
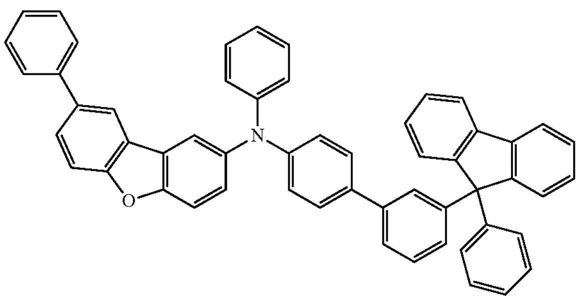
B21
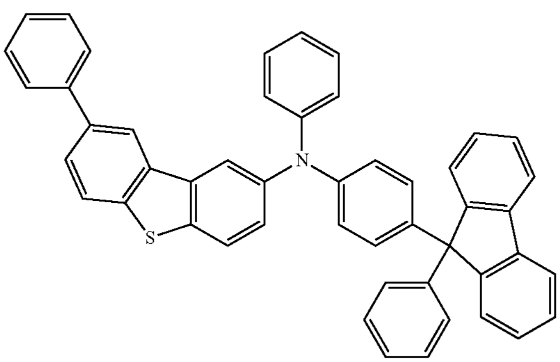
B22
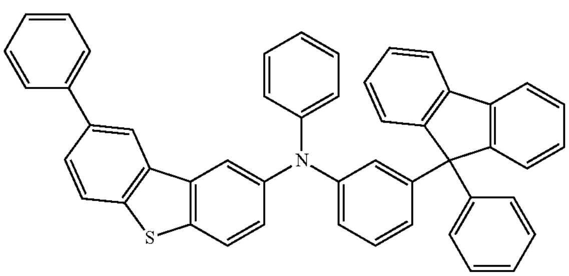
-continued
B23
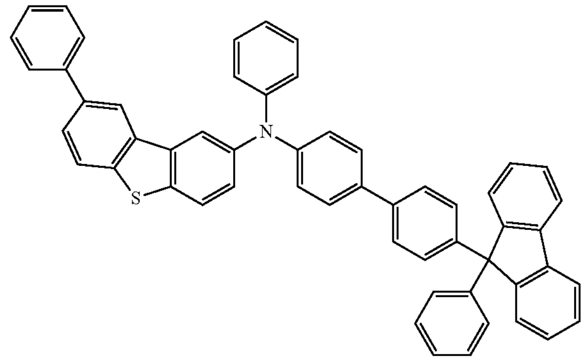
B24
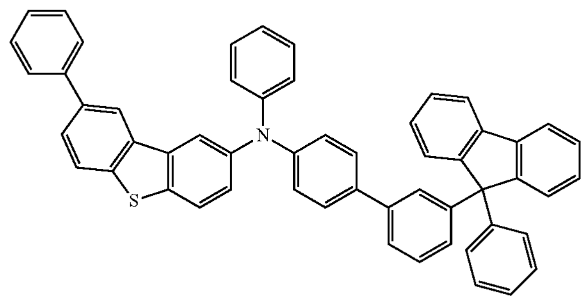
B25
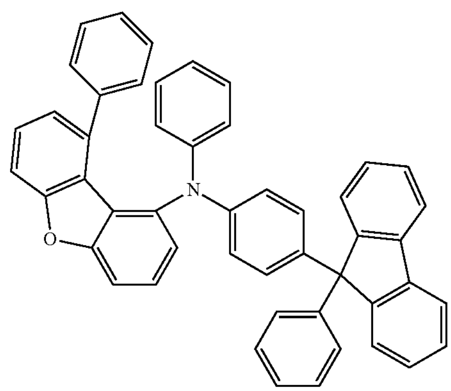
B26
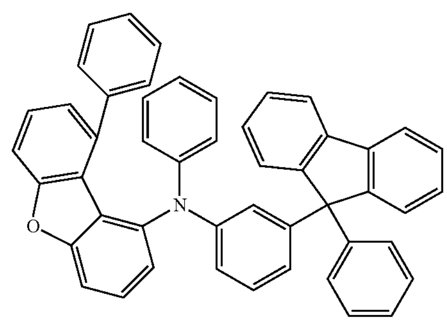

-continued
B27
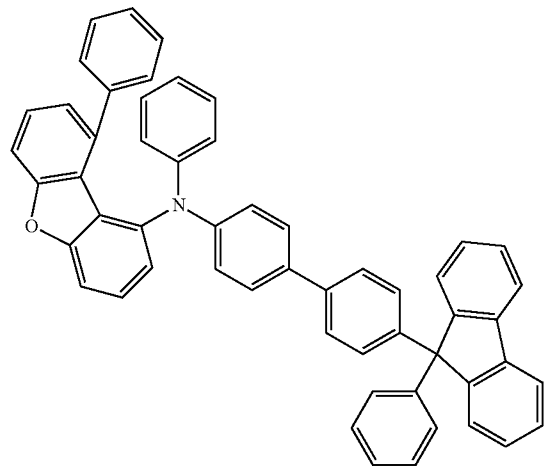
B28
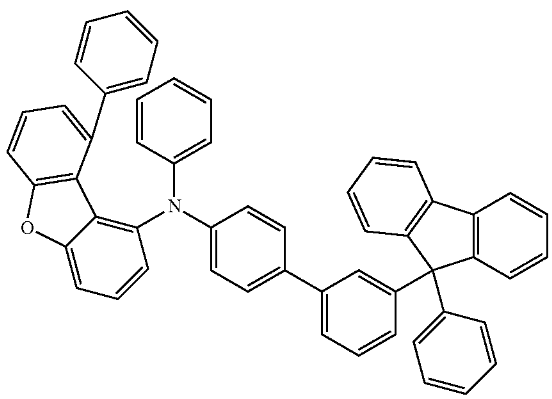
B29
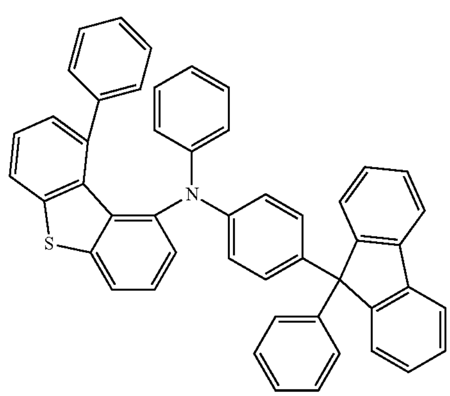
B30
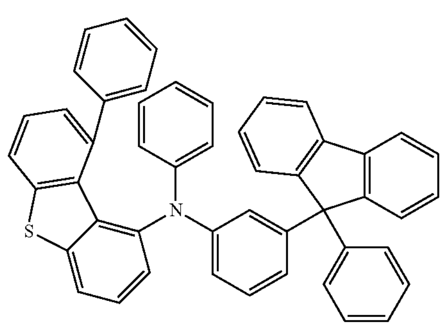
-continued
B31
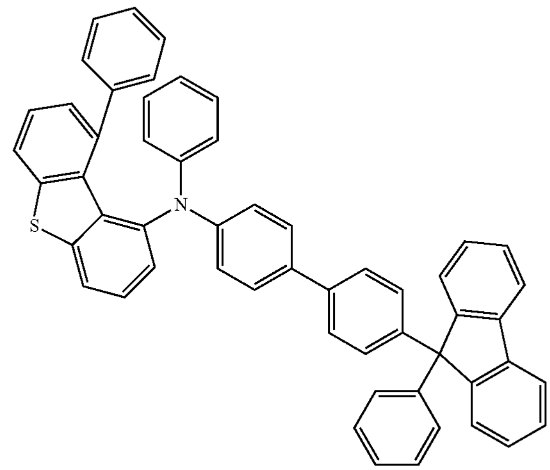
B32
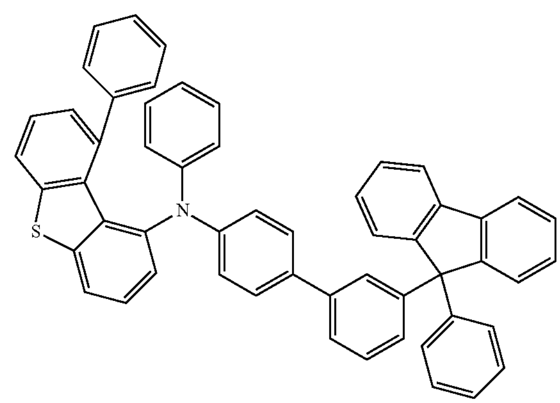
B33
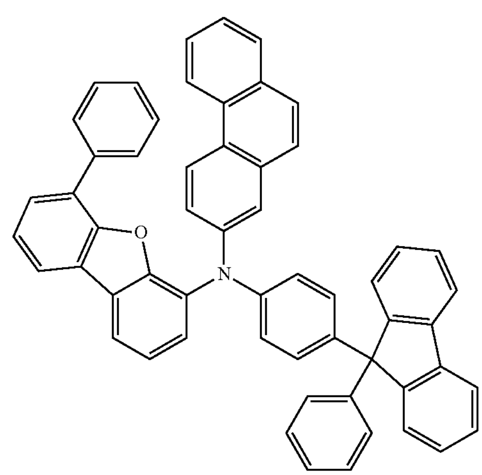

-continued
B34
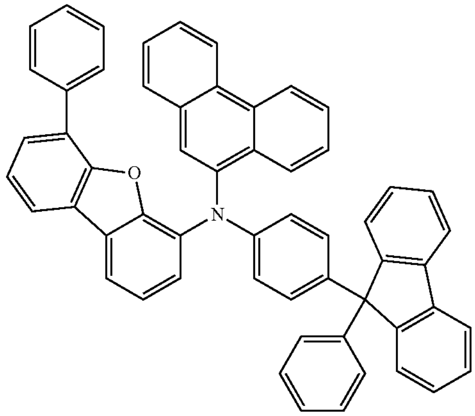
B35
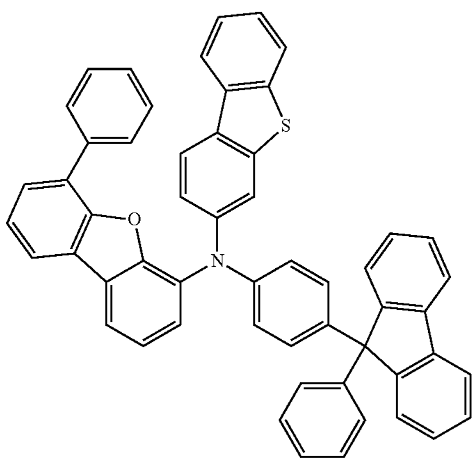
B36
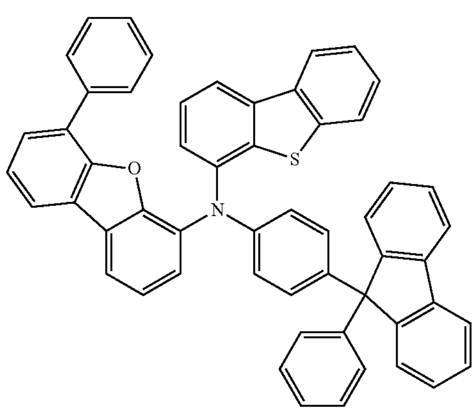
-continued
B37
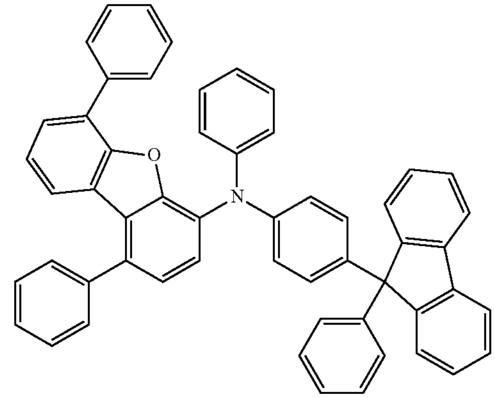
B38
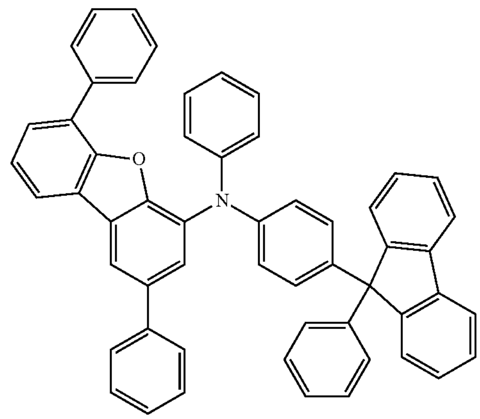
B39
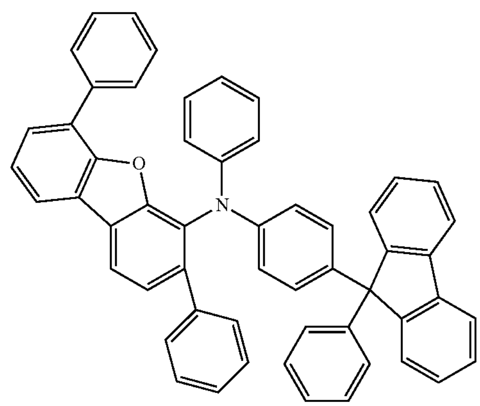
B40
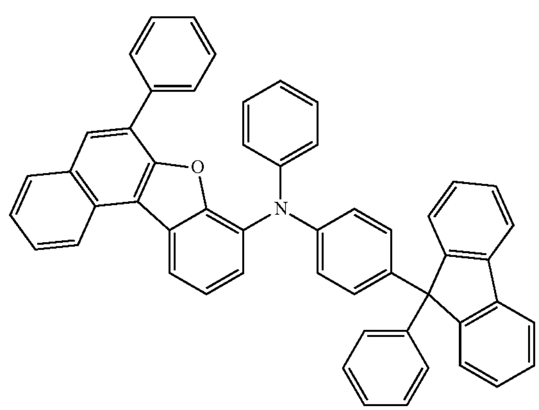

B41
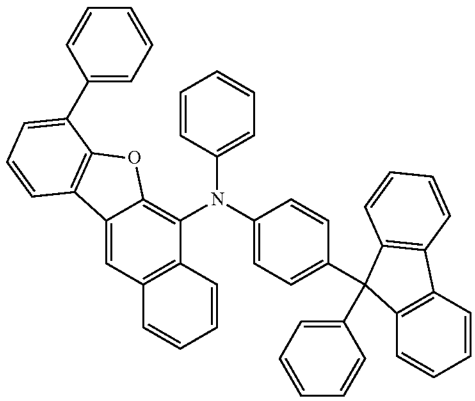
B42
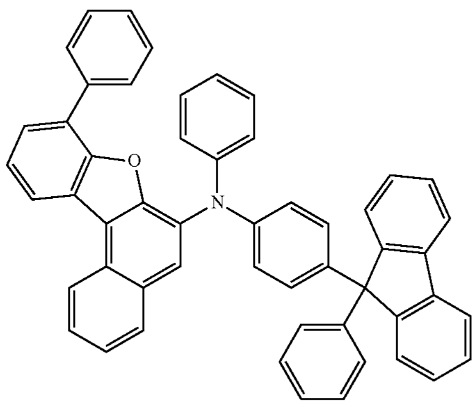
B43
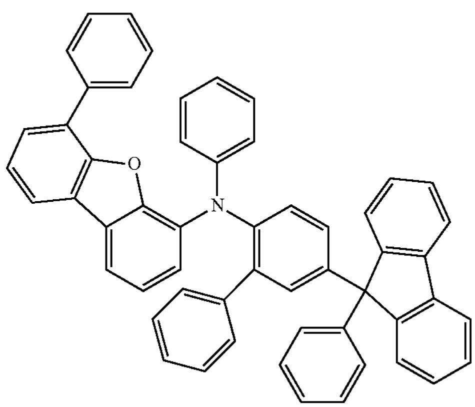
B44
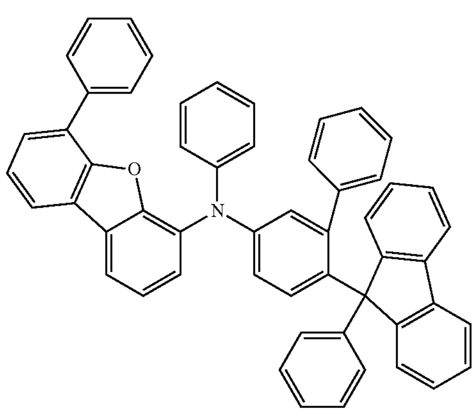
B45
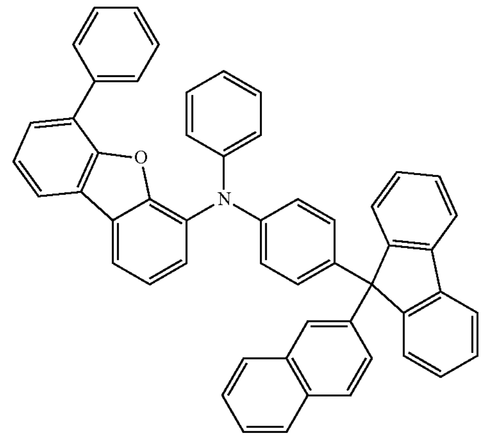
B46
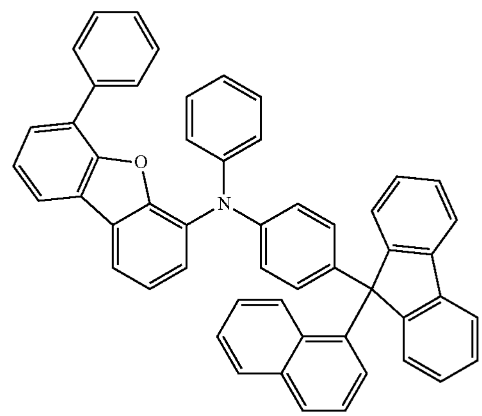
B47
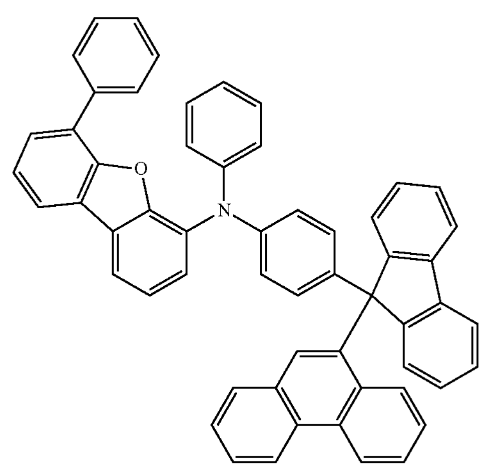

-continued
B48
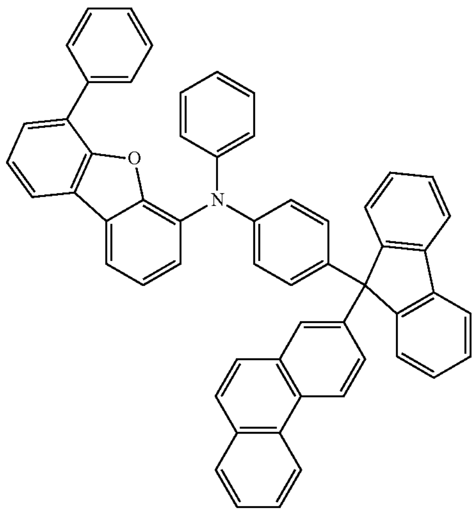
B49
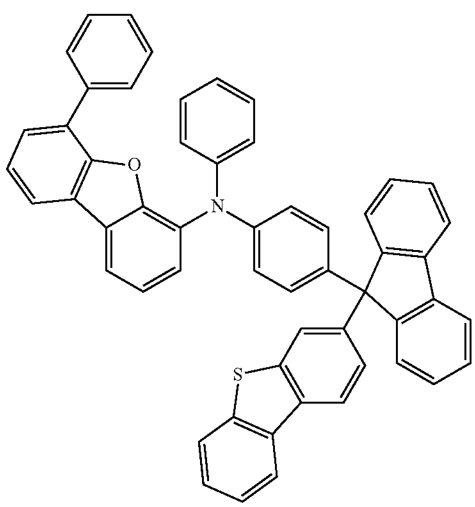
B50
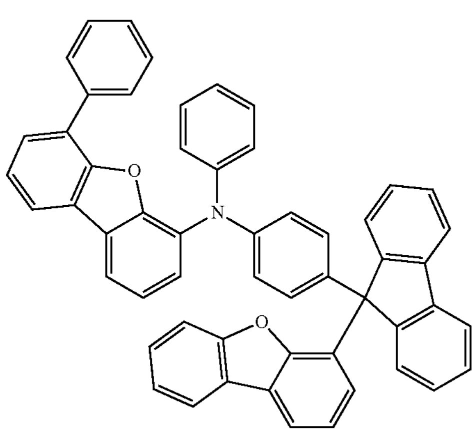
-continued
B51
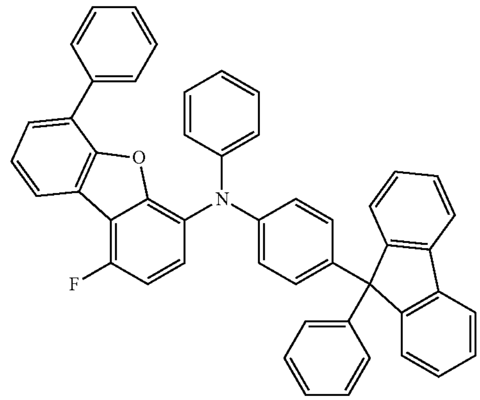
B52
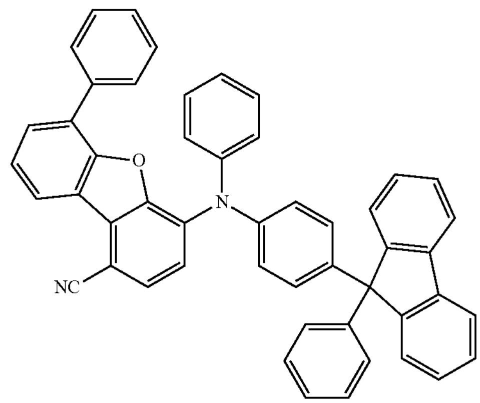
B53
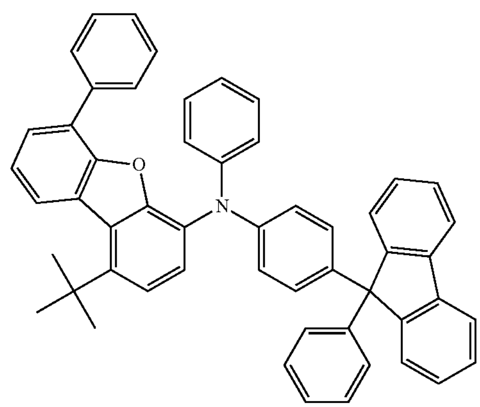
B54
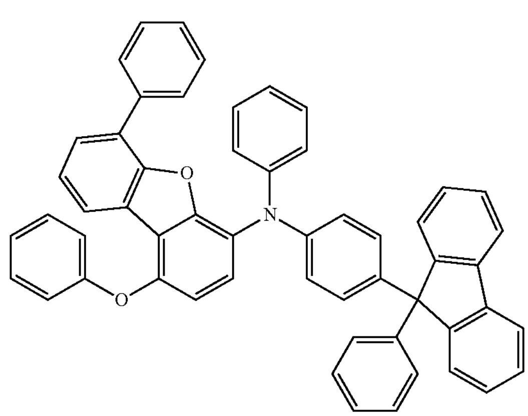

-continued
B55
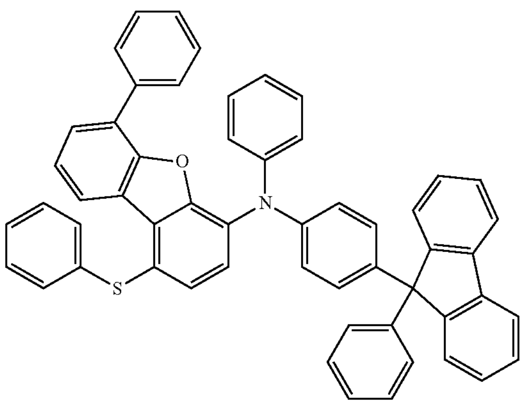
B56
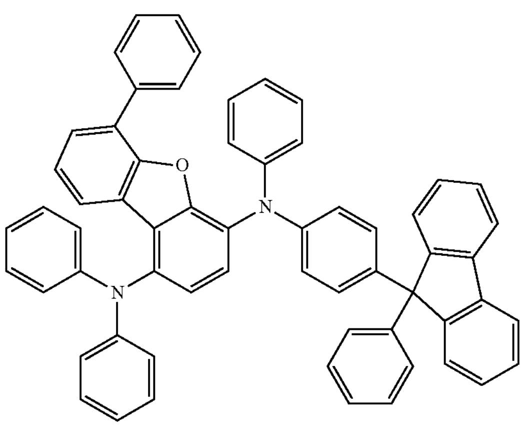
B57
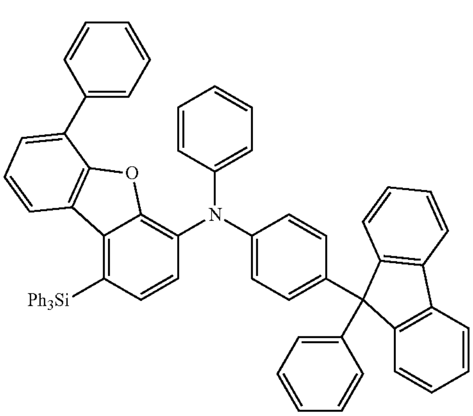
-continued
B58
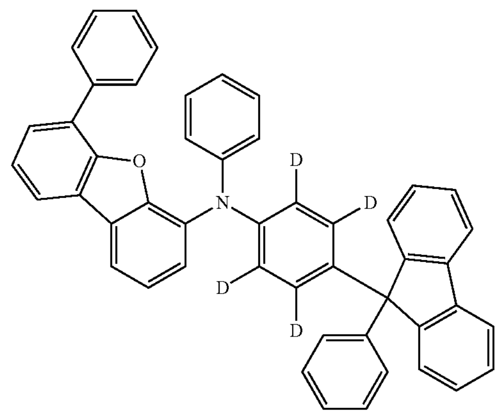
B59
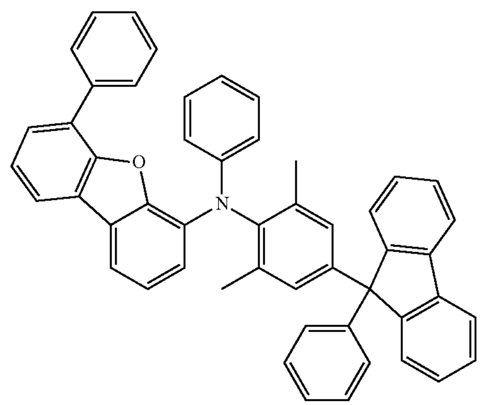
B60
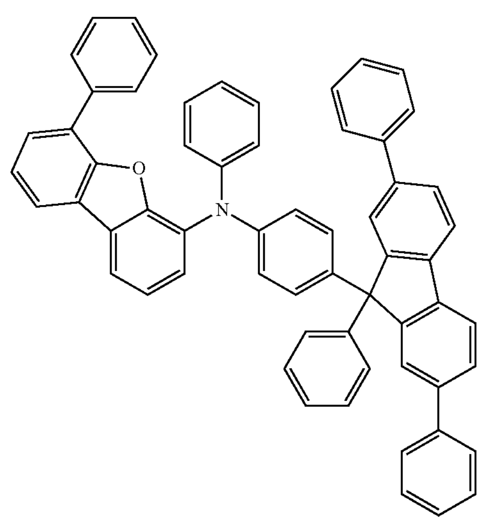

-continued
B61
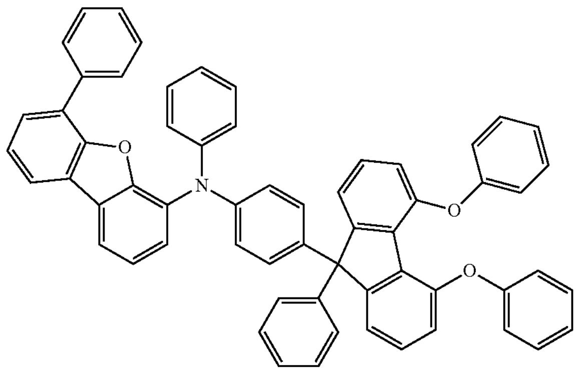
-continued
B62
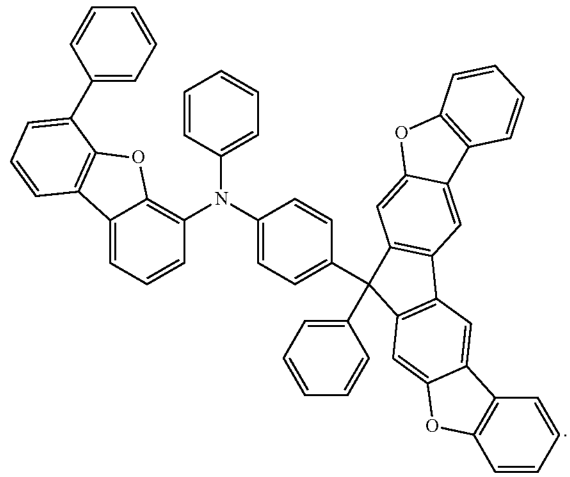
* * * * *